US011316248B2

(12) United States Patent
Matsubara et al.

(10) Patent No.: US 11,316,248 B2
(45) Date of Patent: Apr. 26, 2022

(54) SCANNED ANTENNA AND TFT SUBSTRATE

(71) Applicant: SHARP KABUSHIKI KAISHA, Sakai (JP)

(72) Inventors: Kunio Matsubara, Yonago (JP); Katsunori Misaki, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 109 days.

(21) Appl. No.: 16/583,104

(22) Filed: Sep. 25, 2019

(65) Prior Publication Data

US 2020/0099124 A1 Mar. 26, 2020

(30) Foreign Application Priority Data

Sep. 25, 2018 (JP) ............................ JP2018-179027

(51) Int. Cl.
*H01Q 1/22* (2006.01)
*H01Q 3/44* (2006.01)
(Continued)

(52) U.S. Cl.
CPC ........... *H01Q 1/2283* (2013.01); *H01L 23/66* (2013.01); *H01L 27/127* (2013.01);
(Continued)

(58) Field of Classification Search
CPC .......... H01Q 1/22; H01Q 13/10; H01Q 21/06; H01Q 3/44; H01Q 9/04; H01L 23/66; H01L 27/12
See application file for complete search history.

(56) References Cited

U.S. PATENT DOCUMENTS 7,466,269 B2 12/2008 Haziza
7,847,894 B2 12/2010 Rho
(Continued)

FOREIGN PATENT DOCUMENTS

CN 206834321 U 1/2018
CN 108432047 A 8/2018
(Continued)

OTHER PUBLICATIONS

R. A. Stevenson et al., "Rethinking Wireless Communications: Advanced Antenna Design using LCD Technology", SID 2015 DIGEST, pp. 827-830.
(Continued)

*Primary Examiner* — Sheng-Bai Zhu
(74) *Attorney, Agent, or Firm* — ScienBiziP, P.C.

(57) ABSTRACT

The scanning antenna includes a TFT substrate, a slot substrate including a slot electrode, a liquid crystal layer provided between the TFT substrate and the slot substrate, and a reflective conductive plate. Each of the plurality of antenna units includes a TFT, a patch electrode electrically connected to the drain of the TFT, a slot formed in the slot electrode corresponding to the patch electrode, and a first region in which the patch electrode and the slot electrode overlap each other when viewed from the normal direction of the first dielectric substrate. A distance in the normal direction of the first dielectric substrate between the patch electrode and the slot electrode of the plurality of second antenna units is smaller than a distance in the normal direction of the first dielectric substrate between the patch electrode and the slot electrode of the plurality of first antenna units.

19 Claims, 63 Drawing Sheets

(51) Int. Cl.

| | |
|---|---|
| ***H01L 27/12*** | (2006.01) |
| ***H01Q 9/04*** | (2006.01) |
| ***H01L 23/66*** | (2006.01) |
| ***H01Q 21/06*** | (2006.01) |
| ***H01Q 13/10*** | (2006.01) |

(52) U.S. Cl.

CPC .......... *H01L 27/1218* (2013.01); *H01Q 3/44* (2013.01); *H01Q 9/0407* (2013.01); *H01Q 13/10* (2013.01); *H01Q 21/064* (2013.01); *H01Q 21/065* (2013.01); *H01L 2223/6677* (2013.01)

(56) References Cited

U.S. PATENT DOCUMENTS

| | | | | |
|---|---|---|---|---|
| 2003/0164797 | A1* | 9/2003 | Ngai | H01Q 1/523 343/700 MS |
| 2009/0251356 | A1* | 10/2009 | Margomenos | H01Q 21/064 342/70 |
| 2009/0278744 | A1* | 11/2009 | Kirino | H01Q 9/045 343/700 MS |
| 2010/0060535 | A1* | 3/2010 | Tiezzi | H01Q 5/40 343/770 |
| 2012/0092577 | A1 | 4/2012 | Shi et al. | |
| 2012/0138922 | A1 | 6/2012 | Yamazaki et al. | |
| 2012/0194399 | A1 | 8/2012 | Bily et al. | |
| 2013/0320334 | A1 | 12/2013 | Yamazaki et al. | |
| 2014/0286076 | A1 | 9/2014 | Aoki et al. | |
| 2015/0263426 | A1* | 9/2015 | Hsu | H01Q 15/008 343/787 |
| 2017/0187124 | A1* | 6/2017 | Kirino | H01Q 1/3266 |
| 2018/0138594 | A1* | 5/2018 | Orui | H01Q 3/34 |
| 2018/0337446 | A1 | 11/2018 | Nakazawa et al. | |
| 2020/0286931 | A1 | 9/2020 | Takahashi et al. | |

FOREIGN PATENT DOCUMENTS

| | | | |
|---|---|---|---|
| EP | 3611796 | A1 | 2/2020 |
| JP | 2002-217640 | A | 8/2002 |
| JP | 2007-116573 | A | 5/2007 |
| JP | 2007-295044 | A | 11/2007 |
| JP | 2009-538565 | A | 11/2009 |
| JP | 2012-134475 | A | 7/2012 |
| JP | 2013-539949 | A | 10/2013 |
| JP | 2014-007399 | A | 1/2014 |
| JP | 2014-209727 | A | 11/2014 |
| WO | 2007/139736 | A2 | 12/2007 |
| WO | 2012/050614 | A1 | 4/2012 |
| WO | 2014/149341 | A1 | 9/2014 |
| WO | 2015/126550 | A1 | 8/2015 |
| WO | 2015/126578 | A1 | 8/2015 |
| WO | 2016/057539 | A1 | 4/2016 |
| WO | 2016/130383 | A1 | 8/2016 |
| WO | 2016/141340 | A1 | 9/2016 |
| WO | 2016/141342 | A1 | 9/2016 |
| WO | 2017/061527 | A1 | 4/2017 |

OTHER PUBLICATIONS

M. Ando et al., "A Radial Line Slot Antenna for 12GHz Satellite TV Reception", IEEE Transactions on Antennas and Propagation, vol. AP-33, No. 12, pp. 1347-1353 (1985).

M. Wittek et al., "Liquid Crystals for Smart Antennas and Other Microwave Applications", SID 2015 DIGEST, pp. 824-826.

Kuki, "New Functional Element Using Liquid Crystal" Polymer, vol. 55, August issue, pp. 599-602 (2006) (A concise explanation of the relevance can be found in paragraph [0051] of the specification of the subject application).

Co-Pending letter regarding a related co-pending U.S. Appl. No. 15/542,488, filed Jul. 10, 2017.

* cited by examiner

B-B'CROSS-SECTION
C-C'CROSS-SECTION
D-D'CROSS-SECTION
E-E'CROSS-SECTION

15p1
15p2
13sg
13s
17
11
4
1
3p1
7sg
3s
22
22p1
22s
22p2
19'
PT1
SG
ST
13p2
PT2
101A

A-A'CROSS-SECTION
H-H'CROSS-SECTION

55'
51

57
55
51

58
55
51

PS1
58
55
51

A-A'CROSS-SECTION
G-G'CROSS-SECTION
H-H'CROSS-SECTION 15
15h
17'
17
19'
20
11
4
1
6S
6D
7S
7D
7C
5
3G
3C
7w
U1
U2
101B

A-A'CROSS-SECTION
G-G'CROSS-SECTION
H-H'CROSS-SECTION

A-A'CROSS-SECTION G-G'CROSS-SECTION H-H'CROSS-SECTION

A-A'CROSS-SECTION G-G'CROSS-SECTION H-H'CROSS-SECTION

A-A'CROSS-SECTION G-G'CROSS-SECTION H-H'CROSS-SECTION

SCANNED ANTENNA AND TFT SUBSTRATE

CROSS-REFERENCE TO RELATED APPLICATIONS

This application claims the benefit of priority to Japanese Patent Application Number 2018-179027 filed on Sep. 25, 2018. The entire contents of the above-identified application are hereby incorporated by reference.

BACKGROUND

Technical Field

The present disclosure relates to a scanning antenna, and more particularly relates to a scanning antenna in which an antenna unit (also referred to as an "element antenna") has a liquid crystal capacitance (also referred to as a "liquid crystal array antenna"), and a TFT substrate used for such a scanning antenna.

Antennas for mobile communication and satellite broadcasting require functions that can change the beam direction (referred to as "beam scanning" or "beam steering"). As an example of an antenna (hereinafter referred to as a "scanning antenna" (scanned antenna) having such functionality, phased array antennas equipped with antenna units are known. However, phased array antennas of the related art are expensive, which is an obstacle for popularization as a consumer product. In particular, as the number of antenna units increases, the cost rises considerably.

Therefore, scanning antennas that utilize the high dielectric anisotropy (birefringence index) of liquid crystal materials (including nematic liquid crystals and polymer dispersed liquid crystals) have been proposed (JP 2007-116573 A, JP 2007-295044 A, JP 2009-538565 A, JP 2013-539949 A, WO 2015/126550, and R. A. Stevenson et al., "Rethinking Wireless Communications: Advanced Antenna Design using LCD Technology", SID 2015 DIGEST, pp. 827-830.). Since the dielectric constant of liquid crystal materials has a frequency dispersion, in the present specification, the dielectric constant in a frequency band for microwaves (also referred to as the "dielectric constant for microwaves") is particularly denoted as "dielectric constant M($\varepsilon_M$)".

JP 2009-538565 and R. A. Stevenson et al., "Rethinking Wireless Communications: Advanced Antenna Design using LCD Technology", SID 2015 DIGEST, pp. 827-830. describe that an inexpensive scanning antenna can be obtained by using liquid crystal display device (hereinafter referred to as "LCD") technology.

The applicant develops a scanning antenna which can be mass-manufactured by utilizing manufacturing techniques of LCDs of the related art. WO 2017/061527 of the application applied by the applicant discloses a scanning antenna which can be mass-manufactured by utilizing the manufacturing techniques of LCDs of the related art, a TFT substrate used for such a scanning antenna, and a manufacturing method and driving method of such a scanning antenna. For reference, the entire contents of the disclosures of WO 2017/061527 are incorporated herein.

SUMMARY

An object of the present disclosure is to provide a scanning antenna that can further improve the performance of a scanning antenna described in WO 2017/061527, and a TFT substrate used for such a scanning antenna.

According to the embodiments of the present disclosure, there are provided solutions according to the following items.

Item 1

A scanning antenna including:

a plurality of antenna units arranged in the scanning antenna;

a TFT substrate including a first dielectric substrate;

a slot substrate including a second dielectric substrate, and a slot electrode supported by a first main surface of the second dielectric substrate;

a liquid crystal layer provided between the TFT substrate and the slot substrate; and a reflective conductive plate disposed opposing a second main surface of the second dielectric substrate opposite to the first main surface with a dielectric layer interposed between the reflective conductive plate and the second dielectric substrate, wherein each of the plurality of antenna units includes a TFT supported by the first dielectric substrate, a patch electrode electrically connected to a drain of the TFT, a slot formed in the slot electrode corresponding to the patch electrode; and a first region in which the patch electrode and the slot electrode overlap each other when viewed from a normal direction of the first dielectric substrate, the plurality of antenna units includes a plurality of first antenna units and a plurality of second antenna units, and a distance between the patch electrode and the slot electrode in the first region of the plurality of second antenna units is smaller than a distance between the patch electrode and the slot electrode in the first region of the plurality of first antenna units.

Item 2

The scanning antenna according to item 1, wherein a thickness of the liquid crystal layer in the first region of the plurality of second antenna units is smaller than a thickness of the liquid crystal layer in the first region of the plurality of first antenna units.

Item 3

The scanning antenna according to item 1 or 2, wherein a thickness of the patch electrode in the plurality of second antenna units is greater than a thickness of the patch electrode of the plurality of first antenna units.

Item 4

The scanning antenna according to any one of items 1 to 3 wherein a thickness of the slot electrode in the first region of the plurality of second antenna units is greater than a thickness of the slot electrode in the first region of the plurality of first antenna units.

Item 5

The scanning antenna according to any one of items 1 to 4, wherein each of the plurality of first antenna units includes at least one first insulating layer formed in the first region between the first dielectric substrate and the patch electrode, each of the plurality of second antenna units includes at least one second insulating layer formed in the first region between the first dielectric substrate and the patch electrode, and a sum of thicknesses of the at least one second insulating layer is greater than a sum of thicknesses of the at least one first insulating layer.

Item 6

The scanning antenna according to any one of items 1 to 4, wherein each of the plurality of second antenna units includes at least one insulating layer formed in the first region between the first dielectric substrate and the patch electrode, and each of the plurality of first antenna units does not include an insulating layer in the first region and between the first dielectric substrate and the patch electrode.

Item 7

The scanning antenna according to any one of items 1 to 6, wherein each of the plurality of first antenna units includes at least one third insulating layer formed in the first region between the second dielectric substrate and the slot electrode, each of the plurality of second antenna units includes at least one fourth insulating layer formed in the first region between the second dielectric substrate and the slot electrode, and a sum of thicknesses of the at least one fourth insulating layer is greater than a sum of thicknesses of the at least one third insulating layer.

Item 8

The scanning antenna according to any one of items 1 to 6, wherein each of the plurality of second antenna units includes at least one insulating layer formed in the first region between the second dielectric substrate and the slot electrode, and each of the plurality of first antenna units does not include an insulating layer in the first region and between the second dielectric substrate and the slot electrode.

Item 9

The scanning antenna according to any one of items 1 to 8, wherein each of the plurality of first antenna units includes at least one first conductive layer formed in the first region between the first dielectric substrate and the patch electrode, each of the plurality of second antenna units includes at least one second conductive layer formed in the first region between the first dielectric substrate and the patch electrode, and a sum of thicknesses of the at least one second conductive layer is greater than a sum of thicknesses of the at least one first conductive layer.

Item 10

The scanning antenna according to any one of items 1 to 8, wherein each of the plurality of second antenna units includes at least one conductive layer formed in the first region between the first dielectric substrate and the patch electrode, and each of the plurality of first antenna units does not include a conductive layer in the first region and between the first dielectric substrate and the patch electrode.

Item 11

The scanning antenna according to any one of items 1 to 10, wherein a thickness of the second dielectric substrate in the first region of the plurality of second antenna units is greater than a thickness of the second dielectric substrate in the first region of the plurality of first antenna units.

Item 12

The scanning antenna according to item 11, wherein the second dielectric substrate includes a plurality of recessed portions overlapping the first region of the plurality of second antenna units when viewed from a normal direction of the first dielectric substrate, formed on the first main surface of the second dielectric substrate.

Item 13

The scanning antenna according to any one of items 1 to 12, wherein each of the plurality of antenna units includes a columnar spacer, and a height of the columnar spacer of the plurality of first antenna units is approximately equal to a height of the columnar spacer of the plurality of second antenna units.

Item 14

The scanning antenna according to any one of items 1 to 13, wherein the TFT substrate includes a gate metal layer supported by the first dielectric substrate and including a gate electrode of the TFT, a source metal layer supported by the first dielectric substrate and including a source electrode of the TFT, a semiconductor layer of the TFT, supported by the first dielectric substrate, a gate insulating layer formed between the gate metal layer and the semiconductor layer, an interlayer insulating layer formed on the TFT, and an additional insulating layer formed between the first dielectric substrate and the patch electrode, each of the plurality of second antenna units includes the additional insulating layer in at least the first region, and each of the plurality of first antenna units does not include the additional insulating layer.

Item 15

The scanning antenna according to any one of items 1 to 14, wherein the TFT substrate includes a gate metal layer supported by the first dielectric substrate and including a gate electrode of the TFT, a source metal layer supported by the first dielectric substrate and including a source electrode of the TFT, a semiconductor layer of the TFT, supported by the first dielectric substrate, a gate insulating layer formed between the gate metal layer and the semiconductor layer, and an interlayer insulating layer formed on the TFT, and each of the gate insulating layer and/or the interlayer insulating layer includes a plurality of openings or a plurality of recessed portions overlapping with the patch electrode of each of the plurality of first antenna units when viewed from the normal direction of the first dielectric substrate.

Item 16

A TFT substrate including:

a dielectric substrate; and a plurality of antenna unit regions arranged on the dielectric substrate, wherein each of the plurality of antenna unit regions includes a TFT supported by the dielectric substrate, and a patch electrode electrically connected to a drain of the TFT, the plurality of antenna unit regions include a plurality of first antenna unit regions and a plurality of second antenna unit regions, and a height of the patch electrode of the plurality of second antenna unit regions is greater than a height of the patch electrode of the plurality of second antenna unit regions.

Item 17

The TFT substrate according to item 16, wherein a thickness of the patch electrode of the plurality of second antenna unit regions is greater than a thickness of the patch electrode of the plurality of first antenna unit regions.

Item 18

The TFT substrate according to item 16 or 17, wherein each of the plurality of antenna unit regions includes a second region including two mutually opposing sides of the patch electrode when viewed from a normal direction of the dielectric substrate, each of the plurality of first antenna unit regions includes at least one first insulating layer formed in the second region between the dielectric substrate and the patch electrode, each of the plurality of second antenna unit regions includes at least one second insulating layer formed in the second region between the dielectric substrate and the patch electrode, and a sum of thicknesses of the at least one second insulating layer is greater than a sum of thicknesses of the at least one first insulating layer.

Here, the two mutually opposing sides of the patch electrode refer to two sides opposing each other with a slot therebetween in the scanning antenna, and refers to the short sides of the substantially rectangular patch electrode (see, for example, FIGS. 4A and 4B).

Item 19

The TFT substrate of item 16 or 17, wherein each of the plurality of antenna unit regions includes a second region including two mutually opposing sides of the patch electrode when viewed from a normal direction of the dielectric substrate, each of the plurality of second antenna unit regions includes at least one insulating layer formed in the second region between the dielectric substrate and the patch electrode, and each of the plurality of first antenna unit regions does not include an insulating layer in the second region and between the dielectric substrate and the patch electrode.

Item 20

The TFT substrate of any of items 16 to 19, wherein each of the plurality of antenna unit regions includes a second region including two mutually opposing sides of the patch electrode when viewed from a normal direction of the dielectric substrate, each of the plurality of first antenna unit regions includes at least one first conductive layer formed in the second region between the dielectric substrate and the patch electrode, each of the plurality of second antenna unit regions includes at least one second conductive layer formed in the second region between the dielectric substrate and the patch electrode, and a sum of thicknesses of the at least one second conductive layer is greater than a sum of thicknesses of the at least one first conductive layer.

Item 21

The TFT substrate of any of items 16 to 19, wherein each of the plurality of antenna unit regions includes a second region including two mutually opposing sides of the patch electrode when viewed from a normal direction of the dielectric substrate, each of the plurality of second antenna unit regions includes at least one conductive layer formed in the second region between the dielectric substrate and the patch electrode, and each of the plurality of first antenna unit regions does not include a conductive layer in the second region and between the dielectric substrate and the patch electrode.

Item 22

The TFT substrate of any of items 16 to 21, wherein each of the plurality of antenna unit regions includes a second region including two mutually opposing sides of the patch electrode when viewed from a normal direction of the dielectric substrate, each of the plurality of antenna unit regions including a gate metal layer, supported by the dielectric substrate and including a gate electrode of the TFT, a source metal layer supported by the dielectric substrate and including a source electrode of the TFT, a semiconductor layer of the TFT supported by the dielectric substrate, a gate insulating layer formed between the gate metal layer and the semiconductor layer, an interlayer insulating layer formed on the TFT, and an additional insulating layer formed between the dielectric substrate and the patch electrode, each of the plurality of second antenna unit regions includes the additional insulating layer in at least the second region, and each of the plurality of first antenna unit regions does not include the additional insulating layer.

Item 23

The TFT substrate of any of items 16 to 22, including a gate metal layer supported by the dielectric substrate and including a gate electrode of the TFT;

a source metal layer supported by the dielectric substrate and including a source electrode of the TFT;

a semiconductor layer of the TFT, supported by the dielectric substrate;

a gate insulating layer formed between the gate metal layer and the semiconductor layer; and an interlayer insulating layer formed on the TFT, wherein each of the gate insulating layer and/or the interlayer insulating layer includes a plurality of openings or a plurality of recessed portions overlapping with the patch electrode of each of the plurality of first antenna unit regions when viewed from a normal direction of the dielectric substrate.

According to the embodiments of the present disclosure, the performance of the scanning antenna can be further improved.

BRIEF DESCRIPTION OF DRAWINGS

The disclosure will be described with reference to the accompanying drawings, wherein like numbers reference like elements.

DESCRIPTION OF EMBODIMENTS

Figure 1:
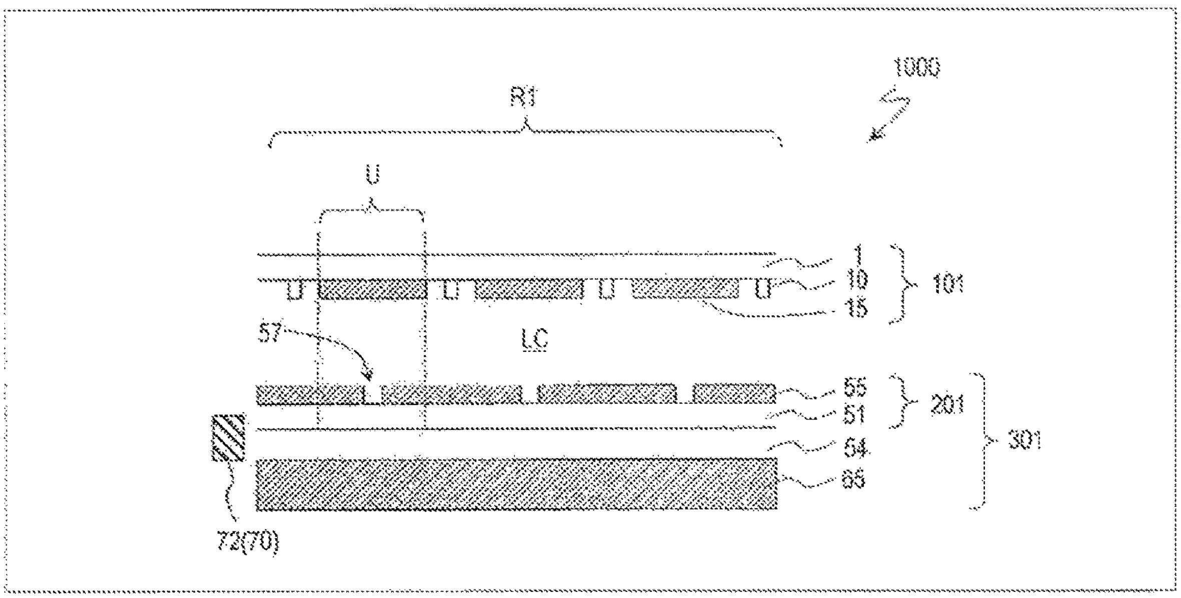
FIG. 1 is a cross-sectional view schematically illustrating a portion of a scanning antenna 1000.

Hereinafter, a scanning antenna, a manufacturing method of the scanning antenna, and a TFT substrate used in the scanning antenna according to embodiments of the present disclosure will be described with reference to the drawings. Note that the present disclosure is not limited to the embodiments illustrated below. The embodiments of the present disclosure are not limited to the drawings. For example, a thickness of a layer in a cross-sectional view, a size of a conductive portion and an opening in a plan view, and the like are exemplary.

Basic Structure of Scanning Antenna

By controlling the voltage applied to each liquid crystal layer of each antenna unit corresponding to the pixels of the LCD panel and changing the effective dielectric constant M ($\varepsilon_M$) of the liquid crystal layer for each antenna unit, a scanning antenna equipped with an antenna unit that uses the anisotropy (birefringence index) of a large dielectric constant M ($\varepsilon_M$) of a liquid crystal material forms a two-dimensional pattern by antenna units with different electrostatic capacitances (corresponding to displaying of an image by an LCD). An electromagnetic wave (for example, a microwave) emitted from an antenna or received by an antenna is given a phase difference depending on the electrostatic capacitance of each antenna unit, and gains a strong directivity in a particular direction depending on the two-dimensional pattern formed by the antenna units having different electrostatic capacitances (beam scanning). For example, an electromagnetic wave emitted from an antenna is obtained by integrating, with consideration for the phase difference provided by each antenna unit, spherical waves obtained as a result of input electromagnetic waves entering each antenna unit and being scattered by each antenna unit. It can be considered that each antenna unit functions as a "phase shifter". The basic structure and operating principle of a scanning antenna using liquid crystal material is disclosed in JP 2007-116573 A, JP 2007-295044 A, JP 2009-538565 A, JP 2013-539949 A, and R. A. Stevenson et al., "Rethinking Wireless Communications: Advanced Antenna Design using LCD Technology", SID 2015 DIGEST, pp. 827-830., M. ANDO et al., "A Radial Line Slot Antenna for 12 GHz Satellite TV Reception", IEEE Transactions of Antennas and Propagation, Vol. AP-33, No. 12, pp. 1347-1353 (1985). M. ANDO et al., "A Radial Line Slot Antenna for 12 GHz Satellite TV Reception", IEEE Transactions of Antennas and Propagation, Vol. AP-33, No. 12, pp. 1347-1353 (1985). discloses the basic structure of a scanning antenna in which spiral slots are arranged. For reference, the entire contents of the disclosures of JP 2007-116573 A, JP 2007-295044 A, JP 2009-538565 A, JP 2013-539949 A, and R. A. Stevenson et al., "Rethinking Wireless Communications: Advanced Antenna Design using LCD Technology", SID 2015 DIGEST, pp. 827-830., M. ANDO et al., "A Radial Line Slot Antenna for 12 GHz Satellite TV Reception", IEEE Transactions of Antennas and Propagation, Vol. AP-33, No. 12, pp. 1347-1353 (1985). are incorporated herein.

Note that although the antenna units in the scanning antenna are similar to the pixels of the LCD panel, the structure of the antenna units is different from the structure of the pixel of the LCD panel, and the arrangement of the plurality of antenna units is also different from the arrangement of the pixels in the LCD panel. A basic structure of the scanning antenna will be described with reference to FIG. 1, which illustrates a scanning antenna 1000 described in WO 2017/061527. Although the scanning antenna 1000 is a radial in-line slot antenna in which slots are concentrically arranged, the scanning antennas according to the embodiments of the present disclosure are not limited to this. For example, the arrangement of the slots may be any of various known arrangements. In particular, with respect to the slot and/or antenna unit arrangements, the entire disclosure of WO 2015/126550 is incorporated herein by reference.

FIG. 1 is a cross-sectional view schematically illustrating a portion of the scanning antenna 1000, and schematically illustrates a part of the cross-section along the radial direction from a power feed pin 72 (see FIG. 2B) provided near the center of the concentrically arranged slots.

The scanning antenna 1000 includes a TFT substrate 101, a slot substrate 201, a liquid crystal layer LC provided therebetween, and a reflective conductive plate 65 opposing the slot substrate 201 with an air layer 54 interposed between the slot substrate 201 and the reflective conductive plate 65. The scanning antenna 1000 transmits and/or receives microwaves to and/or from a side closer to the TFT substrate 101.

The TFT substrate 101 includes a dielectric substrate 1 such as a glass substrate, a plurality of patch electrodes 15 and a plurality of TFTs 10 formed on the dielectric substrate 1. Each patch electrode 15 is connected to a corresponding TFT 10. Each TFT 10 is connected to a gate bus line and a source bus line.

The slot substrate 201 includes a dielectric substrate 51 such as a glass substrate and a slot electrode 55 formed on a side of the dielectric substrate 51 closer to the liquid crystal layer LC. The slot electrode 55 includes a plurality of slots 57.

The reflective conductive plate 65 is disposed opposing the slot substrate 201 with the air layer 54 interposed between the reflective conductive plate 65 and the slot substrate 201. In place of the air layer 54, a layer formed of a dielectric (for example, a fluorine resin such as PTFE) having a small dielectric constant M for microwaves can be used. The slot electrode 55, the reflective conductive plate 65, and the dielectric substrate 51 and the air layer 54 therebetween function as a waveguide 301.

The patch electrode 15, the portion of the slot electrode 55 including the slot 57, and the liquid crystal layer LC therebetween constitute an antenna unit U. In each antenna unit U, one patch electrode 15 is opposed to a portion of the slot electrode 55 including one slot 57 with a liquid crystal layer LC interposed therebetween, thereby constituting the liquid crystal capacitance. The structure in which the patch electrode 15 and the slot electrode 55 oppose each other with the liquid crystal layer LC interposed therebetween is similar to the structure in which the pixel electrode and the counter electrode of the LCD panel oppose each other with the liquid crystal layer interposed therebetween. That is, the antenna unit U of the scanning antenna 1000 and the pixel of the LCD panel have a similar configuration. The antenna unit has a configuration similar to that of the pixel in the LCD panel in that the antenna unit has an auxiliary capacitance electrically connected in parallel with the liquid crystal capacitance. However, the scanning antenna 1000 has many differences from the LCD panel.

First, the performance required for the dielectric substrates 1 and 51 of the scanning antenna 1000 is different from the performance required for the substrate of the LCD panel.

Generally, transparent substrates that are transparent to visible light are used for LCD panels. For example, glass substrates or plastic substrates are used. In reflective LCD panels, since the substrate on the back side does not need transparency, a semiconductor substrate may be used in some cases. In contrast to this, it is preferable for the dielectric substrates 1 and 51 used for the antennas to have small dielectric losses with respect to microwaves (where the dielectric tangent with respect to microwaves is denoted as tan $\delta_M$). The tan $\delta_M$ of each of the dielectric substrates 1 and 51 is preferably approximately less than or equal to 0.03, and more preferably less than or equal to 0.01. Specifically, a glass substrate or a plastic substrate can be used. Glass substrates are superior to plastic substrates with respect to dimensional stability and heat resistance, and are suitable for forming circuit elements such as TFTs, a wiring line, and electrodes using LCD technology. For example, in a case where the materials forming the waveguide are air and glass, as the dielectric loss of glass is greater, from the viewpoint that thinner glass can reduce the waveguide loss, it is preferable for the thickness to be less than or equal to 400 μm, and more preferably less than or equal to 300 μm. There is no particular lower limit, provided that the glass can be handled such that it does not break in the manufacturing process.

The conductive material used for the electrode is also different. In many cases, an ITO film is used as a transparent conductive film for pixel electrodes and counter electrodes of LCD panels. However, ITO has a large tan $\delta_M$ with respect to microwaves, and as such cannot be used as the conductive layer in an antenna. The slot electrode 55 functions as a wall for the waveguide 301 together with the reflective conductive plate 65. Accordingly, to suppress the transmission of microwaves in the wall of the waveguide 301, it is preferable that the thickness of the wall of the waveguide 301, that is, the thickness of the metal layer (Cu layer or Al layer) be large. It is known that in a case where the thickness of the metal layer is three times the skin depth, electromagnetic waves are attenuated to 1/20 (−26 dB), and in a case where the thickness is five times the skin depth, electromagnetic waves are attenuated to about 1/150 (−43 dB). Accordingly, in a case where the thickness of the metal layer is five times the skin depth, the transmittance of electromagnetic waves can be reduced to 1%. For example, for a microwave of 10 GHz, in a case where a Cu layer having a thickness of greater than or equal to 3.3 μm and an Al layer having a thickness of greater than or equal to 4.0 μm are used, microwaves can be reduced to 1/150. For a microwave of 30 GHz, in a case where a Cu layer having a thickness of greater than or equal to 1.9 μm and an Al layer having a thickness of greater than or equal to 2.3 μm are used, microwaves can be reduced to 1/150. In this way, the slot electrode 55 is preferably formed of a relatively thick Cu layer or Al layer. There is no particular upper limit for the thickness of the Cu layer or the Al layer, and the thicknesses can be configured appropriately in consideration of the time and cost of film formation. The usage of a Cu layer provides the advantage of being thinner than the case of using an Al layer. Relatively thick Cu layers or Al layers can be formed not only by the thin film deposition method used in LCD manufacturing processes, but also by other methods such as bonding Cu foil or Al foil to the substrate. The thickness of the metal layer, for example, ranges from 2 μm to 30 μm. In a case where the thin film deposition methods are used, the thickness of the metal layer is preferably less than or equal to 5 μm. Note that aluminum plates, copper plates, or the like having a thickness of several mm can be used as the reflective conductive plate 65, for example.

Since the patch electrode 15 does not configure the waveguide 301 like the slot electrode 55, a Cu layer or an Al layer can be used that has a smaller thickness than that of the slot electrode 55. However, to avoid losses caused by heat when the oscillation of free electrons near the slot 57 of the slot electrode 55 induces the oscillation of the free electrons in the patch electrode 15, it is preferable that the resistance be low. From the viewpoint of mass production, it is preferable to use an Al layer rather than a Cu layer, and the thickness of the Al layer is preferably greater than or equal to 0.3 μm and less than or equal to 2 μm, for example.

An arrangement pitch of the antenna units U is considerably different from that of a pixel pitch. For example, considering an antenna for microwaves of 12 GHz (Ku band), the wavelength A is 25 mm, for example. Then, as described in JP 2013-539949 A, since the pitch of the antenna unit U is less than or equal to λ/4 and/or less than or equal to λ/5, the arrangement pitch becomes less than or equal to 6.25 mm and/or less than or equal to 5 mm. This is ten times greater than the pixel pitch of the LCD panel. Accordingly, the length and width of the antenna unit U are also roughly ten times greater than the pixel length and width of the LCD panel.

Of course, the arrangement of the antenna units U may be different from the arrangement of the pixels in the LCD panel. Here, although an example is illustrated in which the antenna units U are arranged in concentric circles (for example, refer to JP 2002-217640 A), the present disclosure is not limited thereto, and the antenna units may be arranged in a spiral shape as described in M. ANDO et al., "A Radial Line Slot Antenna for 12 GHz Satellite TV Reception", IEEE Transactions of Antennas and Propagation, Vol. AP-33, No. 12, pp. 1347-1353 (1985)., for example. Furthermore, the antenna units may be arranged in a matrix as described in JP 2013-539949 A.

The properties required for the liquid crystal material of the liquid crystal layer LC of the scanning antenna 1000 are different from the properties required for the liquid crystal material of the LCD panel. In the LCD panel, a change in a refractive index of the liquid crystal layer of the pixels allows a phase difference to be provided to the polarized visible light (wavelength of from 380 nm to 830 nm) such that the polarization state is changed (for example, the change in the refractive index allows the polarization axis direction of linearly polarized light to be rotated or the degree of circular polarization of circularly polarized light to be changed), whereby display is performed. In contrast, in the scanning antenna 1000, the phase of the microwave excited (re-radiated) from each patch electrode is changed by changing the electrostatic capacitance value of the liquid crystal capacitance of the antenna unit U. Accordingly, the liquid crystal layer preferably has a large anisotropy ($\Delta\varepsilon_M$) of the dielectric constant M ($\varepsilon_M$) for microwaves, and tan $\delta_M$ is preferably small. For example, the $\Delta\varepsilon_M$ of greater than or equal to 4 and the $\delta_M$ of less than or equal to 0.02 (values of 19 GHz in both cases) described in SID 2015 DIGEST pp. 824-826 written by M. Witteck et al, can be suitably used. In addition, it is possible to use a liquid crystal material having a $\Delta\varepsilon_M$ of greater than or equal to 0.4 and a $\delta_M$ of less than or equal to 0.04 as described in POLYMERS 55 vol. August issue pp. 599-602 (2006), written by Kuki.

In general, the dielectric constant of a liquid crystal material has a frequency dispersion, but the dielectric anisotropy ΔεM for microwaves has a positive correlation with the refractive index anisotropy Δn with respect to visible light. Accordingly, it can be said that a material having a large refractive index anisotropy Δn with respect to visible light is preferable as a liquid crystal material for an antenna unit for microwaves. The refractive index anisotropy Δn of the liquid crystal material for LCDs is evaluated by the refractive index anisotropy for light having a wavelength of 550 nm. Here again, in a case where a Δn (birefringence index) is used as an index for light having a wavelength of 550 nm, a nematic liquid crystal having a Δn of greater than or equal to 0.3, preferably greater than or equal to 0.4, can be used for an antenna unit for microwaves. Δn has no particular upper limit. However, since liquid crystal materials having a large Δn tend to have a strong polarity, there is a possibility that reliability may decrease. The thickness of the liquid crystal layer is, for example, from 1 μm to 500 μm.

Hereinafter, the structure of the scanning antenna will be described in more detail.

Figure 2A:
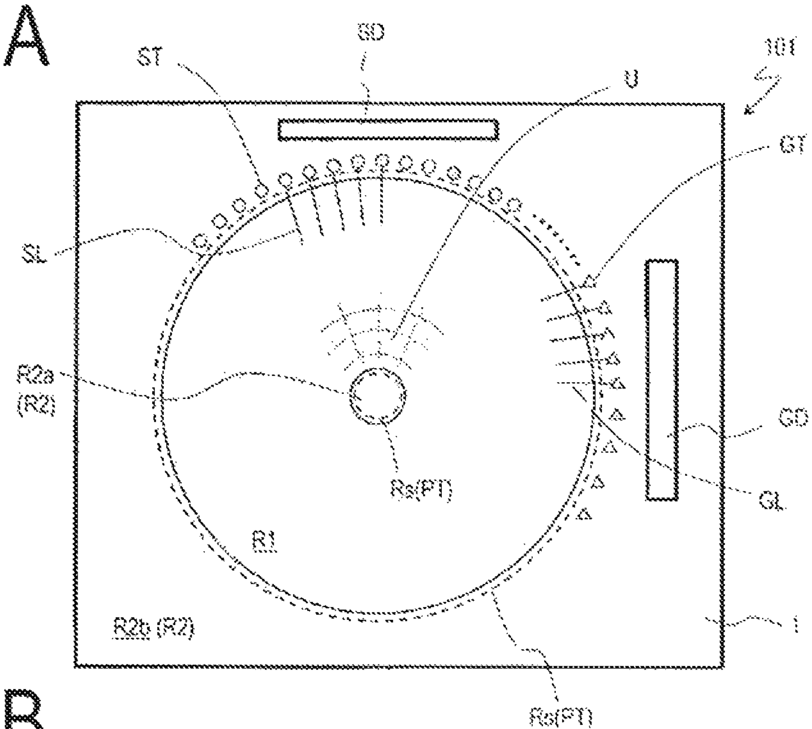
FIGS. 2A and 2B are schematic plan views illustrating a TFT substrate 101 and a slot substrate 201 included in the scanning antenna 1000, respectively.
Figure 2B:
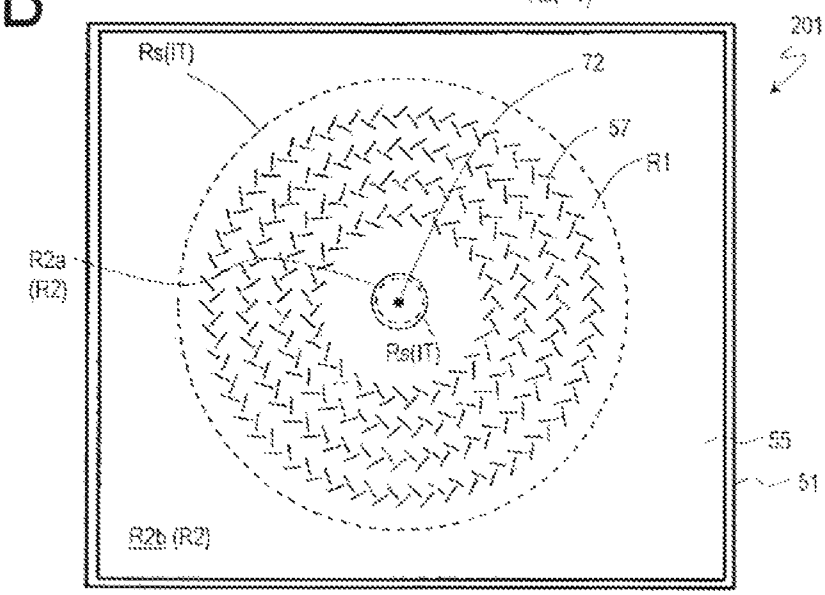

First, a description is given with reference to FIG. 1 and FIGS. 2A and 2B. FIG. 1 is a schematic partial cross-sectional view of the scanning antenna 1000 near the center thereof as described above in detail, and FIG. 2A and FIG. 2B are schematic plan views illustrating the TFT substrate 101 and the slot substrate 201 included in the scanning antenna 1000, respectively.

The scanning antenna 1000 includes a plurality of antenna units U arranged two-dimensionally. In the scanning antenna 1000 exemplified here, the plurality of antenna units are arranged concentrically. In the following description, the region of the TFT substrate 101 and the region of the slot substrate 201 corresponding to the antenna unit U will be referred to as "antenna unit region," and be denoted with the same reference numeral U as the antenna unit. As illustrated in FIGS. 2A and 2B, in the TFT substrate 101 and the slot substrate 201, a region defined by the plurality of two-dimensionally arranged antenna unit regions is referred to as a "transmission and/or reception region R1," and a region other than the transmission and/or reception region R1 is referred to as a "non-transmission and/or reception region R2". A terminal section, a driving circuit, and the like are provided in the non-transmission and/or reception region R2.

FIG. 2A is a schematic plan view illustrating the TFT substrate 101 included in the scanning antenna 1000.

In the illustrated example, the transmission and/or reception region R1 has a donut-shape when viewed from a normal direction of the TFT substrate 101. The non-transmission and/or reception region R2 includes a first non-transmission and/or reception region R2*a* located at the center of the transmission and/or reception region R1 and a second non-transmission and/or reception region R2*b* located at the periphery of the transmission and/or reception region R1. An outer diameter of the transmission and/or reception region R1, for example, is from 200 mm to 1500 mm, and is configured according to a communication traffic volume or the like.

A plurality of gate bus lines GL and a plurality of source bus lines SL supported by the dielectric substrate 1 are provided in the transmission and/or reception region R1 of the TFT substrate 101, and the antenna unit regions U are defined by these wiring lines. The antenna unit regions U are, for example, arranged concentrically in the transmission and/or reception region R1. Each of the antenna unit regions U includes a TFT and a patch electrode electrically connected to the TFT. The source electrode of the TFT is electrically connected to the source bus line SL, and the gate electrode is electrically connected to the gate bus line GL. The drain electrode is electrically connected to the patch electrode.

In the non-transmission and/or reception region R2 (R2*a*, R2*b*), a seal region Rs is disposed surrounding the transmission and/or reception region R1. A sealing member (not illustrated) is applied to the seal region Rs.

The sealing member bonds the TFT substrate 101 and the slot substrate 201 to each other, and also encloses liquid crystals between these substrates 101, 201.

A gate terminal section GT, the gate driver GD, a source terminal section ST, and the source driver SD are provided outside the seal region Rs in the non-transmission and/or reception region R2. Each of the gate bus lines GL is connected to the gate driver GD with the gate terminal section GT therebetween.

Each of the source bus lines SL is connected to the source driver SD with the source terminal section ST therebetween. Note that, in this example, although the source driver SD and the gate driver GD are formed on the dielectric substrate 1, one or both of these drivers may be provided on another dielectric substrate.

A plurality of transfer terminal sections PT are provided in the non-transmission and/or reception region R2. The transfer terminal section PT is electrically connected to the slot electrode 55 (FIG. 2B) of the slot substrate 201. In the present specification, the connection section between the transfer terminal section PT and the slot electrode 55 is referred to as a "transfer section". As illustrated in drawings, the transfer terminal section PT (transfer section) may be disposed in the seal region Rs. In this case, a resin containing conductive particles may be used as the sealing member. In this way, liquid crystals are sealed between the TFT substrate 101 and the slot substrate 201, and an electrical connection can be secured between the transfer terminal section PT and the slot electrode 55 of the slot substrate 201. In this example, although a transfer terminal section PT is disposed in both the first non-transmission and/or reception region R2*a* and the second non-transmission and/or reception region R2*b*, the transfer terminal section PT may be disposed in only one of them.

Note that the transfer terminal section PT (transfer section) need not be disposed in the seal region Rs. For example, the transfer terminal section PT may be disposed outside the seal region Rs in the non-transmission and/or reception region R2. Of course, the transfer section may be disposed both within the seal region Rs and outside the seal region Rs.

FIG. 2B is a schematic plan view illustrating the slot substrate 201 in the scanning antenna 1000, and illustrates the surface of the slot substrate 201 closer to the liquid crystal layer LC.

In the slot substrate 201, the slot electrode 55 is formed on the dielectric substrate 51 extending across the transmission and/or reception region R1 and the non-transmission and/or reception region R2.

In the transmission and/or reception region R1 of the slot substrate 201, a plurality of slots 57 are formed in the slot electrode 55. The slots 57 are formed corresponding to the antenna unit region U on the TFT substrate 101. For the plurality of slots 57 in the illustrated example, a pair of slots 57 extending in directions substantially orthogonal to each other are concentrically disposed so that a radial in-line slot antenna is configured. Since the scanning antenna 1000 includes slots that are substantially orthogonal to each other, the scanning antenna 1000 can transmit and/or receive circularly polarized waves.

A plurality of terminal sections IT of the slot electrode 55 are provided in the non-transmission and/or reception region R2. The terminal section IT is electrically connected to the transfer terminal section PT (FIG. 2A) of the TFT substrate 101. In this example, the terminal section IT is disposed within the seal region Rs, and is electrically connected to a corresponding transfer terminal section PT by a sealing member containing conductive particles.

The power feed pin 72 is disposed on a rear surface side of the slot substrate 201 in the first non-transmission and/or reception region R2*a*. The power feed pin 72 allows microwaves to be inserted into the waveguide 301 constituted by the slot electrode 55, the reflective conductive plate 65, and the dielectric substrate 51. The power feed pin 72 is connected to a power feed device 70. Power feeding is performed from the center of the concentric circle in which the slots 57 are arranged. The power feed method may be either a direct coupling power feed method or an electromagnetic coupling method, and a known power feed structure can be utilized.

In FIGS. 2A and 2B, an example is illustrated in which the seal region Rs is provided so as to surround a relatively narrow region including the transmission and/or reception region R1, but the arrangement of the seal region Rs is not limited to this. In particular, the seal region Rs provided outside the transmission and/or reception region R1 may be provided nearby the side of the dielectric substrate 1 and/or the dielectric substrate 51, for example, so as to maintain a certain distance or more from the transmission and/or reception region R1. Of course, the terminal section and the driving circuit, for example, that are provided in the non-transmission and/or reception region R2 may be formed outside the region surrounded by the seal region Rs (that is, the side where the liquid crystal layer is not present). By forming the seal region Rs at a position separated from the transmission and/or reception region R1 by a certain distance or more, it is possible to prevent the antenna characteristics from deteriorating due to the influence of impurities (in particular, ionic impurities) contained in the sealing member (in particular, a curable resin).

As described above, by controlling the voltage applied to each liquid crystal layer of each antenna unit and changing the effective dielectric constant M ($\varepsilon_M$) of the liquid crystal layer for each antenna unit, the scanning antenna forms a two-dimensional pattern by antenna units with different electrostatic capacitances. However, the electrostatic capacitance values of the antenna units may vary. For example, the volume of liquid crystal material may change depending on the environment temperature of the scanning antenna, and therefore the electrostatic capacitance value of the liquid crystal capacitance may change. For example, in a case where the liquid crystal material thermally expands, the thickness of the liquid crystal layer may increase, and in a case where the liquid crystal material thermally shrinks, the thickness of the liquid crystal layer may decrease. As a result, the phase difference provided to the microwaves by the liquid crystal layer of each antenna unit is shifted from a predetermined value. In a case where the phase difference shifts from the predetermined value, the antenna characteristics deteriorate. This deterioration of the antenna characteristics can be evaluated as a shift in the resonance frequency, for example. In reality, for example, since the scanning antenna is designed to maximize the gain at a predetermined resonance frequency $f_0$, the deterioration in the antenna characteristics due to a shift in the resonance frequency appears as a change in gain, for example. Alternatively, in a case where the direction in which the gain of the scanning antenna is maximized deviates from the desired direction, the communication satellite cannot be accurately tracked, for example.

Figure 3A:
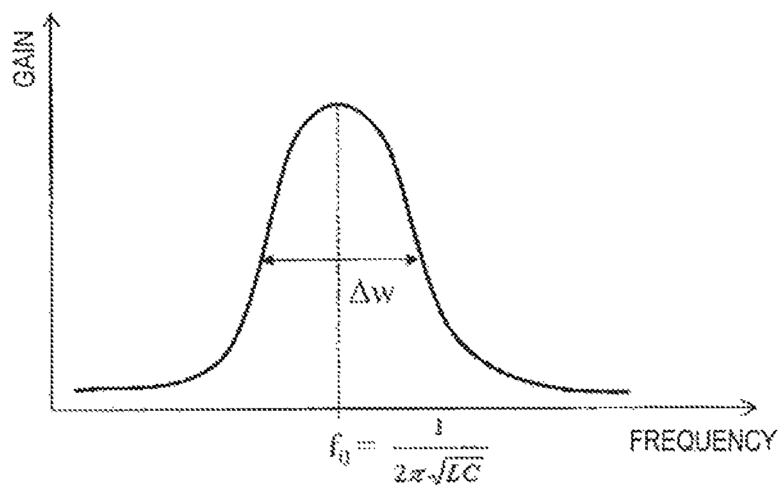
FIGS. 3A and 3B are diagrams illustrating an example of frequency (transmission or reception frequency)-gain characteristics of a scanning antenna described in WO 2017/061527 and an example of a frequency (transmission or reception frequency)-gain characteristic of a scanning antenna according to the embodiments of the present disclosure, respectively.

FIG. 3A illustrates an example of the frequency (transmission or reception frequency)-gain characteristics of the scanning antenna described in WO 2017/061527. The scanning antenna described in WO 2017/061527 is designed to have equal thickness of the liquid crystal layers each between the patch electrode and the slot electrode in all antenna units. The resonant frequency $f_0$ illustrated in FIG. 3A is determined by, for example, the electrostatic capacitance value of the liquid crystal capacitance formed by the patch electrode, the slot electrode, and the liquid crystal layer therebetween. The larger the width of the resonance peak (frequency bandwidth) Δw (width where the gain is 1/√2) indicates that even if the resonant frequency is shifted, the effect on the gain is suppressed.

Figure 3B:
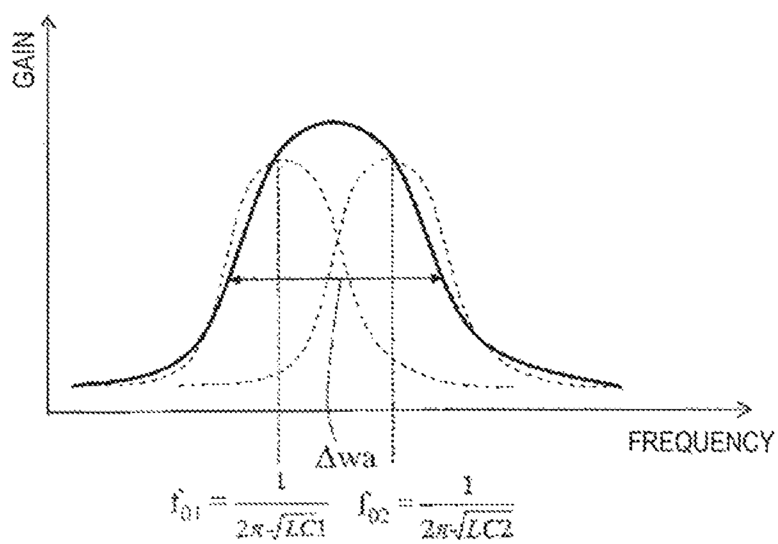

A plurality of antenna units of a scanning antenna according to the embodiments of the present disclosure include a plurality of first antenna units and a plurality of second antenna units. The first antenna units and the second antenna units differ from each other in the thickness of the liquid crystal layer between the patch electrode and the slot electrode. That is, the electrostatic capacitance value of the liquid crystal capacitance that each of the first antenna units and the second antenna units has are different from each other. FIG. 3B illustrates an example of the frequency (transmission or reception frequency)-gain characteristics of the scanning antenna according to the embodiments of the present disclosure. As illustrated in FIG. 3B, the first antenna units and the second antenna units are designed to maximize the gain at different resonant frequencies $f_{01}$ and $f_{02}$, respectively. As the whole scanning antenna, by overlapping the frequency-gain characteristics (dotted lines in FIG. 3B) in each of the first antenna units and the second antenna units, frequency-gain characteristics (solid line in FIG. 3B) having a wider width (frequency bandwidth) Δwa (width where the gain is 1/√2) than that of the scanning antenna described in WO 2017/061527 are obtained. Thus, in the scanning antenna according to the embodiments of the present disclosure, the deterioration in antenna characteristics due to a shift of the resonant frequency is suppressed compared with the scanning antenna described in WO 2017/061527.

Note that, strictly speaking, the liquid crystal capacitance contributing to the antenna characteristics typically includes, in addition to the liquid crystal layer LC, an inorganic insulating layer formed between the patch electrode 15 and the liquid crystal layer LC and between the slot electrode 55 and the liquid crystal layer LC, to cover the patch electrode 15 or the slot electrode 55. Furthermore, the liquid crystal capacitance contributing to the antenna characteristics also includes an alignment film formed between the inorganic insulating layer and the liquid crystal layer LC. However, the liquid crystal layer LC mainly contributes to the electrostatic capacitance value of the liquid crystal capacitance. Accordingly, typically, the thickness of the liquid crystal layer LC between the patch electrode 15 and the slot electrode 55 may be varied between the first antenna units and the second antenna units. However, the embodiments of the present disclosure are not limited thereto, and the distance between the patch electrode 15 and the slot electrode 55 (distance in the normal direction of the dielectric substrate 1 or 51) may be different between the first antenna units and the second antenna units.

For example, a scanning antenna according to the embodiments of the present disclosure can be obtained by using a TFT substrate having a different height of the patch electrode 15 in the first antenna unit region and the second antenna unit region. Alternatively, a scanning antenna according to the embodiments of the present disclosure can be obtained by using a slot substrate having a different height of the slot electrodes 55 in the first antenna unit region and the second antenna unit region. Of course, both the TFT substrate and the slot substrate described above may be used as well. Here, the height of the patch electrode 15 refers to the distance (the distance in the normal direction of the first dielectric substrate 1) from the surface of the first dielectric substrate 1 opposite to the liquid crystal layer LC (the surface further from the liquid crystal layer LC) to the top surface of the patch electrode 15 (the surface closer to the liquid crystal layer LC). The height of the slot electrode 55 refers to the distance (the distance in the normal direction of the second dielectric substrate 51) from the surface of the second dielectric substrate 51 opposite to the liquid crystal layer LC (the surface further from the liquid crystal layer LC) to the top surface of the slot electrode 55 (the surface closer to the liquid crystal layer LC).

In the following, a structure of the scanning antenna according to the embodiments of the present disclosure will be described. Note that the embodiments of the present disclosure are not limited to those illustrated.

First Embodiment

Figure 4B:
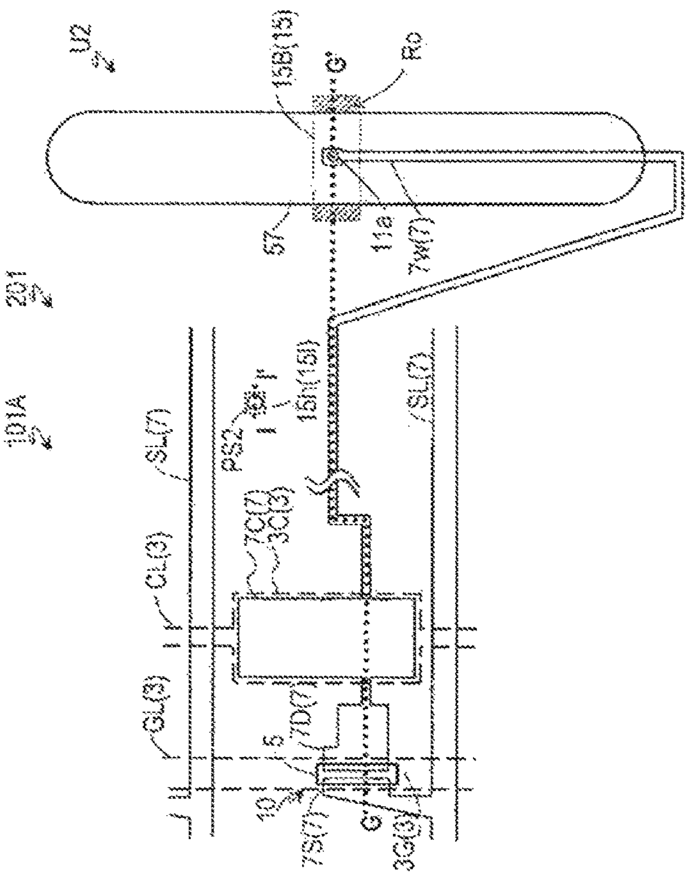
FIGS. 4A and 4B are schematic plan views illustrating a transmission and/or reception region R1 of a scanning antenna 1000A according to a first embodiment of the present disclosure.
Figure 4A:
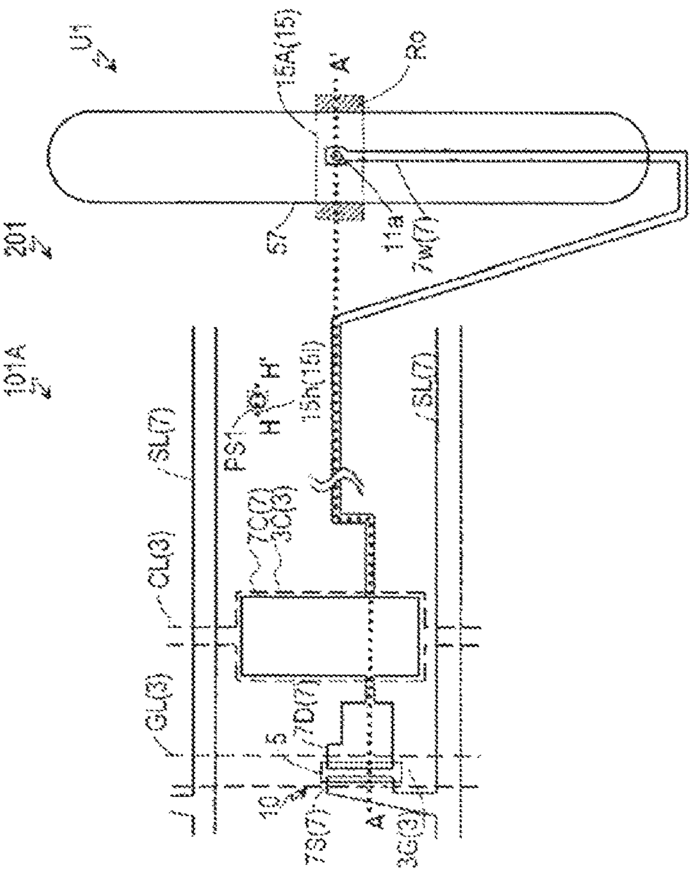
Figures 5A, 5B, 5C, 5D:
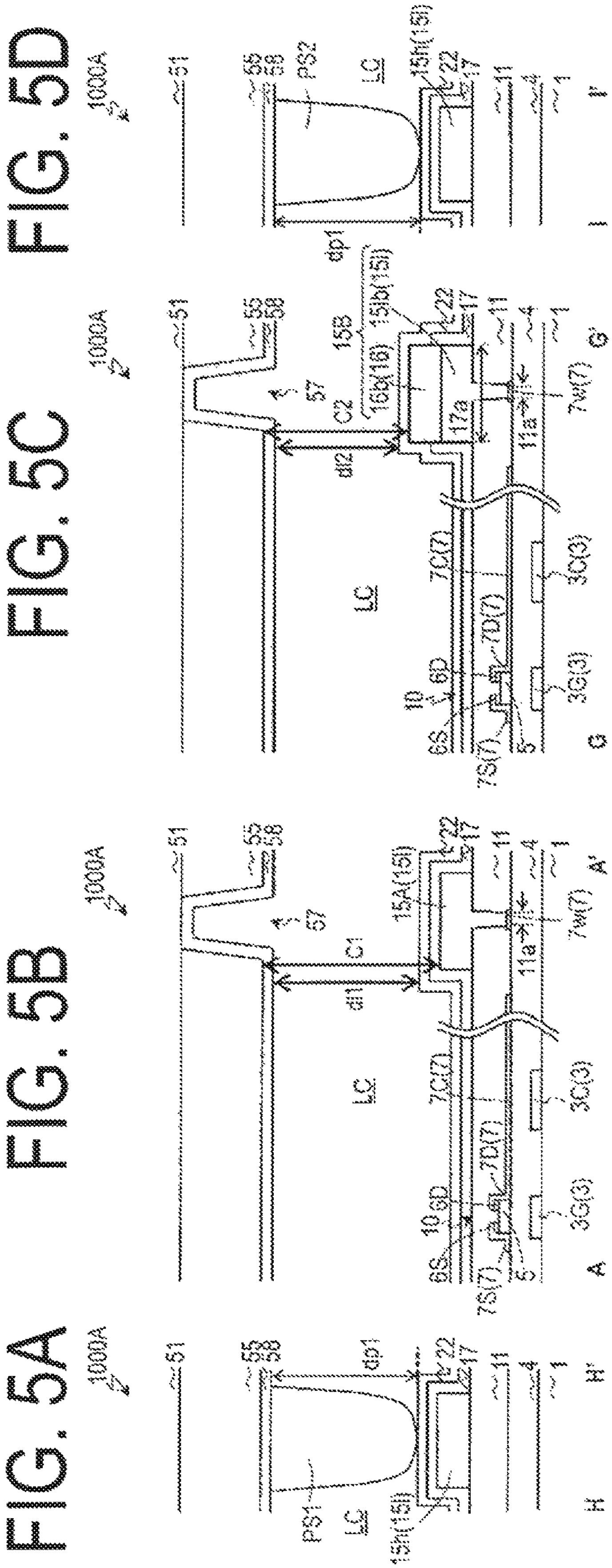
FIGS. 5A to 5D are schematic cross-sectional views illustrating the transmission and/or reception region R1 of the scanning antenna 1000A.

The structure of the transmission and/or reception region R1 of the scanning antenna 1000A according to the present embodiment will be described with reference to FIGS. 4A and 4B and FIGS. 5A to 5D. Common reference numerals may be assigned to the configuration common to the scanning antenna 1000, and descriptions thereof may be omitted. FIGS. 4A and 4B are schematic plan views of the transmission and/or reception region R1 of the scanning antenna 1000A, and FIGS. 5A to 5D are schematic cross-sectional views of the transmission and/or reception region R1 of the scanning antenna 1000A. FIG. 4A is a schematic plan view of the first antenna unit U1 of the transmission and/or reception region R1 of the scanning antenna 1000A, and FIG. 4B is a schematic plan view of the second antenna unit U2 of the transmission and/or reception region R1 of the scanning antenna 1000A. FIGS. 5A and 5B are schematic cross-sectional views of the first antenna unit U1 of the transmission and/or reception region R1 of the scanning antenna 1000A, and FIGS. 5C and 5D are schematic cross-sectional views of the second antenna unit U2 of the transmission and/or reception region R1 of the scanning antenna 1000A. FIGS. 5A to 5D illustrate cross-sections along the line H-H' and the line A-A' in FIG. 4A and the cross-sections along line G-G' and line I-I' in FIG. 4B, respectively. In the cross-sectional view of FIGS. 5A to 5D, an illustration of the reflective conductive plate and the dielectric layer (dielectric layer provided between the reflective conductive plate and the dielectric substrate 51) is omitted. In the following cross-sectional views of the scanning antenna, an illustration of the reflective conductive plate and the dielectric layer (dielectric layer provided between the reflective conductive plate and the dielectric substrate 51) may be omitted.

As illustrated in FIGS. 4A and 4B and FIGS. 5A to 5D, a plurality of antenna units of the scanning antenna 1000A include a plurality of first antenna units U1 and a plurality of second antenna units U2. The first antenna units U1 and the second antenna units U2 may be collectively referred to as antenna units U. Each of the plurality of antenna units U included in the scanning antenna 1000A includes a TFT10 supported by the dielectric substrate 1, a patch electrode 15 electrically connected to the drain electrode 7D of the TFT10, and a slot 57 formed in the slot electrode 55 corresponding to the patch electrode 15. Each of the plurality of antenna units U has a first region Ro that overlaps the patch electrode 15 and the slot electrode 55 when viewed from the normal direction of the dielectric substrate 1. The distance C2 in the normal direction of the dielectric substrate 1 between the patch electrode 15 and the slot electrode 55 of the plurality of second antenna units U2 is smaller than the distance C1 in the normal direction of the dielectric substrate 1 between the patch electrode 15 and the slot electrode 55 of the plurality of first antenna units U1. That is, the distance (distance in the normal direction of the dielectric substrate 1) C2 between a surface of the patch electrode 15 closer to the liquid crystal layer LC and a surface of the slot electrode 55 closer to the liquid crystal layer LC in the first region Ro of the plurality of second antenna units U2 is smaller than the distance (distance in the normal direction of the dielectric substrate 1) C1 between a surface of the patch electrode 15 closer to the liquid crystal layer LC and a surface of the slot electrode 55 closer to the liquid crystal layer LC in the first region Ro of the plurality of first antenna units U1.

In the scanning antenna 1000A, the thickness dl2 of the liquid crystal layer LC between the patch electrode 15 and the slot electrode 55 of the plurality of second antenna units U2 is smaller than the thickness dl1 of the liquid crystal layer LC between the patch electrode 15 and the slot electrode 55 of the plurality of first antenna units U1. That is, the thickness dl2 of the liquid crystal layer LC in the first region Ro of the plurality of second antenna units U2 is smaller than the thickness dl1 of the liquid crystal layer LC of the first region Ro of the plurality of first antenna units U1. In the scanning antenna 1000A, the first antenna units U1 include the patch electrode 15A, and the second antenna units U2 include the patch electrode 15B. The thickness of the patch electrode 15B of the second antenna units U2 is greater than the thickness of the patch electrode 15A of the first antenna units U1. The patch electrodes 15A and 15B may be referred to collectively as the patch electrode 15. Here, the patch electrode 15B of the second antenna units U2 includes the first patch metal layer 151 (also referred to as the patch metal layer 151) and the second patch metal layer 16 formed on the first patch metal layer 151. The patch electrode 15A of the first antenna units U1 includes the first patch metal layer 151 and does not include the second patch metal layer 16. That is, the patch electrode 15B includes a lower layer 151*b* included in the first patch metal layer 151 and an upper layer 16*b* formed on the lower layer 151*b* and included in the second patch metal layer 16.

The thickness of the patch electrode 15B of the plurality of second antenna unit regions U2 of the TFT substrate 101A is greater than the thickness of the patch electrode 15A of the plurality of first antenna unit regions U1. Each of the plurality of antenna unit regions of the TFT substrate 101A has a region (for example, a region corresponding to the first region Ro illustrated) that includes two mutually opposing sides of the patch electrode 15 when viewed from the normal direction of the dielectric substrate 1. Here, the two mutually opposing sides of the patch electrode 15 refer to two mutually opposing sides with the slot 57 therebetween in the scanning antenna 1000A, and refers to the short sides of the patch electrode 15 having a substantially rectangular shape (see FIGS. 4A and 4B).

Note that the present embodiment is not limited to the illustrated example. For example, the patch electrode of the first antenna units U1 and the patch electrode of the second antenna units U2 may be formed by patterning the same conductive film. In this case, the thickness of the patch electrode of the first antenna units U1 and the thickness of the patch electrode of the second antenna units U2 may be varied by changing the etching amount thereof, for example.

Here, for example, the ratio of the plurality of first antenna units U1 and the plurality of second antenna units U2 included in the plurality of antenna units U is 50%. Here, the distance C1 in the normal direction of the dielectric substrate 1 between the patch electrode 15 and the slot electrode 55 of the plurality of first antenna units U1 is 2.8 μm (design value), and the distance C2 in the normal direction of the dielectric substrate 1 between the patch electrode 15 and the slot electrode 55 of the plurality of second antenna units U2 is 2.6 μm (design value). The difference between the distance C1 and the distance C2 (C1−C2) is 0.2 μm (design value). Here, the difference between the distance C1 and the distance C2 (C1−C2) corresponds to the thickness of the second patch metal layer 16, for example. The thickness dl1 of the liquid crystal layer LC of the first region Ro of the plurality of first antenna units U1 is the distance C1 minus the sum of the thicknesses of the second insulating layer 17, the third insulating layer 22, and the fourth insulating layer 58. Note that, for example, depending on the environment temperature at which the scanning antenna is installed, the distance C1 and the distance C2 may vary from the design value. For example, the distance C1 may vary approximately from 2.7 μm to 3.2 μm, and the distance C2 may vary approximately from 2.2 μm to 2.7 μm. The difference between the distance C1 and the distance C2 (C1−C2) may vary approximately from 0.05 μm to 1.0 μm.

Note that, in the cross-sectional view, for simplicity, the inorganic insulating layer (for example, the gate insulating layer 4, the first insulating layer 11, the second insulating layer 17, the third insulating layer 22, and the fourth insulating layer 58) may be represented as a flattened layer, but in general, a layer formed by a thin film deposition method (for example, a CVD method, a sputtering method, or a vacuum vapor deposition method) has a surface reflecting the step of the base layer.

As illustrated in FIGS. 4A and 4B and FIGS. 5A to 5D, the scanning antenna 1000A includes a spacer that controls the thickness of the liquid crystal layer LC.

As illustrated in FIGS. 4A and 4B and FIGS. 5A to 5D, the scanning antenna 1000A includes a columnar spacer PS that is formed in each of the plurality of antenna units U and that controls the thickness of the liquid crystal layer LC. The columnar spacer PS1 disposed on the first antenna units U1 and the columnar spacer PS2 disposed on the second antenna units U2 may be referred to collectively as the columnar spacer PS. The columnar spacer is a spacer formed by a photolithography process by using a photosensitive resin such as an ultraviolet curable resin, and may also be referred to as a "photo spacer". Note that a spacer (also referred to as a "granular spacer") mixed with a sealing member may be used in combination as a spacer. Illustrations of specific examples of the number and arrangement of spacers are omitted, but may be arbitrary. A plurality of the columnar spacers PS may be provided in each antenna unit U. The spacer may be provided in the non-transmission and/or reception region R2.

Here, the columnar spacer PS1 of the first antenna units U1 and the columnar spacer PS2 of the second antenna units U2 have the same height dp1. This has the advantage of being easy to form the columnar spacer PS. However, the heights of the columnar spacer PS1 of the first antenna units U1 and the columnar spacer PS2 of the second antenna units U2 may be different from each other. The height of the columnar spacer PS can be appropriately adjusted by the configuration of the conductive layer that constitutes the protruding portion 15*h* that overlaps with the columnar spacer PS, the thickness of the liquid crystal layer LC, and the like.

In the illustrated example, the TFT substrate 101A includes a protruding portion 15*h* that overlaps with the columnar spacer PS in each of the plurality of antenna unit regions U when viewed from the normal direction of the dielectric substrate 1 or 51. Here, the protruding portion 15*h* is included in the patch metal layer 151. The protruding portion may include, for example, a conductive layer of at least one of the gate metal layer 3, the source metal layer 7, and the patch metal layer 151. The protruding portion typically includes a metal layer.

The TFT substrate 101A has the protruding portion 15*h*, and thus the following effects can be obtained. In a case where the thickness of the liquid crystal layer LC is large, it is difficult to form a high columnar spacer (for example, a columnar spacer having a height of greater than 5 μm) by using a photosensitive resin. In such a case, in a case where the columnar spacer PS is formed on the protruding portion 15*h* of the TFT substrate 101A, the height of the columnar spacer PS can be reduced. Note that the height of the columnar spacer PS corresponds to the thickness dp1 of the liquid crystal layer LC defined by the columnar spacer PS.

In the scanning antenna 1000A, the slot substrate 201 includes a columnar spacer PS. However, the embodiment of the present disclosure is not limited thereto, and the TFT substrate may include a columnar spacer PS. Forming the columnar spacer PS on the TFT substrate has the advantage that a problem with misalignment with the protruding portion 15*h* of the TFT substrate does not occur.

The ratio of the plurality of first antenna units U1 and the plurality of second antenna units U2 included in the plurality of antenna units U are equal to each other (for example, 50% together). Alternatively, the ratios may be different from each other. The ratio of the plurality of first antenna units U1 included in the plurality of antenna units U is, for example, from 20% to 80%, and the ratio of the plurality of second antenna units U2 included in the plurality of antenna units U is, for example, from 20% to 80%.

The difference (C1−C2) between the distance C1 in the normal direction of the dielectric substrate 1 between the patch electrode 15 and the slot electrode 55 of the plurality of first antenna units U1 and the distance C2 in the normal direction of the dielectric substrate 1 between the patch electrode 15 and the slot electrode 55 of the plurality of second antenna units U2 is, for example, from 0.05 μm to 1.0 μm. The difference (dl1−dl2) between the thickness dl1 of the liquid crystal layer LC of the first region Ro of the plurality of first antenna units U1 and the thickness dl2 of the liquid crystal layer LC of the first region Ro of the plurality of second antenna units U2 is, for example, from 0.05 μm to 1.5 μm.

The ratio of the plurality of first antenna units U1 and the plurality of second antenna units U2 included in the plurality of antenna units U, the difference (C1−C2) in the distance between the patch electrode 15 and the slot electrode 55, the difference (dl1−dl2) in the thickness of the liquid crystal layer LC between the patch electrode 15 and the slot electrode 55, and the like may be adjusted so as to obtain the frequency-gain characteristics that have a wide width (frequency bandwidth, for example, a width with the gain of $1/\sqrt{2}$) as the entire scanning antenna, by the overlapping the two different frequency-gain characteristics, as described with reference to FIGS. 3A and 3B.

A method of mutually differing distances in the normal direction of the dielectric substrate 1 between the patch electrode 15 and the slot electrode 55 of the first antenna units U1 and the second antenna units U2 may be arbitrary, and are not limited to those illustrated as embodiments of the present disclosure. For example, it is conceivable to differ the following amounts between the first antenna units U1 and the second antenna units U2.

Of course, some of the followings may be combined.

Thickness of the patch electrode 15 in the first region Ro

Thickness of the slot electrode 55 in the first region Ro

Sum of the thicknesses of the first region Ro and at least one insulating layer between the first dielectric substrate 1 and the patch electrode 15

Presence/absence of the first region Ro and the insulating layer between the first dielectric substrate 1 and the patch electrode 15

Sum of the thicknesses of the first region Ro and at least one insulating layer between the second dielectric substrate 51 and the slot electrode 55

Presence/absence of the first region Ro and the insulating layer between the second dielectric substrate 51 and the slot electrode 55

Sum of the thicknesses of the first region Ro and at least one conductive layer between the first dielectric substrate 1 and the patch electrode 15

Presence/absence of the first region Ro and the conductive layer between the first dielectric substrate 1 and the patch electrode 15

Thickness of the second dielectric substrate 51 in the first region Ro (differing by forming a recessed portion or a protruding portion on the surface of the second dielectric substrate 51 (the surface closer to the liquid crystal layer LC)

Thickness of the first dielectric substrate 1 in the first region Ro (differing by forming a recessed portion or a protruding portion on the surface of the first dielectric substrate 1 (the surface closer to the liquid crystal layer LC) Structure of TFT Substrate 101A (Antenna Unit Region U)

The structure of the antenna unit region U of the TFT substrate 101A will be described in more detail.

As illustrated in FIGS. 4A and 4B and FIGS. 5A to 5D, the TFT substrate 101A includes a gate metal layer 3 including a gate electrode 3G of the TFT10, supported by the dielectric substrate 1, a source metal layer 7 including a source electrode 7S of the TFT10, supported by the dielectric substrate 1, a semiconductor layer 5 of the TFT10, supported by the dielectric substrate 1, and a gate insulating layer 4 formed between the gate metal layer 3 and the semiconductor layer 5. Here, the TFT substrate 101A includes a gate metal layer 3 supported by the dielectric substrate 1, a semiconductor layer 5 formed on the gate metal layer 3, a gate insulating layer 4 formed between the gate metal layer 3 and the semiconductor layer 5, a source metal layer 7 formed on the gate insulating layer 4, a first insulating layer 11 formed on the source metal layer 7, a first patch metal layer 151 formed on the first insulating layer 11, a second insulating layer 17 formed on the first patch metal layer 151, and a second patch metal layer 16 formed on the first patch metal layer 151. The TFT substrate 101A further includes a third insulating layer 22 formed on the second insulating layer (here, on the second patch metal layer 16). The TFT substrate 101A further includes a lower conductive layer 13 formed between the first insulating layer 11 and the patch metal layer 151, as described below in the structure of the non-transmission and/or reception region R2 of the TFT substrate 101A. The TFT substrate 101A further includes an upper conductive layer 19 formed on the second insulating layer 17 (here, on the third insulating layer 22).

The TFT 10 of each antenna unit region U includes the gate electrode 3G, the island-shaped semiconductor layer 5, the contact portions 6S and 6D, the gate insulating layer 4 disposed between the gate electrode 3G and the semiconductor layer 5, the source electrode 7S, and the drain electrode 7D. In this example, the TFT 10 is a channel etch-type TFT having a bottom gate structure.

The gate electrode 3G is electrically connected to the gate bus line GL, and a scanning signal voltage is supplied via the gate bus line GL. The source electrode 7S is electrically connected to the source bus line SL, and a data signal voltage is supplied via the source bus line SL. In this example, the gate electrode 3G and the gate bus line GL are formed of the same conductive film (gate conductive film). Here, the source electrode 7S, the drain electrode 7D, and the source bus line SL are formed from the same conductive film (source conductive film). The gate conductive film and the source conductive film are, for example, metal films.

The semiconductor layer 5 is disposed overlapping the gate electrode 3G with the gate insulating layer 4 interposed therebetween. In the illustrated example, a source contact portion 6S and a drain contact portion 6D are formed on the semiconductor layer 5. The source contact portion 6S and the drain contact portion 6D are disposed on both sides of a region where a channel is formed in the semiconductor layer 5 (channel region). The semiconductor layer 5 may be an intrinsic amorphous silicon (i-a-Si) layer, and the source contact portion 6S and the drain contact portion 6D may be $n^+$ type amorphous silicon ($n^+$-a-Si) layers.

The source electrode 7S is provided in contact with the source contact portion 6S and is connected to the semiconductor layer 5 with the source contact portion 6S interposed therebetween. The drain electrode 7D is provided in contact with the drain contact portion 6D and is connected to the semiconductor layer 5 with the drain contact portion 6D interposed therebetween.

Here, each antenna unit region U includes an auxiliary capacitance electrically connected in parallel with the liquid crystal capacitance. In this example, the auxiliary capacitance is constituted by the auxiliary capacitance electrode 7C electrically connected to the drain electrode 7D, the gate insulating layer 4, and the auxiliary capacitance counter electrode 3C opposing the auxiliary capacitance electrode 7C with the gate insulating layer 4 interposed therebetween. The auxiliary capacitance counter electrode 3C is included in the gate metal layer 3, and the auxiliary capacitance electrode 7C is included in the source metal layer 7. The gate metal layer 3 further includes a CS bus line (auxiliary capacitance line) CL connected to the auxiliary capacitance counter electrode 3C. The CS bus line CL extends substantially in parallel with the gate bus line GL, for example. In this example, the auxiliary capacitance counter electrode 3C is integrally formed with the CS bus line CL. A width of the auxiliary capacitance counter electrode 3C may be larger than a width of the CS bus line CL. In this example, the auxiliary capacitance electrode 7C extends from the drain electrode 7D. A width of the auxiliary capacitance electrode 7C may be larger than a width of a portion except for the auxiliary capacitance electrode 7C in the portion extending from the drain electrode 7D. Note that an arrangement relationship between the auxiliary capacitance and the patch electrode 15 is not limited to the example illustrated in the drawing.

The gate metal layer 3 includes the gate electrode 3G of the TFT 10, the gate bus line GL, the auxiliary capacitance counter electrode 3C, and the CS bus line CL.

The source metal layer 7 includes the source electrode 7S and drain electrode 7D of the TFT 10, the source bus line SL, and the auxiliary capacitance electrode 7C. The source metal layer 7 further includes a wiring line 7*w* that electrically connects the drain electrode 7D and the patch electrode 15. In this example, the wiring line 7*w* extends from the auxiliary capacitance electrode 7C extending from the drain electrode 7D, and is integrally formed with the drain electrode 7D and the auxiliary capacitance electrode 7C. The wiring line 7*w* extends in the slot 57 in the long axis direction of the slot 57 and overlaps the patch electrode 15 within the slot 57. The portion of the wiring line 7*w* overlapping the patch electrode 15 is connected to the patch electrode 15 via the opening 11*a* formed in the first insulating layer 11. In other words, the patch electrode 15 is in contact with the wiring line 7*w* in the opening 11*a*. Note that the method for electrically connecting the drain electrode 7D and the patch electrode 15 is not limited to the illustrated example.

The first insulating layer 11 is formed to cover the TFT 10. The first insulating layer 11 includes an opening 11*a* that at least reaches the wiring line 7*w*.

The first patch metal layer 151 includes a patch electrode 15A and a lower layer 151*b* of the patch electrode 15B. The patch electrode 15 (patch electrode 15A and patch electrode 15B) is formed on the first insulating layer 11 and within the opening 11*a*, and is connected to the wiring line 7*w* within the opening 11*a*.

The first patch metal layer 151 includes a metal layer. The first patch metal layer 151 may be formed only from a metal layer. The first patch metal layer 151 has a layered structure including, for example, a low resistance metal layer and a high melting point metal containing layer below the low resistance metal layer. The layered structure may further include a high melting point metal containing layer on the low resistance metal layer. The "high melting point metal containing layer" is a layer including at least one element selected from the group consisting of titanium (Ti), tungsten (W), molybdenum (Mo), tantalum (Ta), and niobium (Nb). The "high melting point metal containing layer" may be in a layered structure. For example, the "high melting point metal containing layer" refers to a layer formed of any of Ti, W, Mo, Ta, Nb, an alloy containing these, and a nitride of these, and a solid solution of the metal or alloy and the nitride. The "low resistance metal layer" is a layer including at least one element selected from the group consisting of copper (Cu), aluminum (Al), silver (Ag), and gold (Au). The "low resistance metal layer" may be in a layered structure. The low resistance metal layer of the patch metal layer 151 may be referred to as a "main layer", and the high melting point metal containing layer below and above the low resistance metal layer may be referred to as the "lower layer" and the "upper layer", respectively.

The first patch metal layer 151 includes a Cu layer or an Al layer as a main layer, for example. That is, the patch electrode 15 includes a Cu layer or an Al layer as a main layer, for example. A performance of the scanning antenna correlates with an electric resistance of the patch electrode 15, and a thickness of the main layer is configured so as to obtain a desired resistance. In terms of the electric resistance, there is a possibility that the thickness of the patch electrode 15 can be made thinner in the Cu layer than in the Al layer. A thickness of the metal layer of the patch metal layer 151 (that is, a thickness of the metal layer of the patch electrode 15) is, for example, configured to be greater than thicknesses of the source electrode 7S and the drain electrode 7D. The thickness of the metal layer in the patch electrode 15 is configured to, for example, greater than or equal to 0.3 μm in a case where it is formed of an Al layer.

The second insulating layer 17 is formed on the first insulating layer 11 and on the first patch metal layer 151. The second insulating layer 17 is formed to cover the first insulating layer 11 and the patch electrode 15A of the first antenna units U1. The second insulating layer 17 has an opening 17*a* that at least reaches the patch electrode 15B of the second antenna units U2.

The second patch metal layer 16 is formed on the first patch metal layer 151 and on the second insulating layer 17. The second patch metal layer 16 includes an upper layer 16*b* of the patch electrode 15B.

The upper layer 16*b* of the patch electrode 15B is connected to the lower layer 151*b* of the patch electrode 15B of the second antenna units U2 within the opening 17*a* formed in the second insulating layer 17. The second patch metal layer 16 may be formed from a material similar to that of the first patch metal layer 151. Here, the second patch metal layer 16 is disposed on the second insulating layer 17, but the second patch metal layer 16 may be disposed between the first patch metal layer 151 and the second insulating layer 17. Either one of the second insulating layer 17 or the third insulating layer 22 may be omitted. However, as illustrated, in the process of etching the conductive film for forming the second patch metal layer 16, by providing an insulating layer (here, the second insulating layer 17) between the first patch metal layer 151 and the second patch metal layer 16, etching of the first patch metal layer 151 (etching shift) can be suppressed.

The third insulating layer 22 is formed on the second insulating layer 17 and on the second patch metal layer 16. The third insulating layer 22 is formed to cover the second patch metal layer 16 of the patch electrode 15B of the second antenna units U2.

Structure of Slot Substrate 201 (Antenna Unit Region U)

The structure of the slot substrate 201 included in the scanning antenna 1000A will be described with reference to FIGS. 4A and 4B and FIGS. 5A to 5D.

The slot substrate 201 includes the dielectric substrate 51 having a front surface and a rear surface, the slot electrode 55 formed on the front surface of the dielectric substrate 51, and a fourth insulating layer 58 covering the slot electrode 55. The reflective conductive plate 65 is disposed opposing the rear surface of the dielectric substrate 51 with the dielectric layer (air layer) 54 interposed therebetween. The slot electrode 55 and the reflective conductive plate 65 function as walls of the waveguide 301. The slot substrate 201 may further include an insulating layer formed between the surface of the dielectric substrate 51 and the slot electrode 55.

In the transmission and/or reception region R1, a plurality of slots 57 are formed in the slot electrode 55. The slot 57 is an opening that opens through the slot electrode 55. In this example, one slot 57 is disposed in each antenna unit region U.

The fourth insulating layer 58 is formed on the slot electrode 55 and within the slot 57. The fourth insulating layer 58 is not particularly limited to a specific film, and, for example, a silicon oxide ($SiO_x$) film, a silicon nitride ($SiN_x$) film, a silicon oxynitride ($SiO_xN_y$; x>y) film, a silicon nitride oxide ($SiN_xO_y$; x>y) film, or the like can be used as appropriate. By covering the slot electrode 55 with the fourth insulating layer 58, the slot electrode 55 and the liquid crystal layer LC are not in direct contact with each other, such that the reliability can be enhanced. In a case where the slot electrode 55 is formed of a Cu layer, Cu may elute into the liquid crystal layer LC in some cases. In a case where the slot electrode 55 is formed of an Al layer by using a thin film deposition technique, the Al layer may include a void. The fourth insulating layer 58 can prevent the liquid crystal material from entering the void of the Al layer. Note that in a case where the Al film is formed by bonding an aluminum foil on the dielectric substrate 51 with an adhesive and the slot electrode 55 is fabricated by patterning the Al film, the problem of voids can be avoided.

The slot electrode 55 includes a main layer such as a Cu layer or an Al layer. The slot electrode 55 may have a layered structure that includes the main layer 55M, as well as an upper layer 55U and/or a lower layer 55L disposed sandwiching the main layer 55M therebetween (see FIG. 9). A thickness of the main layer may be configured in consideration of the skin effect depending on the material, and may be, for example, greater than or equal to 2 μm and less than or equal to 30 μm. The thickness of the main layer is typically greater than the thickness of the upper layer and the lower layer.

In the illustrated example, the main layer 55M is a Cu layer, and the upper layer 55U and the lower layer 55L are Ti layers. Disposing the lower layer 55L between the main layer 55M and the dielectric substrate 51 (an insulating layer in a case where the insulating layer is formed on the surface of the dielectric substrate 51) makes it possible to improve adhesion between the slot electrode 55 and the dielectric substrate 51 (an insulating layer in a case where the insulating layer is formed on the surface of the dielectric substrate 51). By providing the upper layer 55U, corrosion of the main layer 55M (for example, the Cu layer) can be suppressed.

Since the reflective conductive plate 65 constitutes the wall of the waveguide 301, it is desirable that the reflective conductive plate 65 has a thickness that is three times or greater than the skin depth, and preferably five times or greater. For example, an aluminum plate, a copper plate, or the like having a thickness of several millimeters manufactured by a cutting out process can be used as the reflective conductive plate 65.

Note that the embodiments of the present disclosure are not limited to the illustrated examples. For example, the structure of TFT is not limited to the illustrated example. The arrangement relationship between the gate metal layer 3 and the source metal layer 7 may be reversed. The patch electrode may be included in the gate metal layer 3 or the source metal layer 7.

Structure of TFT Substrate 101A (Non-Transmission and/or Reception Region R2)

With reference to FIGS. 4A and 4B, FIGS. 5A to 5D, and FIGS. 6A and 6B, the structure of the non-transmission and/or reception region R2 of the TFT substrate 101A included in the scanning antenna 1000A will be described. However, the structure of the non-transmission and/or reception region R2 of the scanning antenna 1000A is not limited to the illustrated example. The scanning antenna according to the embodiments of the present disclosure basically can suppress the deterioration in the antenna performance as described above, regardless of the structure of the non-transmission and/or reception region R2.

Figure 6A:
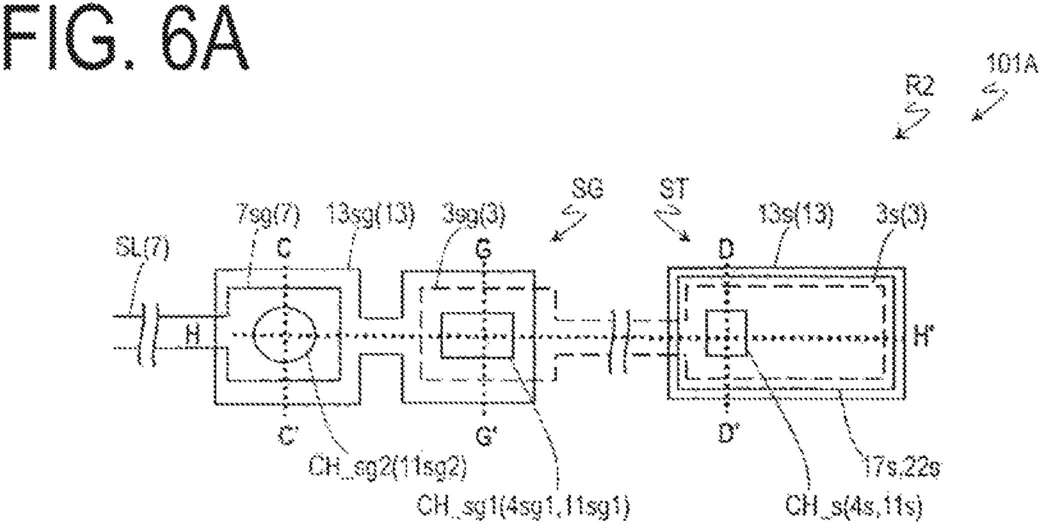
FIGS. 6A and 6B are schematic plan views illustrating a non-transmission and/or reception region R2 of a TFT substrate 101A included in the scanning antenna 1000A.
Figure 6B:
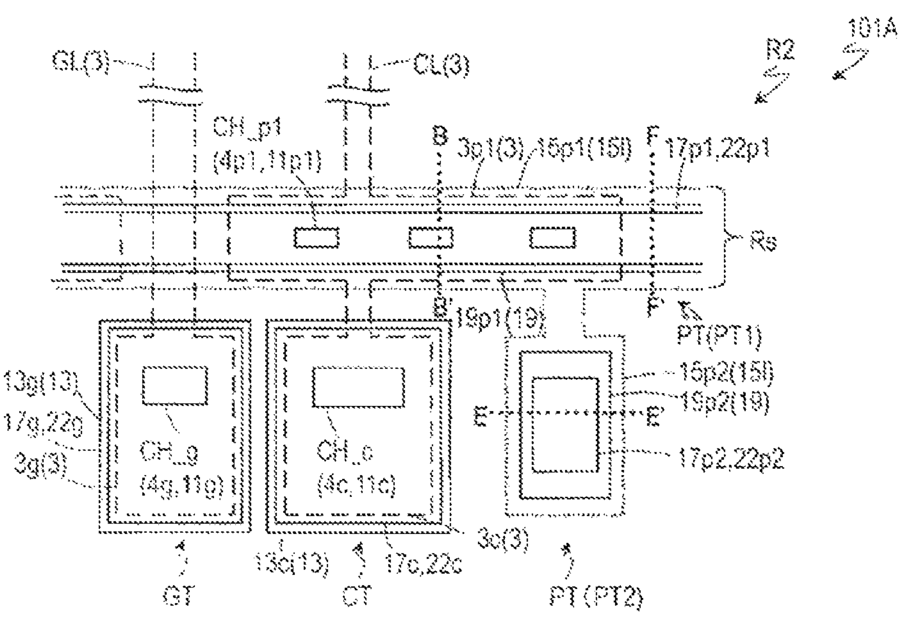

FIGS. 6A and 6B are schematic plan views of the non-transmission and/or reception region R2 of the TFT substrate 101A included in the scanning antenna 1000A, and FIGS. 7A to 7D and FIGS. 8A to 8C are schematic cross-sectional views of the non-transmission and/or reception region R2 of the TFT substrate 101A.

FIG. 6A illustrates the source-gate connection section SG and the source terminal section ST provided in the non-transmission and/or reception region R2, and FIG. 6B illustrates the transfer terminal section PT, the gate terminal section GT, and the CS terminal section CT provided in the non-transmission and/or reception region R2.

The transfer terminal section PT includes a first transfer terminal section PT1 located in the seal region Rs and a second transfer terminal section PT2 provided outside the seal region Rs (the side where the liquid crystal layer is not present). In this illustrated example, the first transfer terminal section PT1 extends along the seal region Rs to surround the transmission and/or reception region R1.

Figure 7A:
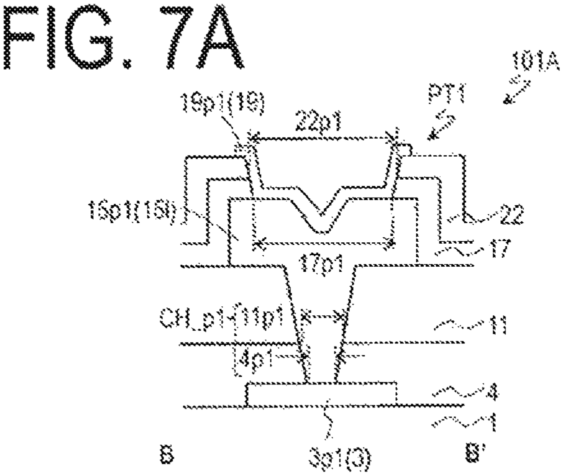
FIGS. 7A to 7D are schematic cross-sectional views illustrating the non-transmission and/or reception region R2 of the TFT substrate 101A.
Figure 7B:
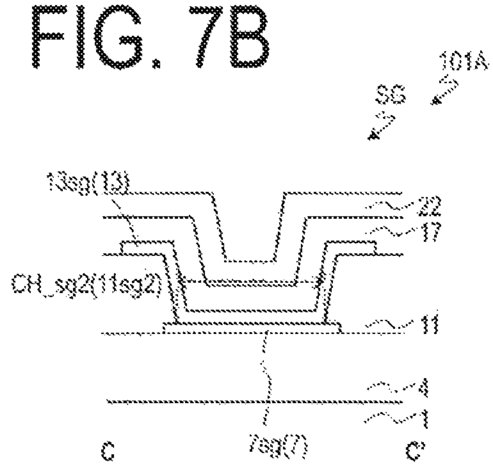
Figure 7C:
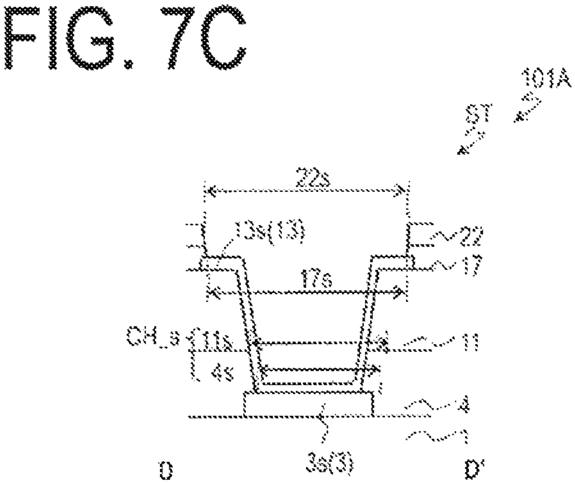
Figure 7D:
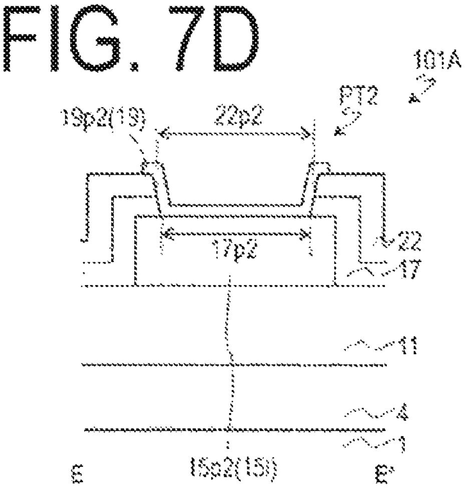
Figure 8A:
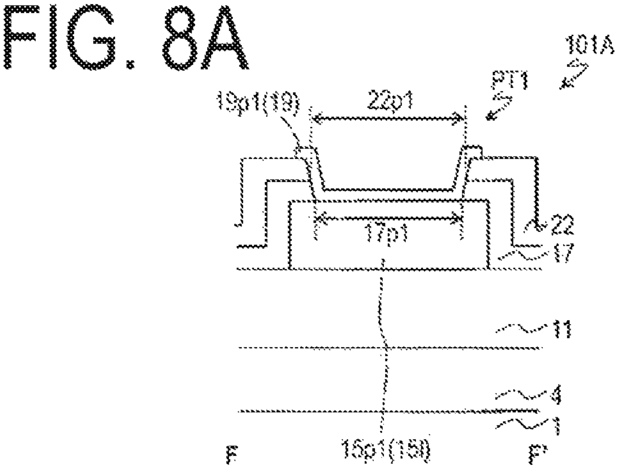
FIGS. 8A to 8C are schematic cross-sectional views illustrating the non-transmission and/or reception region R2 of the TFT substrate 101A.
Figure 8B:
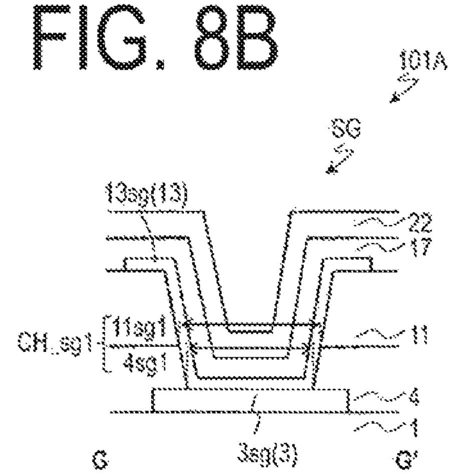
Figure 8C:
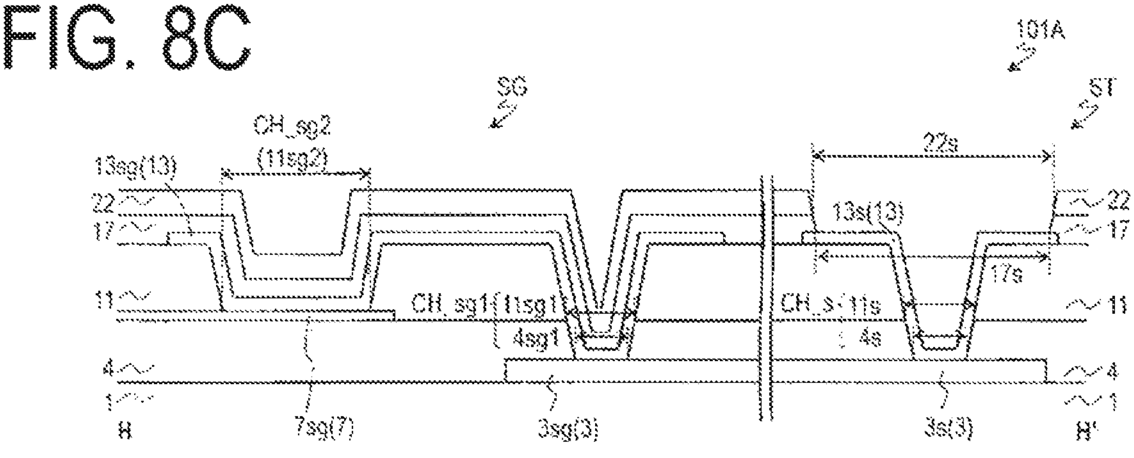

FIG. 7A illustrates a cross-section of the first transfer terminal section PT1 along the line B-B' in FIG. 6B, FIG. 7B illustrates a cross-section of the source-gate connection section SG along the line C-C' in FIG. 6A, FIG. 7C illustrates a cross-section of the source terminal section ST along the line D-D' in FIG. 6A, FIG. 7D illustrates a cross-section of the second transfer terminal section PT2 along the line E-E' in FIG. 6B, FIG. 8A illustrates a cross-section of the first transfer terminal section PT1 along the line F-F' in FIG. 6B, FIG. 8B illustrates a cross-section of the source-gate terminal connection section SG along the line G-G' in FIG. 6A, FIG. 8C illustrates a cross-section of the source-gate connection section SG and the source terminal section ST along the line H-H' in FIG. 6A.

In general, the gate terminal section GT and the source terminal section ST are provided for each gate bus line and for each source bus line, respectively. The source-gate connection section SG is generally provided corresponding to each source bus line. FIG. 6B illustrates the CS terminal section CT and the second transfer terminal section PT2 aligned with the gate terminal section GT, but the numbers and arrangements of CS terminal sections CT and second transfer terminal sections PT2 are configured independently from the gate terminal section GT. Typically, the numbers of CS terminal sections CT and second transfer terminal sections PT2 are less than the number of gate terminal sections GT and are adequately configured in consideration of uniformity of voltages of the CS electrode and the slot electrode. The second transfer terminal section PT2 can be omitted in a case where the first transfer terminal section PT1 is formed.

Each CS terminal section CT is provided, for example, corresponding to each CS bus line. Each CS terminal section CT may be provided corresponding to a plurality of CS bus lines. For example, in a case where the CS bus lines are supplied with the same voltage as the slot voltage, the TFT substrate 101A may have at least one CS terminal section CT. However, in order to reduce wiring resistance, the TFT substrate 101A preferably includes a plurality of CS terminal sections CT. Note that the slot voltage is, for example, a ground potential. In a case where the CS bus line is supplied with the same voltage as the slot voltage, either the CS terminal section CT or the second transfer terminal section PT2 may be omitted.

Source-Gate Connection Section SG

The TFT substrate 101A includes a source-gate connection section SG in the non-transmission and/or reception region R2, as illustrated in FIG. 6A. The source-gate connection section SG is provided for each source bus line SL, in general. The source-gate connection section SG electrically connects each source bus line SL to a connection wiring line (also referred to as a "source lower connection wiring line" in some cases) formed in the gate metal layer 3.

As illustrated in FIG. 6A, FIG. 7B, FIG. 8B, and FIG. 8C, the source-gate connection section SG includes the source lower connection wiring line 3*sg*, an opening 4*sg*1 formed in the gate insulating layer 4, a source bus line connection section 7*sg*, an opening 11*sg*1 and opening 11*sg*2 formed in the first insulating layer 11, and the source bus line upper connection section 13*sg*.

The source lower connection wiring line 3*sg* is included in the gate metal layer 3. The source lower connection wiring line 3*sg* is electrically separate from the gate bus line GL.

The opening 4*sg*1 formed in the gate insulating layer 4 at least reaches the source lower connection wiring line 3*sg*.

The source bus line connection section 7*sg* is included in the source metal layer 7 and is electrically connected to the source bus line SL. In this example, the source bus line connection section 7*sg* extends from the source bus line SL and is formed integrally with the source bus line SL. A width of the source bus line connection section 7*sg* may be larger than a width of the source bus line SL.

The opening 11*sg*1 formed in the first insulating layer 11 overlaps the opening 4*sg*1 formed in the gate insulating layer 4 when viewed from the normal direction of the dielectric substrate 1. The opening 4*sg*1 formed in the gate insulating layer 4 and the opening 11*sg*1 formed in the first insulating layer 11 constitute a contact hole CH_sg1.

The opening 11*sg*2 formed in the first insulating layer 11 at least reaches the source bus line connection section 7*sg*. The opening 11*sg*2 may be referred to as a contact hole CH_sg2.

The source bus line upper connection section 13*sg* (also referred to simply as the "upper connection section 13*sg*") is included in the lower conductive layer 13. The upper connection section 13*sg* is formed on the first insulating layer 11, within the contact hole CH_sg1, and within the contact hole CH_sg2, is connected to the source lower connection wiring line 3*sg* within the contact hole CH_sg1, and is connected to the source bus line connection section 7*sg* within the contact hole CH_sg2. For example, here, the upper connection section 13*sg* is in contact with the source lower connection wiring line 3*sg* within the opening 4*sg*1 formed in the gate insulating layer 4, and in contact with the source bus line connection section 7*sg* within the opening 11*sg*2 formed in the first insulating layer 11.

The portion of the source lower connection wiring line 3*sg* exposed by the opening 4*sg*1 is preferably covered by the upper connection section 13*sg*. The portion of the source bus line connection section 7*sg* exposed by the opening 11*sg*2 is preferably covered by the upper connection section 13*sg*.

The lower conductive layer 13 includes, for example, a transparent conductive layer (for example, ITO layer).

In this example, the source-gate connection section SG does not include the conductive portion included in the patch metal layer 151 and the conductive portion included in the upper conductive layer 19.

The TFT substrate 101A has excellent operation stability by including an upper connection section 13*sg* in the source-gate connection section SG. The source-gate connection section SG includes the upper connection section 13*sg*, thereby reducing damage to the gate metal layer 3 and/or the source metal layer 7 in the process of etching the patch conductive film for forming the patch metal layer 151. This effect will be described.

As described above, in the TFT substrate 101A, the source-gate connection section SG does not include the conductive portion included in the patch metal layer 151. In other words, in the patterning process of the patch conductive film, the patch conductive film in the source-gate connection section region is removed. In a case where the source-gate connection section SG does not include the upper connection section 13*sg*, the gate metal layer 3 (source lower connection wiring line 3*sg*) is exposed in the contact hole CH_sg1, the patch conductive film to be removed is deposited in the contact hole CH_sg1 and is formed in contact with the source lower connection wiring line 3*sg*. Similarly, in a case where the source-gate connection section SG does not include the upper connection section 13*sg*, the source metal layer 7 (source bus line connection section 7*sg*) is exposed in the contact hole CH_sg2, and thus the patch conductive film to be removed is deposited in the contact hole CH_sg2 and is formed in contact with the source bus line connection section 7*sg*. In such a case, the gate metal layer 3 and/or the source metal layer 7 can be damaged by etching. In the process of patterning the patch conductive film, an etchant containing phosphoric acid, nitric acid, and acetic acid is used, for example. In a case where the source lower connection wiring line 3*sg* and/or the source bus line connection section 7*sg* are damaged by etching, contact failure may occur at the source-gate connection section SG.

The TFT source-gate connection section SG of the TFT substrate 101A includes the upper connection section 13*sg* formed within the contact hole CH_sg1 and within the contact hole CH_sg2. Accordingly, damage to the source lower connection wiring line 3*sg* and/or the source bus line connection section 7*sg* caused by etching in the patterning process of the patch conductive film is reduced. Accordingly, the TFT substrate 101A has excellent operating stability.

From the perspective of effectively reducing etching damage to the gate metal layer 3 and/or the source metal layer 7, a portion exposed by the contact hole CH_sg1 in the source lower connection wiring line 3*sg* is preferably covered by the upper connection section 13*sg*, and the portion exposed by the opening 11*sg*2 in the source bus line connection section 7*sg* is preferably covered by the upper connection section 13*sg*.

In a TFT substrate used for a scanning antenna, a patch electrode may be formed by using a relatively thick conductive film (patch conductive film). In this case, the etching time and the overetching time of the patch conductive film can be longer than the etching process of the other layers. At this time, in a case where the gate metal layer 3 (source lower connection wiring line 3*sg*) and the source metal layer 7 (source bus line connection section 7*sg*) are exposed in the contact hole CH_sg1 and the contact hole CH_sg2, the etching damage to these metal layers increases. In this manner, in the TFT substrate including a relatively thick patch metal layer, the effect of reducing the etching damage to the gate metal layer 3 and/or the source metal layer 7 is particularly great due to the source-gate connection section SG having the upper connection section 13*sg*.

In the illustrated example, the contact hole CH_sg2 is formed at a position away from the contact hole CH_sg1. The present embodiment is not limited to this, and the contact hole CH_sg1 and the contact hole CH_sg2 may be contiguous to each other (that is, the contact hole CH_sg1 and the contact hole CH_sg2 may be formed as a single contact hole). The contact hole CH_sg1 and the contact hole CH_sg2 may be formed as a single contact hole in the same process. Specifically, a single contact hole that at least reaches the source lower connection wiring line 3*sg* and source bus line connection section 7*sg* may be formed on the gate insulating layer 4 and the first insulating layer 11 to form the upper connection section 13*sg* within this contact hole and on the first insulating layer 11. At this time, the upper connection section 13*sg* is preferably formed to cover a portion exposed by the contact hole within the source lower connection wiring line 3*sg* and the source bus line connection section 7*sg*.

As described later, the lower connection section of the source terminal section ST can be formed of the gate metal layer 3 by providing the source-gate connection section SG. The source terminal section ST including the lower connection section formed of the gate metal layer 3 is excellent in reliability.

Source Terminal Section ST

The TFT substrate 101A includes a source terminal section ST in the non-transmission and/or reception region R2, as illustrated in FIG. 6A. The source terminal section ST is generally provided corresponding to each source bus line SL. Here, a source terminal section ST and a source-gate connection section SG are provided corresponding to each source bus line SL.

The source terminal section ST includes a source terminal lower connection section 3*s* (also referred to simply as a "lower connection section 3*s*") connected to the source lower connection wiring line 3*sg* formed in the source-gate connection section SG, an opening 4*s* formed in the gate insulating layer 4, an opening 11*s* formed in the first insulating layer 11, a source terminal upper connection section 13*s* (also referred to simply as an "upper connection section 13*s*"), an opening 17*s* formed in the second insulating layer 17, and an opening 22*s* formed in the third insulating layer 22, as illustrated in FIG. 6A, FIG. 7C, and FIG. 8C.

The lower connection section 3*s* is included in the gate metal layer 3. The lower connection section 3*s* is electrically connected to the source lower connection wiring line 3*sg* formed in the source-gate connection section SG. In this example, the lower connection section 3*s* extends from the source lower connection wiring line 3*sg* and is formed integrally with the source lower connection wiring line 3*sg*.

The opening 4*s* formed in the gate insulating layer 4 at least reaches the lower connection section 3*s*.

The opening 11*s* formed in the first insulating layer 11 overlaps the opening 4*s* formed in the gate insulating layer 4 when viewed from the normal direction of the dielectric substrate 1. The opening 4*s* formed in the gate insulating layer 4 and the opening 11*s* formed in the first insulating layer 11 constitute a contact hole CH_s.

The upper connection section 13*s* is included in the lower conductive layer 13. The upper connection section 13*s* is formed on the first insulating layer 11 and within the contact hole CH_s, and is connected to the lower connection section 3*s* within the contact hole CH_s. Here, the upper connection section 13*s* is in contact with the lower connection section 3*s* within the opening 4*s* formed in the gate insulating layer 4.

The opening 17*s* formed in the second insulating layer 17 at least reaches the upper connection section 13*s*.

The opening 22*s* formed in the third insulating layer 22 overlaps the opening 17*s* formed in the second insulating layer 17 when viewed from the normal direction of the dielectric substrate 1.

When viewed from the normal direction of the dielectric substrate 1, the entire upper connection section 13*s* may overlap the lower connection section 3*s*.

In this example, the source terminal section ST does not include a conductive portion included in the source metal layer 7, a conductive portion included in the patch metal layer 151, and a conductive portion included in the upper conductive layer 19.

The source terminal section ST which includes the lower connection section 3*s* included in the gate metal layer 3 has excellent reliability.

In the terminal section, particularly, the terminal section provided outside the seal region Rs (opposite to the liquid crystal layer), corrosion may occur due to atmospheric moisture (which may contain impurities). The atmospheric moisture intrudes from the contact hole at least reaching the lower connection section and at least reaches the lower connection section so that corrosion may occur in the lower connection section. From the viewpoint of suppressing the corrosion occurring, the contact hole that at least reaches the lower connection section is preferably deep. In other words, the thickness of the insulating layer where the opening constituting the contact hole is formed is preferably large.

In the process of fabricating an TFT substrate having a glass substrate as a dielectric substrate, scratches and breaks may occur in the lower connection section of the terminal section by chips or cullets of the glass substrate. For example, a plurality of TFT substrates are fabricated from one mother substrate. Cullets occur, for example, in a case of cutting the mother substrate, forming a scribe line in the mother substrate, and the like. From the viewpoint of preventing scratches and breaks of the lower connection section of the terminal section, the contact hole that at least reaches the lower connection section is preferably deep. In other words, the thickness of the insulating layer where the opening constituting the contact hole is formed is preferably large.

In the source terminal section ST of the TFT substrate 101A, since the lower connection section 3*s* is included in the gate metal layer 3, the contact hole CH_s that at least reaches the lower connection section 3*s* includes the opening 4*s* formed in the gate insulating layer 4 and the opening 11*s* formed in the first insulating layer 11. A depth of the contact hole CH_s is a sum of a thickness of the gate insulating layer 4 and a thickness of the first insulating layer 11. In contrast, in a case where the lower connection section is included in the source metal layer 7, for example, the contact hole that at least reaches the lower connection section includes only an opening formed in the first insulating layer 11, and a depth of the opening is the thickness of the first insulating layer 11 and is smaller than the depth of the contact hole CH_s. Here, the depth of the contact hole and the thickness of the insulating layer are respectively a depth and a thickness in the normal direction of the dielectric substrate 1. The same holds for other contact holes and insulating layers unless otherwise specifically described. In this way, the source terminal section ST of the TFT substrate 101A includes the lower connection section 3*s* included in the gate metal layer 3, and therefore, has excellent reliability as compared with the case that the lower connection section is included in the source metal layer 7, for example.

The opening 4*s* formed in the gate insulating layer 4 is formed to expose only a part of the lower connection section 3*s*. The opening 4*s* formed in the gate insulating layer 4 is inside the lower connection section 3*s* when viewed from the normal direction of the dielectric substrate 1. Therefore, the entire region within the opening 4*s* has a layered structure including the lower connection section 3*s* and the upper connection section 13*s* on the dielectric substrate 1. In the source terminal section ST, the region other than the lower connection section 3*s* has a layered structure including the gate insulating layer 4 and the first insulating layer 11. With this configuration, the source terminal section ST of the TFT substrate 101A has excellent reliability. From the viewpoint of obtaining excellent reliability, the sum of the thickness of the gate insulating layer 4 and the thickness of the first insulating layer 11 are preferably large.

The portion of the lower connection section 3*s*, exposed by the opening 4*s* is covered by the upper connection section 13*s*.

In a case where a thickness of the upper connection section of the terminal section is large (that is, the thickness of the upper conductive layer 19 is large), corrosion of the lower connection section can be suppressed. In order to effectively suppress the corrosion of the lower connection section, as described above, the upper conductive layer 19 may have the layered structure including the first upper conductive layer including the transparent conductive layer (for example, ITO layer), and the second upper conductive layer formed under the first upper conductive layer and formed of one layer or two or more layers selected from the group consisting of Ti layer, MoNbNi layer, MoNb layer, MoW layer, W layer and Ta layer. In order to effectively suppress the corrosion of the lower connection section from occurring, the thickness of the second upper conductive layer may be over 100 nm, for example.

Gate Terminal Section GT

The TFT substrate 101A includes a gate terminal section GT in the non-transmission and/or reception region R2, as illustrated in FIG. 6B. The gate terminal section GT may have the same configuration as the source terminal section ST, as illustrated in FIG. 6B. The gate terminal section GT is generally provided for each gate bus line GL.

In this example, the gate terminal section GT includes a gate terminal lower connection section 3*g* (also referred to simply as a "lower connection section 3*g*"), an opening 4*g* formed in the gate insulating layer 4, an opening 11*g* formed in the first insulating layer 11, a gate terminal upper connection section 13*g* (also referred to simply as an "upper connection section 13*g*"), an opening 17*g* formed in the second insulating layer 17, and an opening 22*g* formed in the third insulating layer 22, as illustrated in FIG. 6B.

The lower connection section 3*g* is included in the gate metal layer 3, and is electrically connected to the gate bus line GL. In this example, the lower connection section 3*g* extends from the gate bus line GL and is formed integrally with the gate bus line GL.

The opening 4*g* formed in the gate insulating layer 4 at least reaches the lower connection section 3*g*.

The opening 11*g* formed in the first insulating layer 11 overlaps the opening 4*g* formed in the gate insulating layer 4 when viewed from the normal direction of the dielectric substrate 1. The opening 4*g* formed in the gate insulating layer 4 and the opening 11*g* formed in the first insulating layer 11 constitute a contact hole CH_g.

The upper connection section 13*g* is included in the lower conductive layer 13. The upper connection section 13*g* is formed on the first insulating layer 11 and within the contact hole CH_g, and is connected to the lower connection section 3*g* within the contact hole CH_g. Here, the upper connection section 13*g* is in contact with the lower connection section 3*g* within the opening 4*g* formed in the gate insulating layer 4.

The opening 17*g* formed in the second insulating layer 17 at least reaches the upper connection section 13*g*.

The opening 22*g* formed in the third insulating layer 22 overlaps the opening 17*g* formed in the second insulating layer 17 when viewed from the normal direction of the dielectric substrate 1.

When viewed from the normal direction of the dielectric substrate 1, the entire upper connection section 13*g* may overlap the lower connection section 3*g*.

In this example, the gate terminal section GT does not include a conductive portion included in the source metal layer 7, a conductive portion included in the patch metal layer 151, and a conductive portion included in the upper conductive layer 19.

The gate terminal section GT which includes the lower connection section 3*g* included in the gate metal layer 3 has excellent reliability similar to the source terminal section ST.

CS Terminal Section CT

The TFT substrate 101A includes a CS terminal section CT in the non-transmission and/or reception region R2, as illustrated in FIG. 6B. The CS terminal section CT has the same configuration as the source terminal section ST and the gate terminal section GT, as illustrated in FIG. 6B. The CS terminal section CT may be provided, for example, corresponding to each CS bus line CL.

The CS terminal section CT includes a CS terminal lower connection section 3*c* (also referred to simply as a "lower connection section 3*c*"), an opening 4*c* formed in the gate insulating layer 4, an opening 11*c* formed in the first insulating layer 11, a CS terminal upper connection section 13*c* (also referred to simply as an "upper connection section 13*c*"), an opening 17*c* formed in the second insulating layer 17, and an opening 22*c* formed in the third insulating layer 22, as illustrated in FIG. 6B.

The lower connection section 3*c* is included in the gate metal layer 3. The lower connection section 3*c* is electrically connected to the CS bus line CL. In this example, the lower connection section 3*c* extends from the CS bus line CL and is formed integrally with the CS bus line CL.

The opening 4*c* formed in the gate insulating layer 4 at least reaches the lower connection section 3*c*.

The opening 11*c* formed in the first insulating layer 11 overlaps the opening 4*c* formed in the gate insulating layer 4 when viewed from the normal direction of the dielectric substrate 1. The opening 4*c* formed in the gate insulating layer 4 and the opening 11*c* formed in the first insulating layer 11 constitute a contact hole CH_c.

The upper connection section 13*c* is included in the lower conductive layer 13. The upper connection section 13*c* is formed on the first insulating layer 11 and within the contact hole CH_c, and is connected to the lower connection section 3*c* within the contact hole CH_c. Here, the upper connection section 13*c* is in contact with the lower connection section 3*c* within the opening 4*c* formed in the gate insulating layer 4.

The opening 17*c* formed in the second insulating layer 17 at least reaches the upper connection section 13*c*.

The opening 22*c* formed in the third insulating layer 22 overlaps the opening 17*c* formed in the second insulating layer 17 when viewed from the normal direction of the dielectric substrate 1.

When viewed from the normal direction of the dielectric substrate 1, the entire upper connection section 13*c* may overlap the lower connection section 3*c*.

In this example, the CS terminal section CT does not include a conductive portion included in the source metal layer 7, a conductive portion included in the patch metal layer 151, and a conductive portion included in the upper conductive layer 19.

The CS terminal section CT which includes the lower connection section 3*c* included in the gate metal layer 3 has excellent reliability similar to the source terminal section ST.

Transfer Terminal Section PT

The TFT substrate 101A includes a first transfer terminal section PT1 in the non-transmission and/or reception region R2, as illustrated in FIG. 6B. The first transfer terminal section PT1 is provided in the seal region Rs (that is, the first transfer terminal section PT1 is provided in a sealing portion that surrounds the liquid crystal layer).

The first transfer terminal section PT1 includes the first transfer terminal lower connection section 3*p*1 (also referred to simply as the "lower connection section 3*p*1"), the opening 4*p*1 formed in the gate insulating layer 4, an opening 11*p*1 formed in the first insulating layer 11, the first transfer terminal conductive portion 15*p*1 (also referred to simply as the "conductive portion 15*p*1"), the opening 17*p*1 formed in the second insulating layer 17, an opening 22*p*1 formed in the third insulating layer 22, the first transfer terminal upper connection section 19*p*1 (also referred to simply as the "upper connection section 19*p*1") as illustrated in FIG. 6B and FIG. 7A.

The lower connection section 3*p*1 is included in the gate metal layer 3. That is, the lower connection section 3*p*1 is formed of the same conductive film as that of the gate bus line GL. The lower connection section 3*p*1 is electrically separate from the gate bus line GL. For example, in a case where the CS bus line CL is supplied with the same voltage as the slot voltage, the lower connection section 3*p*1 is electrically connected to the CS bus line CL, for example. As illustrated, the lower connection section 3*p*1 may be extended from the CS bus line. However, the configuration is not limited to this example, and the lower connection section 3*p*1 may be electrically separate from the CS bus line.

The opening 4*p*1 formed in the gate insulating layer 4 at least reaches the lower connection section 3*p*1.

The opening 11*p*1 formed in the first insulating layer 11 overlaps the opening 4*p*1 formed in the gate insulating layer 4 when viewed from the normal direction of the dielectric substrate 1. The opening 4*p*1 formed in the gate insulating layer 4 and the opening 11*p*1 formed in the first insulating layer 11 constitute a contact hole CH_p1.

The conductive portion 15*p*1 is included in the patch metal layer 151. The conductive portion 15*p*1 is formed on the first insulating layer 11 and within the contact hole CH_p1, and is connected to the lower connection section 3*p*1 within the contact hole CH_p1. Here, the conductive portion 15*p*1 is in contact with the lower connection section 3*p*1 within the opening 4*p*1.

The opening 17*p*1 formed in the second insulating layer 17 reaches at least the conductive portion 15*p*1.

The opening 22*p*1 formed in the third insulating layer 22 overlaps the opening 17*p*1 formed in the second insulating layer 17 when viewed from the normal direction of the dielectric substrate 1.

The upper connection section 19*p*1 is included in the upper conductive layer 19. The upper connection section 19*p*1 is formed on the second insulating layer 17 and within the opening 17*p*1, and is connected to the conductive portion 15*p*1 within the opening 17*p*1. Here, the upper connection section 19*p*1 is in contact with the conductive portion 15*p*1 within the opening 17*p*1. The upper connection section 19*p*1 is connected to a transfer terminal upper connection section on the slot substrate side by a sealing member containing conductive particles, for example (see FIG. 9).

In this example, the first transfer terminal section PT1 does not include the conductive portion included in the source metal layer 7 and the conductive portion included in the lower conductive layer 13.

The upper conductive layer 19 includes, for example, a transparent conductive layer (for example, ITO layer). The upper conductive layer 19 may be formed of only a transparent conductive layer, for example. Alternatively, the upper conductive layer 19 may include a first upper conductive layer including a transparent conductive layer and a second upper conductive layer formed under the first upper conductive layer. The second upper conductive layer is formed of one layer or two or more layers selected from the group consisting of Ti layer, MoNbNi layer, MoNb layer, MoW layer, W layer and Ta layer, for example.

The first transfer terminal section PT1 includes a conductive portion 15*p*1 between the lower connection section 3*p*1 and the upper connection section 19*p*1. This has the advantage that the electric resistance between the lower connection section 3*p*1 and the upper connection section 19*p*1 is low in the first transfer terminal section PT1.

When viewed from the normal direction of the dielectric substrate 1, the entire upper connection section 19*p*1 may overlap the conductive portion 15*p*1.

In this example, the lower connection section 3*p*1 is disposed between two gate bus lines GL adjacent to each other. Two lower connection sections 3*p*1 disposed with the gate bus line GL being interposed therebetween may be electrically connected to each other via a conductive connection section (not illustrated). A conductive connection section that electrically connects the two lower connection sections 3*p*1 may be included, for example, in the source metal layer 7.

Here, the lower connection section 3*p*1 is connected to the upper connection section 19*p*1 via the conductive portion 15*p*1 by providing a plurality of contact holes CH_p1, but one or more contact holes CH_p1 may be provided to one lower connection section 3*p*1. One contact hole may be provided with to one lower connection section 3*p*1. The number and shape of the contact holes are not limited to the illustrated example.

Here, the upper connection section 19*p*1 is connected to the conductive portion 15*p*1 by one opening 17*p*1, but it is sufficient that one or more of openings 17*p*1 are provided to one upper connection section 19*p*1. A plurality of openings may be provided to one upper connection section 19*p*1. The number and shape of the openings are not limited to the illustrated example.

The second transfer terminal section PT2 is provided outside the seal region Rs (opposite to the transmission and/or reception region R1). The second transfer terminal section PT2 includes a second transfer terminal lower connection section 15*p*2 (also referred to simply as a "lower connection section 15*p*2"), an opening 17*p*2 formed in the second insulating layer 17, an opening 22*p*2 formed in the third insulating layer 22, and a second transfer terminal upper connection section 19*p*2 (also referred to simply as an "upper connection section 19*p*2"), as illustrated in FIG. 6B and FIG. 7D.

The second transfer terminal section PT2 has a similar cross-sectional structure to the portion of the first transfer terminal section PT1 that does not include the lower connection section 3*p*1 and the contact hole CH_p1 (see FIG. 8A).

The lower connection section 15*p*2 is included in the patch metal layer 151. Here, the lower connection section 15*p*2 is extended from the first transfer terminal conductive portion 15*p*1 and is integrally formed with the first transfer terminal conductive portion 15*p*1.

The opening (contact hole) 17*p*2 formed in the second insulating layer 17 at least reaches the lower connection section 15*p*2.

The upper connection section 19*p*2 is included in the upper conductive layer 19. The upper connection section 19*p*2 is formed on the second insulating layer 17 and within the opening 17*p*2, and is connected to the lower connection section 15*p*2 within the opening 17*p*2. Here, the upper connection section 19*p*2 is in contact with the lower connection section 15*p*2 within the opening 17*p*2.

In this example, the second transfer terminal section PT2 does not include the conductive portion included in the gate metal layer 3, the conductive portion included in the source metal layer 7, and the conductive portion included in the lower conductive layer 13.

In the second transfer terminal section PT2 also, the upper connection section 19*p*2 may be connected to a transfer terminal connection section on the slot substrate side by a sealing member containing conductive particles, for example.

Structure of Slot Substrate 201 (Non-Transmission and/or Reception Region R2)

Figure 9:
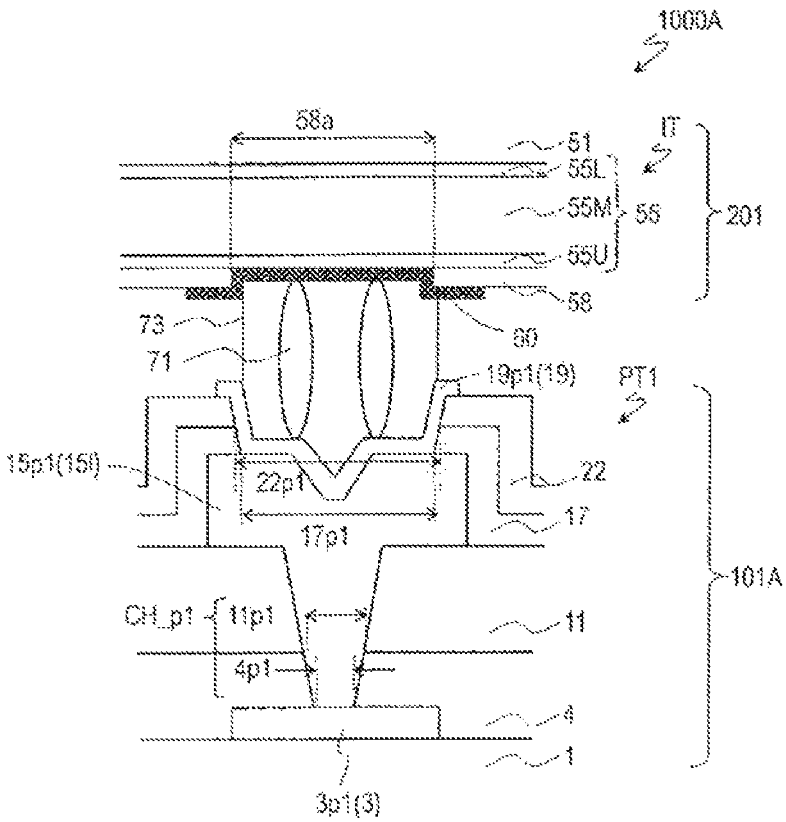
FIG. 9 is a schematic cross-sectional view for illustrating a transfer section connecting a first transfer terminal section PT1 of the TFT substrate 101A and a terminal section IT of the slot substrate 201 included in the scanning antenna 1000A.

FIG. 9 is a schematic cross-sectional view for illustrating the transfer section connecting the first transfer terminal section PT1 of the TFT substrate 101A and the terminal section IT of the slot substrate 201.

As illustrated in FIG. 9, the terminal section IT is provided in the non-transmission and/or reception region R2 of the slot substrate 201. The terminal section IT includes the slot electrode 55, the fourth insulating layer 58 covering the slot electrode 55, and an upper connection section 60. The fourth insulating layer 58 includes an opening 58*a* that at least reaches the slot electrode 55. The upper connection section 60 is in contact with the slot electrode 55 within the opening 58*a*. In the present embodiment, the terminal section IT is disposed in the seal region Rs, and is connected to the transfer terminal section on the TFT substrate (transfer section) by a sealing resin containing conductive particles.

As illustrated in FIG. 9, in the transfer section, the upper connection section 60 of the terminal section IT is electrically connected to the first transfer terminal upper connection section 19*p*1 of the first transfer terminal section PT1 in the TFT substrate 101A. In the present embodiment, the upper connection section 60 and the upper connection section 19*p*1 are connected with a resin (sealing resin) 73 (also referred to as a sealing portion 73) including conductive beads 71 therebetween.

Each of the upper connection sections 60 and 19*p*1 is a transparent conductive layer such as an ITO film or an IZO film, and there is a possibility that an oxide film is formed on the surface thereof. In a case where an oxide film is formed, the electrical connection between the transparent conductive layers cannot be ensured, and the contact resistance may increase. In contrast, in the present embodiment, since these transparent conductive layers are bonded with a resin including conductive beads (for example, Au beads) 71 therebetween, even in a case where a surface oxide film is formed, the conductive beads pierce (penetrate) the surface oxide film, allowing an increase in contact resistance to be suppressed. The conductive beads 71 may penetrate not only the surface oxide film but also penetrate the upper connection sections 60 and 19*p*1 which are the transparent conductive layers, and directly contact the conductive portion 15*p*1 and the slot electrode 55.

The transfer section may be disposed at both a center portion and a peripheral portion (that is, inside and outside of the donut-shaped transmission and/or reception region R1 when viewed from the normal direction of the scanning antenna 1000A) of the scanning antenna 1000A, or alternatively may be disposed at only one of them. The transfer section may be disposed in the seal region Rs in which the liquid crystals are sealed, or may be disposed outside the seal region Rs (opposite to the liquid crystal layer).

Manufacturing Method of TFT Substrate 101A

A description is given of a manufacturing method of the TFT substrate 101A with reference to FIG. 10A to FIG. 15E.

FIG. 10A to FIG. 15E are schematic cross-sectional views for illustrating a manufacturing method of the TFT substrate 101A. FIG. 10A to FIG. 12E illustrate cross-sections corresponding to FIG. 5B, FIG. 5C, and FIG. 5A (cross-section A-A', cross-section G-G', and cross-section H-H' of the TFT substrate 101A), and FIG. 13A to FIG. 15E illustrate cross-sections corresponding to FIGS. 7A to 7D (cross-section B-B', cross-section C-C', cross-section D-D', and cross-section E-E' of the TFT substrate 101A).

Figures 10A, 10B, 10C, 10D, 10E, 10F, 10G, 10H, 10I:
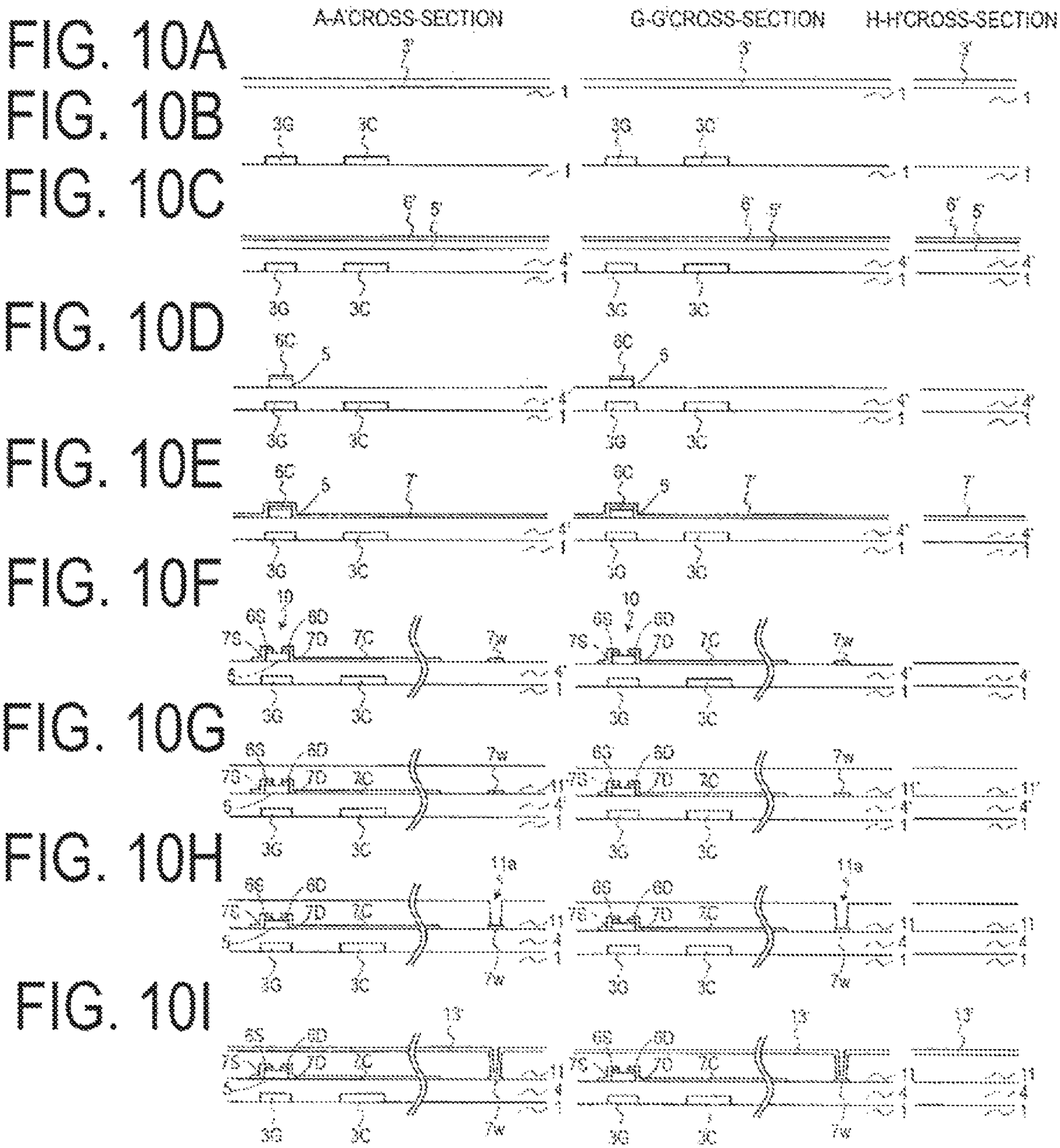
FIGS. 10A to 10I are schematic cross-sectional views for illustrating a manufacturing method of the TFT substrate 101A.
Figures 13A, 13B, 13C, 13D, 13E, 13F, 13G, 13H, 13I:
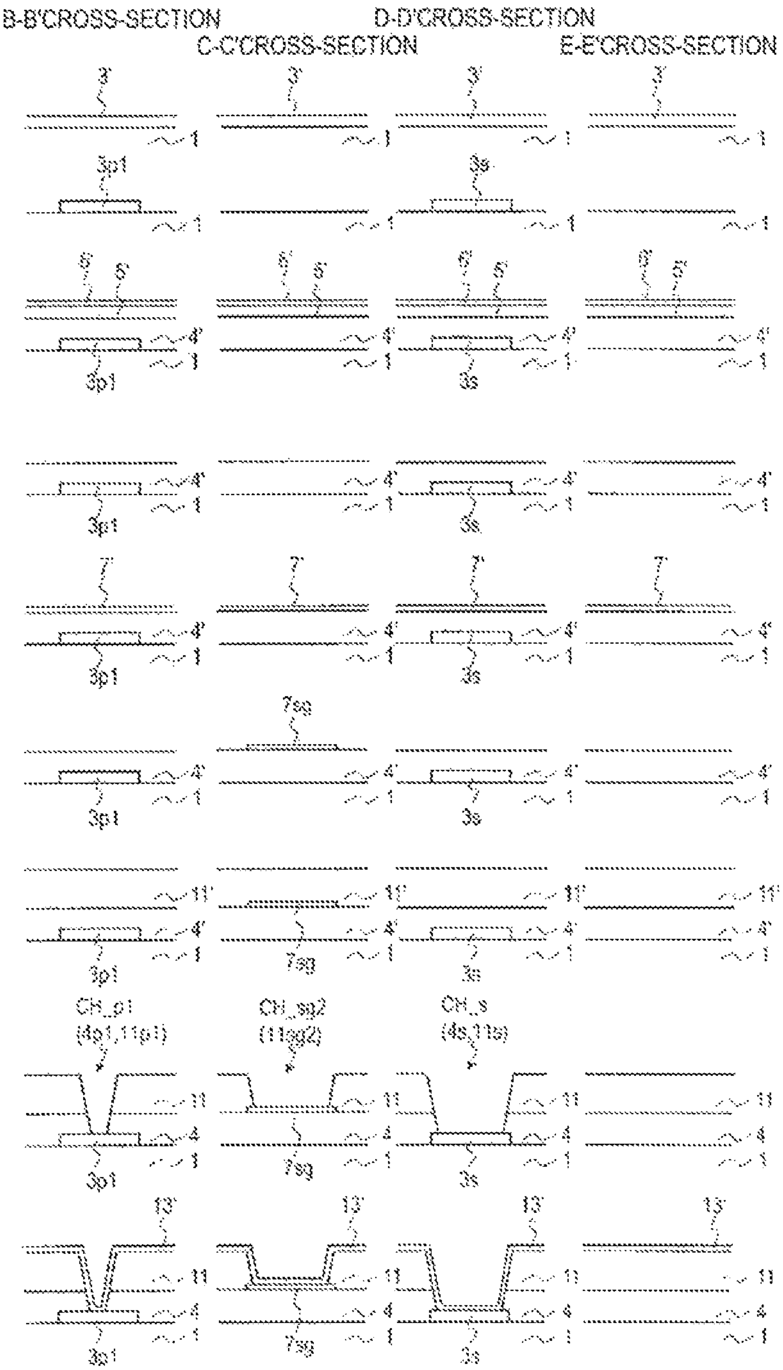
FIGS. 13A to 13I are schematic cross-sectional views for illustrating the manufacturing method of the TFT substrate 101A.

First, as illustrated in FIG. 10A and FIG. 13A, a gate conductive film 3' is formed on the dielectric substrate 1 by a sputtering method or the like. Materials of the gate conductive film 3' are not particularly limited, and a film containing a metal such as aluminum (Al), tungsten (W), molybdenum (Mo), tantalum (Ta), chromium (Cr), titanium (Ti), or copper (Cu), an alloy thereof, or alternatively a metal nitride thereof can be appropriately used. Here, as the gate conductive film 3', a layered film (MoN/Al) is formed by layering an Al film (having a thickness of 150 nm, for example) and a MoN layer (having a thickness of 100 nm, for example) in this order.

Next, the gate conductive film 3' is patterned to form the gate metal layer 3 as illustrated in FIG. 10B and FIG. 13B. Specifically, the gate electrode 3G, the gate bus line GL, the auxiliary capacitance counter electrode 3C, and the CS bus line CL are formed in each of the plurality of antenna unit formation regions (the plurality of antenna unit formation regions include the plurality of the first antenna unit formation regions and the plurality of the second antenna unit formation regions, and the same holds unless otherwise specifically described), the source lower connection wiring line 3*sg* is formed in the source-gate connection section formation region, and the lower connection sections 3*s*, 3*g*, 3*c*, and 3*p*1 are formed in each of the terminal section formation regions. Here, patterning of the gate conductive film 3' is performed by wet etching.

After that, as illustrated in FIG. 10C and FIG. 13C, a gate insulating film 4', an intrinsic amorphous silicon film 5', and an $n^+$ type amorphous silicon film 6' are formed in this order to cover the gate metal layer 3. The gate insulating film 4' can be formed by a CVD method or the like. For the gate insulating film 4', a silicon oxide ($SiO_x$) film, a silicon nitride ($Si_xN_y$) film, a silicon oxynitride ($SiO_xN_y$; x>y) film, a silicon nitride oxide ($SiN_xO_y$; x>y) film, or the like can be used as appropriate. Here, as the gate insulating film 4', a silicon nitride ($Si_xN_y$) film having a thickness of 350 nm, for example, is formed. The intrinsic amorphous silicon film 5' having a thickness of 120 nm, for example, and the $n^+$ type amorphous silicon film 6' having a thickness of 30 nm, for example, are formed.

Next, the intrinsic amorphous silicon film 5' and the $n^+$ type amorphous silicon film 6' are patterned to obtain the island-shaped semiconductor layer 5 and the contact portion 6C as illustrated in FIG. 10D and FIG. 13D. Note that the semiconductor film used for the semiconductor layer 5 is not limited to an amorphous silicon film. For example, an oxide semiconductor layer (for example, In—Ga—Zn—O based semiconductor layer having a thickness of 70 nm) may be formed as the semiconductor layer 5. In this case, it is not necessary to provide a contact portion between the semiconductor layer 5, and the source electrode and the drain electrode.

Next, a source conductive film 7' is formed on the gate insulating film 4' and on the contact portion 6C by a sputtering method or the like as illustrated in FIG. 10E and FIG. 13E. Materials of the source conductive film 7' are not particularly limited, and a film containing a metal such as aluminum (Al), tungsten (W), molybdenum (Mo), tantalum (Ta), chromium (Cr), titanium (Ti), or copper (Cu), an alloy thereof, or alternatively a metal nitride thereof can be appropriately used. Here, as the source conductive film 7', a layered film (MoN/Al/MoN) is formed by layering MoN (having a thickness of 50 nm, for example), Al (having a thickness of 150 nm, for example), and MoN (having a thickness of 100 nm, for example) in this order.

Next, the source conductive film 7' is patterned to form the source metal layer 7 as illustrated in FIG. 10F and FIG. 13F. Specifically, the source electrode 7S, the drain electrode 7D, the source bus line SL, the auxiliary capacitance electrode 7C, and the wiring line 7*w* are formed in the antenna unit formation region, and the source bus line connection section 7*sg* is formed in the source-gate connection section formation region. At this time, the contact portion 6C is also etched, and the source contact portion 6S and the drain contact portion 6D separated from each other are formed. Here, patterning of the source conductive film 7' is performed by wet etching. For example, the MoN film and the Al film are simultaneously patterned by wet etching by using an aqueous solution containing phosphoric acid, nitric acid, and acetic acid. Thereafter, a portion of the contact portion 6C located on the region that will serve as the channel region of the semiconductor layer 5 is removed by dry etching, for example, to form a gap portion, and the source contact portion 6S and the drain contact portion 6D are separated. At this time, in the gap portion, the area around the surface of the semiconductor layer 5 is also etched (overetching). In this manner, the TFT 10 is obtained.

Note that, in a case where a layered film in which a Ti film and an Al film layered in this order is used as a source conductive film, for example, after patterning the Al film by wet etching using, for example, an aqueous solution of phosphoric acid, acetic acid, and nitric acid, the Ti film and the contact portion ($n^+$ type amorphous silicon layer) 6C may be simultaneously patterned by dry etching. Alternatively, it is also possible to collectively etch the source conductive film and the contact portion. However, in the case of simultaneously etching the source conductive film or the lower layer thereof and the contact portion 6C, it may be difficult to control the distribution of the etching amount of the semiconductor layer 5 (the amount of excavation of the gap portion) of the entire substrate. In contrast, as described above, in a case where etching is performed in an etching process separate from the source/drain separation and the gap portion formation, the etching amount of the gap portion can be more easily controlled.

Here, in a source-gate connection section formation region, the source metal layer 7 is formed such that at least a part of the source lower connection wiring line 3*sg* does not overlap the source bus line connection section 7*sg*. Each terminal section formation region does not include the conductive portion included in the source metal layer 7.

Next, as illustrated in FIG. 10G and FIG. 13G, the first insulating film 11' is formed to cover the TFT 10 and the source metal layer 7. The first insulating film 11' is formed by the CVD method, for example. For the first insulating film 11', a silicon oxide ($SiO_x$) film, a silicon nitride ($Si_xN_y$) film, a silicon oxynitride ($SiO_xN_y$; x>y) film, a silicon nitride oxide ($SiN_xO_y$; x>y) film, or the like can be used as appropriate. In this example, the first insulating film 11' is formed to be in contact with the channel region of the semiconductor layer 5. Here, as the first insulating film 11', a silicon nitride ($Si_xN_y$) film having a thickness of 330 nm, for example, is formed.

Subsequently, as illustrated in FIG. 10H and FIG. 13H, the first insulating film 11' and the gate insulating film 4' are etched through a known photolithography process to form the first insulating layer 11 and the gate insulating layer 4. Specifically, in the antenna unit formation region, the opening 11*a* that at least reaches a portion of the source metal layer 7 that is electrically connected to the drain electrode 7D (here, the wiring line 7*w*) is formed in the first insulating film 11'. In the first transfer terminal section formation region, the contact hole that at least reaches the lower connection section 3*p*1 is formed in the gate insulating film 4' and the first insulating film 11'. In the source-gate connection section formation region, the contact hole CH_sg1 that at least reaches the source lower connection wiring line 3*sg* is formed in the gate insulating film 4' and the first insulating film 11', and the opening 11*sg*2 (contact hole CH_sg2) that at least reaches the source bus line connection section 7*sg* is formed in the first insulating film 11'.

In this etching process, the source metal layer 7 is used as an etch stop to etch the first insulating film 11' and the gate insulating film 4'.

In the source-gate connection section formation region, the first insulating film 11' and the gate insulating film 4' are collectively etched in the region overlapping the source lower connection wiring line 3*sg*, and the source bus line connection section 7*sg* functions as the etch stop to etch the first insulating film 11' in the region overlapping the source bus line connection section 7*sg*. This allows the contact holes CH_sg1 and CH_sg2 to be obtained.

The contact hole CH_sg1 includes the opening 4*sg*1 formed in the gate insulating film 4', and the opening llsgl formed in the first insulating film 11'. Here, since at least a part of the source lower connection wiring line 3*sg* is formed not to overlap the source bus line connection section 7*sg*, the contact hole CH_sg1 is formed in the gate insulating film 4' and the first insulating film 11'. A side surface of the opening 4*sg*1 and a side surface of the opening 11*sg*1 may be aligned on a side surface of the contact hole CH_sg1. In the present embodiment, the expression that "the side surfaces of different two or more layers are aligned" within the contact hole refers to not only a case that the side surfaces exposed in the contact hole in these layers are flush in the vertical direction, but also a case that those side surfaces continuously form an inclined surface such as a tapered shape. Such a structure can be obtained, for example, by etching these layers using the same mask, or alternatively by using one of these layers as a mask to etch the other layer.

The first insulating film 11' and the gate insulating film 4' are collectively etched using the same etchant, for example. Here, the first insulating film 11' and the gate insulating film 4' are etched by dry etching using a fluorine gas. The first insulating film 11' and the gate insulating film 4' may be etched using different etchants.

In the first transfer terminal section formation region, the first insulating film 11' and the gate insulating film 4' are collectively etched to form the opening 4*p*1 in the gate insulating film 4', and the opening 11*p*1 in the first insulating film 11'. A side surface of the opening 4*p*1 and a side surface of the opening 11*p*1 may be aligned.

In this process, an opening is not formed in the gate insulating film 4' and the first insulating film 11', in the source terminal section formation region, the gate terminal section formation region, the CS terminal section formation region, and the second transfer terminal section formation region.

Next, as illustrated in FIG. 10I and FIG. 13I, the lower conductive film 13' is formed on the first insulating layer 11, within the opening 11*a*, within the contact hole CH_sg1, within the contact hole CH_sg2, and within the opening 4*p*1, by a sputtering method, for example. The lower conductive film 13' includes a transparent conductive film, for example. An indium tin oxide (ITO) film, an IZO film, a zinc oxide (ZnO) film or the like can be used as the transparent conductive film. Here, an ITO film having a thickness of, for example, 70 nm is formed as the lower conductive film 13'.

Figures 11A, 11B, 11C, 11D, 11E, 11F:
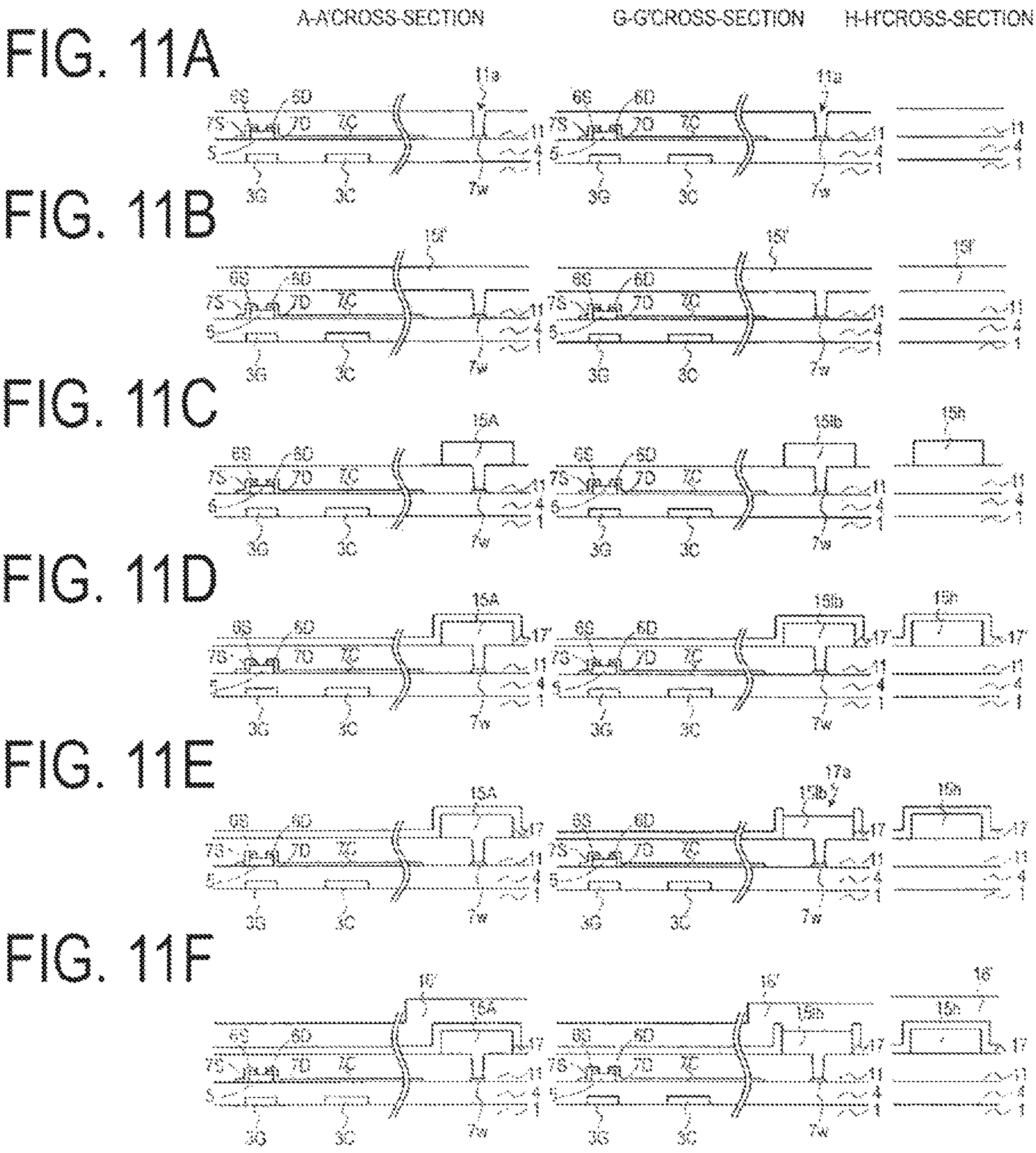
FIGS. 11A to 11F are schematic cross-sectional views for illustrating the manufacturing method of the TFT substrate 101A.
Figures 14A, 14B, 14C, 14D, 14E, 14F:
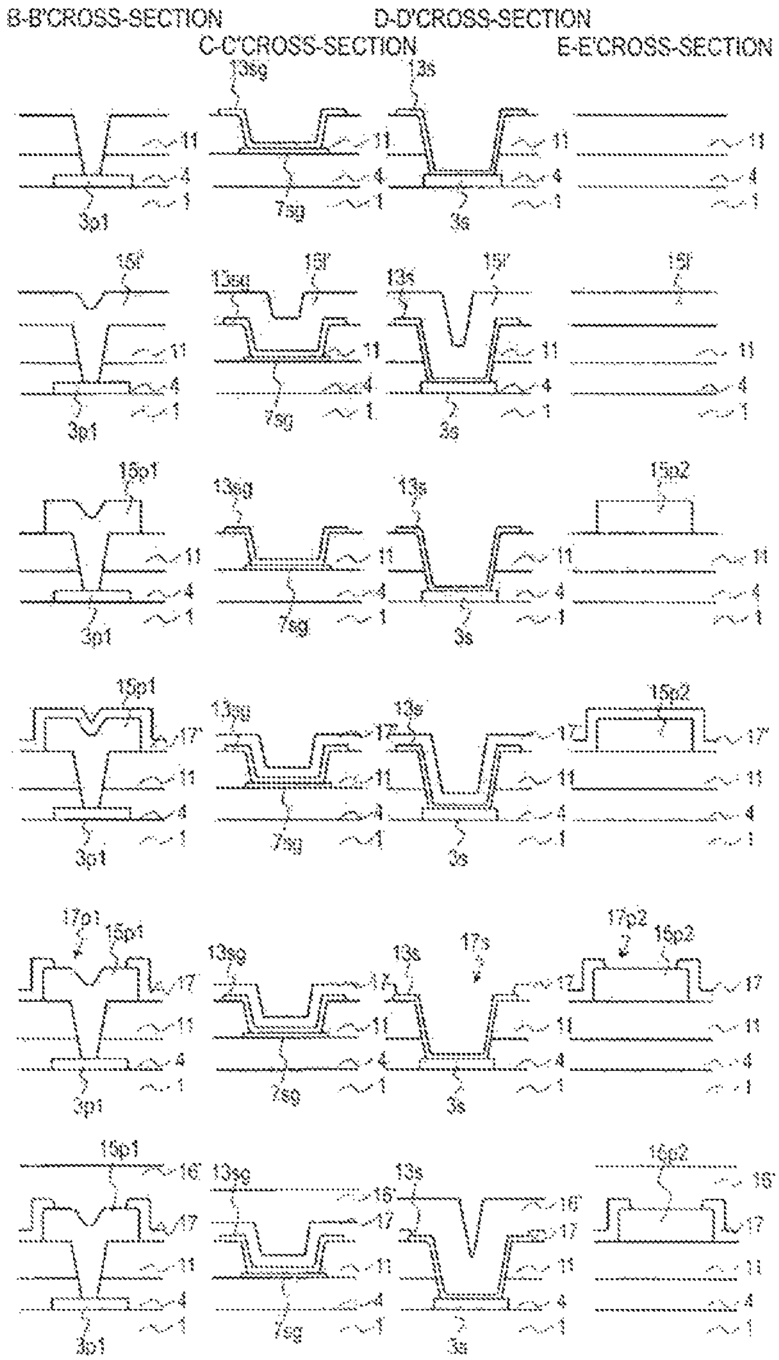
FIGS. 14A to 14F are schematic cross-sectional views for illustrating the manufacturing method of the TFT substrate 101A.

Next, the lower conductive film 13' is patterned to form the lower conductive layer 13 as illustrated in FIG. 11A and FIG. 14A. Specifically, the source-gate connection section formation region, the source bus line upper connection section 13*sg* is formed that is in contact with the source lower connection wiring line 3*sg* within the contact hole CH_sg1 and is in contact with the source bus line connection section 7*sg* within the contact hole CH_sg2.

Next, as illustrated in FIG. 11B and FIG. 14B, the patch first conductive film 151' is formed on the lower conductive layer 13 and the first insulating layer 11. The same material as that of the gate conductive film 3' or the source conductive film 7' can be used as the material of the patch first conductive film 151'. Here, as the patch first conductive film 151' (also referred to as the patch conductive film 151'), a layered film (Cu/Ti) is formed by including a Ti film (having a thickness of 20 nm, for example) and a Cu film (having a thickness of 500 nm, for example) in this order. Alternatively, as the patch first conductive film 151', a layered film (MoN/Al/MoN) may be formed by including a MoN film (having a thickness of 50 nm, for example), an Al film (having a thickness of 1000 nm, for example), and a MoN film (having a thickness of 50 nm, for example) in this order.

The patch conductive film (here, the patch first conductive film) is preferably configured to be thicker than the gate conductive film and the source conductive film. Accordingly, by reducing the sheet resistance of the patch electrode, the loss resulting from the oscillation of free electrons in the patch electrode changing to heat can be reduced. A suitable thickness of the patch conductive film is, for example, greater than or equal to 0.3 μm. In a case where the thickness of the patch conductive film becomes thinner than this, the sheet resistance becomes greater or equal to 0.10 Ω/sq, and there is a possibility that the loss increases. The thickness of the patch conductive film is, for example, less than or equal to 3 μm, and more preferably less than or equal to 2 μm. In a case where the thickness is thicker than this, warping of the substrate may be caused by a thermal stress in the process. In a case where the warping is large, problems such as conveyance troubles, chipping of the substrate, or cracking of the substrate may occur in the mass production process.

Next, as illustrated in FIG. 11C and FIG. 14C, the first patch metal layer 151 is formed by patterning the patch first conductive film 151'. Specifically, the protruding portion 15*h* is formed in the antenna unit formation region, the patch electrode 15A is formed in the first antenna unit formation region, the lower layer 151*b* of the patch electrode 15B is formed in the second antenna unit formation region, the conductive portion 15*p*1 is formed in the first transfer terminal section formation region, and the lower connection section 15*p*2 is formed in the second transfer terminal section formation region.

The conductive portion 15*p*1 is formed to be connected to the lower connection section 3*p*1 within the contact hole CH_p1 in the first transfer terminal section formation region.

In a case where a layered film (MoN/Al/MoN) in which MoN, Al, and MoN are layered in this order is formed as the patch first conductive film 151', patterning of the patch first conductive film 151' includes, for example, patterning the MoN film and the Al film simultaneously by + wet etching, by using an aqueous solution containing phosphoric acid, nitric acid, and acetic acid as the etching solution. In a case where the layered film (Cu/Ti) in which Ti and Cu are layered in this order is formed as the patch first conductive film 151', the patch first conductive film 151' can be patterned by wet etching by using an aqueous solution of mixed acid as the etching solution, for example.

In the patterning process of the patch first conductive film 151', the patch first conductive film 151' of the source-gate connection section formation region is removed. Since the source bus line upper connection section 13*sg* is formed within the contact hole CH_sg1 and within the contact hole CH_sg2, damage to the source lower connection wiring line 3*sg* and/or the source bus line connection section 7*sg* by etching is reduced in the patterning process of the patch first conductive film 151'.

Here, the portion of the source lower connection wiring line 3*sg* exposed by the contact hole CH_sg1 is covered by the source bus line upper connection section 13*sg*, and the portion of the source bus line connection section 7*sg* exposed by the contact hole CH_sg2 is covered by the source bus line upper connection section 13*sg*. As a result, etching damage to the source bus line connection section 7*sg* and/or the source lower connection wiring line 3*sg* is effectively reduced.

Next, as illustrated in FIG. 11D and FIG. 14D, the second insulating film 17' is formed on the patch metal layer 151, on the lower conductive layer 13, and on the first insulating layer 11. The second insulating film 17' is formed by the CVD method, for example. For the second insulating film 17', a silicon oxide ($SiO_x$) film, a silicon nitride ($Si_xN_y$) film, a silicon oxynitride ($SiO_xN_y$; x>y) film, a silicon nitride oxide ($SiN_xO_y$; x>y) film, or the like can be used as appropriate. Here, as the second insulating film 17', a silicon nitride ($Si_xN_y$) film having a thickness of 100 nm, for example, is formed. The second insulating film 17' is formed covering the first patch metal layer 151.

Next, the second insulating film 17' is etched through a known photolithography process to form the second insulating layer 17 as illustrated in FIG. 11E and FIG. 14E. Specifically, the opening 17*a* that at least reaches the lower layer 151*b* of the patch electrode 15B is formed in the second antenna unit formation region. In the source terminal section formation region, the opening 17*s* that exposes at least a portion of the upper connection section 13*s* is formed. In the gate terminal section formation region, the opening 17*g* that exposes at least a portion of the upper connection section 13*g* is formed. In the CS terminal section formation region, the opening 17*c* that exposes at least a portion of the upper connection section 13*c* is formed. In the first transfer terminal section formation region, the opening 17*p*1 that at least reaches the conductive portion 15*p*1 is formed. In the second transfer terminal section formation region, the opening 17*p*2 that at least reaches the lower connection section 15*p*2 is formed.

Next, as illustrated in FIG. 11F and FIG. 14F, a patch second conductive film 16' is formed on the second insulating layer 17, within the opening 17*a*, within the opening 17*s*, within the opening 17*g*, within the opening 17*c*, within the opening 17*p*1, and within the opening 17*p*2. The patch second conductive film 16' can be formed from a material similar to that of the patch first conductive film 151'. Here, as the patch second conductive film 16', a layered film (Cu/Ti) is formed by including a Ti film (having a thickness of 20 nm, for example) and a Cu film (having a thickness of 180 nm, for example) in this order.

Figures 12A, 12B, 12C, 12D, 12E:
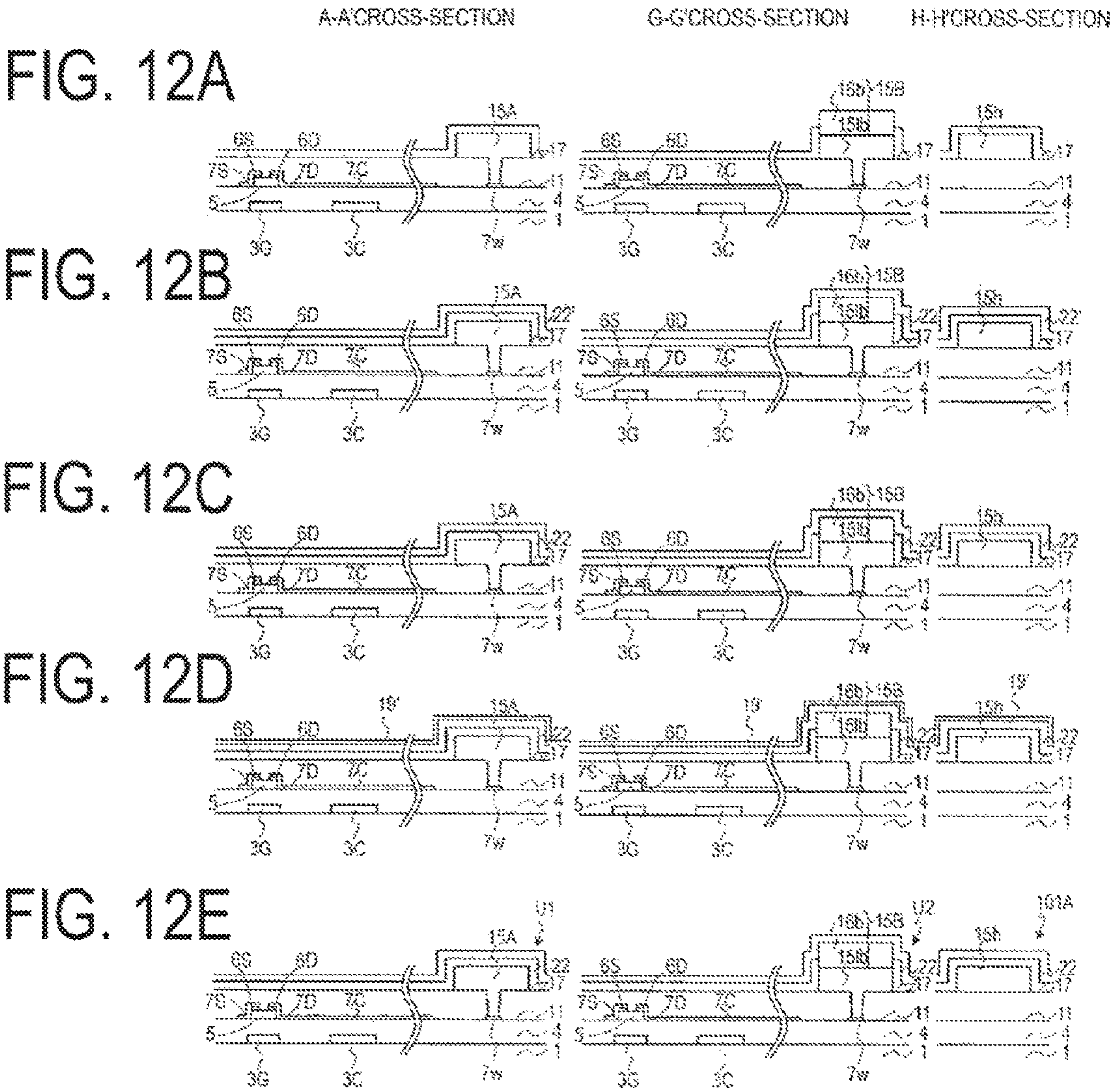
FIGS. 12A to 12E are schematic cross-sectional views for illustrating the manufacturing method of the TFT substrate 101A.
Figures 15A, 15B, 15C, 15D, 15E:
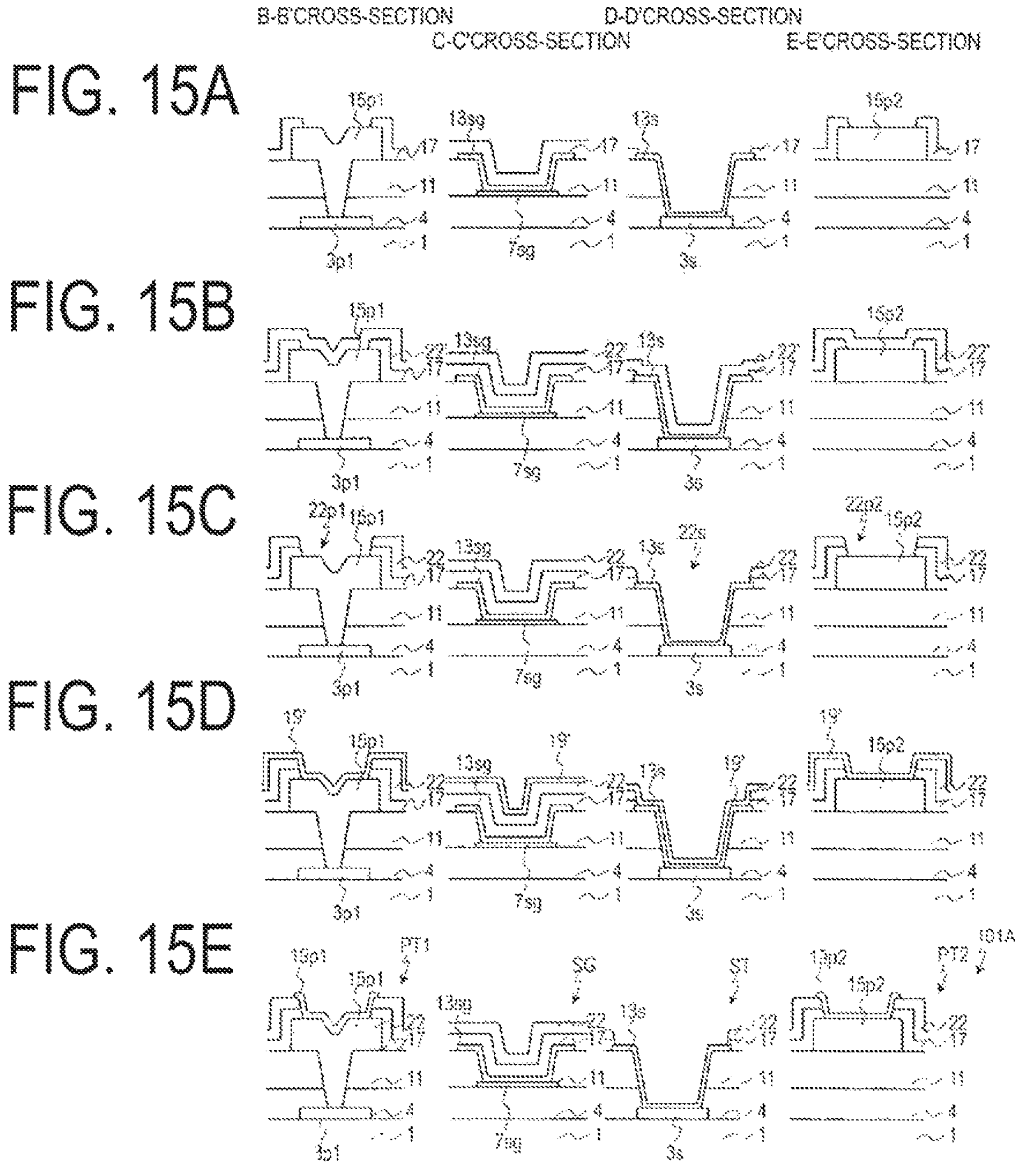
FIGS. 15A to 15E are schematic cross-sectional views for illustrating the manufacturing method of the TFT substrate 101A.

Next, as illustrated in FIG. 12A and FIG. 15A, the second patch metal layer 16 is formed by patterning the patch second conductive film 16'. The upper layer 16*b* that is in contact with the lower layer 151*b* of the patch electrode 15B is formed in the second antenna unit formation region. As a result, the patch electrode 15B including the first patch metal layer 151 (lower layer 151*b*) and the second patch metal layer 16 (upper layer 16*b*) are formed in the second antenna formation region.

Next, as illustrated in FIG. 12B and FIG. 15B, the third insulating film 22' is formed on the second insulating layer 17 and the second patch metal layer 16. The third insulating film 22' is formed by the CVD method, for example. For the third insulating film 22', a silicon oxide ($SiO_x$) film, a silicon nitride ($Si_xN_y$) film, a silicon oxynitride ($SiO_xN_y$; x>y) film, a silicon nitride oxide ($SiN_xO_y$; x>y) film, or the like can be used as appropriate. Here, as the third insulating film 22', a silicon nitride ($Si_xN_y$) film having a thickness of 100 nm, for example, is formed. The third insulating film 22' is formed to cover the second patch metal layer 16.

Next, the third insulating film 22' is etched through a known photolithography process to form the third insulating layer 22 as illustrated in FIG. 12C and FIG. 15C. Specifically, in the source terminal section formation region, the opening 22*s* that at least reaches the upper connection section 13*s* that is exposed within the opening 17*s* is formed. In the gate terminal section formation region, the opening 22*g* that at least reaches the upper connection section 13*g* that is exposed within the opening 17*g* is formed. In the CS terminal section formation region, the opening 22*c* that at least reaches the upper connection section 13*c* that is exposed within the opening 17*c* is formed. In the first transfer terminal section formation region, the opening 22*p*1 that at least reaches the conductive portion 15*p*1 is formed. In the second transfer terminal section formation region, the opening 22*p*2 that at least reaches the lower connection section 15*p*2 is formed.

Next, as illustrated in FIG. 12D and FIG. 15D, the upper conductive film 19' is formed on the third insulating layer 22, within the opening 17*s*, within the opening 17*g*, within the opening 17*c*, within the opening 17*p*1, and within the opening 17*p*2, for example, by a sputtering method. The upper conductive film 19' includes a transparent conductive film, for example. For example, an indium tin oxide (ITO) film, an IZO film, a zinc oxide (ZnO) film or the like can be used as the transparent conductive film. Here, an ITO film having a thickness of, for example, 70 nm is used as the upper conductive film 19'. Alternatively, a layered film (ITO/Ti) formed by layering Ti (having a thickness of 50 nm, for example) and ITO (having a thickness of 70 nm, for example) in this order may be used as the upper conductive film 19'. The layering order may be reversed. That is, a layered film (Ti/ITO) formed by layering ITO (having a thickness of 70 nm, for example) and Ti (having a thickness of 50 nm, for example) in this order may be used as the upper conductive film 19'. In place of the Ti film, a layered film formed of one film or two or more films selected from the group consisting of MoNbNi film, MoNb film, MoW film, W film, and Ta film may be used. Specifically, as the upper conductive film 19', a layered film may be used that is formed by layering a layered film formed of one film or two or more films selected from the group consisting of Ti film, MoNbNi film, MoNb film, MoW film, W film, and Ta film, and an ITO film.

Next, the upper conductive film 19' is patterned to form the upper conductive layer 19 as illustrated in FIG. 12E and FIG. 15E. Specifically, the upper connection section 19*p*1 connected to the conductive portion 15*p*1 within the opening 17*p*1 in the first transfer terminal section formation region and the upper connection section 19*p*2 connected to the lower connection section 15*p*2 within the opening 17*p*2 in the second transfer terminal section formation region are formed. This makes it possible to obtain the first antenna unit region U1, the second antenna unit region U2, the source-gate connection section SG, the source terminal section ST, the gate terminal section GT, the CS terminal section CT, the first transfer terminal section PT1, and the second transfer terminal section PT2.

In this manner, the TFT substrate 101A is manufactured.

Manufacturing Method of Slot Substrate 201

A manufacturing method of the slot substrate 201 will be described with reference to FIGS. 16A to 16D. FIGS. 16A to 16D are schematic cross-sectional views for illustrating a manufacturing method of the slot substrate 201. FIGS. 16A to 16D illustrate cross-sections (cross-section A-A' and cross-section H-H' of the slot substrate 201) corresponding to FIG. 5B and FIG. 5A. Note that illustration of the non-transmission and/or reception region R2 is omitted.

Figures 16A, 16B, 16C, 16D:
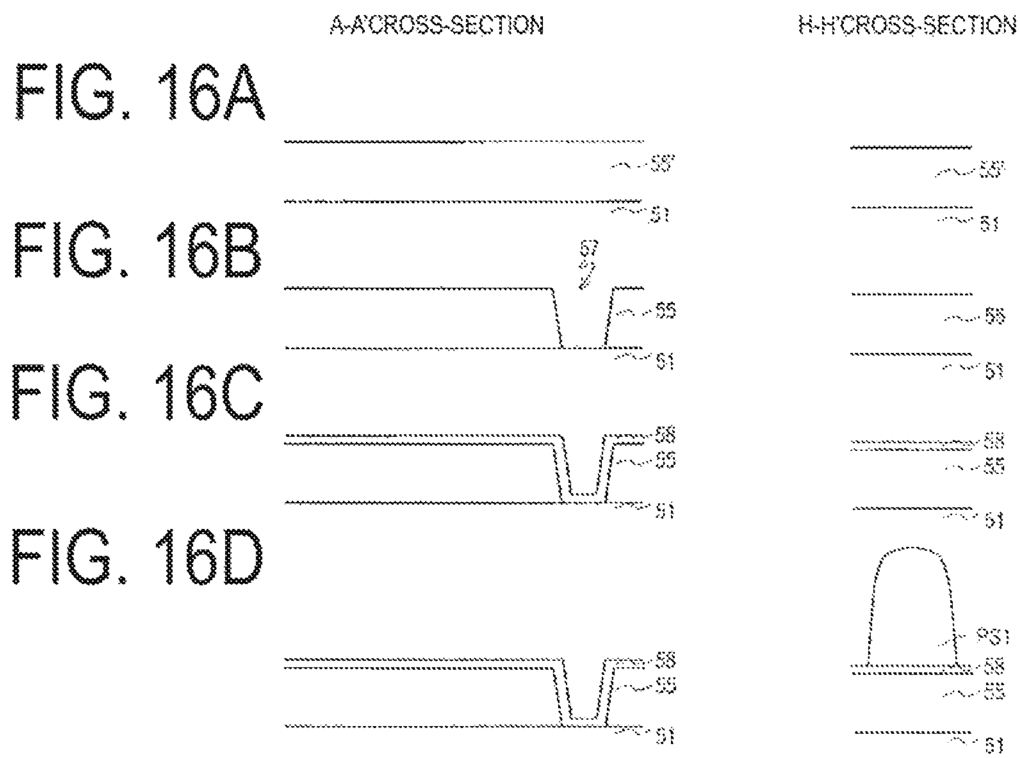
FIGS. 16A to 16D are schematic cross-sectional views for illustrating a manufacturing method of the slot substrate 201.

First, a metal film 55' is formed on the dielectric substrate 51 as illustrated in FIG. 16A. Thereafter, the metal film 55' is patterned to obtain the slot electrode 55 including the plurality of slots 57, as illustrated in FIG. 16B. As the metal film 55', a Cu film (or Al film) having a thickness of from 2 μm to 5 μm may be used. Here, a layered film is used by layering Ti (having a thickness of 20 nm, for example) and Cu (having a thickness of 3000 nm, for example) in this order. Note that, instead, a layered film obtained by layering a Ti film, a Cu film, and a Ti film in this order may be formed.

A substrate such as a glass substrate or a resin substrate having a high transmittance to electromagnetic waves (the dielectric constant $\varepsilon_m$ and the dielectric loss tan $\delta_M$ are small) can be used as the dielectric substrate 51. The dielectric substrate 51 is preferably thin in order to suppress the attenuation of the electromagnetic waves. For example, after forming the constituent elements such as the slot electrode 55 on the front surface of the glass substrate by a process to be described later, the glass substrate may be thinned from the rear side. This allows the thickness of the glass substrate to be reduced to 500 μm or less, for example.

In a case where a resin substrate is used as the dielectric substrate 51, constituent elements such as TFTs may be formed directly on the resin substrate, or may be formed on the resin substrate by a transfer method. In a case of the transfer method, for example, a resin film (for example, a polyimide film) is formed on the glass substrate, and after the constituent elements are formed on the resin film by the process to be described later, the resin film on which the constituent elements are formed is separate from the glass substrate. Generally, the dielectric constant $\varepsilon_m$ and the dielectric loss tan $\delta_M$ of resin are smaller than those of glass. The thickness of the resin substrate is, for example, from 3 μm to 300 μm. Besides polyimide, for example, a liquid crystal polymer can also be used as the resin material.

Note that an insulating layer (having a thickness of 200 nm, for example) may be formed between the dielectric substrate 51 and the slot electrode 55. The insulating layer can be formed from the same material as that of the fourth insulating layer 58 described below.

Thereafter, as illustrated in FIG. 16C, the fourth insulating layer 58 (having a thickness of 100 nm or 200 nm, for example) is formed on the slot electrode 55 and within the slot 57. Specifically, after forming the fourth insulating film on the slot electrode 55 and within the slot 57, the fourth insulating layer 58 is obtained by forming the opening 58*a* that at least reaches the slot electrode 55 in the non-transmission and/or reception region R2. For the fourth insulating layer 58, for example, a silicon oxide ($SiO_x$) film, a silicon nitride (SiNx) film, a silicon oxynitride ($SiO_xN_y$; x>y) film, a silicon nitride oxide ($SiN_xO_y$; x>y) film, or the like can be used as appropriate. Here, as the fourth insulating layer 58, a silicon nitride ($Si_xN_y$) film having a thickness of 100 nm, for example, is formed.

Next, a transparent conductive film is formed on the fourth insulating layer 58 and within the opening 58*a* of the fourth insulating layer 58, and is patterned to form the upper connection section 60 in contact with the slot electrode 55 within the opening 58*a*. In this way, the terminal section IT is obtained.

Thereafter, a photosensitive resin film is formed on the fourth insulating layer 58 and the upper connection section 60, and the photosensitive resin film is exposed and developed with a photomask having an opening with a predetermined pattern to form a columnar spacer PS, as illustrated in FIG. 16D. The photosensitive resin may be negative-working or positive-working. Here, the columnar spacers PS1 and PS2 having a height of 2.6 μm are formed by using an acrylic resin film (having a thickness of 2.6 μm, for example).

In this way, the slot substrate 201 is manufactured.

Note that in a case where the TFT substrate includes the columnar spacer PS, after the TFT substrate 101A is manufactured by the above method, a photosensitive resin film may be formed, exposed and developed on the third insulating layer 22 and the upper conductive layer 19, to form the columnar spacer PS.

Material and Structure of TFT 10

In the present embodiment, a TFT including a semiconductor layer 5 as an active layer is used as a switching element disposed in each pixel. The semiconductor layer 5 is not limited to an amorphous silicon layer, and may be a polysilicon layer or an oxide semiconductor layer.

In a case where an oxide semiconductor layer is used, the oxide semiconductor included in the oxide semiconductor layer may be an amorphous oxide semiconductor or a crystalline oxide semiconductor including a crystalline portion. Examples of the crystalline oxide semiconductor include a polycrystalline oxide semiconductor, a microcrystalline oxide semiconductor, or a crystalline oxide semiconductor having a c-axis oriented substantially perpendicular to the layer surface.

The oxide semiconductor layer may have a layered structure including two or more layers. In a case where the oxide semiconductor layer includes a layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. The oxide semiconductor layer may include a plurality of amorphous oxide semiconductor layers. In a case where the oxide semiconductor layer includes a dual-layer structure including an upper layer and a lower layer, an energy gap of an oxide semiconductor present in the upper layer is preferably greater than an energy gap of an oxide semiconductor present in the lower layer. However, in a case where a difference in the energy gap between these layers is relatively small, the energy gap of the oxide semiconductor in the lower layer may be greater than the energy gap of the oxide semiconductor in the upper layer.

Materials, structures, and film formation methods of an amorphous oxide semiconductor and the above-described crystalline oxide semiconductors, a configuration of an oxide semiconductor layer including a layered structure, and the like are described in, for example, JP 2014-007399 A. The entire contents of the disclosure of JP 2014-007399 A are incorporated herein as reference.

The oxide semiconductor layer may include, for example, at least one metal element selected from In, Ga, and Zn. In the present embodiment, the oxide semiconductor layer includes, for example, an In—Ga—Zn—C based semiconductor (for example, an indium gallium zinc oxide). Here, the In—Ga—Zn—C based semiconductor is a ternary oxide of In (indium), Ga (gallium), and Zn (zinc), and a ratio (composition ratio) of In, Ga, and Zn is not particularly limited. For example, the ratio includes In:Ga:Zn=2:2:1, In:Ga:Zn=1:1:1, or In:Ga:Zn=1:1:2. Such an oxide semiconductor layer can be formed of an oxide semiconductor film including an In—Ga—Zn—O based semiconductor.

The In—Ga—Zn—O based semiconductor may be an amorphous semiconductor, or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is disclosed in, for example, JP 2014-007399 A, JP 2012-134475 A, and JP 2014-209727 A as described above. The entire contents of the disclosure of JP 2012-134475 A and JP 2014-209727 A are incorporated herein as reference. Since a TFT including an In—Ga—Zn—O based semiconductor layer has high mobility (more than 20 times in comparison with a-Si TFTs) and low leakage current (less than 1/100th in comparison with a-Si TFTs), such a TFT can suitably be used as a driving TFT (for example, a TFT included in a driving circuit provided in the non-transmission and/or reception region) and a TFT provided in each antenna unit region.

In place of the In—Ga—Zn—O based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, a CdO (cadmium oxide), an Mg—Zn—O based semiconductor, an In—Ga—Sn—O based semiconductor, an In—Ga—O based semiconductor, a Zr—In—Zn—O based semiconductor, an Hf—In—Zn—O based semiconductor, an Al—Ga—Zn—O based semiconductor, or a Ga—Zn—O based semiconductor.

In the example illustrated in FIGS. 3A and 3B, the TFT 10 is a channel etch type TFT having a bottom gate structure. The "channel etch type TFT" does not include an etch stop layer formed on the channel region, and a lower face of an end portion of each of the source and drain electrodes, which is closer to the channel, is provided so as to be in contact with an upper face of the semiconductor layer. The channel etch type TFT is formed by, for example, forming a conductive film for a source/drain electrode on a semiconductor layer and performing source/drain separation. In the source/drain separation process, the surface portion of the channel region may be etched.

Note that the TFT 10 may be an etch stop type TFT in which an etch stop layer is formed on the channel region. In the etch stop type TFT, the lower face of an end portion of each of the source and drain electrodes, which is closer to the channel, is located, for example, on the etch stop layer. The etch stop type TFT is formed as follows; after forming an etch stop layer covering the portion that will become the channel region in a semiconductor layer, for example, a conductive film for the source and drain electrodes is formed on the semiconductor layer and the etch stop layer, and source/drain separation is performed.

Although the TFT 10 has a top contact structure in which the source and drain electrodes are in contact with the upper face of the semiconductor layer, the source and drain electrodes may be disposed to be in contact with the lower face of the semiconductor layer (a bottom contact structure). Furthermore, the TFT 10 may have a bottom gate structure having a gate electrode on the dielectric substrate side of the semiconductor layer, or a top gate structure having a gate electrode above the semiconductor layer.

Second Embodiment

In the previous embodiment, the thickness of the patch electrode 15 is varied between the first antenna units U1 and the second antenna units U2. In the present embodiment, by forming an additional insulating layer in at least the first region Ro of the second antenna units U2, a sum of the thicknesses of the first region Ro and the insulating layer between the first dielectric substrate 1 and the patch electrode 15 differs between the first antenna units U1 and the second antenna units U2.

The structure of a transmission and/or reception region R1 of a scanning antenna 1000B according to the present embodiment will be described with reference to FIGS. 17A and 17B and FIGS. 18A to 18D. Common reference numerals may be assigned to the configuration common to the scanning antenna 1000A, and descriptions thereof may be omitted. The following mainly describes the points different from the previous embodiment.

Figure 17B:
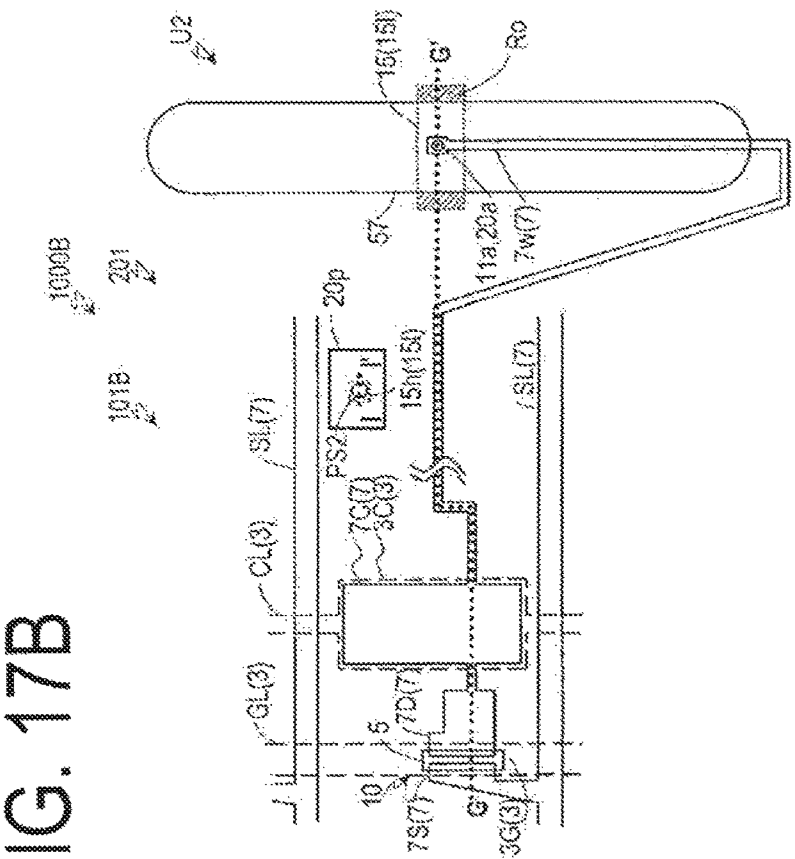
FIGS. 17A and 17B are schematic plan views illustrating a transmission and/or reception region R1 of a scanning antenna 1000B according to a second embodiment of the present disclosure.
Figure 17A:
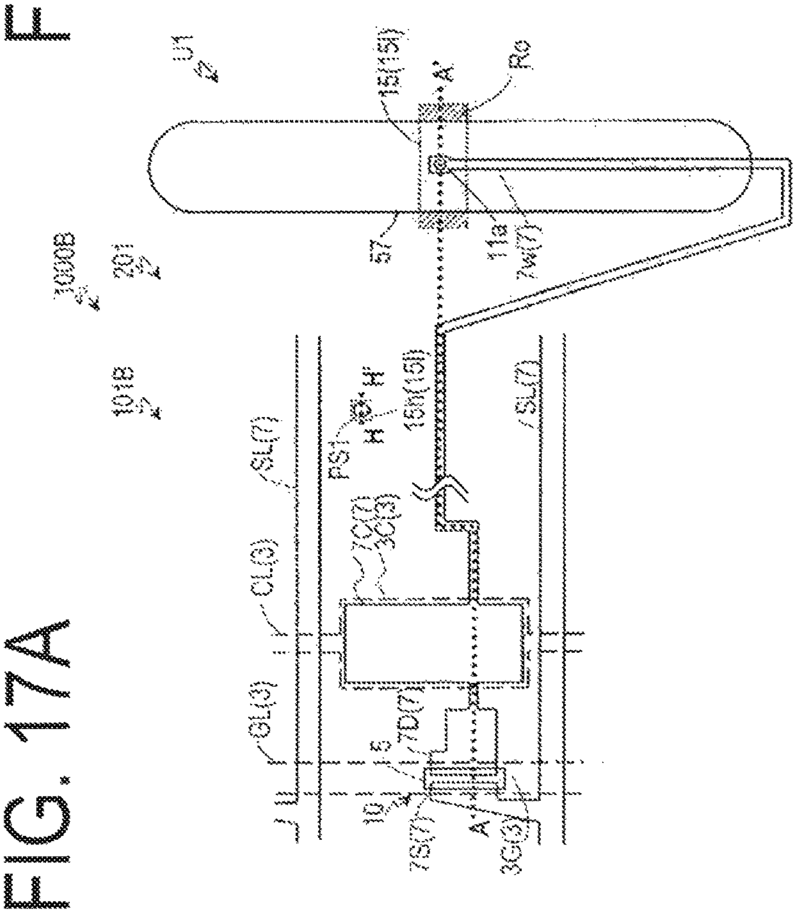
Figures 18A, 18B, 18C, 18D:
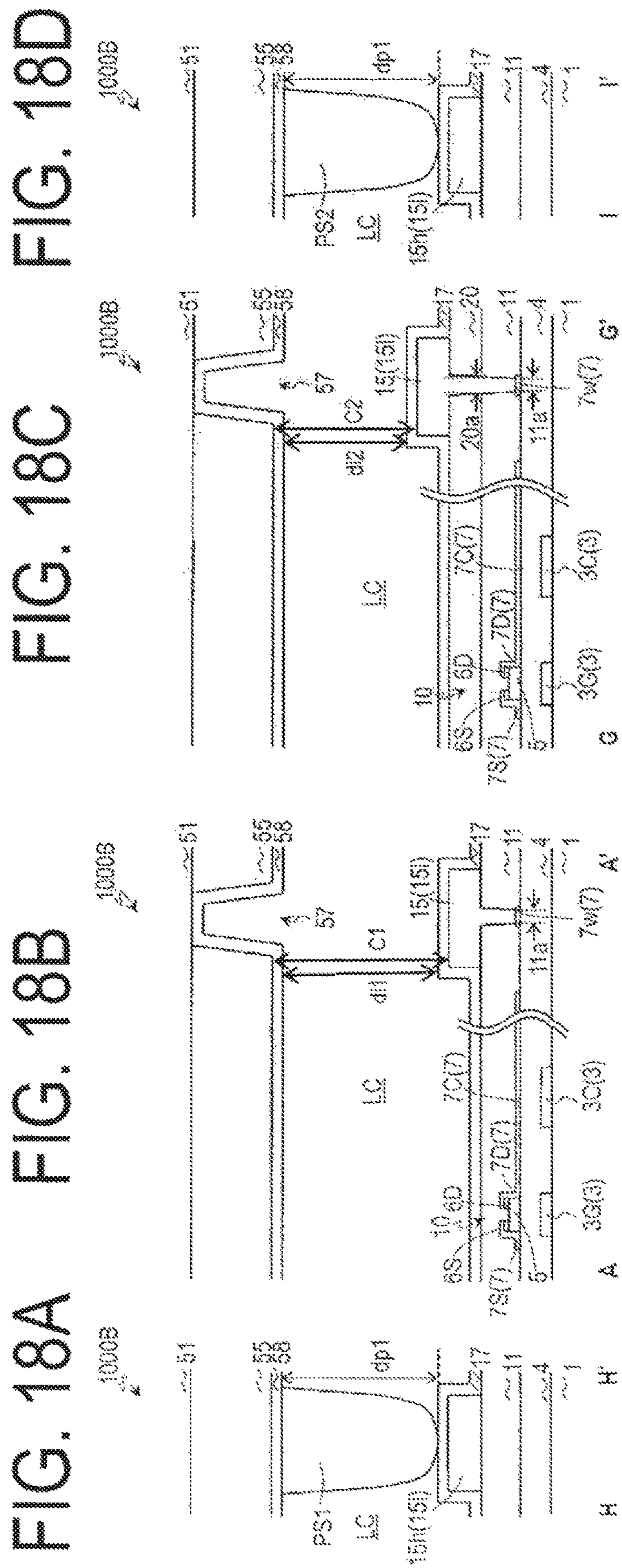
FIGS. 18A to 18D are schematic cross-sectional views illustrating the transmission and/or reception region R1 of the scanning antenna 1000B.

FIGS. 17A and 17B are schematic plan views of the transmission and/or reception region R1 of the scanning antenna 1000B, and FIGS. 18A to 18D are schematic cross-sectional views of the transmission and/or reception region R1 of the scanning antenna 1000B. FIG. 17A is a schematic plan view of first antenna units U1 of the transmission and/or reception region R1 of the scanning antenna 1000B, and FIG. 17B is a schematic plan view of second antenna units U2 of the transmission and/or reception region R1 of the scanning antenna 1000B. FIGS. 18A and 18B are schematic cross-sectional views of the first antenna units U1 of the transmission and/or reception region R1 of the scanning antenna 1000B, and FIGS. 18C and 18D are schematic cross-sectional views of the second antenna units U2 of the transmission and/or reception region R1 of the scanning antenna 1000B. FIGS. 18A to 18D illustrate cross-sections along the line H-H' and the line A-A' in FIG. 17A and the cross-sections along line G-G' and line I-I' in FIG. 17B, respectively.

The structure of the first antenna units U1 of the scanning antenna 1000B has the same structure as that in which the third insulating layer 22 of the first antenna units U1 of the scanning antenna 1000A is omitted. The second antenna units U2 of the scanning antenna 1000B differs from the first antenna units U1 in that the additional insulating layer 20 includes at least the first region Ro. The additional insulating layer 20 is not formed in the first antenna units U1. Thus, the distance C2 in the normal direction of the dielectric substrate 1 between the patch electrode 15 and the slot electrode 55 of the plurality of second antenna units U2 is smaller than the distance C1 in the normal direction of the dielectric substrate 1 between the patch electrode 15 and the slot electrode 55 of the plurality of first antenna units U1. The thickness dl2 of the liquid crystal layer LC in the first region Ro of the plurality of second antenna units U2 is smaller than the thickness dl1 of the liquid crystal layer LC of the first region Ro of the plurality of first antenna units U1. Here, the sum of the thicknesses of the first region Ro of the plurality of second antenna units U2 and the insulating layer (the gate insulating layer 4, the first insulating layer 11, and the additional insulating layer 20) between the first dielectric substrate 1 and the patch electrode 15 is greater than the sum of the thicknesses of the first region Ro of the plurality of first antenna units U1 and the insulating layer (the gate insulating layer 4 and the first insulating layer 11) between the first dielectric substrate 1 and the patch electrode 15. The additional insulating layer 20 may be formed from an inorganic material or may be formed from an organic material.

Here, for example, the distance C1 in the normal direction of the dielectric substrate 1 between the patch electrode 15 and the slot electrode 55 of the plurality of first antenna units U1 is 2.8 μm (design value), and the distance C2 in the normal direction of the dielectric substrate 1 between the patch electrode 15 and the slot electrode 55 of the plurality of second antenna units U2 is 2.6 μm (design value). The difference between the distance C1 and the distance C2 (C1−C2) is 0.2 μm (design value). Here, the difference between the distance C1 and the distance C2 (C1−C2) corresponds to the thickness of the additional insulating layer 20, for example.

Here, the additional insulating layer 20 is formed not to overlap with the columnar spacer PS2 of the second antenna units U2. For example, the additional insulating layer 20 includes an opening 20*p* that overlaps with the columnar spacer PS2 of the second antenna units U2 when viewed from the normal direction of the first dielectric substrate 1. Therefore, the columnar spacer PS1 of the first antenna units U1 and the columnar spacer PS2 of the second antenna units U2 have the same height dp1. This has the advantage of being easy to form the columnar spacer PS. However, the heights of the columnar spacer PS1 of the first antenna units U1 and the columnar spacer PS2 of the second antenna units U2 may be different from each other.

In this example, the additional insulating layer 20 is formed between the first insulating layer 11 and the second insulating layer 17. The additional insulating layer 20 includes an opening 20*a* that overlaps with the opening 11*a* formed in the first insulating layer 11. The patch metal layer 151 is formed on the additional insulating layer 20, the first insulating layer 11, and the opening 11*a*.

Note that the additional insulating layer may be provided between the first dielectric substrate 1 and the patch electrode 15. For example, the additional insulating layer may be formed between the first dielectric substrate 1 and the gate insulating layer 4 as illustrated in Modified Example below.

Structure of TFT Substrate 101B (Non-Transmission and/or Reception Region R2)

With reference to FIGS. 19A and 19B, FIGS. 20A to 20D, and FIGS. 21A to 21C, the structure of the non-transmission and/or reception region R2 of the TFT substrate 101B included in the scanning antenna 1000B will be described. However, the structure of the non-transmission and/or reception region R2 of the scanning antenna 1000B is not limited to the illustrated example.

Figure 19A:
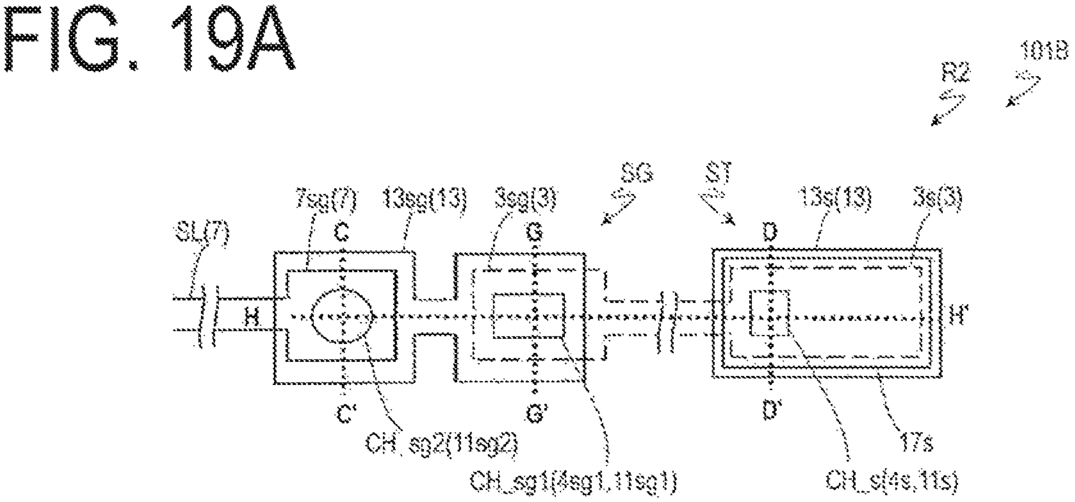
FIGS. 19A and 19B are schematic plan views illustrating a non-transmission and/or reception region R2 of a TFT substrate 101B included in the scanning antenna 1000B.
Figure 19B:
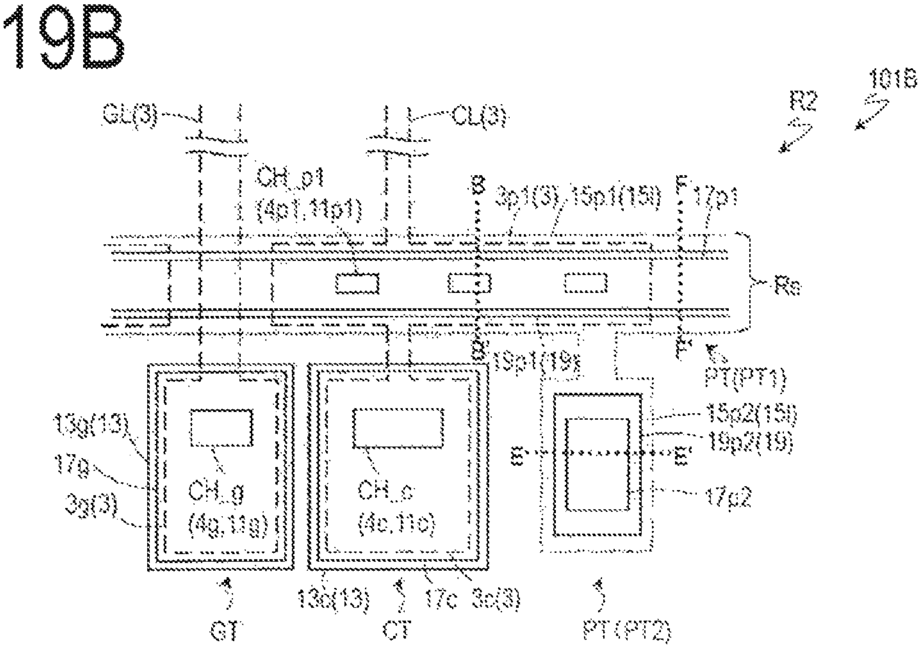
Figure 20A:
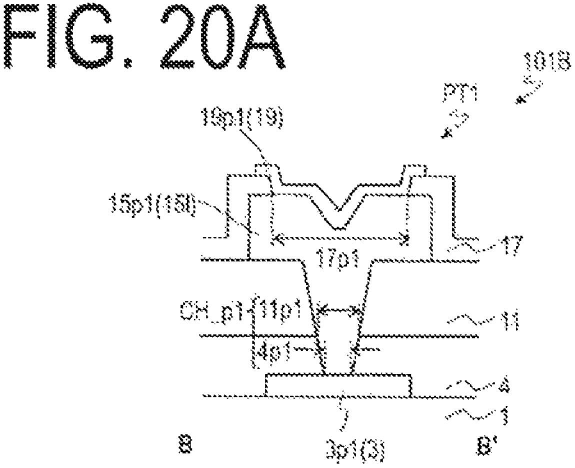
FIGS. 20A to 20D are schematic cross-sectional views illustrating the non-transmission and/or reception region R2 of the TFT substrate 101B.
Figure 20B:
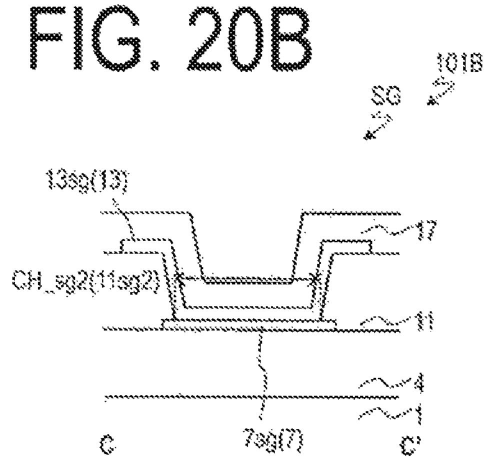
Figure 20C:
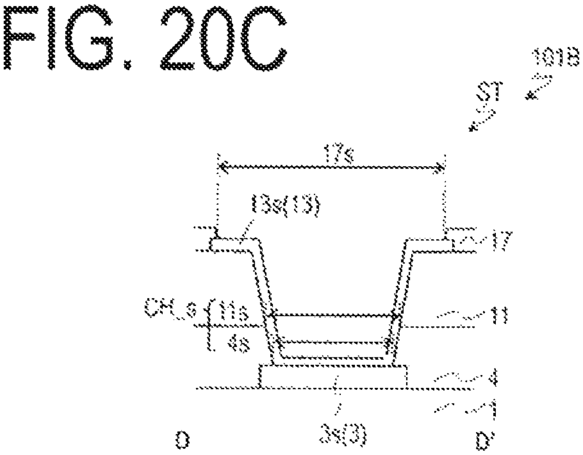
Figure 20D:
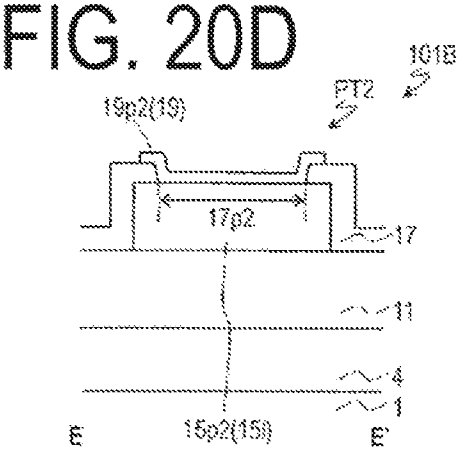
Figure 21A:
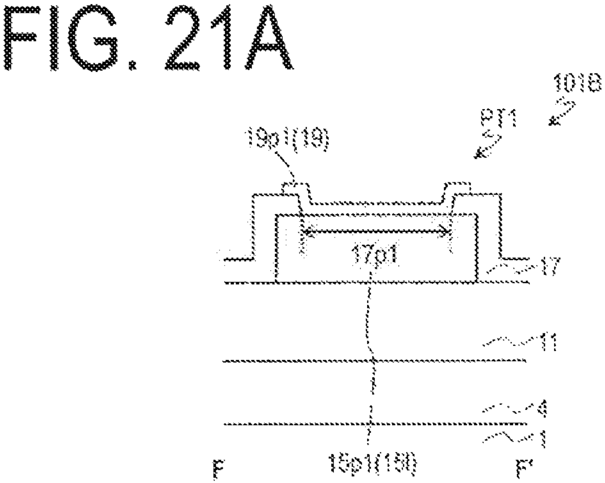
FIGS. 21A to 21C are schematic cross-sectional views illustrating the non-transmission and/or reception region R2 of the TFT substrate 101B.
Figure 21B:
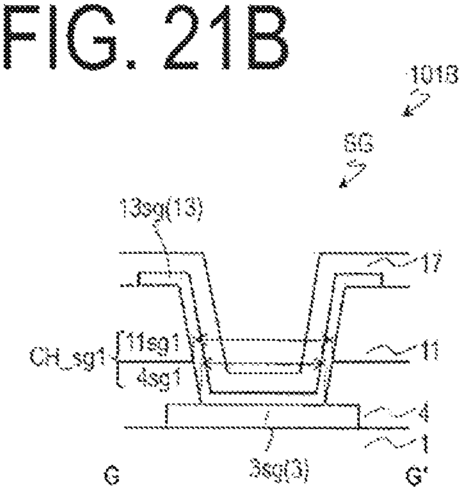
Figure 21C:
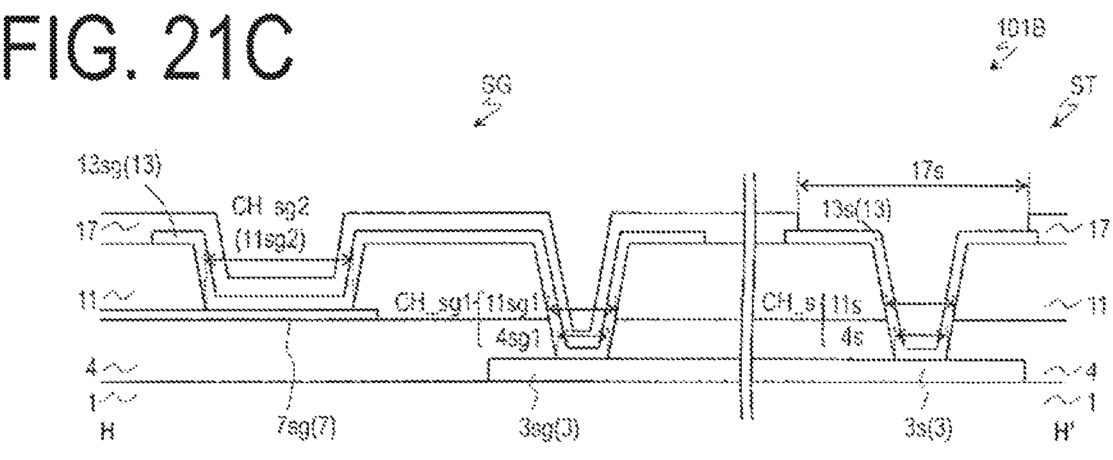

FIGS. 19A and 19B are schematic plan views of the non-transmission and/or reception region R2 of the TFT substrate 101B, and FIGS. 20A to 20D and FIGS. 21A to 21C are schematic cross-sectional views of the non-transmission and/or reception region R2 of the TFT substrate 101B. FIG. 19A illustrates the source-gate connection section SG and the source terminal section ST provided in the non-transmission and/or reception region R2, and FIG. 19B illustrates the transfer terminal section PT, the gate terminal section GT, and the CS terminal section CT provided in the non-transmission and/or reception region R2. FIG. 20A illustrates a cross-section of the first transfer terminal section PT1 along the line B-B' in FIG. 19B, FIG. 20B illustrates a cross-section of the source-gate connection section SG along the line C-C' in FIG. 19A, FIG. 20C illustrates a cross-section of the source terminal section ST along the line D-D' in FIG. 19A, FIG. 20D illustrates a cross-section of the second transfer terminal section PT2 along the line E-E' in FIG. 19B, FIG. 21A illustrates a cross-section of the first transfer terminal section PT1 along the line F-F' in FIG. 19B, FIG. 21B illustrates a cross-section of the source-gate connection section SG along the line G-G' in FIG. 19A, FIG. 21C illustrates a cross-section of the source-gate connection section SG and the source terminal section ST along the line H-H' in FIG. 19A.

As illustrated in FIG. 19A to FIG. 21C, the non-transmission and/or reception region R2 of the TFT substrate 101B corresponds to a configuration in which the third insulating layer 22 in the TFT substrate 101A illustrated in FIG. 6A to FIG. 8C is omitted.

Manufacturing Method of TFT Substrate 101B

A description is given of a manufacturing method of the TFT substrate 101B with reference to FIGS. 22A to 22D and FIGS. 23A to 23D.

FIGS. 22A to 22D and FIGS. 23A to 23D are schematic cross-sectional views for illustrating the manufacturing method of the TFT substrate 101B. FIGS. 22A to 22D and FIGS. 23A to 23D illustrate cross-sections corresponding to FIG. 18B, FIG. 18C, and FIG. 18A (cross-section A-A', cross-section G-G', and cross-section H-H' of the TFT substrate 101B). The non-transmission and/or reception region R2 of the TFT substrate 101B can be manufactured by omitting the third insulating layer 22 in the TFT substrate 101A, and thus illustration and description thereof are omitted. The following description mainly describes differences from the manufacturing method of the TFT substrate 101A described with reference to FIG. 10A to FIG. 15E.

First, as illustrated in FIGS. 10A to 10I and FIG. 11A, a gate metal layer 3, a gate insulating layer 4, an island-shaped semiconductor layer 5, a source contact portion 6S, a drain contact portion 6D, a source metal layer 7, a first insulating layer 11, and a lower conductive layer 13 are formed on the dielectric substrate 1. Here, the lower conductive layer 13 is formed only in the non-transmission and/or reception region R2.

Figure 22A:
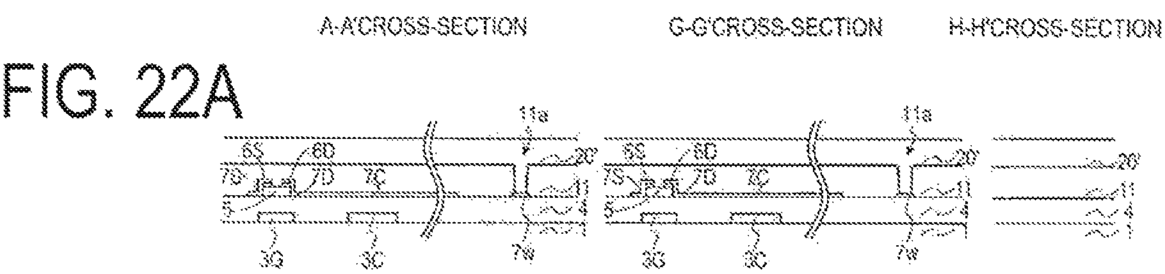
FIGS. 22A to 22D are schematic cross-sectional views for illustrating a manufacturing method of the TFT substrate 101B.

Next, as illustrated in FIG. 22A, an insulating film 20' is formed on the first insulating layer 11 and the lower conductive layer 13. The insulating film 20' is formed by the CVD method, for example. For the insulating film 20', a silicon oxide ($SiO_x$) film, a silicon nitride ($Si_xN_y$) film, a silicon oxynitride ($SiO_xN_y$; x>y) film, a silicon nitride oxide ($SiN_xO_y$; x>y) film, or the like can be used as appropriate. Alternatively, the insulating film 20' may be formed from an acrylic resin, a polyimide resin, or a silicone resin. The insulating film 20' may be a photosensitive resin. Here, as the insulating film 20', a silicon nitride ($Si_xN_y$) film having a thickness of 200 nm, for example, is formed.

Figure 22B:
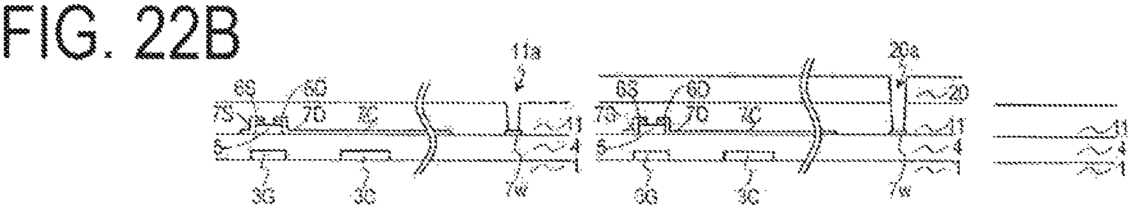

Next, as illustrated in FIG. 22B, the insulating film 20' is etched by a known photolithography process to form an additional insulating layer 20. Specifically, the additional insulating layer 20 is formed in a region that is at least the first region of the second antenna units, for example, and is not formed in the first antenna unit formation region. An opening 20*a* that overlaps with the opening 11*a* formed in the first insulating layer 11 is formed. In this example, no additional insulating layer 20 is formed in the non-transmission and/or reception region R2, but it may also be formed.

Figure 22C:
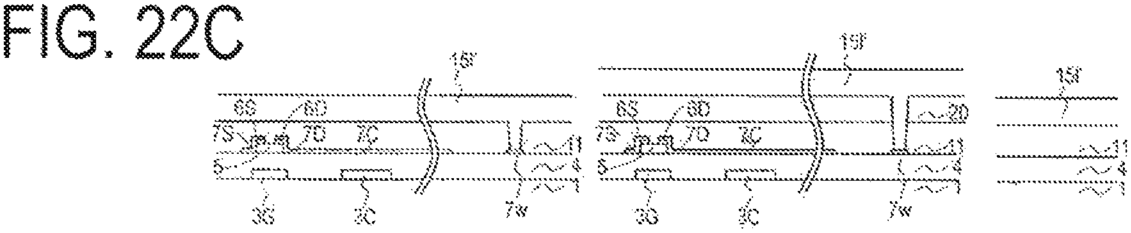

Next, as illustrated in FIG. 22C, the patch conductive film 151' is formed on the lower conductive layer 13, the first insulating layer 11, and the additional insulating layer 20.

Figure 22D:
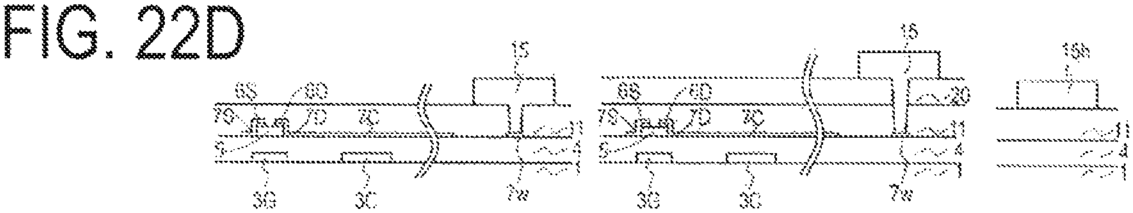

Next, as illustrated in FIG. 22D, the patch metal layer 151 is formed by patterning the patch conductive film 151'. The patch electrode 15 and the protruding portion 15*h* are formed in each antenna unit formation region (the first antenna unit formation region or the second antenna unit formation region). Here, the patch electrode 15 in the first antenna unit formation region is formed on the first insulating layer 11, and the patch electrode 15 in the second antenna unit formation region is formed on the additional insulating layer 20.

Figures 23A, 23B, 23C, 23D:
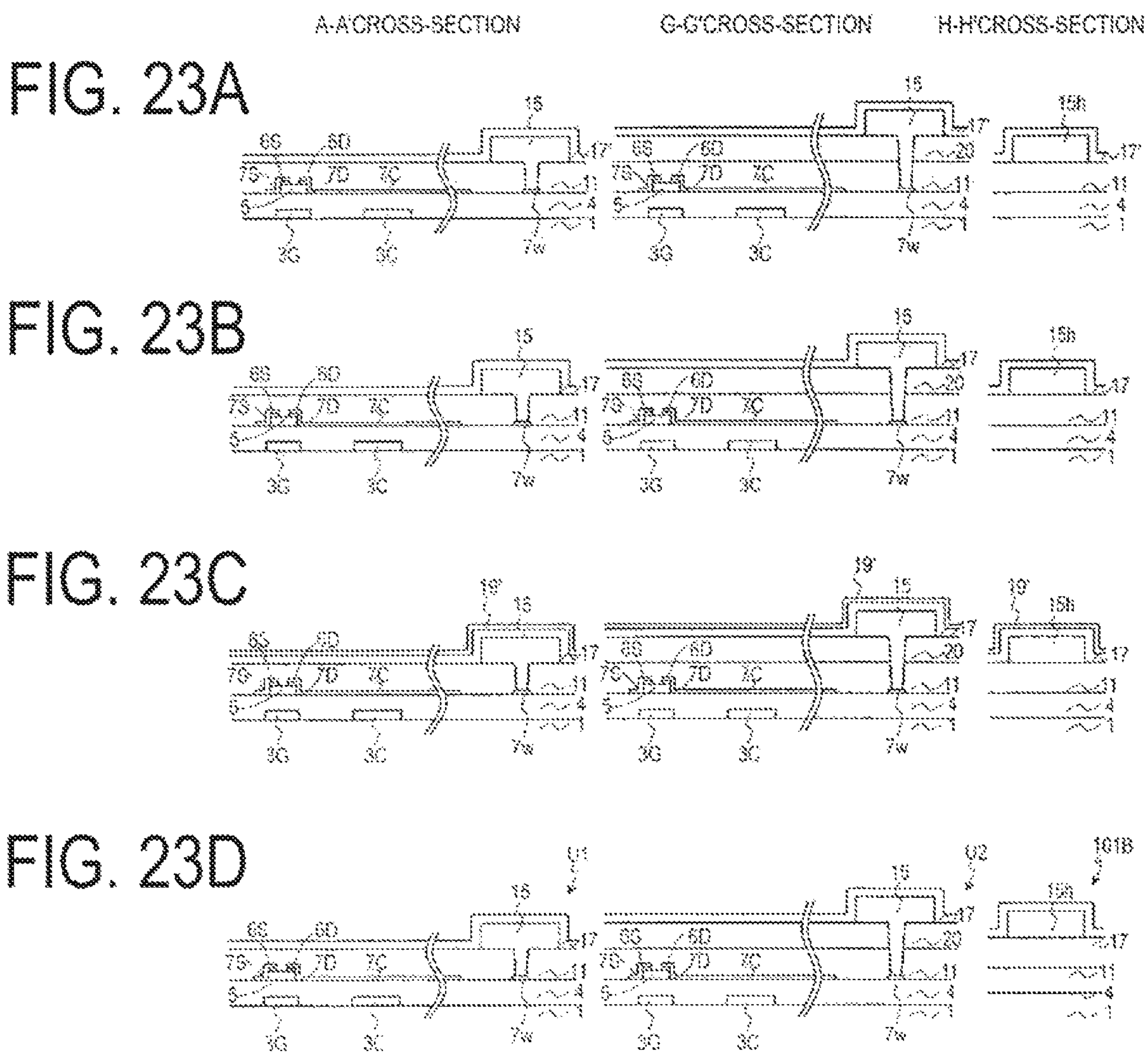
FIGS. 23A to 23D are schematic cross-sectional views for illustrating the manufacturing method of the TFT substrate 101B.

Next, as illustrated in FIG. 23A, the second insulating film 17' is formed on the patch metal layer 151, on the lower conductive layer 13, on the additional insulating layer 20, and on the first insulating layer 11.

Next, the second insulating film 17' is etched through a known photolithography process to form the second insulating layer 17 as illustrated in FIG. 23B. Here, the opening of the second insulating layer 17 is formed only in the non-transmission and/or reception region R2.

Next, as illustrated in FIG. 23C, the upper conductive film 19' is formed on the second insulating layer 17.

Next, the upper conductive film 19' is patterned to form the upper conductive layer 19 as illustrated in FIG. 23D. The upper conductive layer 19 is formed only in the non-transmission and/or reception region R2.

In this manner, the TFT substrate 101B is manufactured.

Modified Example

A scanning antenna 1000Ba according to Modified Example of the present embodiment will be described with reference to FIGS. 24A and 24B and FIGS. 25A to 25D. Common reference numerals may be assigned to the configuration common to the scanning antenna 1000B, and descriptions thereof may be omitted.

Figure 24B:
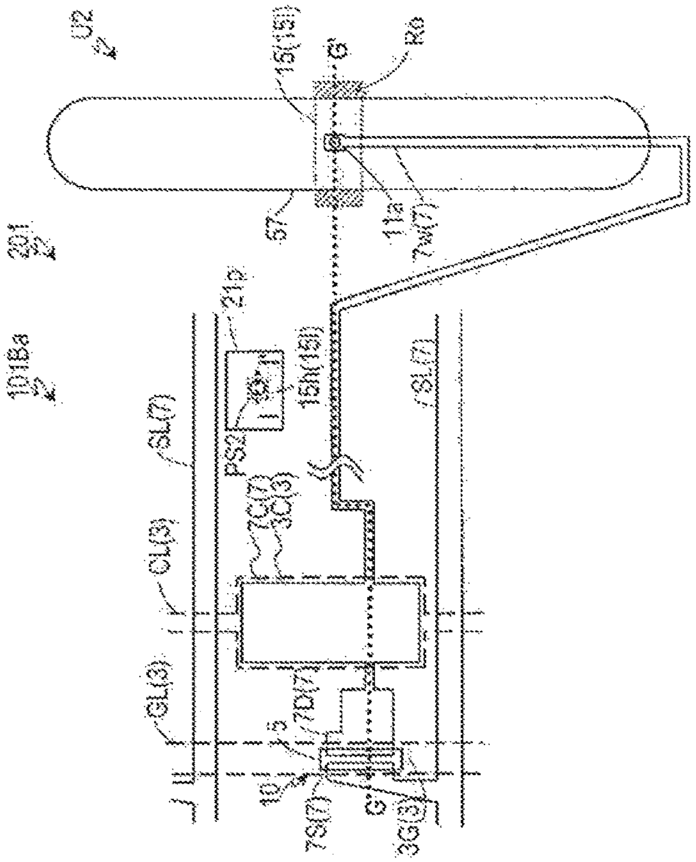
FIGS. 24A and 24B are schematic plan views illustrating a transmission and/or reception region R1 of a scanning antenna 1000Ba according to Modified Example of the second embodiment of the present disclosure.
Figure 24A:
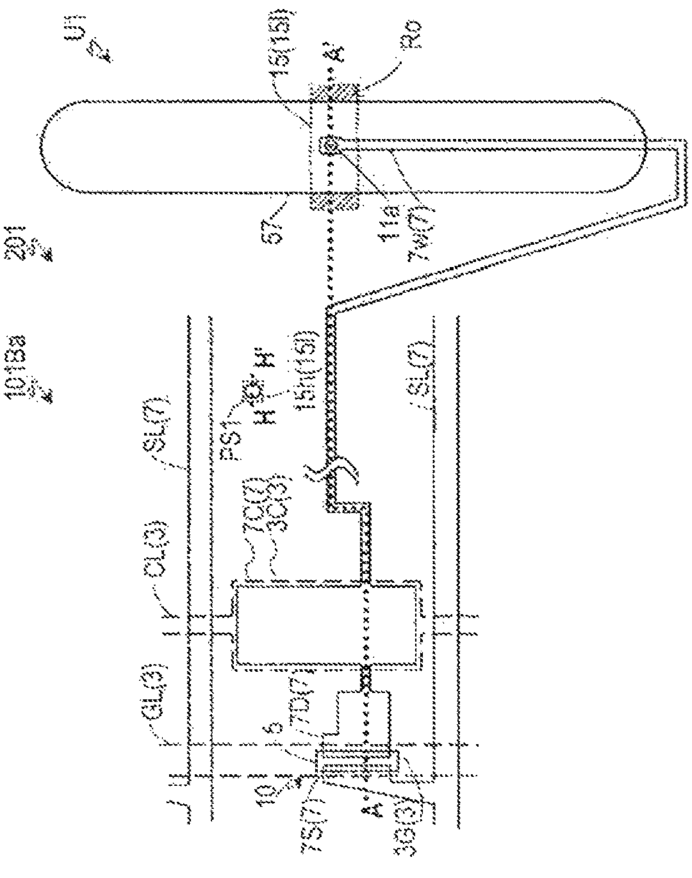
Figure 25A:
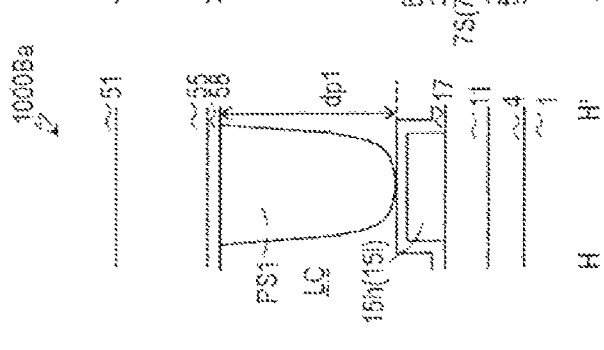
FIGS. 25A to 25D are schematic cross-sectional views illustrating the transmission and/or reception region R1 of the scanning antenna 1000Ba.
Figure 25B:
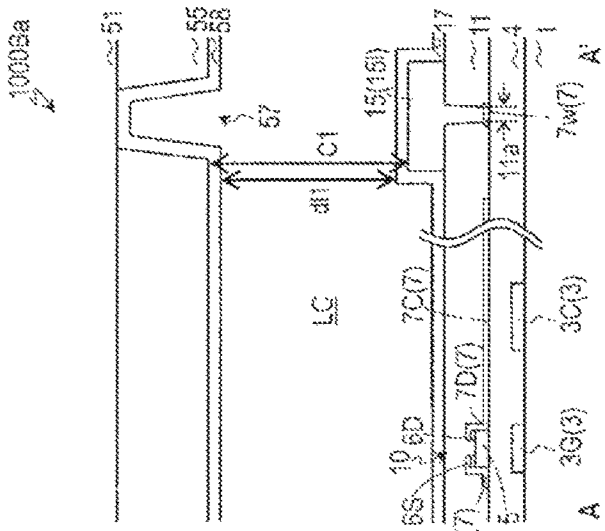
Figure 25C:
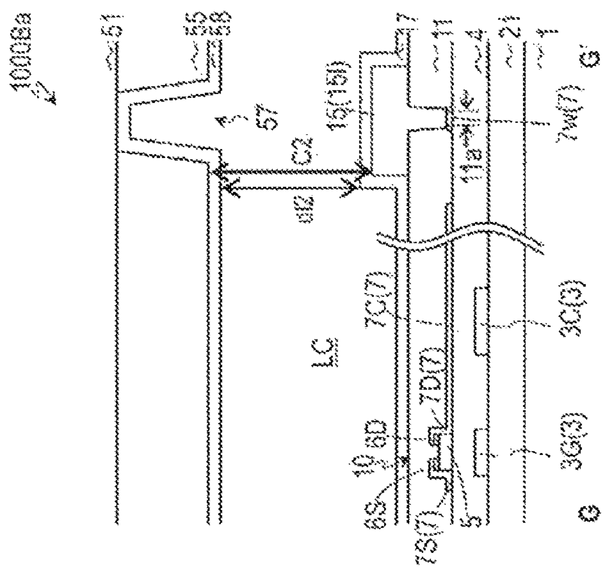
Figure 25D:
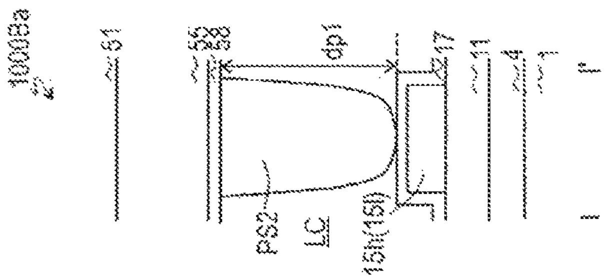

FIGS. 24A and 24B are schematic plan views of a transmission and/or reception region R1 of the scanning antenna 1000Ba, and FIGS. 25A to 25D are schematic cross-sectional views of the transmission and/or reception region R1 of the scanning antenna 1000Ba. FIG. 24A is a schematic plan view of first antenna units U1 of the transmission and/or reception region R1 of the scanning antenna 1000Ba, and FIG. 24B is a schematic plan view of second antenna units U2 of the transmission and/or reception region R1 of the scanning antenna 1000Ba. FIGS. 25A and 25B are schematic cross-sectional views of the first antenna units U1 of the transmission and/or reception region R1 of the scanning antenna 1000Ba, and FIGS. 25C and 25D are schematic cross-sectional views of the second antenna units U2 of the transmission and/or reception region R1 of the scanning antenna 1000Ba. FIGS. 25A to 25D illustrate cross-sections along the line H-H' and the line A-A' in FIG. 24A and the cross-sections along line G-G' and line I-I' in FIG. 24B, respectively.

The TFT substrate 101B included in the scanning antenna 1000B includes the additional insulating layer 20 provided between the first insulating layer 11 and the patch metal layer 151. In contrast, a TFT substrate 101Ba included in the scanning antenna 1000Ba differs from the TFT substrate 101B in that the TFT substrate 101Ba includes an additional insulating layer 21 formed between the first dielectric substrate 1 and the gate insulating layer 4. The additional insulating layer 21 may be formed from the same material as the additional insulating layer 20 of the TFT substrate 101B.

Here, the additional insulating layer 21 is formed not to overlap with the columnar spacer PS2 of the second antenna units U2. For example, the additional insulating layer 21 includes an opening 21*p* that overlaps with the columnar spacer PS2 of the second antenna units U2 when viewed from the normal direction of the first dielectric substrate 1. As a result, the columnar spacer PS1 of the first antenna units U1 and the columnar spacer PS2 of the second antenna units U2 have the same height dp1. However, as described above, the heights of the columnar spacer PS1 of the first antenna units U1 and the columnar spacer PS2 of the second antenna units U2 may be different from each other.

The TFT substrate 101Ba can be manufactured by appropriately changing the manufacturing method of the TFT substrate 101B, and thus illustration and description thereof are omitted.

Third Embodiment

In the present embodiment, by forming an opening or a recessed portion overlapping at least the first region Ro in the insulating layer (here, the gate insulating layer 4 and/or the first insulating layer 11), the sum of the thicknesses of the first region Ro of the antenna unit and the insulating layer between the first dielectric substrate 1 and the patch electrode 15 is varied between the first antenna units U1 and the second antenna units U2. Here, the opening is a through-hole that penetrates the insulating layer, and the recessed portion is a recess formed on the surface of the insulating layer.

The structure of a transmission and/or reception region R1 of a scanning antenna 1000C according to the present embodiment will be described with reference to FIGS. 26A and 26B and FIGS. 27A to 27D. Common reference numerals may be assigned to the configuration common to the scanning antenna 1000B, and descriptions thereof may be omitted. The following mainly describes the points different from the previous embodiments.

Figure 26B:
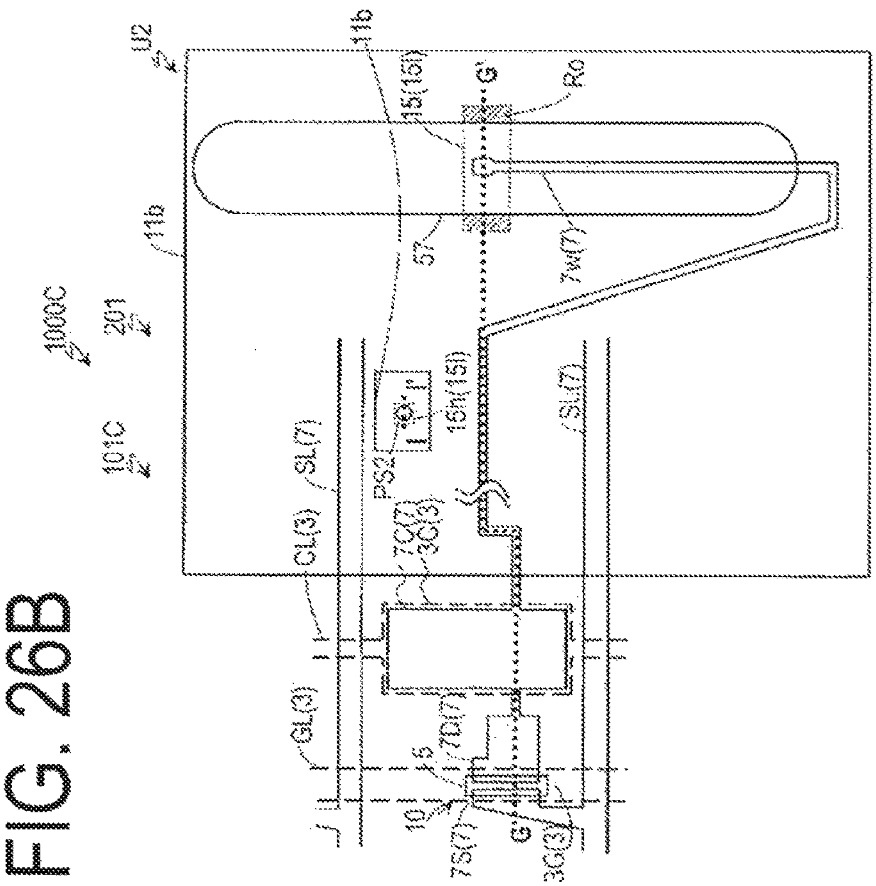
FIGS. 26A and 26B are schematic plan views illustrating a transmission and/or reception region R1 of a scanning antenna 1000C according to a third embodiment of the present disclosure.
Figure 26A:
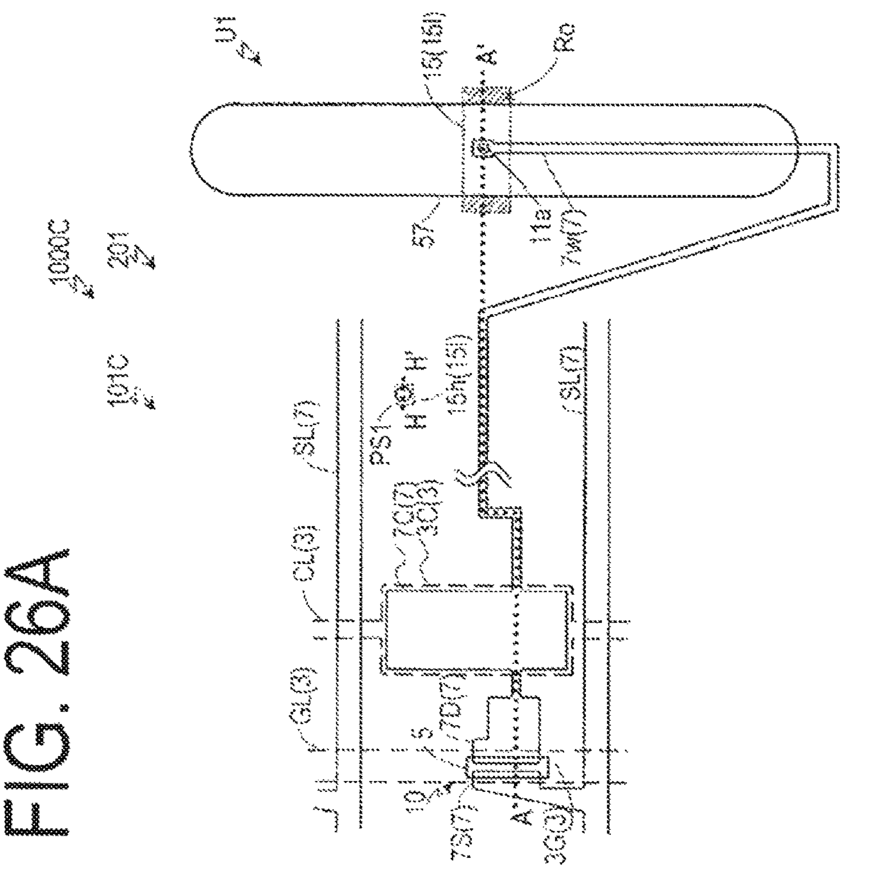
Figures 27A, 27B, 27C, 27D:
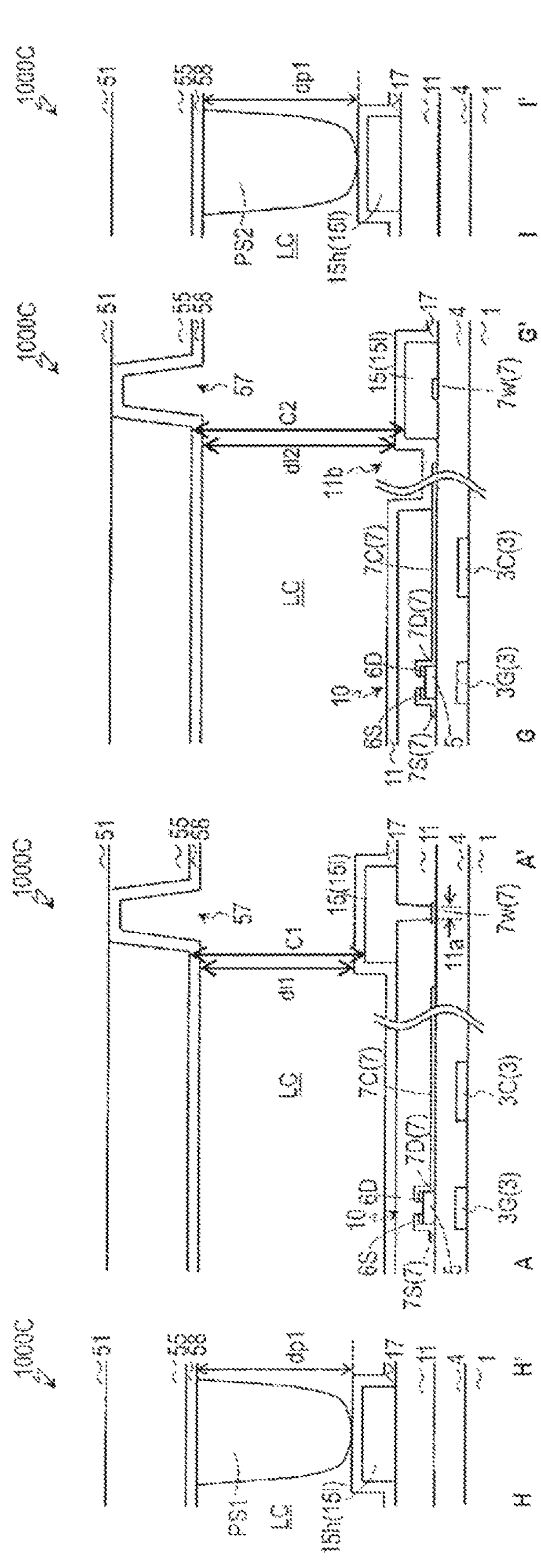
FIGS. 27A to 27D are schematic cross-sectional views illustrating a transmission and/or reception region R1 of the scanning antenna 1000C.

FIGS. 26A and 26B are schematic plan views of the transmission and/or reception region R1 of the scanning antenna 1000C, and FIGS. 27A to 27D are schematic cross-sectional views of the transmission and/or reception region R1 of the scanning antenna 1000C. FIG. 26A is a schematic plan view of the first antenna unit U1 of the transmission and/or reception region R1 of the scanning antenna 1000C, and FIG. 26B is a schematic plan view of the second antenna unit U2 of the transmission and/or reception region R1 of the scanning antenna 1000C. FIGS. 27A and 27B are schematic cross-sectional views of the first antenna unit U1 of the transmission and/or reception region R1 of the scanning antenna 1000C, and FIGS. 27C and 27D are schematic cross-sectional views of the second antenna unit U2 of the transmission and/or reception region R1 of the scanning antenna 1000C. FIGS. 27A to 27D illustrate cross-sections along the line H-H' and the line A-A' in FIG. 26A and the cross-sections along line G-G' and line I-I' in FIG. 26B, respectively.

The TFT substrate 101C included in the scanning antenna 1000C includes an opening 11*b* that overlaps at least the first region Ro of the second antenna units U2 formed in the first insulating layer 11. Here, when viewed from the normal direction of the dielectric substrate 1, the opening 11*b* overlaps with the patch electrode 15 of the second antenna units U2, and the patch electrode 15 of the second antenna units U2 is formed in the opening 11*b*. Accordingly, the sum of the thicknesses of the first region Ro of the plurality of first antenna units U1 and the insulating layer (the gate insulating layer 4 and the first insulating layer 11) between the first dielectric substrate 1 and the patch electrode 15 is greater than the sum of the thicknesses of the first region Ro of the plurality of second antenna units U2 and the insulating layer (gate insulating layer 4) between the first dielectric substrate 1 and the patch electrode 15. Thus, the distance C1 in the normal direction of the dielectric substrate 1 between the patch electrode 15 and the slot electrode 55 of the plurality of first antenna units U1 is smaller than the distance C2 in the normal direction of the dielectric substrate 1 between the patch electrode 15 and the slot electrode 55 of the plurality of second antenna units U2. The thickness dl1 of the liquid crystal layer LC in the first region Ro of the plurality of first antenna units U1 is smaller than the thickness dl2 of the liquid crystal layer LC of the first region Ro of the plurality of second antenna units U2.

Here, the opening 11*b* is formed not to overlap with the columnar spacer PS2 of the second antenna units U2. That is, the first insulating layer 11 is formed to cover the columnar spacer PS2 of the second antenna units U2 when viewed from the normal direction of the dielectric substrate 1. Therefore, the columnar spacer PS1 of the first antenna units U1 and the columnar spacer PS2 of the second antenna units U2 have the same height dp1. This has the advantage of being easy to form the columnar spacer PS. However, the opening 11*b* may be formed overlapping the columnar spacer PS2 of the second antenna units U2. In this case, the heights of the columnar spacer PS1 of the first antenna units U1 and the columnar spacer PS2 of the second antenna units U2 are different from each other.

Manufacturing Method of TFT Substrate 101C

A description is given of a manufacturing method of the TFT substrate 101C with reference to FIGS. 28A to 28E and FIGS. 29A to 29D.

FIGS. 28A to 28E and FIGS. 29A to 29D are schematic cross-sectional views for illustrating a manufacturing method of the TFT substrate 101C. FIGS. 28A to 28E and FIGS. 29A to 29D illustrate cross-sections corresponding to FIG. 27B, FIG. 27C, and FIG. 27A (cross-section A-A', cross-section G-G', and cross-section H-H' of the TFT substrate 101C). The following description mainly describes differences from the manufacturing method of the TFT substrate 101A described with reference to FIGS. 10A to 15E.

First, as illustrated in FIGS. 10A to 10G, a gate metal layer 3, a gate insulating film 4', an island-shaped semiconductor layer 5, a source contact portion 6S, a drain contact portion 6D, a source metal layer 7, and a first insulating film 11' are formed on the dielectric substrate 1. Here, as the first insulating film 11', a $Si—_xN_y$ film having a thickness of 200 nm, for example, is formed.

Figures 28A, 28B, 28C, 28D, 28E:
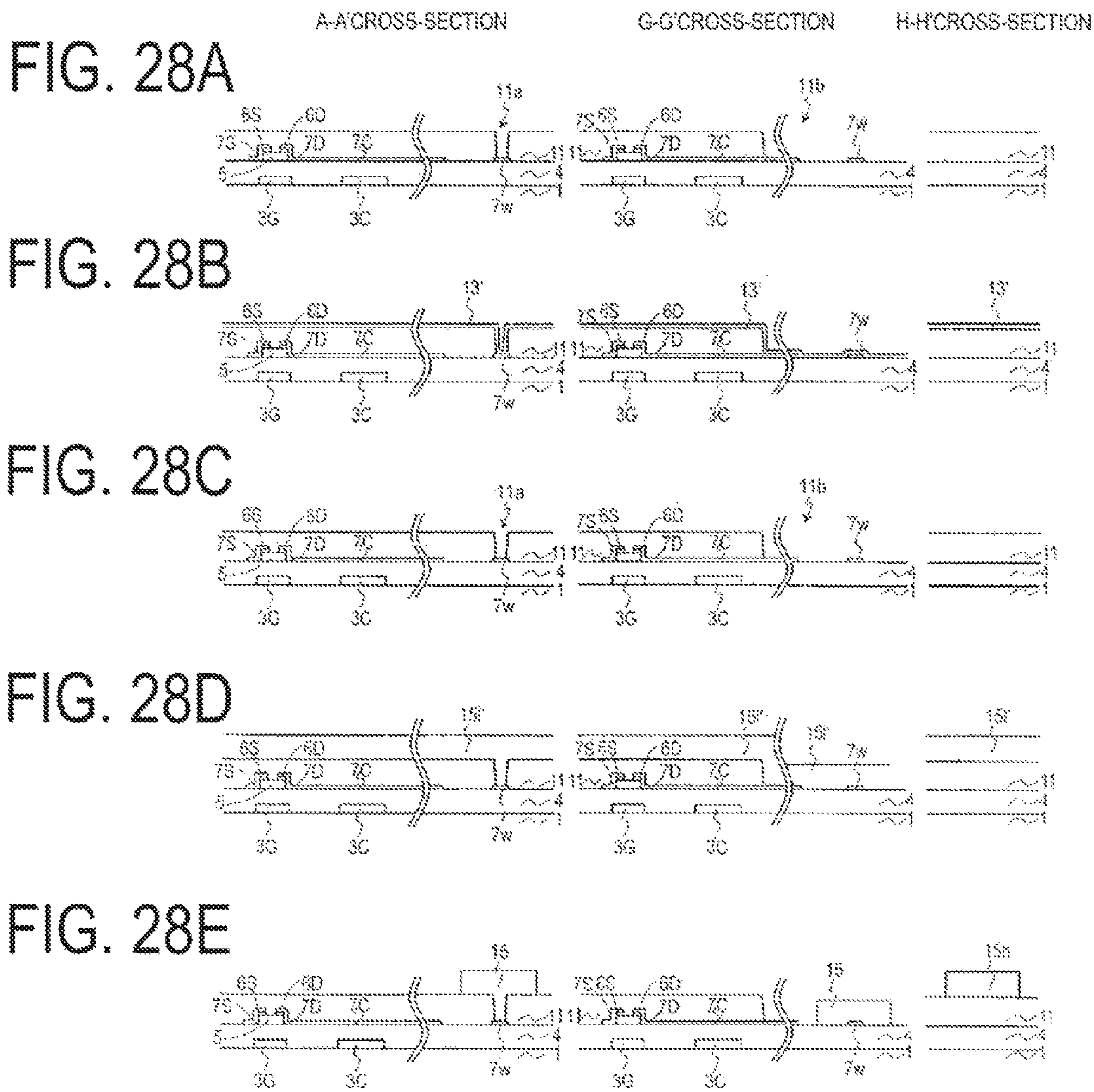
FIGS. 28A to 28E are schematic cross-sectional views for illustrating a manufacturing method of a TFT substrate 101C included in the scanning antenna 1000C.

Subsequently, as illustrated in FIG. 28A, the first insulating film 11' and the gate insulating film 4' are etched through a known photolithography process to form the first insulating layer 11 and the gate insulating layer 4. Here, in the first antenna unit formation region, the opening 11*a* that at least reaches a portion of the source metal layer 7 that is electrically connected to the drain electrode 7D (here, the wiring line 7*w*) is formed in the first insulating film 11'. In the second antenna unit formation region, the opening 11*b* is formed in the first insulating film 11' so as to overlap with the region that is the first region.

Next, as illustrated in FIG. 28B, a lower conductive film 13' is formed on the first insulating layer 11, within the opening 11*a*, and within the opening 11*b*.

Next, the lower conductive film 13' is patterned to form the lower conductive layer 13 as illustrated in FIG. 28C. Here, the lower conductive layer 13 is formed only in the non-transmission and/or reception region R2.

Next, as illustrated in FIG. 28D, the patch conductive film 151' is formed on the lower conductive layer 13 and the first insulating layer 11.

Next, as illustrated in FIG. 28E, the patch metal layer 151 is formed by patterning the patch conductive film 151'. The patch electrode 15 and the protruding portion 15*h* are formed in each antenna unit formation region (the first antenna unit formation region or the second antenna unit formation region). Here, the patch electrode 15 in the first antenna unit formation region is formed on the first insulating layer 11, and the patch electrode 15 in the second antenna unit formation region is formed in the opening 11*b* formed in the first insulating layer 11.

Figure 29A:
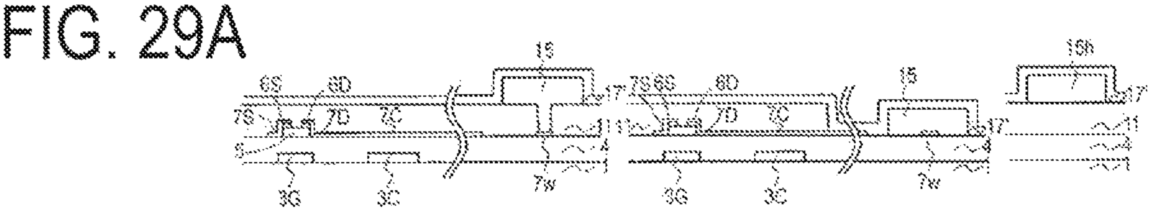
FIGS. 29A to 29D are schematic cross-sectional views for illustrating the manufacturing method of the TFT substrate 101C.

Next, as illustrated in FIG. 29A, the second insulating film 17' is formed on the patch metal layer 151, on the lower conductive layer 13 and on the first insulating layer 11.

Figure 29B:
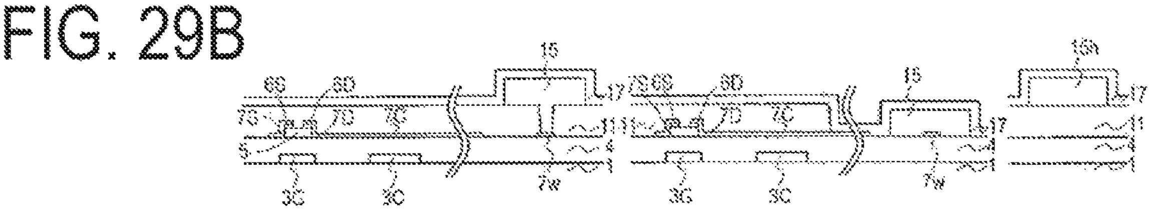

Next, the second insulating film 17' is etched through a known photolithography process to form the second insulating layer 17 as illustrated in FIG. 29B. Here, the opening of the second insulating layer 17 is formed only in the non-transmission and/or reception region R2.

Figure 29C:
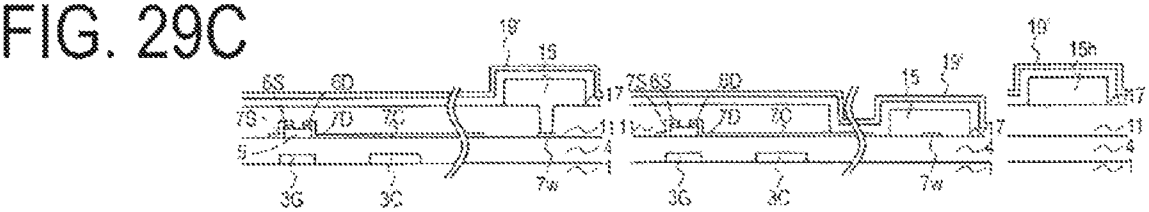

Next, as illustrated in FIG. 29C, the upper conductive film 19' is formed on the second insulating layer 17.

Figure 29D:
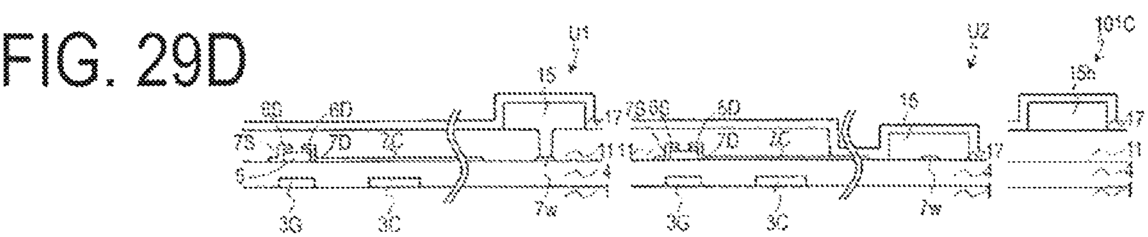

Next, the upper conductive film 19' is patterned to form the upper conductive layer 19 as illustrated in FIG. 29D. The upper conductive layer 19 is formed only in the non-transmission and/or reception region R2.

In this manner, the TFT substrate 101C is manufactured.

The slot substrate 201 is manufactured by the method described above. Here, the columnar spacers PS1 and PS2 may be formed by using an acrylic resin film (having a thickness of 2.4 μm, for example).

Here, for example, the distance C1 in the normal direction of the dielectric substrate 1 between the patch electrode 15 and the slot electrode 55 of the plurality of first antenna units U1 is 2.6 μm (design value), and the distance C2 in the normal direction of the dielectric substrate 1 between the patch electrode 15 and the slot electrode 55 of the plurality of second antenna units U2 is 2.8 μm (design value). The difference between the distance C2 and the distance C1 (C2−C1) is 0.2 μm (design value). Here, the difference between the distance C2 and the distance C1 (C2−C1) corresponds to the thickness of the first insulating layer 11, for example. For example, depending on the environment temperature at which the scanning antenna is installed, for example, the distance C1 may vary approximately from 2.2 μm to 2.7 μm, and the distance C2 may vary approximately from 2.7 μm to 3.2 μm. The difference between the distance C1 and the distance C2 (C2−C1) may vary approximately from 0.05 μm to 1.0 μm.

Modified Example 1

A scanning antenna 1000Ca according to Modified Example 1 of the present embodiment will be described with reference to FIGS. 30A and 30B and FIGS. 31A to 31D. Common reference numerals may be assigned to the configuration common to the scanning antenna 1000C, and descriptions thereof may be omitted.

Figure 30B:
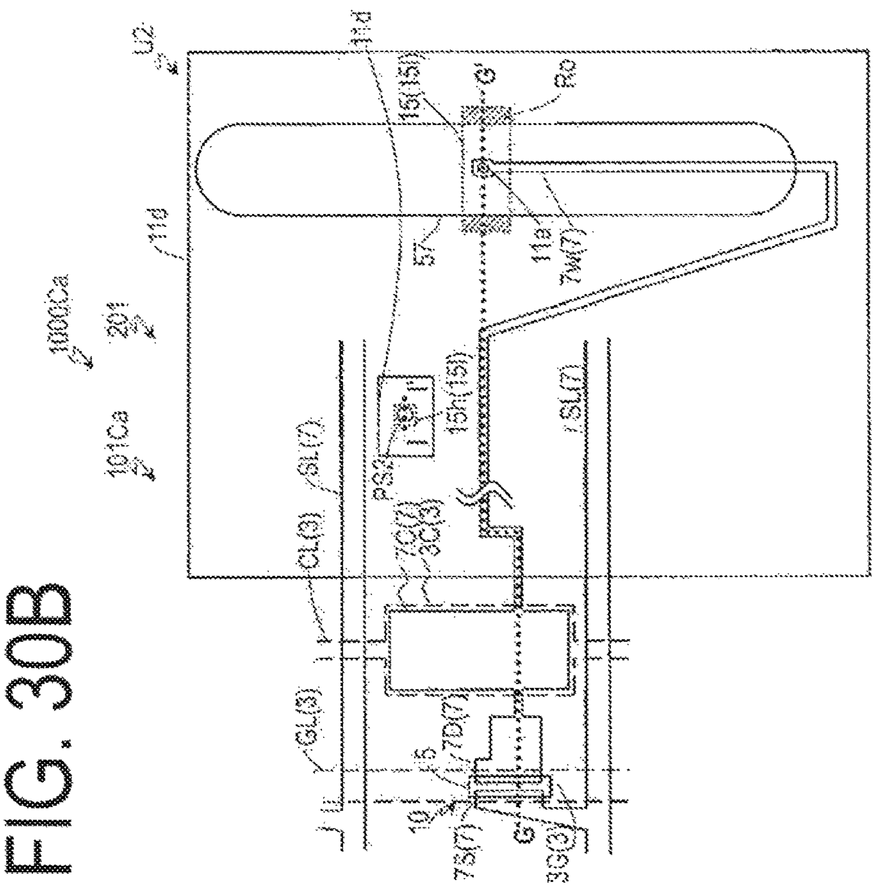
FIGS. 30A and 30B are schematic plan views illustrating a transmission and/or reception region R1 of a scanning antenna 1000Ca according to Modified Example 1 of the third embodiment of the present disclosure.
Figure 30A:
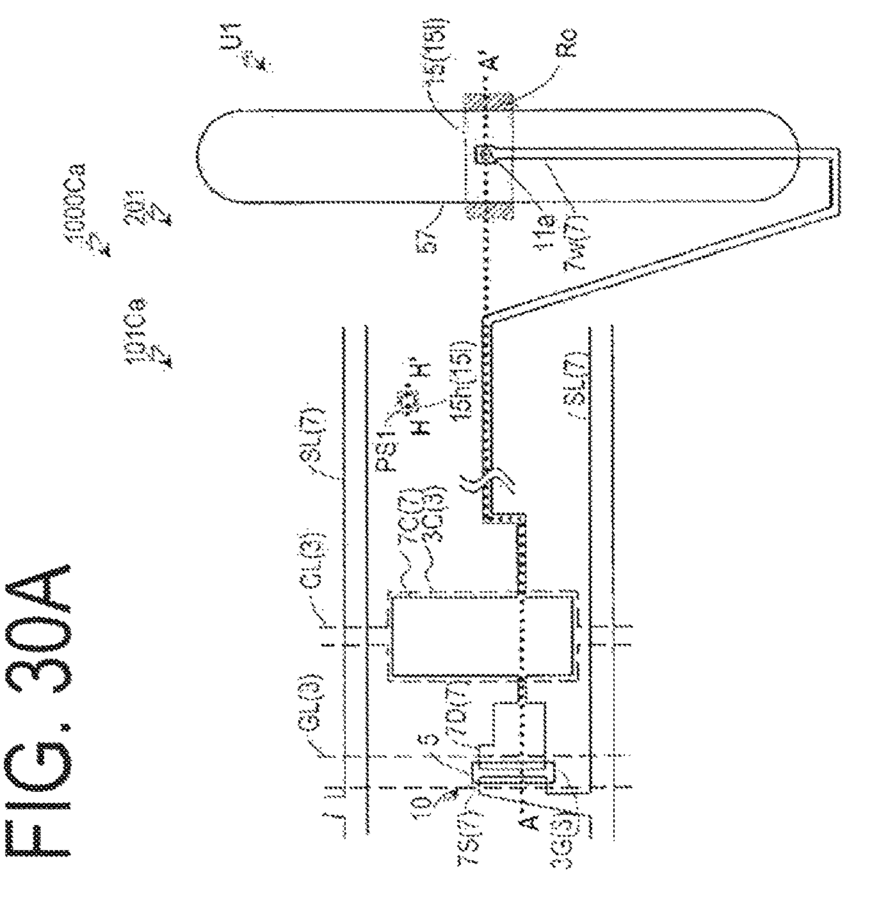
Figures 31A, 31B, 31C, 31D:
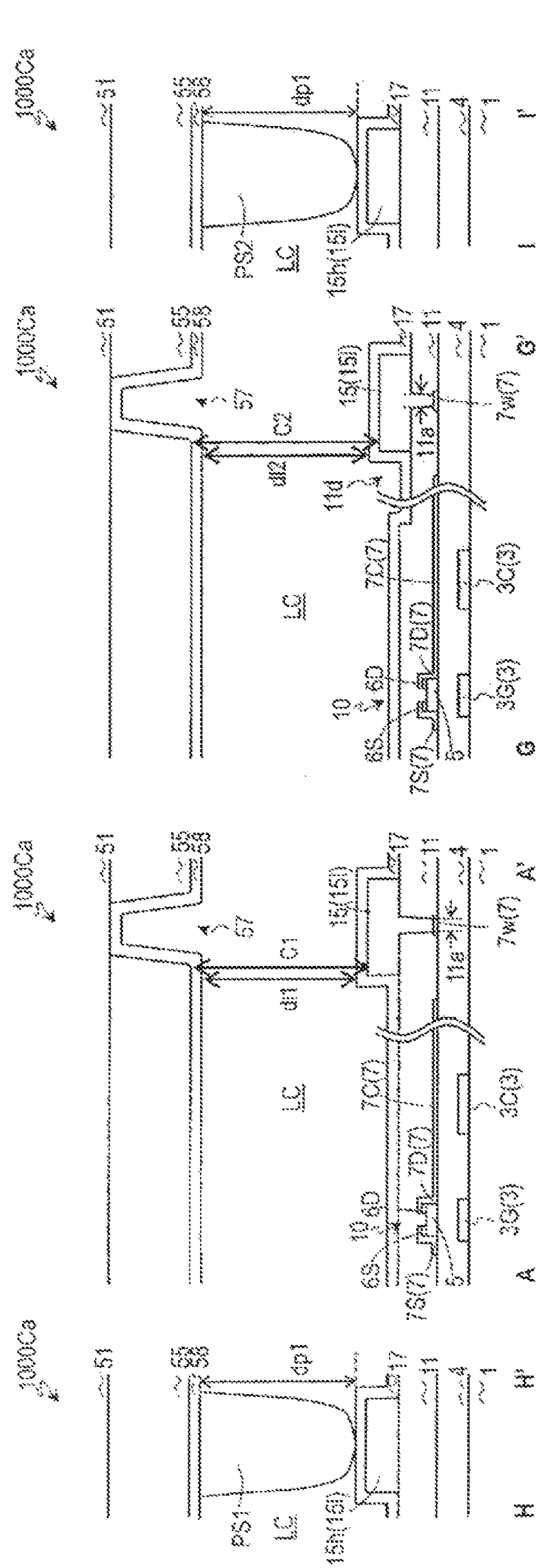
FIGS. 31A to 31D are schematic cross-sectional views illustrating the transmission and/or reception region R1 of the scanning antenna 1000Ca.

FIGS. 30A and 30B are schematic plan views of a transmission and/or reception region R1 of the scanning antenna 1000Ca, and FIGS. 31A to 31D are schematic cross-sectional views of the transmission and/or reception region R1 of the scanning antenna 1000Ca. FIG. 30A is a schematic plan view of first antenna units U1 of the transmission and/or reception region R1 of the scanning antenna 1000Ca, and FIG. 30B is a schematic plan view of second antenna units U2 of the transmission and/or reception region R1 of the scanning antenna 1000Ca. FIGS. 31A and 31B are schematic cross-sectional views of the first antenna units U1 of the transmission and/or reception region R1 of the scanning antenna 1000Ca, and FIGS. 31C and 31D are schematic cross-sectional views of the second antenna units U2 of the transmission and/or reception region R1 of the scanning antenna 1000Ca. FIGS. 31A to 31D illustrate cross-sections along the line H-H' and the line A-A' in FIG. 30A and the cross-sections along line G-G' and line I-I' in FIG. 30B, respectively.

The TFT substrate 101C included in the scanning antenna 1000C includes an opening lib that overlaps at least the first region Ro of the second antenna units U2 formed in the first insulating layer 11. In contrast, a TFT substrate 101Ca included in the scanning antenna 1000Ca differs from the TFT substrate 101C in that TFT substrate 101Ca includes a recessed portion 11*d* that overlaps at least the first region Ro of the second antenna units U2 formed in the first insulating layer 11. Here, the recessed portion 11*d* is formed to overlap with the patch electrode 15 of the second antenna units U2 when viewed from the normal direction of the dielectric substrate 1.

Here, the recessed portion 11*d* is formed not to overlap with the columnar spacer PS2 of the second antenna units U2. Therefore, the columnar spacer PS1 of the first antenna units U1 and the columnar spacer PS2 of the second antenna units U2 have the same height dp1. However, the recessed portion 11*d* may be formed overlapping the columnar spacer PS2 of the second antenna units U2. In this case, the heights of the columnar spacer PS1 of the first antenna units U1 and the columnar spacer PS2 of the second antenna units U2 are different from each other.

The TFT substrate 101Ca can be manufactured by changing the etching amount of the first insulating film 11' from the manufacturing method of the TFT substrate 101C, and thus illustration and description thereof are omitted. Here, as the first insulating layer 11, a $Si_xN_y$ film having a thickness of 500 nm, for example, is formed, and the difference between the thickness of the first insulating layer 11 in the recessed portion 11*d* and the thickness of the first insulating layer 11 outside the recessed portion 11*d* is, for example, 200 nm. Here, the difference (C2−C1) between the distance C2 in the normal direction of the dielectric substrate 1 between the patch electrode 15 and the slot electrode 55 of the plurality of second antenna units U2 and the distance C1 in the normal direction of the dielectric substrate 1 between the patch electrode 15 and the slot electrode 55 of the plurality of first antenna units U1 corresponds to the difference between the thickness of the first insulating layer 11 in the recessed portion 11*d* and the thickness of the first insulating layer 11 outside the recessed portion 11*d*, for example.

Modified Example 2

A scanning antenna 1000C1 according to Modified Example 2 of the present embodiment will be described with reference to FIGS. 32A and 32B and FIGS. 33A to 33D. Common reference numerals may be assigned to the configuration common to the scanning antenna 1000C, and descriptions thereof may be omitted.

Figure 32B:
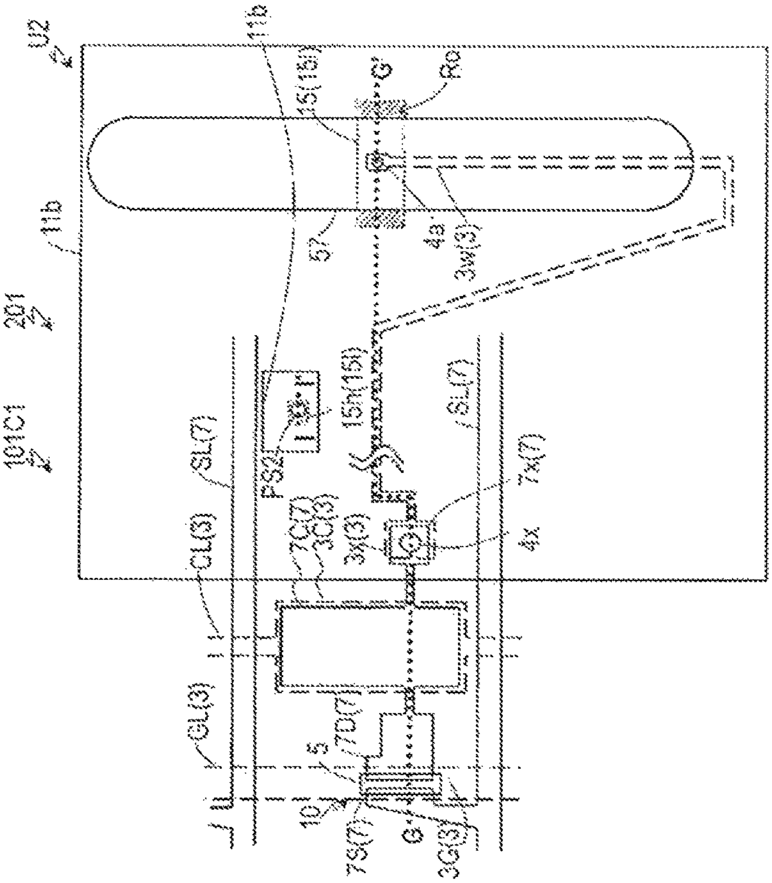
FIGS. 32A and 32B are schematic plan views illustrating a transmission and/or reception region R1 of a scanning antenna 1000C1 according to Modified Example 2 of the third embodiment of the present disclosure.
Figure 32A:
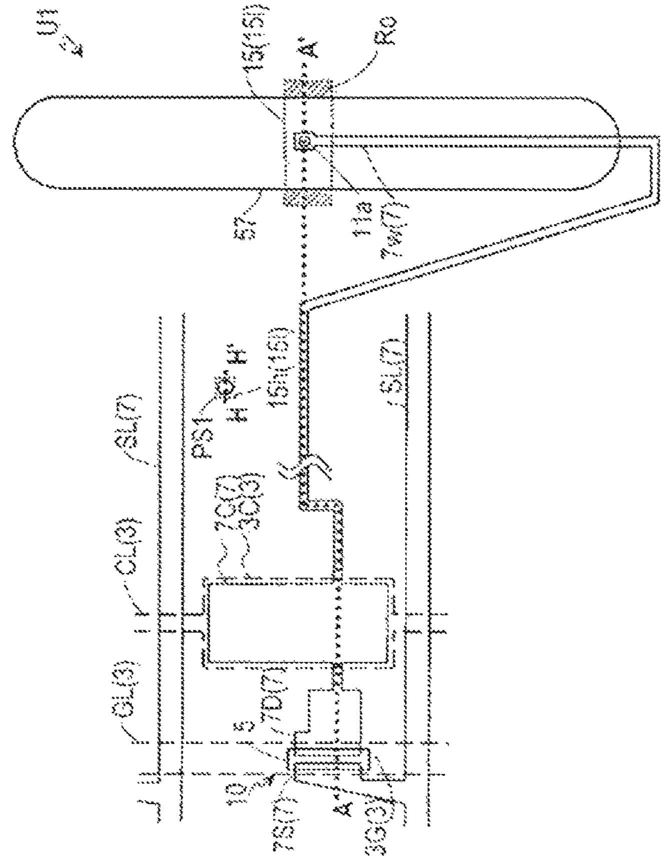
Figures 33A, 33B, 33C, 33D:
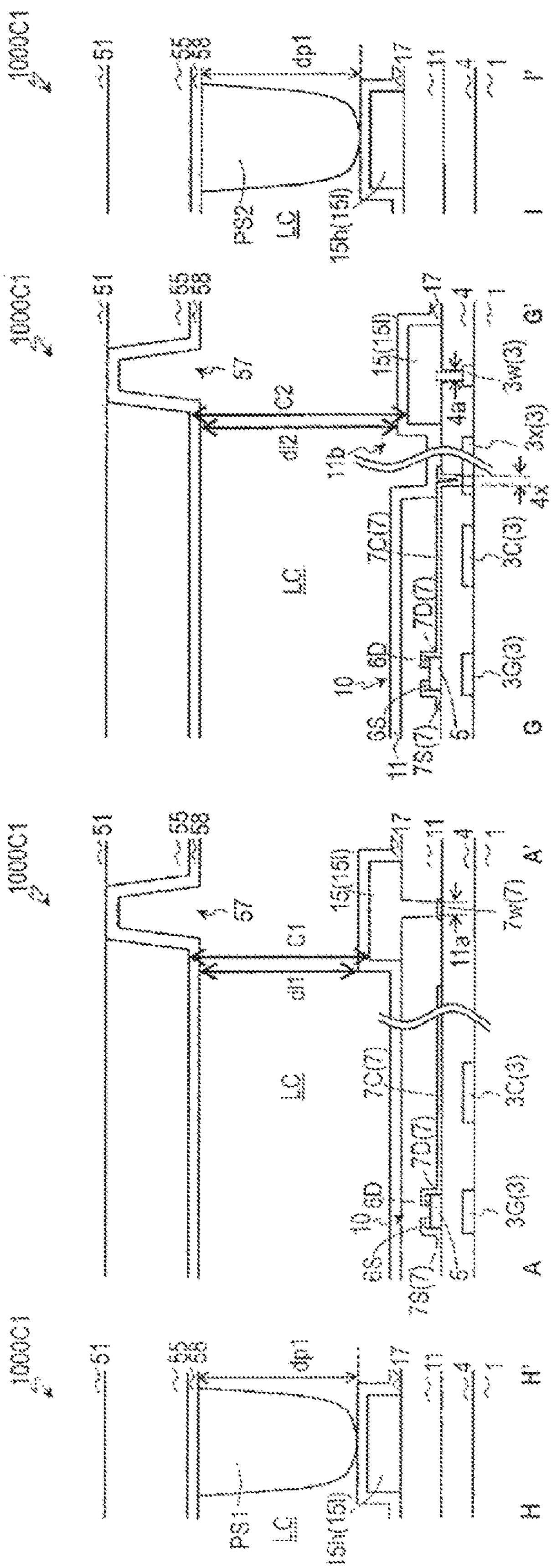
FIGS. 33A to 33D are schematic cross-sectional views illustrating the transmission and/or reception region R1 of the scanning antenna 1000C1.

FIGS. 32A and 32B are schematic plan views of a transmission and/or reception region R1 of the scanning antenna 1000C1, and FIGS. 33A to 33D are schematic cross-sectional views of the transmission and/or reception region R1 of the scanning antenna 1000C1. FIG. 32A is a schematic plan view of first antenna units U1 of the transmission and/or reception region R1 of the scanning antenna 1000C1, and FIG. 32B is a schematic plan view of second antenna units U2 of the transmission and/or reception region R1 of the scanning antenna 1000C1. FIGS. 33A and 33B are schematic cross-sectional views of the first antenna units U1 of the transmission and/or reception region R1 of the scanning antenna 1000C1, and FIGS. 33C and 33D are schematic cross-sectional views of the second antenna units U2 of the transmission and/or reception region R1 of the scanning antenna 1000C1. FIGS. 33A to 33D illustrate cross-sections along the line H-H' and the line A-A' in FIG. 32A and the cross-sections along line G-G' and line I-I' in FIG. 32B, respectively.

The structure of the first antenna units U1 of the scanning antenna 1000C1 has the same structure as the first antenna units U1 of the scanning antenna 1000C. The structure of the second antenna units U2 of the scanning antenna 1000C1 differs from the second antenna units U2 of the scanning antenna 1000C in that the wiring line 3*w* that electrically connects the patch electrode 15 and the drain electrode 7D is formed by the gate metal layer 3. A portion 3*x* extending from the wiring line 3*w* is connected to a portion 7*x* extending from the auxiliary capacitance electrode 7C via an opening 4*x* that is formed in the gate insulating layer 4 and that at least reaches the portion 3*x*. That is, the portion 7*x* is connected to the portion 3*x* within the opening 4*x*.

Manufacturing Method of TFT Substrate 101C1

As described below, the TFT substrate 101C1 included in the scanning antenna 1000C1 can be manufactured by changing the patterning shape of the gate conductive film 3' from the manufacturing method of the TFT substrate 101C.

A description is given of a manufacturing method of the TFT substrate 101C1 with reference to FIG. 34A to FIG. 36E.

FIG. 34A to FIG. 36E are schematic cross-sectional views for illustrating a manufacturing method of the TFT substrate 101C1. FIG. 34A to FIG. 36E illustrate cross-sections corresponding to FIG. 33B, FIG. 33C, and FIG. 33A (cross-section A-A', cross-section G-G', and cross-section H-H' of the TFT substrate 101C1). The following description mainly describes differences from the manufacturing method of the TFT substrate 101C described with reference to FIGS. 28A to 28E and FIGS. 29A to 29D.

Figures 34A, 34B, 34C, 34D, 34E, 34F, 34G:
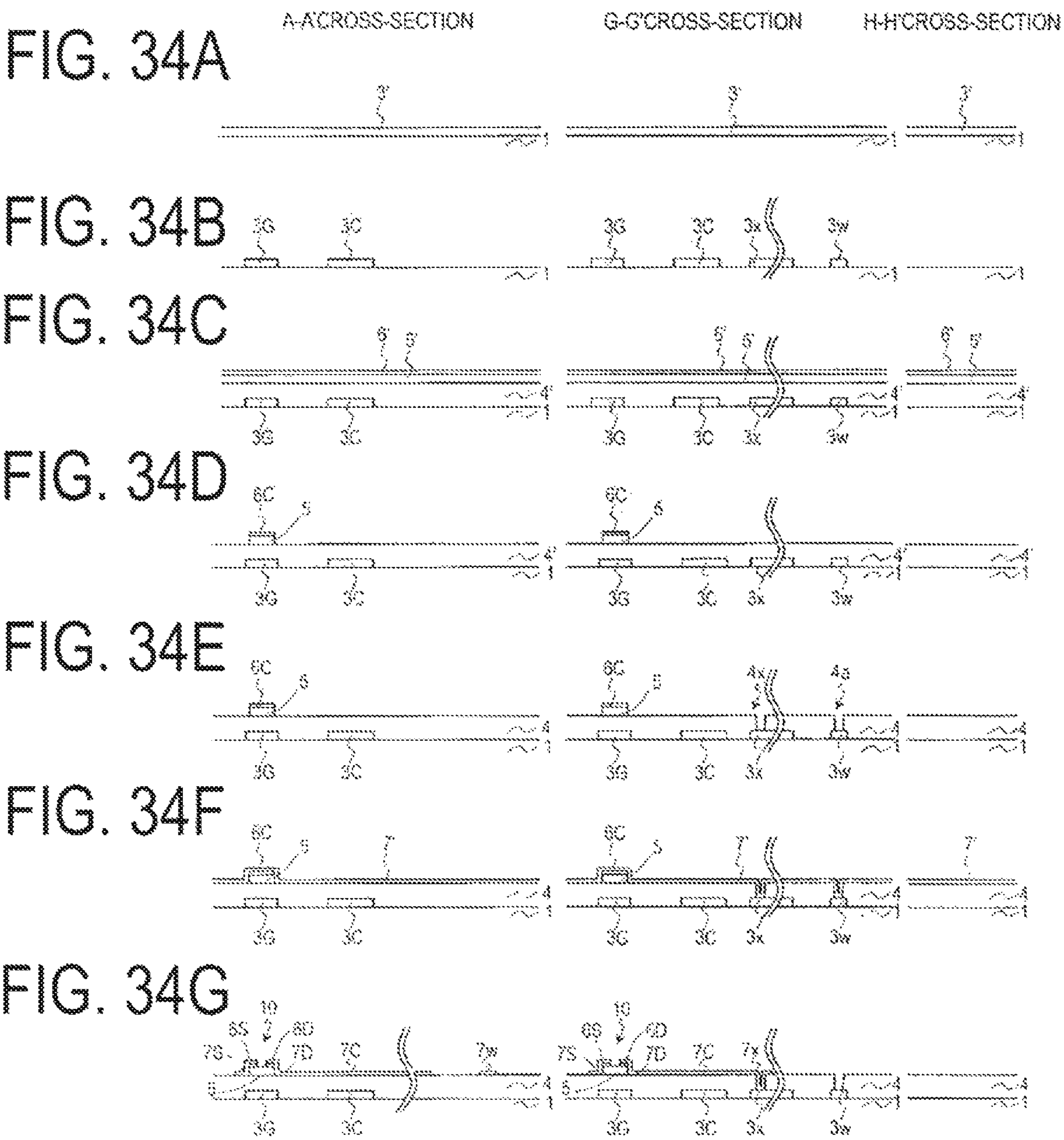
FIGS. 34A to 34G are schematic cross-sectional views for illustrating a manufacturing method of a TFT substrate 101C1 included in the scanning antenna 1000C1.

First, as illustrated in FIG. 34A, a gate conductive film 3' is formed on the dielectric substrate 1 by a sputtering method or the like.

Next, the gate conductive film 3' is patterned to form the gate metal layer 3 as illustrated in FIG. 34B. Here, the present example differs from the manufacturing method of the TFT substrate 101C in that the wiring line 3*w* and the portion 3*x* extending from the wiring line 3*w* are formed in the second antenna unit formation region.

After that, as illustrated in FIG. 34C, a gate insulating film 4', an intrinsic amorphous silicon film 5', and an $n^+$ type amorphous silicon film 6' are formed in this order to cover the gate metal layer 3.

Next, the intrinsic amorphous silicon film 5' and the $n^+$ type amorphous silicon film 6' are patterned to obtain the island-shaped semiconductor layer 5 and the contact portion 6C as illustrated in FIG. 34D.

Next, as illustrated in FIG. 34E, the gate insulating film 4' is etched by a known photolithography process to form the gate insulating layer 4. Here, the opening 4*x* that at least reaches the portion 3*x* extending from the wiring line 3*w* and the opening 4*a* that at least reaches the wiring line 3*w* are formed in the second antenna unit formation region. In this process, the openings 4*sg*1, 4*g*, 4*s*, 4*c*, and 4*p*1 that at least reach each of the source lower connection wiring line 3*sg* and the lower connection sections 3*g*, 3*s*, 3*c*, 3*p*1 of the non-transmission and/or reception region R2 are formed in the gate insulating film 4'. Alternatively, as the manufacturing method described above, after forming the first insulating film 11', the gate insulating layer 4 and the first insulating layer 11 may be formed by collectively etching the gate insulating film 4' and the first insulating film 11' in the non-transmission and/or reception region R2, and forming a contact hole that at least reaches the lower connection section in the gate insulating film 4' and the first insulating film 11'.

Next, a source conductive film 7' is formed on the gate insulating layer 4, within the opening 4*x*, and on the contact portion 6C as illustrated in FIG. 34F.

Next, the source conductive film 7' is patterned to form the source metal layer 7 as illustrated in FIG. 34G. Accordingly, the TFT 10 is obtained. Here, in the second antenna unit formation region, the portion 7*x* extending from the auxiliary capacitance electrode 7C is formed in contact with the portion 3*x* that extends from the wiring line 3*w* in the opening 4*x*.

Figure 35A:
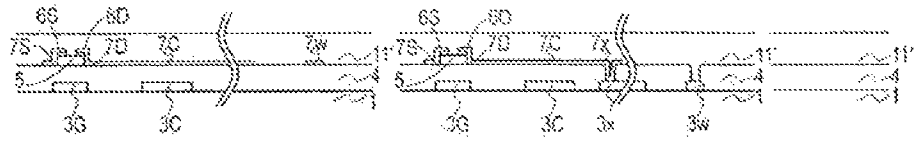
FIGS. 35A to 35E are schematic cross-sectional views for illustrating the manufacturing method of the TFT substrate 101C1.

Next, as illustrated in FIG. 35A, the first insulating film 11' is formed to cover the TFT 10 and the source metal layer 7.

Figure 35B:
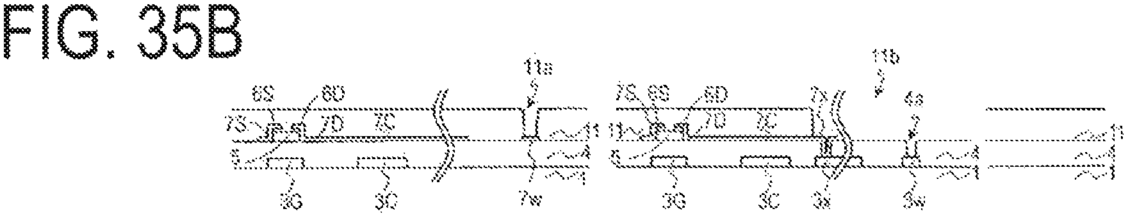

Next, as illustrated in FIG. 35B, the first insulating film 11' is etched by a known photolithography process to form the first insulating layer 11. In the first antenna unit formation region, the opening 11*a* that at least reaches the portion electrically connected to the drain electrode 7D of the source metal layer 7 (here, the wiring line 7*w*) is formed in the first insulating film 11', and in the second antenna unit formation region, the opening 11*b* is formed in the first insulating film 11' so as to overlap with the region that is the first region.

Figure 35C:
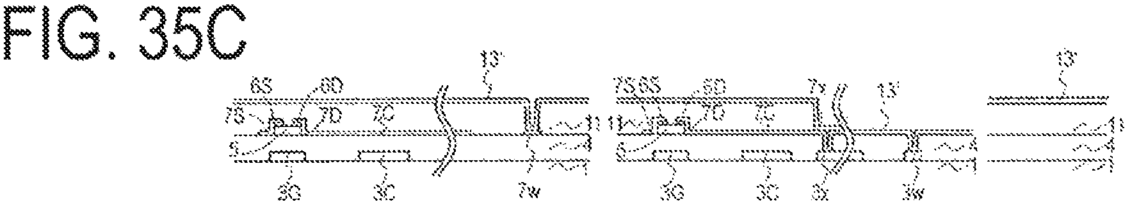

Next, as illustrated in FIG. 35C, a lower conductive film 13' is formed on the first insulating layer 11, within the opening 11*a*, and within the opening 11*b*.

Figure 35D:
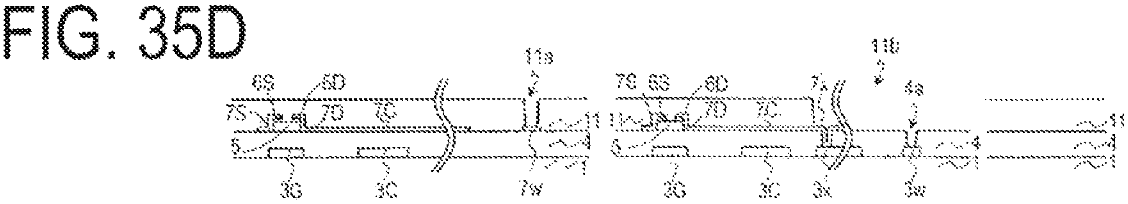

Next, the lower conductive film 13' is patterned to form the lower conductive layer 13 as illustrated in FIG. 35D. Here, the lower conductive layer 13 is formed only in the non-transmission and/or reception region R2.

Figure 35E:
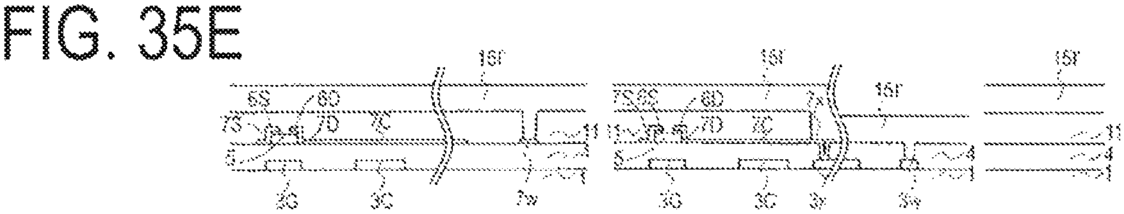

Next, as illustrated in FIG. 35E, the patch conductive film 151' is formed on the lower conductive layer 13 and the first insulating layer 11.

Figure 36A:
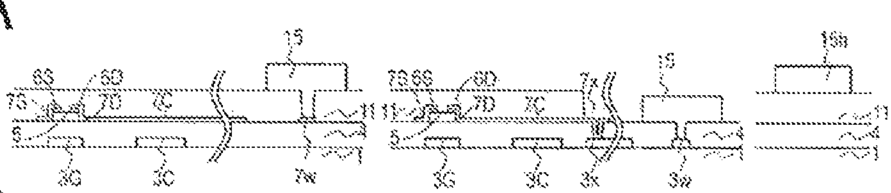
FIGS. 36A to 36E are schematic cross-sectional views for illustrating the manufacturing method of the TFT substrate 101C1.

Next, as illustrated in FIG. 36A, the patch metal layer 151 is formed by patterning the patch conductive film 151'.

Figure 36B:
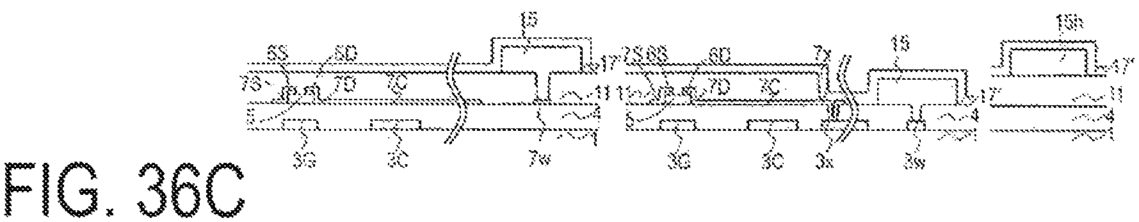

Next, as illustrated in FIG. 36B, the second insulating film 17' is formed on the patch metal layer 151, on the lower conductive layer 13, and on the first insulating layer 11.

Figure 36C:
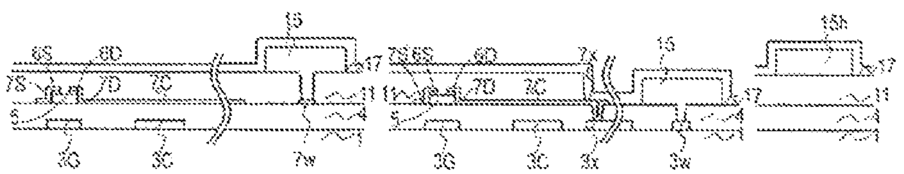

Next, the second insulating film 17' is etched through a known photolithography process to form the second insulating layer 17 as illustrated in FIG. 36C. Here, the opening of the second insulating layer 17 is formed only in the non-transmission and/or reception region R2.

Figure 36D:
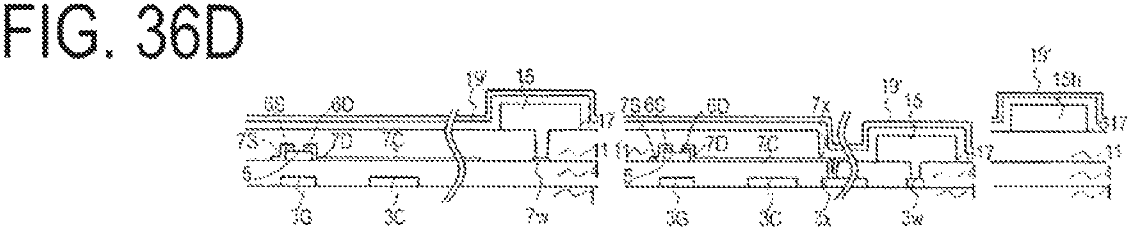

Next, as illustrated in FIG. 36D, the upper conductive film 19' is formed on the second insulating layer 17.

Figure 36E:
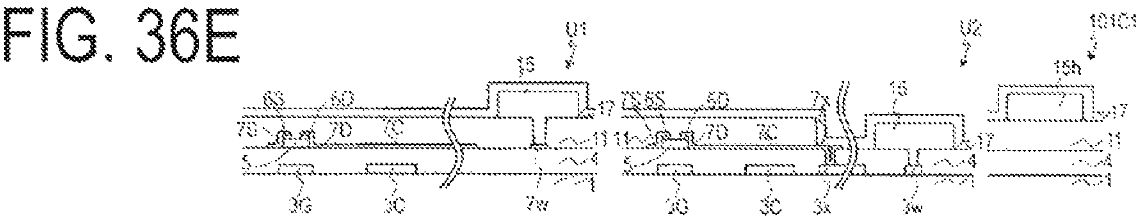

Next, the upper conductive film 19' is patterned to form the upper conductive layer 19 as illustrated in FIG. 36E. The upper conductive layer 19 is formed only in the non-transmission and/or reception region R2.

In this manner, the TFT substrate 101C1 is manufactured.

Modified Example 3

A scanning antenna 1000C1*a* according to Modified Example 3 of the present embodiment will be described with reference to FIGS. 37A and 37B and FIGS. 38A to 38D. Common reference numerals may be assigned to the configuration common to the scanning antenna 1000Ca, and descriptions thereof may be omitted.

Figure 37A:
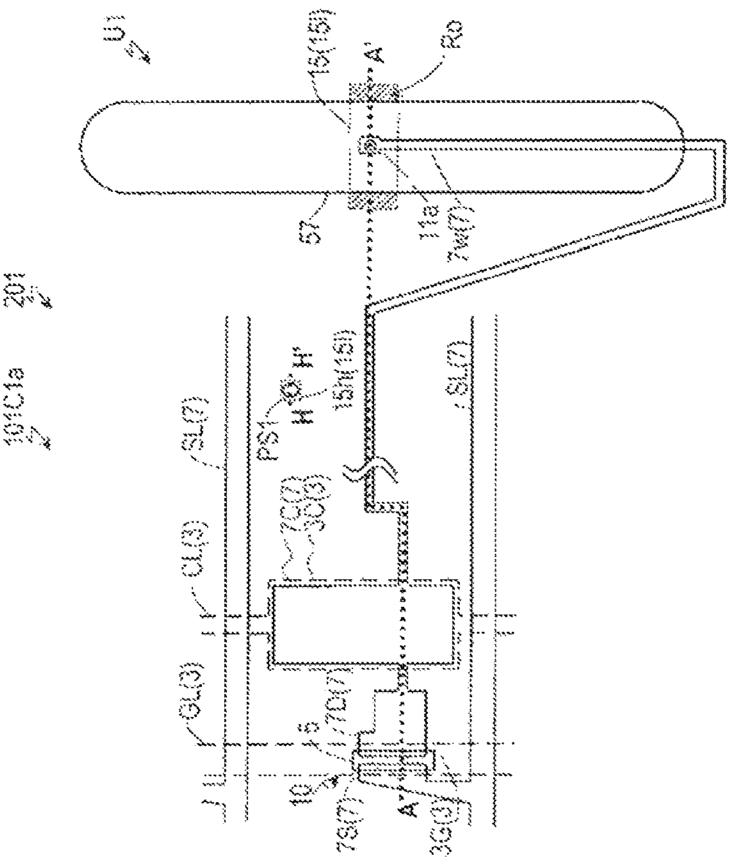
FIGS. 37A and 37B are schematic plan views illustrating a transmission and/or reception region R1 of a scanning antenna 1000C1*a* according to Modified Example 3 of the third embodiment of the present disclosure.
Figure 37B:
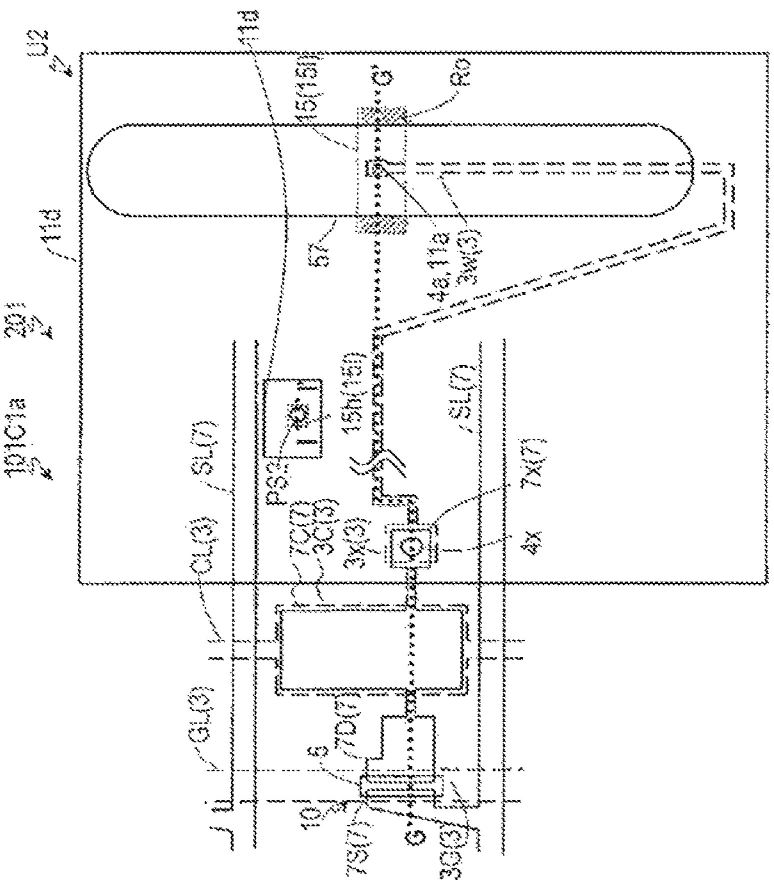
Figures 38A, 38B, 38C, 38D:
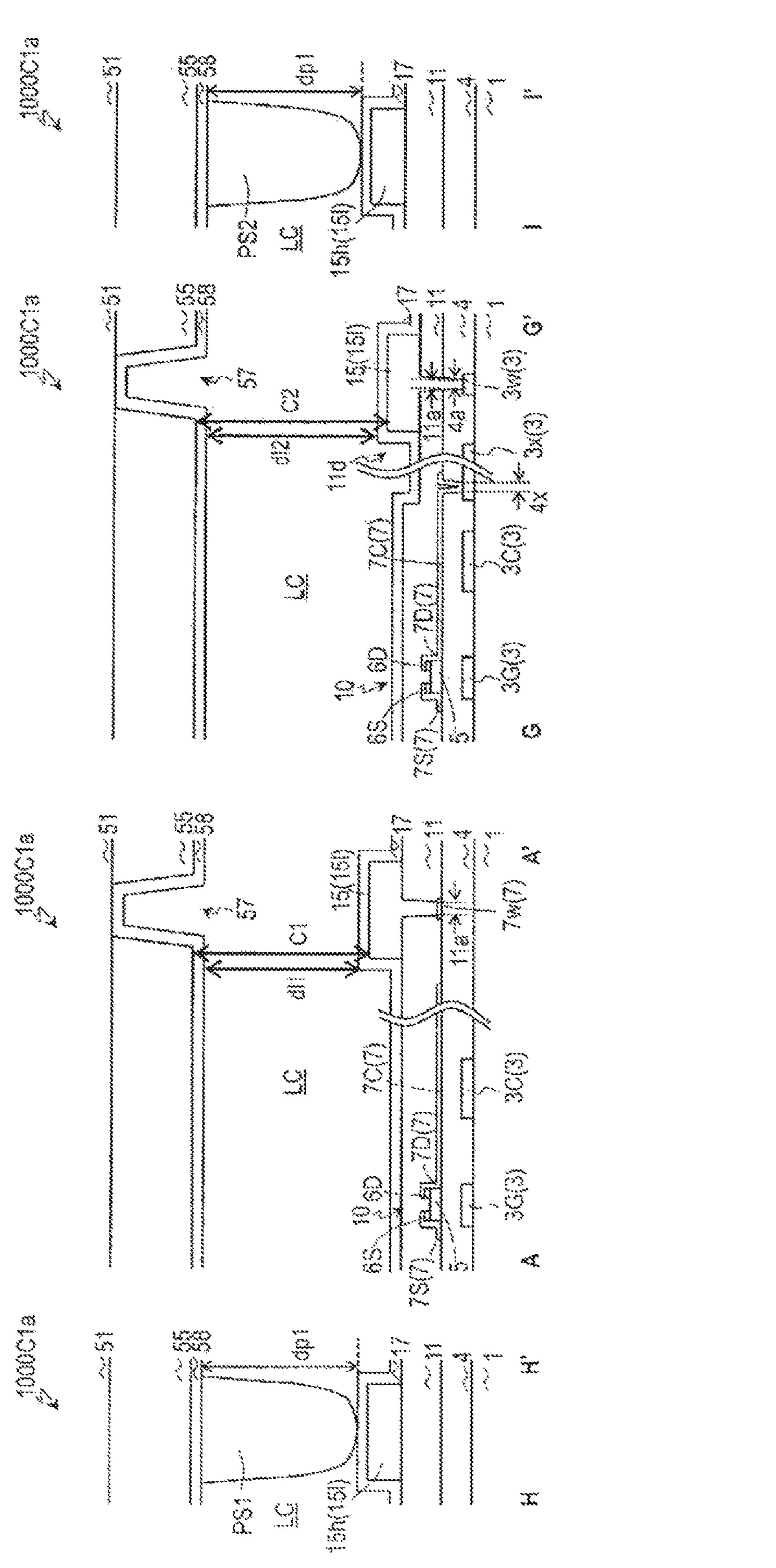
FIGS. 38A to 38D are schematic cross-sectional views illustrating the transmission and/or reception region R1 of the scanning antenna 1000C1*a*.

FIGS. 37A and 37B are schematic plan views of a transmission and/or reception region R1 of the scanning antenna 1000C1*a*, and FIGS. 38A to 38D are schematic cross-sectional views of the transmission and/or reception region R1 of the scanning antenna 1000C1*a*. FIG. 37A is a schematic plan view of first antenna units U1 of the transmission and/or reception region R1 of the scanning antenna 1000C1*a*, and FIG. 37B is a schematic plan view of second antenna units U2 of the transmission and/or reception region R1 of the scanning antenna 1000C1*a*. FIGS. 38A and 38B are schematic cross-sectional views of the first antenna units U1 of the transmission and/or reception region R1 of the scanning antenna 1000C1*a*, and FIGS. 38C and 38D are schematic cross-sectional views of the second antenna units U2 of the transmission and/or reception region R1 of the scanning antenna 1000C1*a*. FIGS. 38A to 38D illustrate cross-sections along the line H-H' and the line A-A' in FIG. 37A and the cross-sections along line G-G' and line I-I' in FIG. 37B, respectively.

The structure of the first antenna units U1 of the scanning antenna 1000C1*a* has the same structure as the first antenna units U1 of the scanning antenna 1000Ca. The structure of the second antenna units U2 of the scanning antenna 1000C1*a* differs from the second antenna units U2 of the scanning antenna 1000Ca in that the wiring line 3*w* that electrically connects the patch electrode 15 and the drain electrode 7D is formed by the gate metal layer 3. A portion 3*x* extending from the wiring line 3*w* is connected to a portion 7*x* extending from the auxiliary capacitance electrode 7C via an opening 4*x* that is formed in the gate insulating layer 4 and that at least reaches the portion 3*x*. That is, the portion 7*x* is connected to the portion 3*x* within the opening 4*x*.

The TFT substrate 101C1*a* included in the scanning antenna 1000C1*a* can be manufactured by changing the patterning shape of the gate conductive film 3' from the manufacturing method of the TFT substrate 101Ca, and thus illustration and description are omitted.

Modified Example 4

A scanning antenna 1000C2 according to Modified Example 4 of the present embodiment will be described with reference to FIGS. 39A and 39B and FIGS. 40A to 40D. Common reference numerals may be assigned to the configuration common to the scanning antenna 1000C1, and descriptions thereof may be omitted.

Figure 39B:
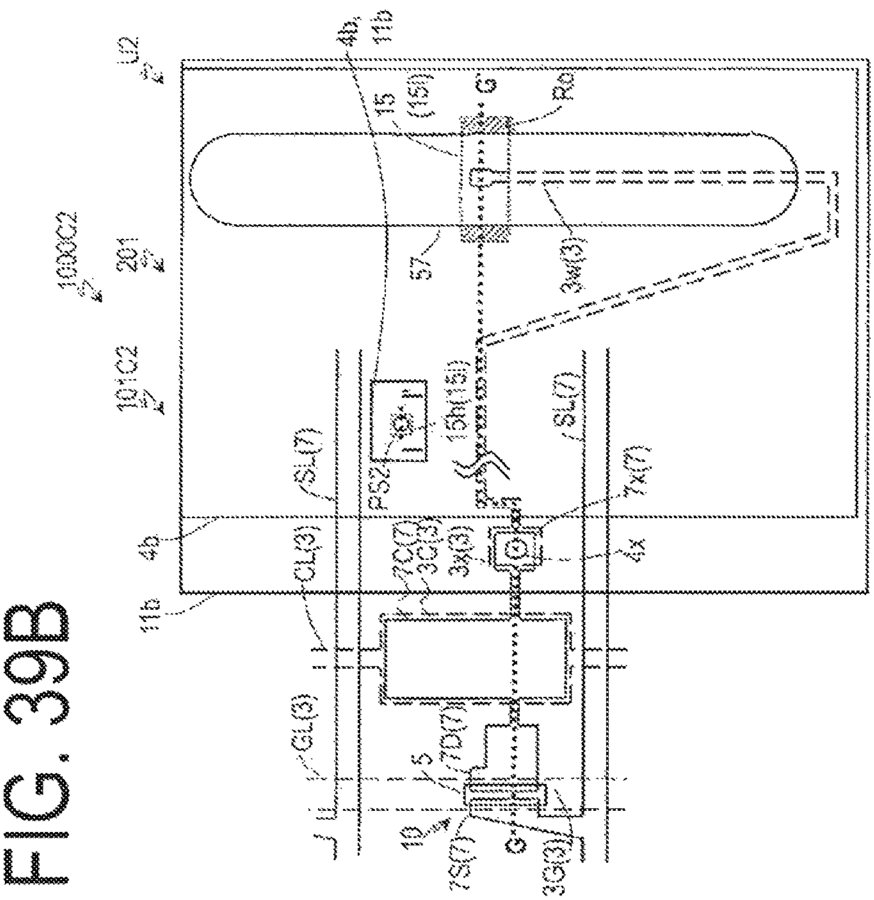
FIGS. 39A and 39B are schematic plan views illustrating a transmission and/or reception region R1 of a scanning antenna 1000C2 according to Modified Example 4 of the third embodiment of the present disclosure.
Figure 39A:
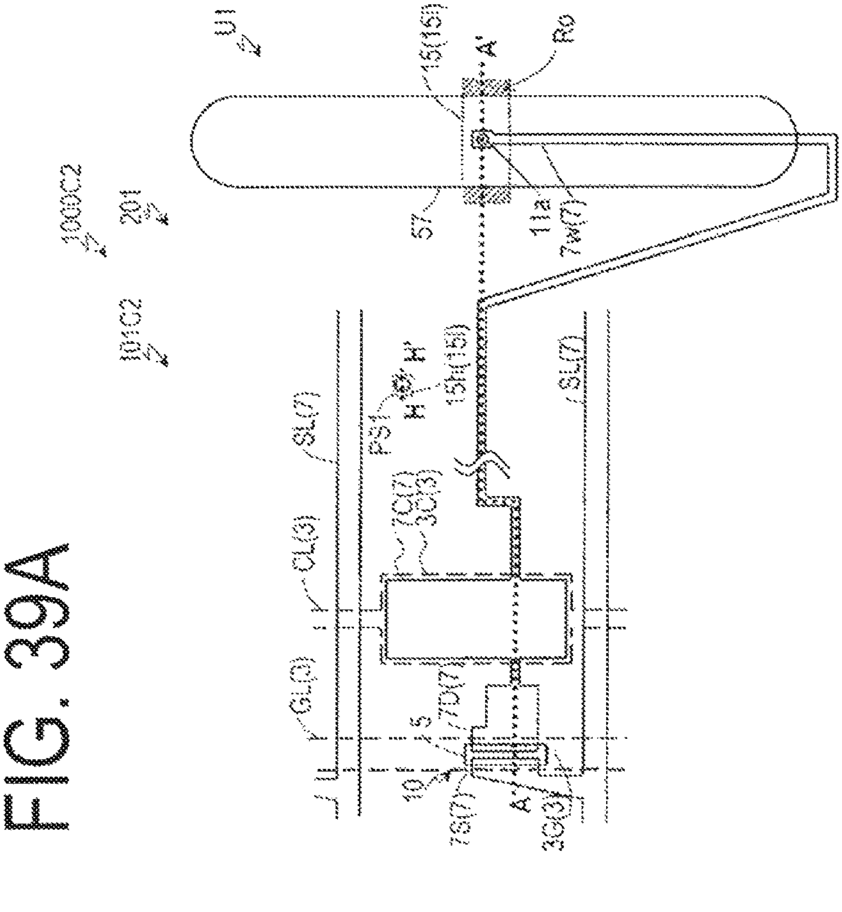
Figure 40A:
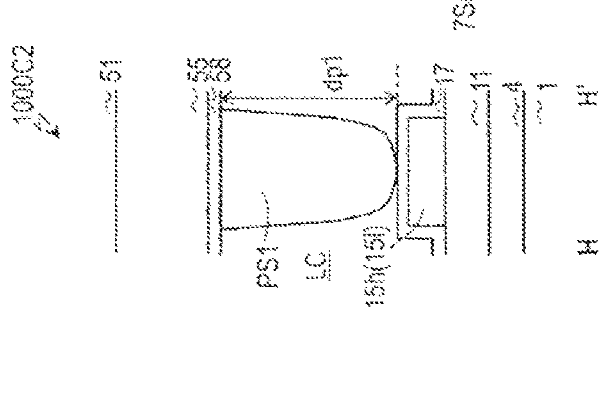
FIGS. 40A to 40D are schematic cross-sectional views illustrating the transmission and/or reception region R1 of the scanning antenna 1000C2.
Figure 40B:
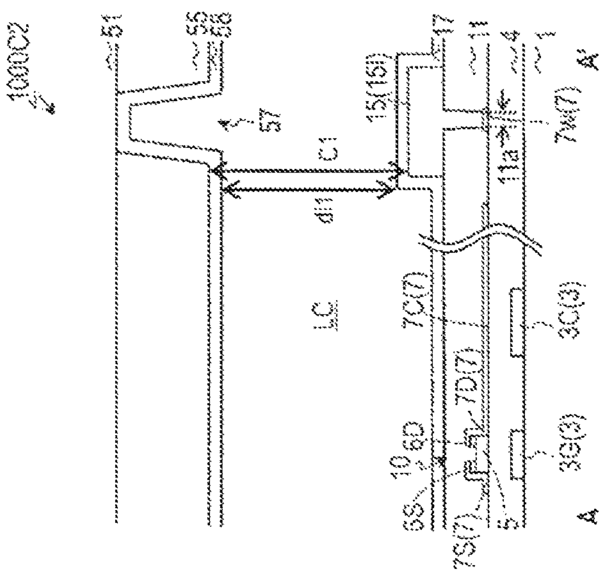
Figure 40C:
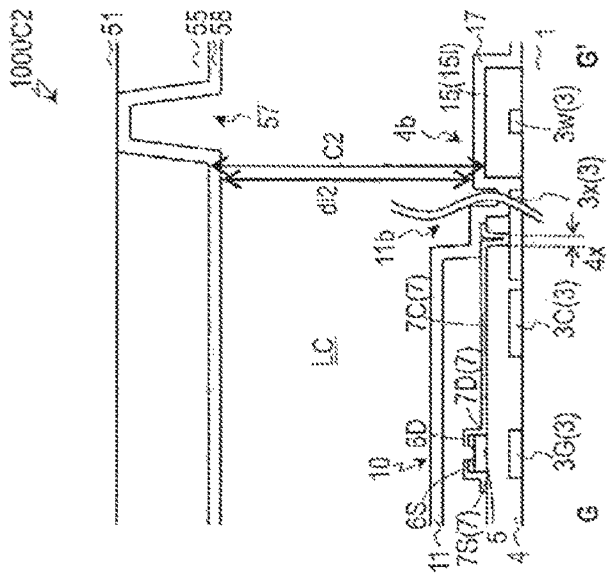
Figure 40D:
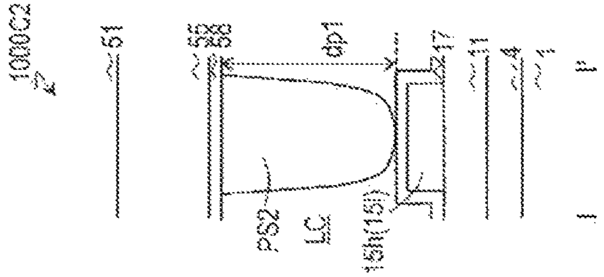

FIGS. 39A and 39B are schematic plan views of a transmission and/or reception region R1 of the scanning antenna 1000C2, and FIGS. 40A to 40D are schematic cross-sectional views of the transmission and/or reception region R1 of the scanning antenna 1000C2. FIG. 39A is a schematic plan view of first antenna units U1 of the transmission and/or reception region R1 of the scanning antenna 1000C2, and FIG. 39B is a schematic plan view of second antenna units U2 of the transmission and/or reception region R1 of the scanning antenna 1000C2. FIGS. 40A and 40B are schematic cross-sectional views of the first antenna units U1 of the transmission and/or reception region R1 of the scanning antenna 1000C2, and FIGS. 40C and 40D are schematic cross-sectional views of the second antenna units U2 of the transmission and/or reception region R1 of the scanning antenna 1000C2. FIGS. 40A to 40D illustrate cross-sections along the line H-H' and the line A-A' in FIG. 39A and the cross-sections along line G-G' and line I-I' in FIG. 39B, respectively.

The structure of the first antenna units U1 of the scanning antenna 1000C2 has the same structure as the first antenna units U1 of the scanning antenna 1000C1. The structure of the second antenna units U2 of the scanning antenna 1000C2 differs from the second antenna units U2 of the scanning antenna 1000C1 in that the second antenna units U2 further include an opening 4*b* that is formed in the gate insulating layer 4 and that overlaps at least the first region Ro of the second antenna units U2. Here, when viewed from the normal direction of the dielectric substrate 1, the opening 4*b* overlaps with the patch electrode 15 of the second antenna units U2, and the patch electrode 15 of the second antenna units U2 is formed in the opening 11*b* and in the opening 4*b*. Accordingly, the gate insulating layer 4 and the first insulating layer 11 are formed on the first region Ro of the plurality of first antenna units U1 and between the first dielectric substrate 1 and the patch electrode 15, and no insulating layer is formed on the first region Ro of the plurality of second antenna units U2 and between the first dielectric substrate 1 and the patch electrode 15. Thus, the distance C1 in the normal direction of the dielectric substrate 1 between the patch electrode 15 and the slot electrode 55 of the plurality of first antenna units U1 is smaller than the distance C2 in the normal direction of the dielectric substrate 1 between the patch electrode 15 and the slot electrode 55 of the plurality of second antenna units U2. The thickness dl1 of the liquid crystal layer LC in the first region Ro of the plurality of first antenna units U1 is smaller than the thickness dl2 of the liquid crystal layer LC of the first region Ro of the plurality of second antenna units U2.

Here, the openings 4*b* and 11*b* are formed not to overlap with the columnar spacer PS2 of the second antenna units U2. In other words, the gate insulating layer 4 and the first insulating layer 11 are formed to cover the columnar spacer PS2 of the second antenna units U2 when viewed from the normal direction of the dielectric substrate 1. Therefore, the columnar spacer PS1 of the first antenna units U1 and the columnar spacer PS2 of the second antenna units U2 have the same height dp1. However, the opening 4*b* and/or the opening 11*b* may be formed overlapping the columnar spacer PS2 of the second antenna units U2. In this case, the heights of the columnar spacer PS1 of the first antenna units U1 and the columnar spacer PS2 of the second antenna units U2 may be different from each other.

Manufacturing Method of TFT Substrate 101C2

As described below, the TFT substrate 101C2 included in the scanning antenna 1000C2 can be manufactured by changing the patterning shape of the gate insulating film 4' from the manufacturing method of the TFT substrate 101C1.

A description is given of a manufacturing method of the TFT substrate 101C2 with reference to FIG. 41A to FIG. 43E.

FIG. 41A to FIG. 43E are schematic cross-sectional views for illustrating a manufacturing method of the TFT substrate 101C2. FIG. 41A to FIG. 43E illustrate cross-sections corresponding to FIG. 40B, FIG. 40C, and FIG. 40A (cross-section A-A', cross-section G-G', and cross-section H-H' of the TFT substrate 101C2). The following description mainly describes differences from the manufacturing method of the TFT substrate 101C1 described with reference to FIG. 34A to FIG. 36E.

First, as illustrated in FIGS. 34A to 34D, a gate metal layer 3, a gate insulating film 4', an island-shaped semiconductor layer 5, a source contact portion 6S, and a drain contact portion 6D are formed on the dielectric substrate 1. Here, as the gate insulating film 4', a Si—$_x$N$_y$ film having a thickness of 250 nm, for example, is formed.

Figure 41A:
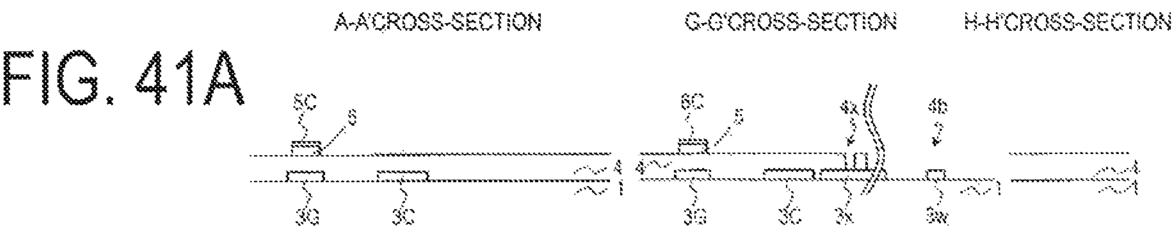
FIGS. 41A to 41C are schematic cross-sectional views for illustrating a manufacturing method of a TFT substrate 101C2 included in the scanning antenna 1000C2.

Next, as illustrated in FIG. 41A, the gate insulating film 4' is etched by a known photolithography process to form the gate insulating layer 4. Here, the opening 4*x* that at least reaches the portion 3*x* extending from the wiring line 3*w* and the opening 4*b* that overlaps with the region that is the first region are formed in the second antenna unit formation region.

Figure 41B:
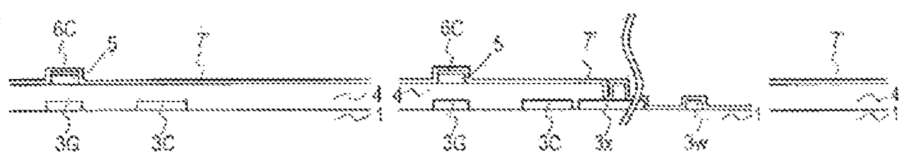

Next, a source conductive film 7' is formed on the gate insulating layer 4, within the opening 4*x*, within the opening 4*b*, and on the contact portion 6C as illustrated in FIG. 41B.

Figure 41C:
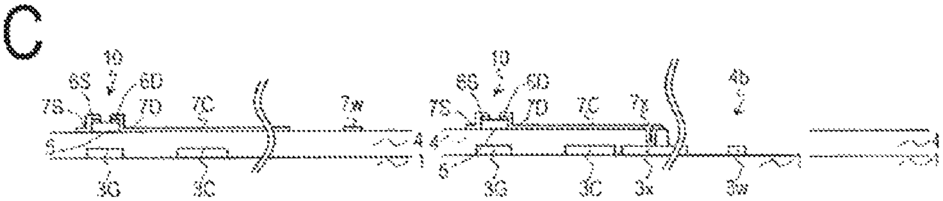

Next, the source conductive film 7' is patterned to form the source metal layer 7 as illustrated in FIG. 41C. Accordingly, the TFT 10 is obtained. Here, in the second antenna unit formation region, the portion 7*x* extending from the auxiliary capacitance electrode 7C is formed in contact with the portion 3*x* that extends from the wiring line 3*w* in the opening 4*x*. Here, the source metal layer 7 is not formed in the opening 4*b*.

Figures 42A, 42B, 42C, 42D, 42E:
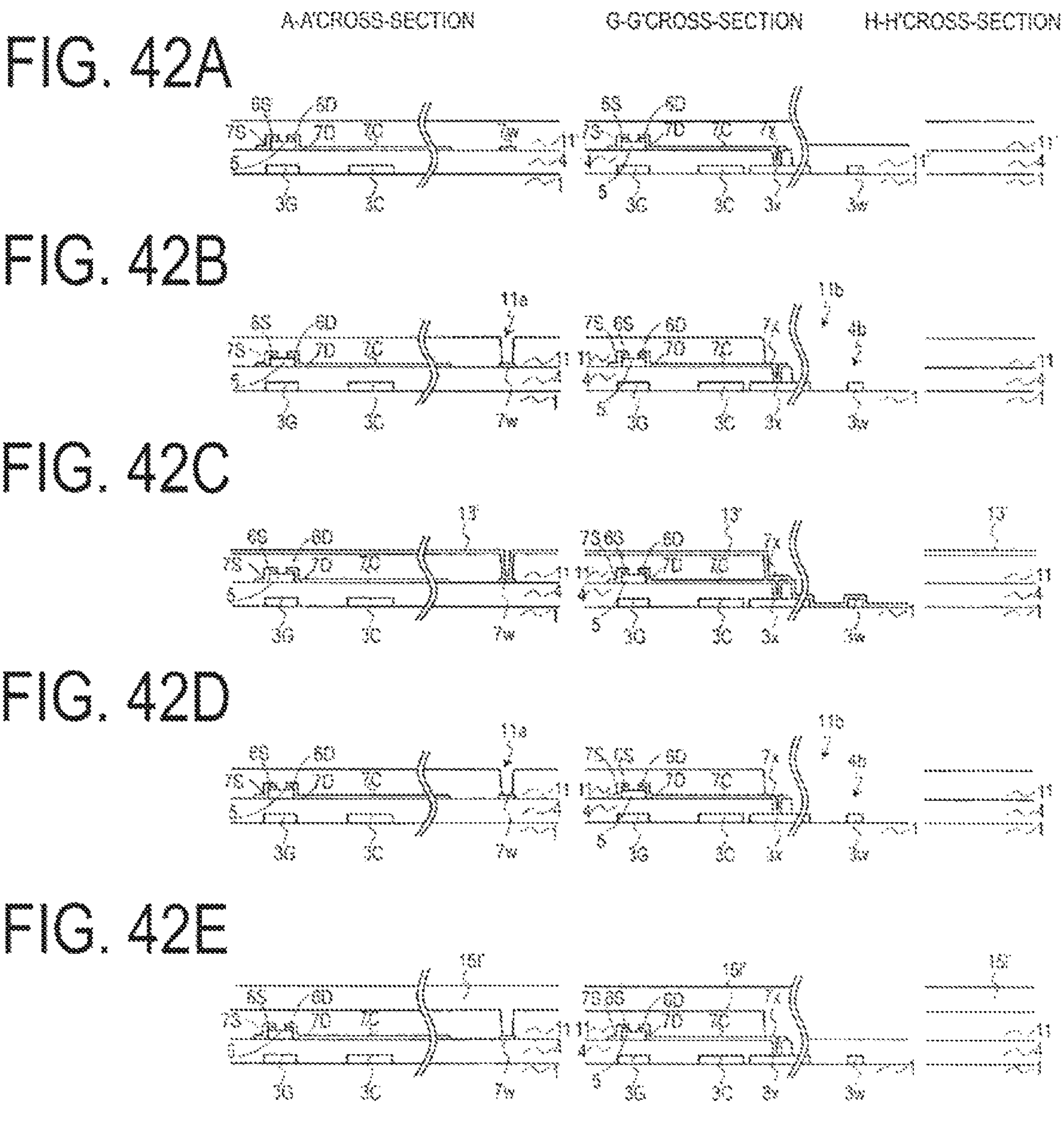
FIGS. 42A to 42E are schematic cross-sectional views for illustrating the manufacturing method of the TFT substrate 101C2.

Next, as illustrated in FIG. 42A, the first insulating film 11' is formed to cover the TFT 10 and the source metal layer 7. Here, as the first insulating film 11', a silicon nitride ($Si_xN_y$) film having a thickness of 150 nm, for example, is formed.

Next, as illustrated in FIG. 42B, the first insulating film 11' is etched by a known photolithography process to form the first insulating layer 11. In the first antenna unit formation region, the opening 11*a* that at least reaches the portion electrically connected to the drain electrode 7D of the source metal layer 7 (here, the wiring line 7*w*) is formed in the first insulating film 11', and in the second antenna unit formation region, the opening 11*b* is formed in the first insulating film 11' so as to overlap with the region that is the first region. Here, the opening 11*b* is formed so as to overlap with the opening 4*b* formed in the gate insulating layer 4.

Next, as illustrated in FIG. 42C, a lower conductive film 13' is formed on the first insulating layer 11, within the opening 11a, within the opening 11b, and within the opening 4b.

Next, the lower conductive film 13' is patterned to form the lower conductive layer 13 as illustrated in FIG. 42D. Here, the lower conductive layer 13 is formed only in the non-transmission and/or reception region R2.

Next, as illustrated in FIG. 42E, the patch conductive film 151' is formed on the lower conductive layer 13 and the first insulating layer 11.

Figure 43A:
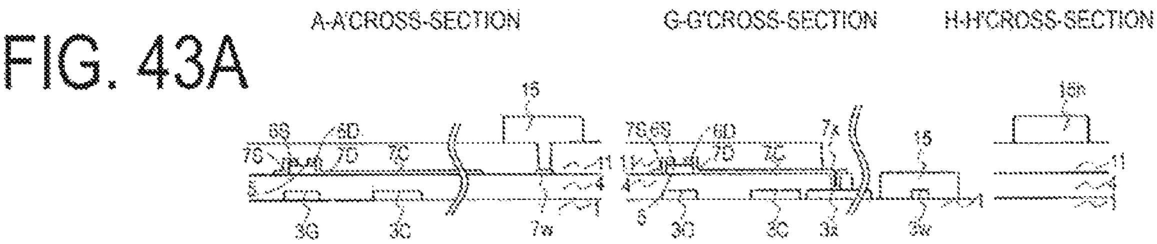
FIGS. 43A to 43E are schematic cross-sectional views for illustrating the manufacturing method of the TFT substrate 101C2.

Next, as illustrated in FIG. 43A, the patch metal layer 151 is formed by patterning the patch conductive film 151'. Here, the patch electrode 15 of the second antenna unit formation region is formed so as to be in contact with the wiring line 3w.

Figure 43B:
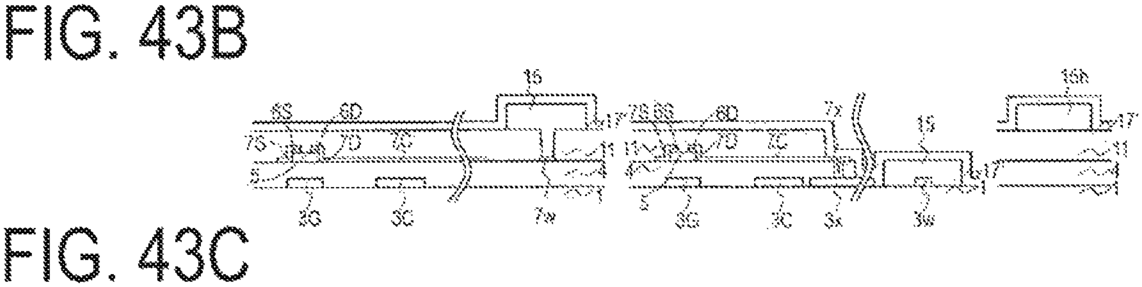

Next, as illustrated in FIG. 43B, the second insulating film 17' is formed on the patch metal layer 151, on the lower conductive layer 13, and on the first insulating layer 11.

Figure 43C:
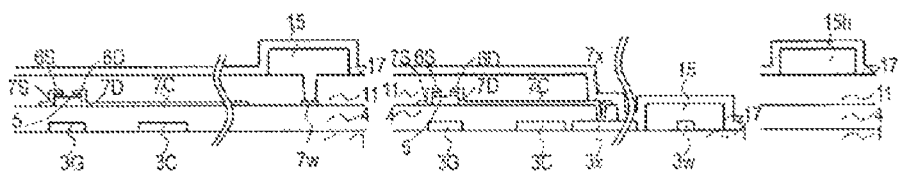

Next, the second insulating film 17' is etched through a known photolithography process to form the second insulating layer 17 as illustrated in FIG. 43C. Here, the opening of the second insulating layer 17 is formed only in the non-transmission and/or reception region R2.

Figure 43D:
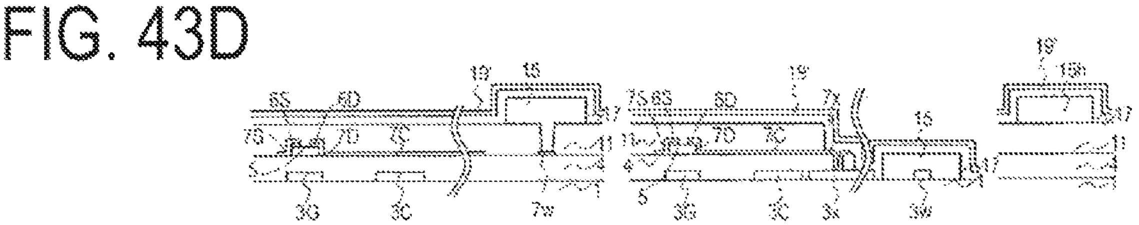

Next, as illustrated in FIG. 43D, the upper conductive film 19' is formed on the second insulating layer 17.

Figure 43E:
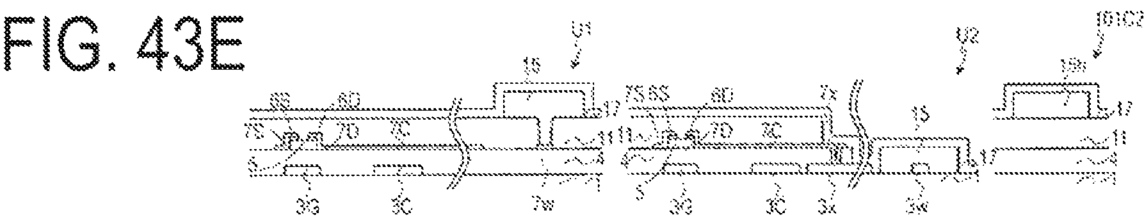

Next, the upper conductive film 19' is patterned to form the upper conductive layer 19 as illustrated in FIG. 43E. The upper conductive layer 19 is formed only in the non-transmission and/or reception region R2.

In this manner, the TFT substrate 101C2 is manufactured.

The slot substrate 201 is manufactured by the method described above. Here, an acrylic resin film (having a thickness of 2.3 μm, for example) may be used to form columnar spacers PS1 and PS2 having a height of 2.3 μm, for example.

Here, for example, the distance C1 in the normal direction of the dielectric substrate 1 between the patch electrode 15 and the slot electrode 55 of the plurality of first antenna units U1 is 2.5 μm (design value), and the distance C2 in the normal direction of the dielectric substrate 1 between the patch electrode 15 and the slot electrode 55 of the plurality of second antenna units U2 is 2.9 μm (design value). The difference between the distance C2 and the distance C1 (C2−C1) is 0.4 μm (design value). Here, the difference between the distance C2 and the distance C1 (C2−C1) corresponds to a sum of the thickness of the gate insulating layer 4 and the thickness of the first insulating layer 11, for example. For example, depending on the environment temperature at which the scanning antenna is installed, the distance C1 may vary approximately from 2.2 μm to 2.7 μm, and the distance C2 may vary approximately from 2.7 μm to 3.2 μm, for example. The difference between the distance C1 and the distance C2 (C2−C1) may vary approximately from 0.05 μm to 1.0 μm.

Modified Example 5

A scanning antenna 1000C2a according to Modified Example 5 of the present embodiment will be described with reference to FIGS. 44A and 44B and FIGS. 45A to 45D. Common reference numerals may be assigned to the configuration common to the scanning antenna 1000C2, and descriptions thereof may be omitted.

Figure 44B:
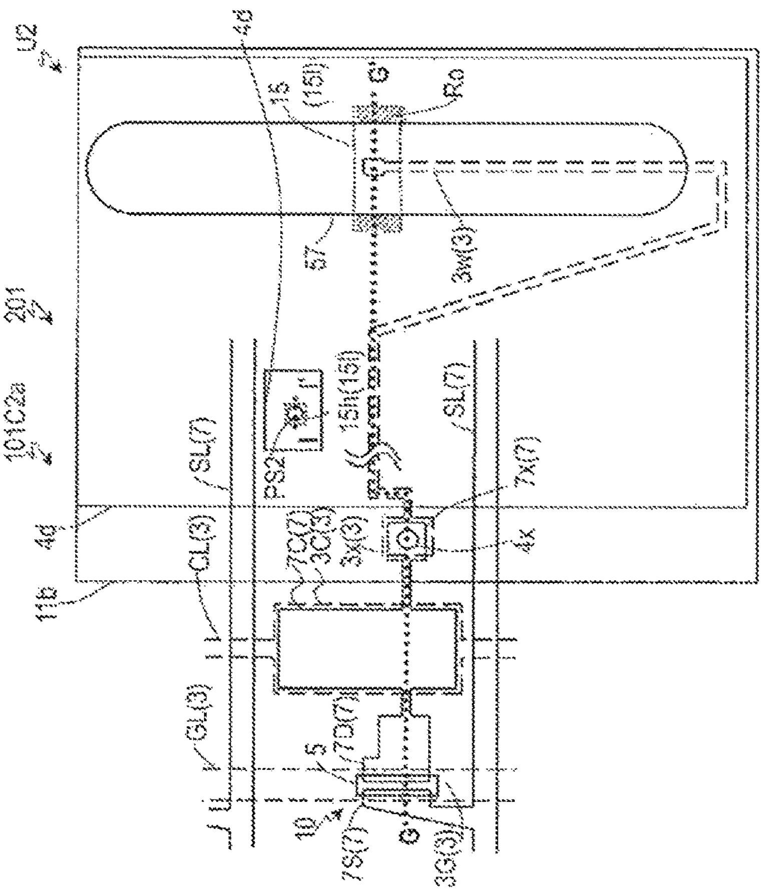
FIGS. 44A and 44B are schematic plan views illustrating a transmission and/or reception region R1 of a scanning antenna 1000C2*a* according to Modified Example 5 of the third embodiment of the present disclosure.
Figure 44A:
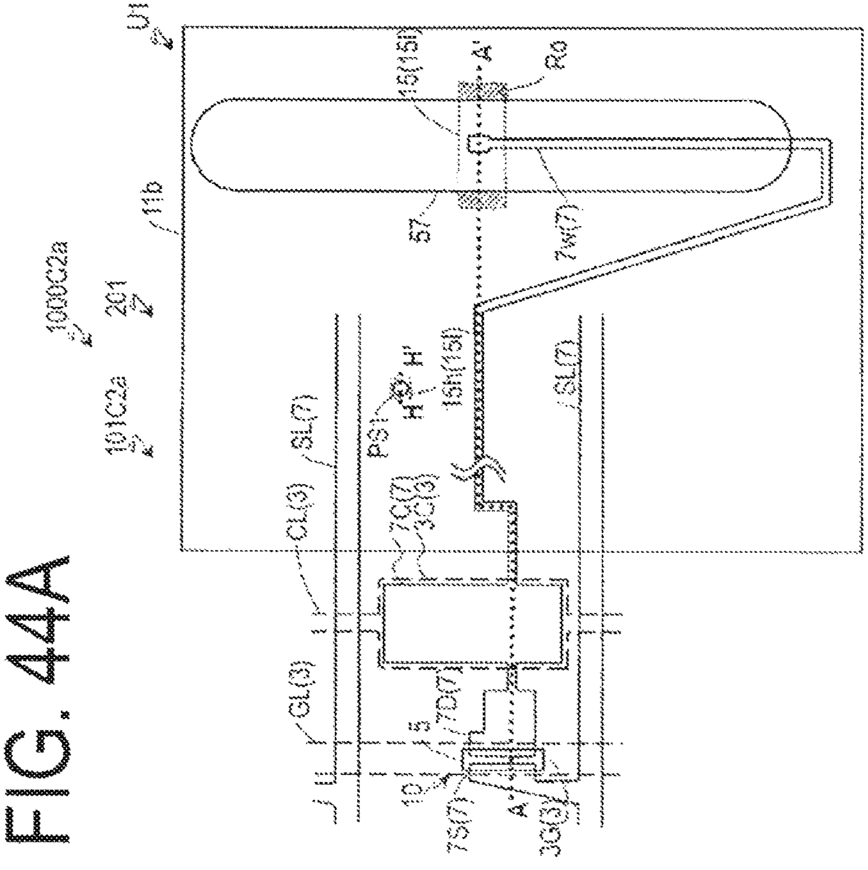
Figures 45A, 45B, 45C, 45D:
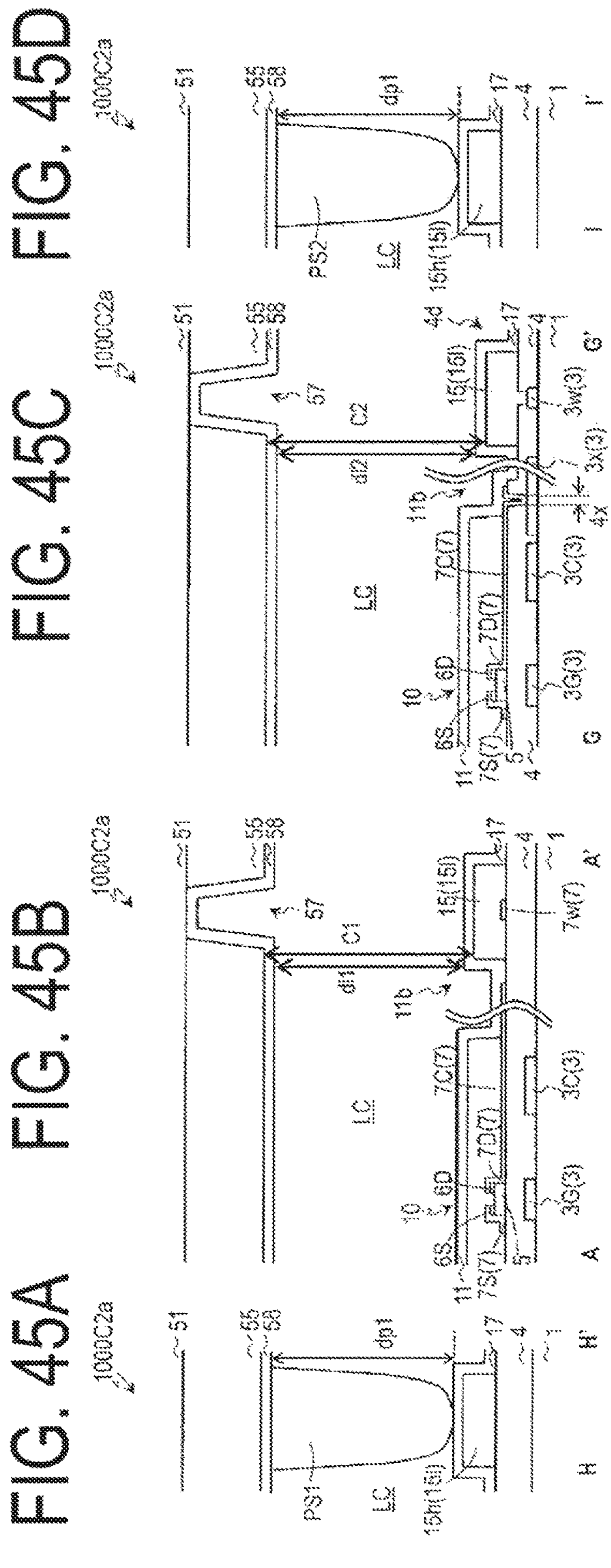
FIGS. 45A to 45D are schematic cross-sectional views illustrating the transmission and/or reception region R1 of the scanning antenna 1000C2*a*.

FIGS. 44A and 44B are schematic plan views of a transmission and/or reception region R1 of the scanning antenna 1000C2a, and FIGS. 45A to 45D are schematic cross-sectional views of the transmission and/or reception region R1 of the scanning antenna 1000C2a. FIG. 44A is a schematic plan view of first antenna units U1 of the transmission and/or reception region R1 of the scanning antenna 1000C2a, and FIG. 44B is a schematic plan view of second antenna units U2 of the transmission and/or reception region R1 of the scanning antenna 1000C2a. FIGS. 45A and 45B are schematic cross-sectional views of the first antenna units U1 of the transmission and/or reception region R1 of the scanning antenna 1000C2a, and FIGS. 45C and 45D are schematic plan views of the second antenna units U2 of the transmission and/or reception region R1 of the scanning antenna 1000C2a. FIGS. 45A to 45D illustrate cross-sections along the line H-H' and the line A-A' in FIG. 44A and the cross-sections along line G-G' and line I-I' in FIG. 44B, respectively.

Similar to the second antenna units U2 of the scanning antenna 1000C, the first antenna units U1 of the scanning antenna 1000C2a includes an opening lib that overlaps at least the first region Ro of the first antenna units U1, formed in the first insulating layer 11. The structure of the second antenna units U2 of the scanning antenna 1000C2a differs from the first antenna units U1 in that the second antenna units U2 further include a recessed portion 4d formed in the gate insulating layer 4 that overlaps at least the first region Ro of the second antenna units U2. Here, when viewed from the normal direction of the dielectric substrate 1, the recessed portion 4d overlaps with the patch electrode 15 of the second antenna units U2. Thus, the distance C1 in the normal direction of the dielectric substrate 1 between the patch electrode 15 and the slot electrode 55 of the plurality of first antenna units U1 is smaller than the distance C2 in the normal direction of the dielectric substrate 1 between the patch electrode 15 and the slot electrode 55 of the plurality of second antenna units U2. The thickness dl1 of the liquid crystal layer LC in the first region Ro of the plurality of first antenna units U1 is smaller than the thickness dl2 of the liquid crystal layer LC of the first region Ro of the plurality of second antenna units U2.

Here, the recessed portion 4d is formed not to overlap with the columnar spacer PS2 of the second antenna units U2. Furthermore, the opening 11b of the first antenna units U1 is formed overlapping the columnar spacer PS1 of the first antenna units U1, and the opening 11b of the second antenna units U2 is formed overlapping the columnar spacer PS2 of the second antenna units U2. As a result, the columnar spacer PS1 of the first antenna units U1 and the columnar spacer PS2 of the second antenna units U2 have the same height dp1. However, the shape of the opening 11b and the recessed portion 4d is not limited to that illustrated. The heights of the columnar spacer PS1 of the first antenna units U1 and the columnar spacer PS2 of the second antenna units U2 may be different from each other.

Note that the structure of the second antenna units U2 of the scanning antenna 1000C2a differs from the first antenna units U1 in that the wiring line 3w that electrically connects the patch electrode 15 and the drain electrode 7D is formed by the gate metal layer 3. A portion 3x extending from the wiring line 3w is connected to a portion 7x extending from the auxiliary capacitance electrode 7C via an opening 4x that is formed in the gate insulating layer 4 and that at least reaches the portion 3x. That is, the portion 7x is connected to the portion 3x within the opening 4x.

The TFT substrate 101C2a included in the scanning antenna 1000C2a can be manufactured by changing the patterning shape of the gate conductive film 3', the gate insulating film 4', and the first insulating film 11' from the manufacturing method of the TFT substrate 101C1*a*, and thus illustration and description are omitted. Here, as the gate insulating layer 4, for example, a $Si_xN_y$ film having a thickness of 500 nm is formed, and the difference between the thickness of the gate insulating layer 4 in the recessed portion 4*d* and the thickness of the gate insulating layer 4 outside the recessed portion 4*d* is, for example, 200 nm. As the first insulating layer 11, a $Si_xN_y$ film having a thickness of 330 nm, for example, may be formed. Here, for example, the distance C1 in the normal direction of the dielectric substrate 1 between the patch electrode 15 and the slot electrode 55 of the plurality of first antenna units U1 is 2.6 μm (design value), and the distance C2 in the normal direction of the dielectric substrate 1 between the patch electrode 15 and the slot electrode 55 of the plurality of second antenna units U2 is 2.8 μm (design value). The difference between the distance C2 and the distance C1 (C2−C1) is 0.2 μm (design value). Here, the difference between the distance C2 and the distance C1 (C2−C1) corresponds to, for example, the difference between the thickness of the gate insulating layer 4 in the recessed portion 4*d* and the thickness of the gate insulating layer 4 outside the recessed portion 4*d*.

Fourth Embodiment

In the present embodiment, a sum of the thicknesses of the first region Ro of the antenna unit and the conductive layer between the first dielectric substrate 1 and the patch electrode 15 is varied between the first antenna units U1 and the second antenna units U2.

The structure of a transmission and/or reception region R1 of a scanning antenna 1000D according to the present embodiment will be described with reference to FIGS. 46A and 46B and FIGS. 47A to 47D. Common reference numerals may be assigned to the configuration common to the scanning antenna 1000B, and descriptions thereof may be omitted. The following mainly describes the points different from the previous embodiments.

Figure 46B:
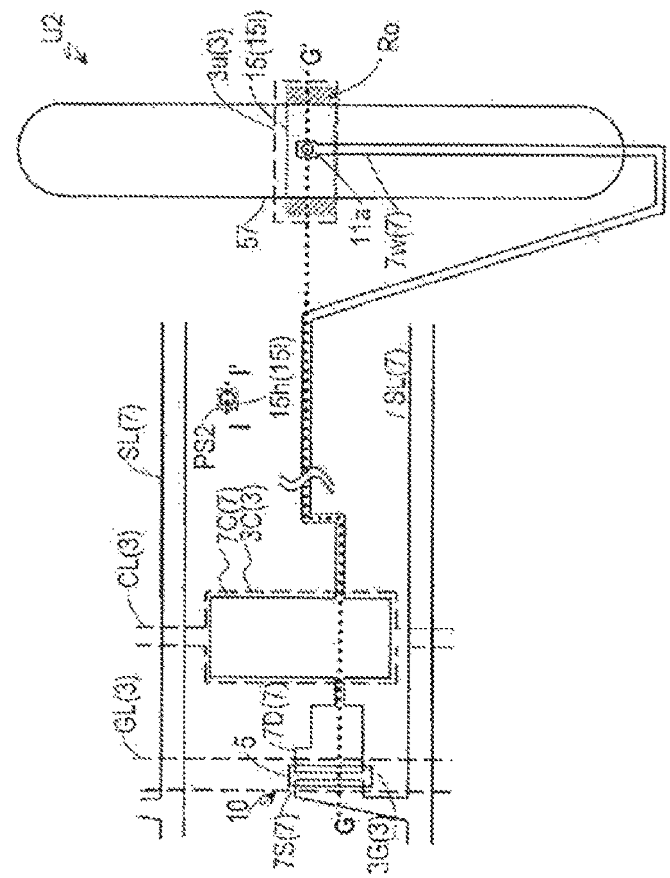
FIGS. 46A and 46B are schematic plan views illustrating a transmission and/or reception region R1 of a scanning antenna 1000D according to a fourth embodiment of the present disclosure.
Figure 46A:
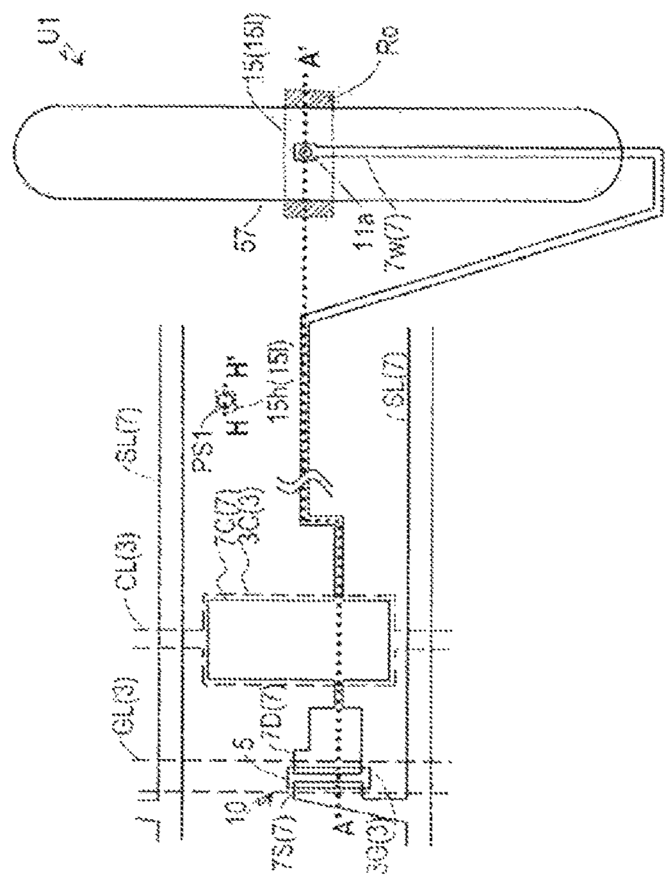
Figure 47A:
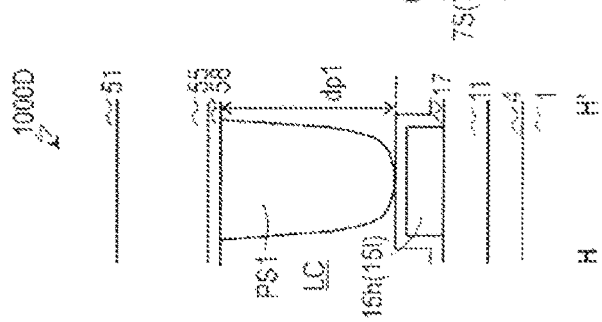
FIGS. 47A to 47D are schematic cross-sectional views illustrating the transmission and/or reception region R1 of the scanning antenna 1000D.
Figure 47B:
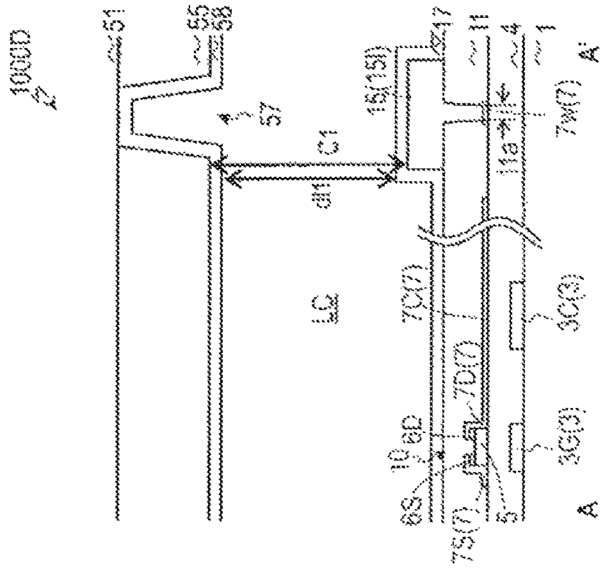
Figure 47C:
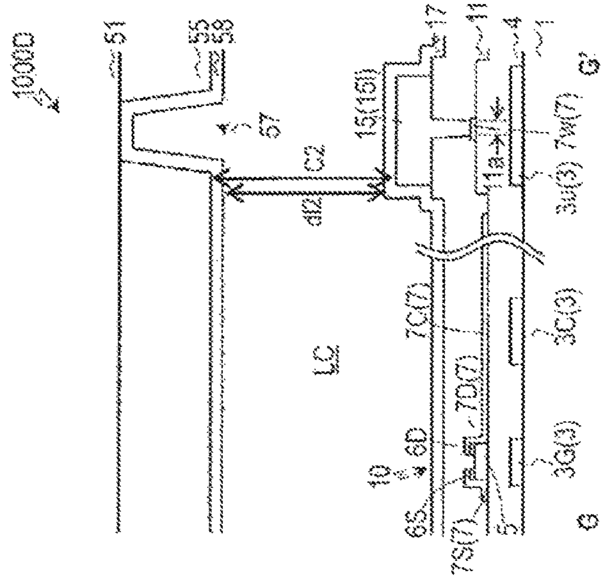
Figure 47D:
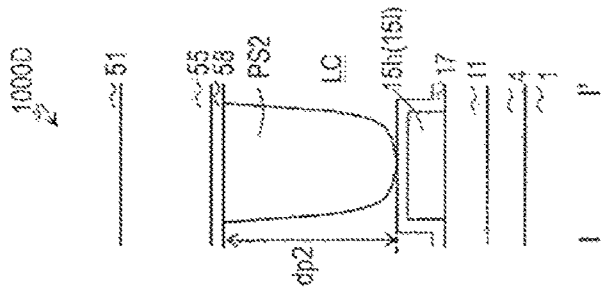

FIGS. 46A and 46B are schematic plan views of the transmission and/or reception region R1 of the scanning antenna 1000D, and FIGS. 47A to 47D are schematic cross-sectional views of the transmission and/or reception region R1 of the scanning antenna 1000D. FIG. 46A is a schematic plan view of the first antenna units U1 of the transmission and/or reception region R1 of the scanning antenna 1000D, and FIG. 46B is a schematic plan view of the second antenna units U2 of the transmission and/or reception region R1 of the scanning antenna 1000D. FIGS. 47A and 47B are schematic cross-sectional views of the first antenna units U1 of the transmission and/or reception region R1 of the scanning antenna 1000D, and FIGS. 47C and 47D are schematic cross-sectional views of the second antenna units U2 of the transmission and/or reception region R1 of the scanning antenna 1000D. FIGS. 47A to 47D illustrate cross-sections along the line H-H' and the line A-A' in FIG. 46A and the cross-sections along line G-G' and line I-I' in FIG. 46B, respectively.

The structure of the first antenna units U1 of the scanning antenna 1000D has the same structure as the first antenna units U1 of the scanning antenna 1000B. The second antenna units U2 of the scanning antenna 1000D differs from the first antenna units U1 in that the second antenna units U2 include a gate metal layer 3 (base portion 3*u*) in the first region Ro. In other words, the gate metal layer 3 is formed in the first region Ro of the plurality of second antenna units U2 and between the first dielectric substrate 1 and the patch electrode 15, while a conductive layer is not formed in the first region Ro of the plurality of first antenna units U1 and between the first dielectric substrate 1 and the patch electrode 15. Thus, the distance C2 in the normal direction of the dielectric substrate 1 between the patch electrode 15 and the slot electrode 55 of the plurality of second antenna units U2 is smaller than the distance C1 in the normal direction of the dielectric substrate 1 between the patch electrode 15 and the slot electrode 55 of the plurality of first antenna units U1. The thickness dl2 of the liquid crystal layer LC in the first region Ro of the plurality of second antenna units U2 is smaller than the thickness dl1 of the liquid crystal layer LC of the first region Ro of the plurality of first antenna units U1. Here, the base portion 3*u* is electrically connected to neither electrode nor wiring line. That is, the base portion 3*u* is in a floating state.

The present embodiment is not limited to those illustrated. At least one conductive layer may be provided in the first region Ro of the plurality of first antenna units U1 and between the first dielectric substrate 1 and the patch electrode 15, and the first region Ro of the plurality of second antenna units U2 and between the first dielectric substrate 1 and the patch electrode 15, and a sum of the thicknesses thereof may be different between the first antenna units U1 and the second antenna units U2.

A TFT substrate 101D included in the scanning antenna 1000D can be manufactured by changing the patterning shape of the gate conductive film 3' from the manufacturing method of the TFT substrate 101B, and thus illustration and description are omitted. In the scanning antenna 1000D, the thickness of the gate metal layer 3 (that is, the thickness of the gate conductive film 3') contributes to the difference between the distance C1 and the distance C2 (C1−C2), and thus the thickness of the gate conductive film 3' may be appropriately changed. For example, as the gate conductive film 3', a layered film (MoN/Al) may be formed by layering an Al film (having a thickness of 150 nm, for example) and a MoN layer (having a thickness of 50 nm, for example) in this order.

The slot substrate 201 included in the scanning antenna 1000D is manufactured by the method described above. Here, an acrylic resin film (having a thickness of 2.4 μm, for example) may be used to form columnar spacers PS1 and PS2 having a height of 2.4 μm, for example.

Here, for example, the distance C1 in the normal direction of the dielectric substrate 1 between the patch electrode 15 and the slot electrode 55 of the plurality of first antenna units U1 is 2.8 μm (design value), and the distance C2 in the normal direction of the dielectric substrate 1 between the patch electrode 15 and the slot electrode 55 of the plurality of second antenna units U2 is 2.6 μm (design value). The difference between the distance C1 and the distance C2 (C1−C2) is 0.2 μm (design value). For example, depending on the environment temperature at which the scanning antenna is installed, for example, the distance C1 may vary approximately from 2.7 μm to 3.2 μm, and the distance C2 may vary approximately from 2.2 μm to 2.7 μm. The difference between the distance C1 and the distance C2 (C1−C2) may vary approximately from 0.05 μm to 1.0 μm.

Modified Example 1

A scanning antenna 1000Da according to Modified Example 1 of the present embodiment will be described with reference to FIGS. 48A and 48B and FIGS. 49A to 49D. Common reference numerals may be assigned to the configuration common to the scanning antenna 1000D, and descriptions thereof may be omitted.

Figure 48A:
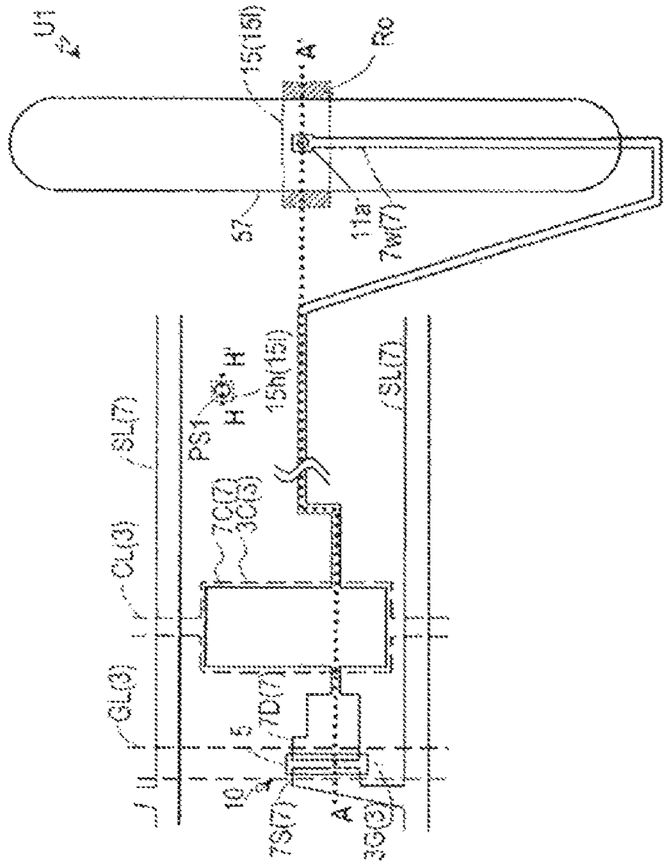
FIGS. 48A and 48B are schematic plan views illustrating a transmission and/or reception region R1 of a scanning antenna 1000Da according to Modified Example 1 of the fourth embodiment of the present disclosure.
Figure 48B:
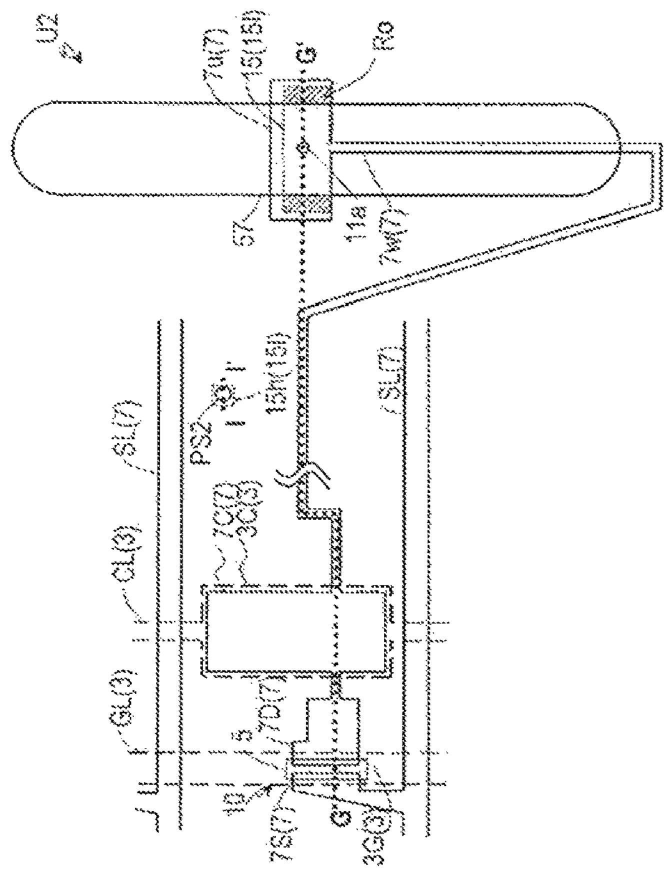
Figure 49A:
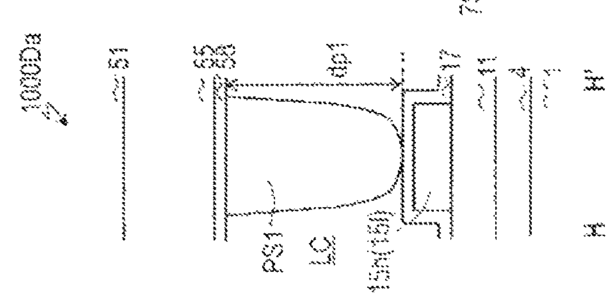
FIGS. 49A to 49D are schematic cross-sectional views illustrating the transmission and/or reception region R1 of the scanning antenna 1000Da.
Figure 49B:
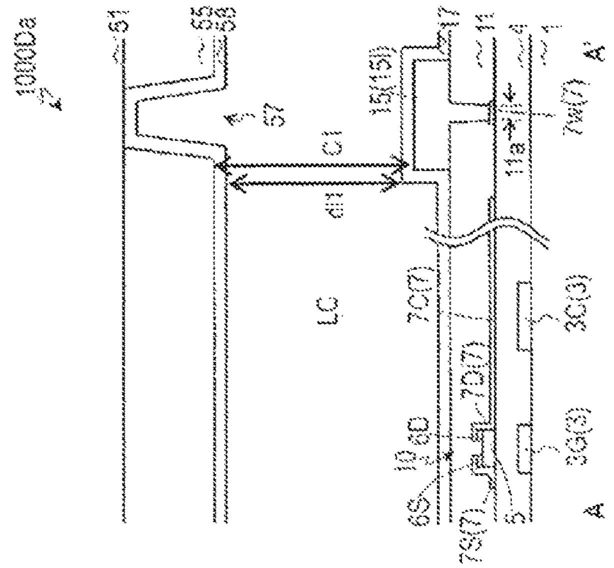
Figure 49C:
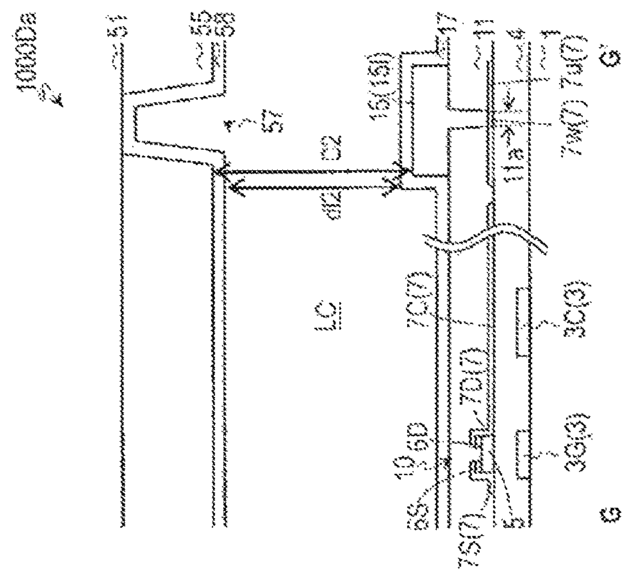
Figure 49D:
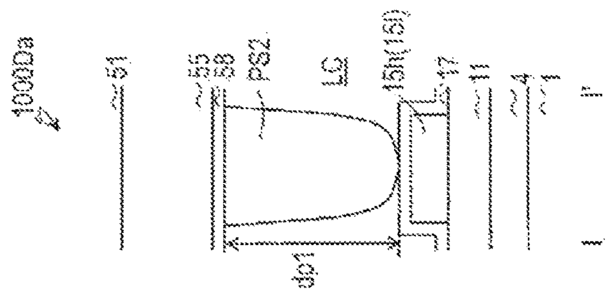

FIGS. 48A and 48B are schematic plan views of a transmission and/or reception region R1 of the scanning antenna 1000Da, and FIGS. 49A to 49D are schematic cross-sectional views of the transmission and/or reception region R1 of the scanning antenna 1000Da. FIG. 48A is a schematic plan view of first antenna units U1 of the transmission and/or reception region R1 of the scanning antenna 1000Da, and FIG. 48B is a schematic plan view of second antenna units U2 of the transmission and/or reception region R1 of the scanning antenna 1000Da. FIGS. 49A to 49D illustrate cross-sections along the line H-H' and the line A-A' in FIG. 48A and the cross-sections along line G-G' and line I-I' in FIG. 48B, respectively.

The TFT substrate 101D included in the scanning antenna 1000D includes a gate metal layer 3 (base portion 3*u*) in the first region Ro of the second antenna units U2. In contrast, the TFT substrate 101Da included in the scanning antenna 1000Da differs from the TFT substrate 101D in that the TFT substrate 101 Da includes the source metal layer 7 (base portion 7*u*) in the first region Ro of the second antenna units U2.

Here, the base portion 7*u* is integrally formed with the wiring line 7*w* of the second antenna units U2.

The TFT substrate 101Da can be manufactured by changing the patterning shape of the source conductive film 7' from the manufacturing method of the TFT substrate 101B, and thus illustration and description thereof are omitted. In the scanning antenna 1000Da, the thickness of the source metal layer (that is, the thickness of the source conductive film 7') contributes to the difference between the distance C1 and the distance C2 (C1−C2), and thus the thickness of the source conductive film 7' may be changed as appropriate. For example, as the source conductive film 7', a layered film (MoN/Al/MoN) may be formed by layering MoN (having a thickness of 50 nm, for example), Al (having a thickness of 100 nm, for example), and MoN (having a thickness of 50 nm, for example) in this order.

Modified Example 2

A scanning antenna 1000Db according to Modified Example 2 of the present embodiment will be described with reference to FIGS. 50A and 50B and FIGS. 51A to 51D. Common reference numerals may be assigned to the configuration common to the scanning antenna 1000D, and descriptions thereof may be omitted.

Figure 50B:
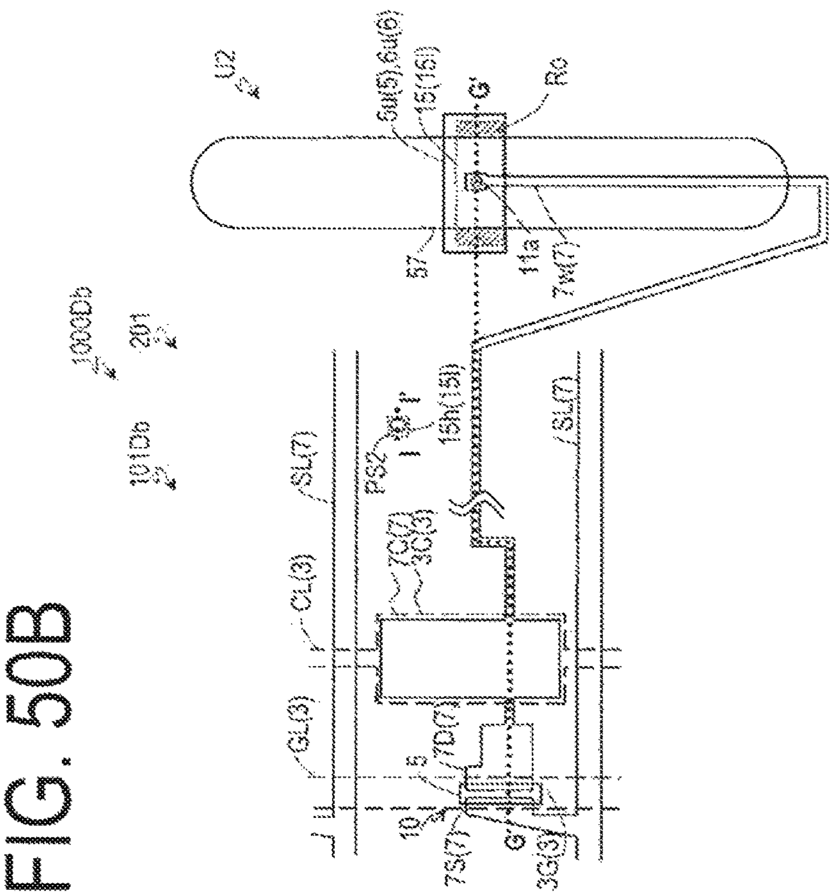
FIGS. 50A and 50B are schematic plan views illustrating a transmission and/or reception region R1 of a scanning antenna 1000Db according to Modified Example 2 of the fourth embodiment of the present disclosure.
Figure 50A:
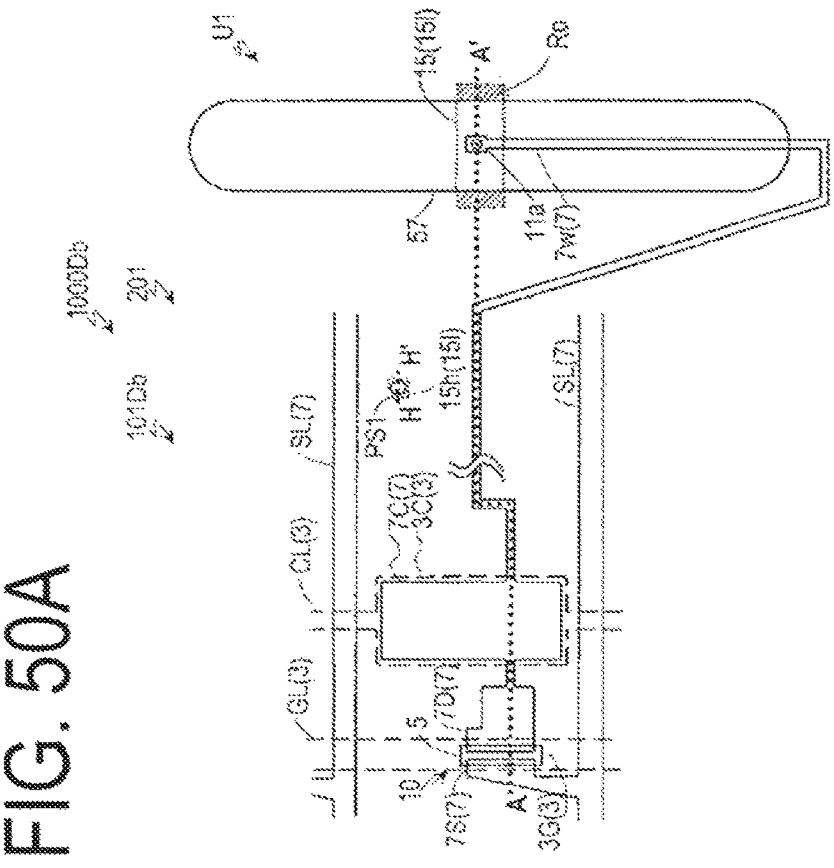
Figures 51A, 51B, 51C, 51D:
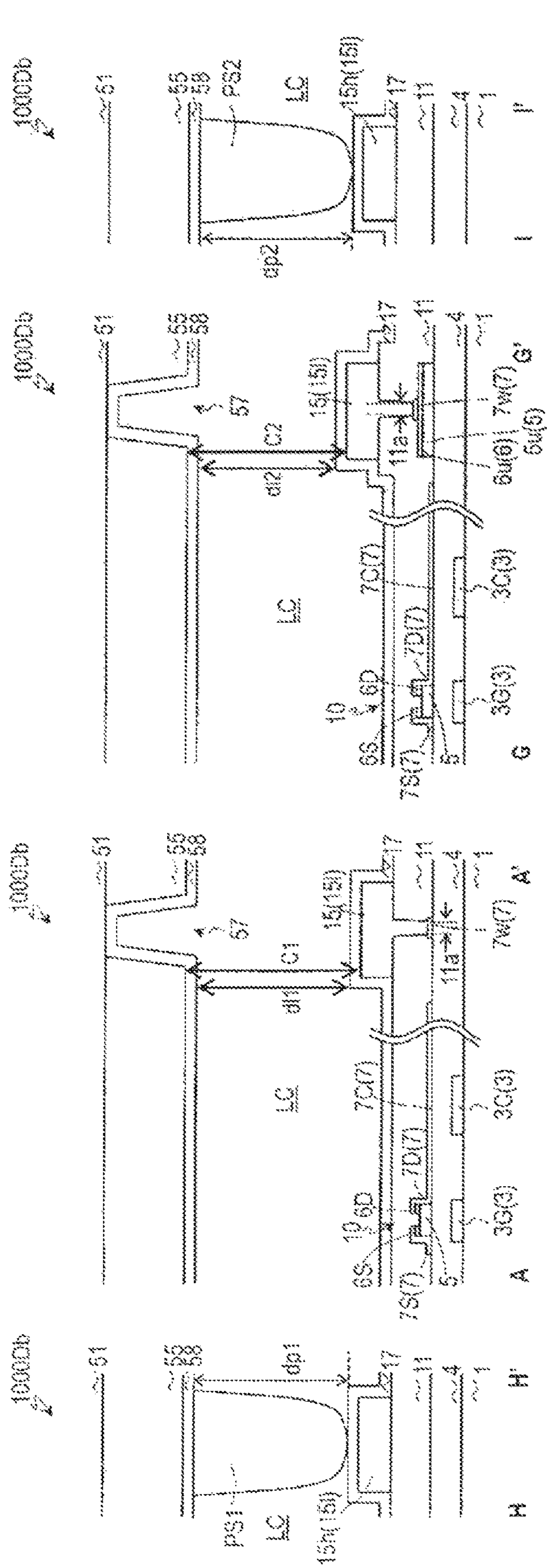
FIGS. 51A to 51D are schematic cross-sectional views illustrating the transmission and/or reception region R1 of the scanning antenna 1000Db.

FIGS. 50A and 50B are schematic plan views of a transmission and/or reception region R1 of the scanning antenna 1000Db, and FIGS. 51A to 51D are schematic cross-sectional views of the transmission and/or reception region R1 of the scanning antenna 1000Db. FIG. 50A is a schematic plan view of first antenna units U1 of the transmission and/or reception region R1 of the scanning antenna 1000Db, and FIG. 50B is a schematic plan view of second antenna units U2 of the transmission and/or reception region R1 of the scanning antenna 1000Db. FIGS. 51A to 51D illustrate cross-sections along the line H-H' and the line A-A' in FIG. 50A and the cross-sections along line G-G' and line I-I' in FIG. 50B, respectively.

The TFT substrate 101D included in the scanning antenna 1000D includes a gate metal layer 3 (base portion 3*u*) in the first region Ro of the second antenna units U2. In contrast, the TFT substrate 101Db included in the scanning antenna 1000Db differs from the TFT substrate 101D in that the TFT substrate 101 Da includes the semiconductor layer 5 and the contact layer 6 (base portions 5*u* and 6*u*) in the first region Ro of the second antenna units U2. Here, the base portions 5*u* and 6*u* are not electrically connected to any electrodes or wiring lines. In other words, the base portions 5*u* and 6*u* are in a floating state.

The TFT substrate 101Db can be manufactured by changing the patterning shapes of the intrinsic amorphous silicon film 5' and the $n^+$ amorphous silicon film 6' from the manufacturing method of the TFT substrate 101B, and thus illustration and description are omitted. In the scanning antenna 1000 Db, a sum of the thicknesses of the semiconductor layer 5 and the contact layer 6 (that is, a sum of the thicknesses of the intrinsic amorphous silicon film 5' and the $n^+$ amorphous silicon film 6') contributes to the difference between the distance C1 and the distance C2 (C1−C2), and thus the thicknesses of the intrinsic amorphous silicon film 5' and the $n^+$ type amorphous silicon film 6' may be appropriately changed. The intrinsic amorphous silicon film 5' having a thickness of 150 nm, for example, and the $n^+$ type amorphous silicon film 6' having a thickness of 50 nm may be formed.

Fifth Embodiment

In the present embodiment, the thickness of the slot electrode in the first antenna units U1 is different from the thickness of the slot electrode in the second antenna units U2.

The structure of a transmission and/or reception region R1 of the scanning antenna 1000E according to the present embodiment will be described with reference to FIGS. 52A and 52B and FIG. 53A to FIG. 53D. Common reference numerals may be assigned to the configuration common to the scanning antenna 1000B, and descriptions thereof may be omitted. The following mainly describes the points different from the previous embodiments.

Figure 52B:
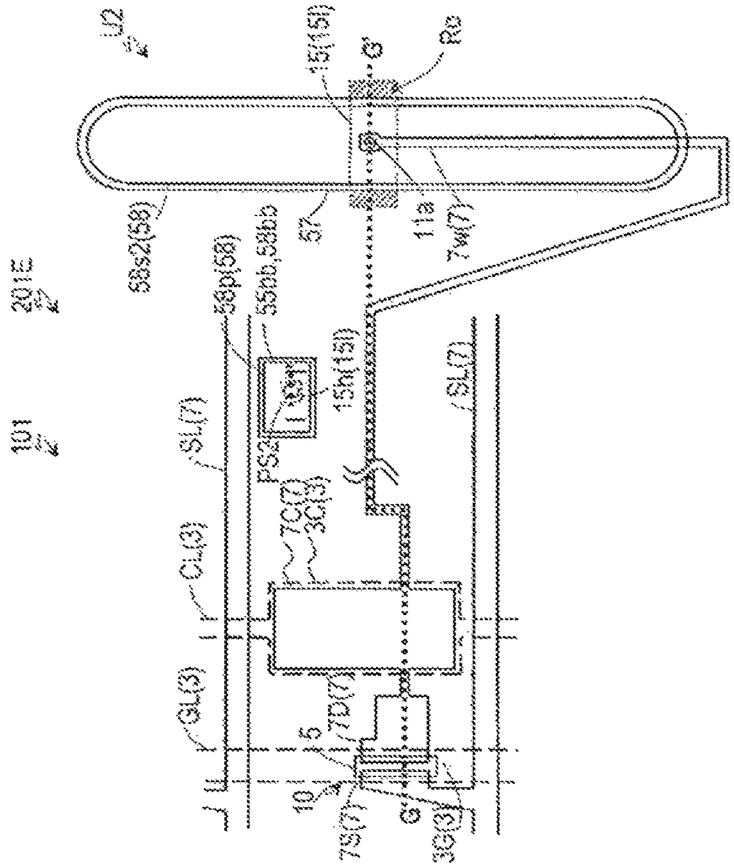
FIGS. 52A and 52B are schematic plan views illustrating a transmission and/or reception region R1 of a scanning antenna 1000E according to a fifth embodiment of the present disclosure.
Figure 52A:
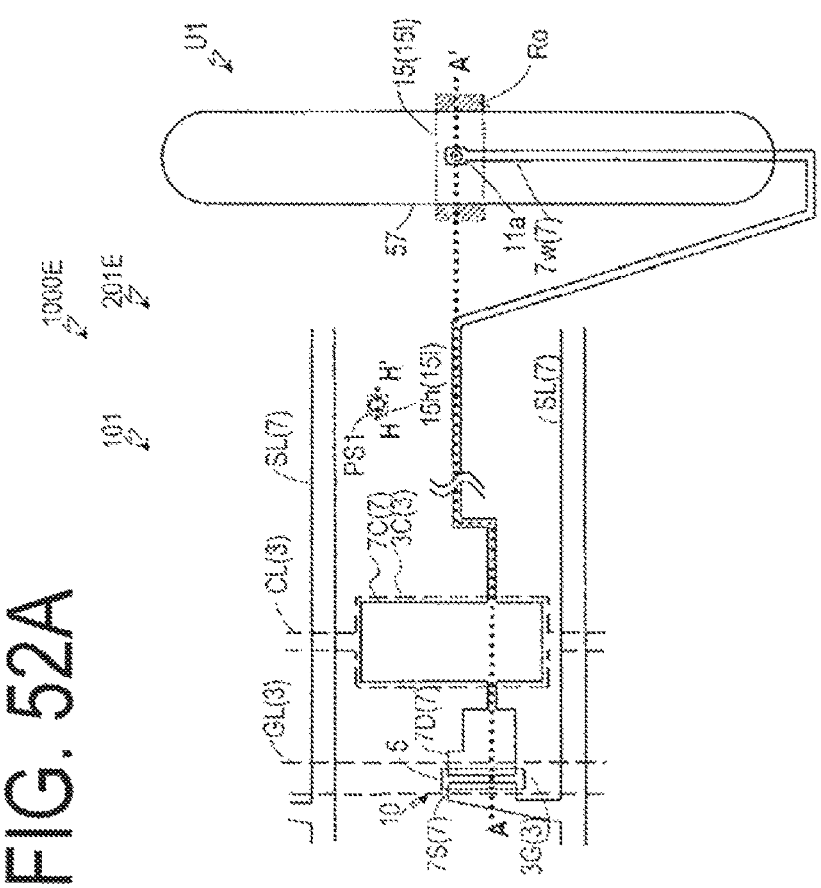
Figures 53A, 53B, 53C, 53D:
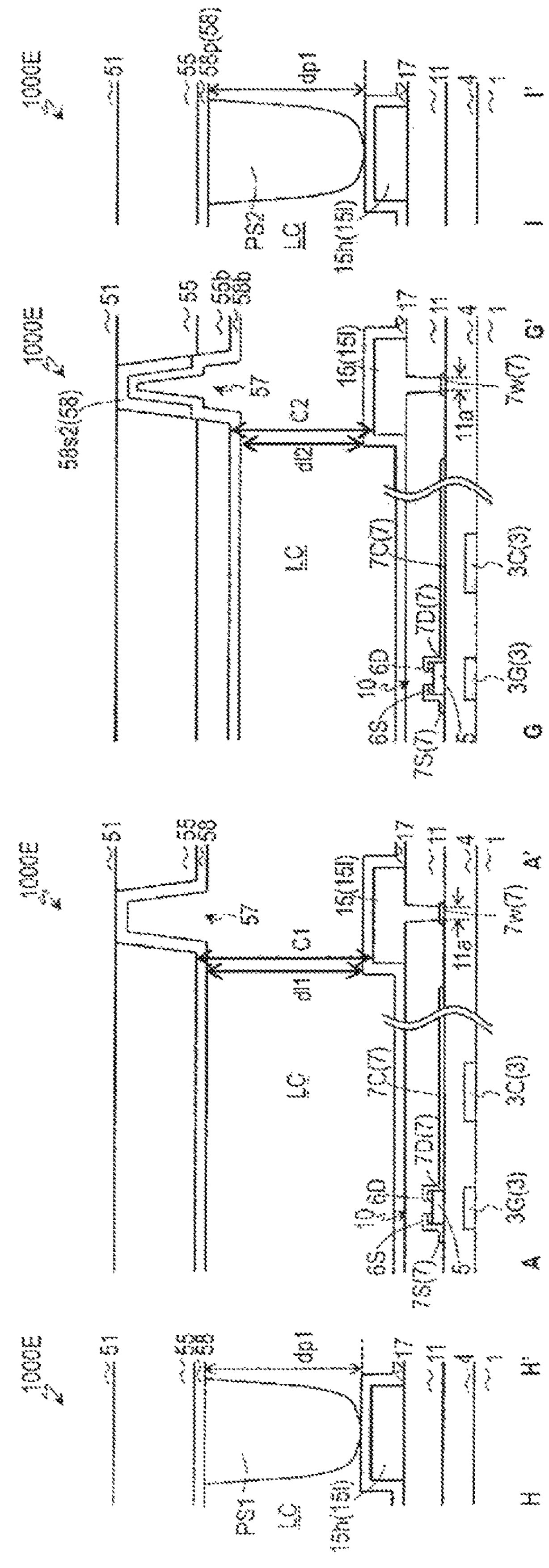
FIGS. 53A to 53D are schematic cross-sectional views illustrating the transmission and/or reception region R1 of the scanning antenna 1000E.

FIGS. 52A and 52B are schematic plan views of the transmission and/or reception region R1 of a scanning antenna 1000E, and FIGS. 53A to 53D are schematic cross-sectional views of the transmission and/or reception region R1 of the scanning antenna 1000E. FIG. 52A is a schematic plan view of first antenna units U1 of the transmission and/or reception region R1 of the scanning antenna 1000E, and FIG. 52B is a schematic plan view of second antenna units U2 of the transmission and/or reception region R1 of the scanning antenna 1000E. FIGS. 53A and 53B are schematic cross-sectional views of the first antenna units U1 of the transmission and/or reception region R1 of the scanning antenna 1000E, and FIG. 53C and FIG. 53D are schematic cross-sectional views of the second antenna units U2 of the transmission and/or reception region R1 of the scanning antenna 1000E. FIGS. 53A to 53D illustrate cross-sections along the line H-H' and the line A-A' in FIG. 52A and the cross-sections along line G-G' and line I-I' in FIG. 52B, respectively.

The slot substrate 201E included in the scanning antenna 1000E includes a first slot electrode 55 and a second slot electrode 55*b* formed to overlap at least the first region Ro of the second antenna units U2. Accordingly, the thickness of the slot electrodes in the first region Ro of the plurality of second antenna units U2 (that is, the sum of the thickness of the first slot electrode 55 and the thickness of the second slot electrode 55*b*) is greater than the thickness of the slot electrode in the first region Ro of the plurality of first antenna units U1 (that is, the thickness of the first slot electrode 55). Thus, the distance C2 in the normal direction of the dielectric substrate 1 between the patch electrode 15 and the slot electrode of the plurality of second antenna units U2 is smaller than the distance C1 in the normal direction of the dielectric substrate 1 between the patch electrode 15 and the slot electrode of the plurality of first antenna units U1. The thickness dl2 of the liquid crystal layer LC in the first region Ro of the plurality of second antenna units U2 is smaller than the thickness dl1 of the liquid crystal layer LC of the first region Ro of the plurality of first antenna units U1.

The second slot electrode 55*b* may be formed by using the same material as the first slot electrode 55, for example.

In this example, a second slot electrode 55*b* is formed on the first slot electrode 55. In the illustrated example, the second slot electrode 55*b* is formed in the entire region of the second antenna units U2, but includes an opening 55*bb* that overlaps with the columnar spacer PS2 of the second antenna units U2. A fourth insulating layer 58 is formed to cover the first slot electrode 55 in the first antenna units U1, and is formed only in the slot 57 of the first slot electrode 55 in the second antenna units U2. In the illustrated example, the fourth insulating layer 58 includes a portion formed in entire region of the first antenna units U1 and a portion 58*s*2 formed in the slot 57 of the first slot electrode 55 of the second antenna units U2. The fourth insulating layer 58 further includes a portion 58*p* that overlaps with the columnar spacer PS2 in the second antenna units U2.

The slot substrate 201E further includes a fifth insulating layer 58*b* provided on the second slot electrode 55*b* in the second antenna units U2. The fifth insulating layer 58*b* is formed to cover the second slot electrode 55*b* of the second antenna units U2 and the portion 58*s*2 of the fourth insulating layer 58 formed in the slot 57. In the illustrated example, the fifth insulating layer 58*b* is formed in entire region of the second antenna units U2, but includes an opening 58*b* b that overlaps with the columnar spacer PS2 of the second antenna units U2.

Note that the second slot electrode 55*b* may be formed between the first slot electrode 55 and the fourth insulating layer 58. In this case, the fifth insulating layer 58*b* may be omitted. However, as illustrated, in the process of etching the conductive film for forming the second slot electrode 55*b* by providing an insulating layer (here, the fourth insulating layer 58) between the first slot electrode 55 and the second slot electrode 55*b*, etching of the first slot electrode 55 (etching shift) can be suppressed.

Note that the present embodiment is not limited to the illustrated example. For example, the slot electrode of the first antenna units U1 and the slot electrode of the second antenna units U2 having different thicknesses may be formed by patterning the same conductive film and varying the etching amount between the slot electrodes.

In this example, the second slot electrode 55*b* and the fifth insulating layer 58*b* are formed not to overlap with both the columnar spacer PS1 of the first antenna units U1 and the columnar spacer PS2 of the second antenna units U2. The fourth insulating layer 58 is formed overlapping both the columnar spacer PS1 of the first antenna units U1 and the columnar spacer PS2 of the second antenna units U2. Therefore, the columnar spacer PS1 of the first antenna units U1 and the columnar spacer PS2 of the second antenna units U2 have the same height dp1. This has the advantage of being easy to form the columnar spacer PS. However, the heights of the columnar spacer PS1 of the first antenna units U1 and the columnar spacer PS2 of the second antenna units U2 may be different from each other.

Manufacturing Method of Slot Substrate 201E

A manufacturing method of the slot substrate 201E will be described with reference to FIGS. 54A to 54I. FIGS. 54A to 54I are schematic cross-sectional views for illustrating the manufacturing method of the slot substrate 201E. FIGS. 54A to 54I illustrate cross-sections (cross-section A-A', cross-section G-G', and cross-section H-H' of the slot substrate 201E) corresponding to FIG. 53B, FIG. 53C, and FIG. 53A. Note that illustration of the non-transmission and/or reception region R2 is omitted. The following description mainly describes differences from the manufacturing method of the slot substrate 201 described with reference to FIGS. 16A to 16D.

Figures 54A, 54B, 54C, 54D, 54E, 54F, 54G, 54H, 54I:
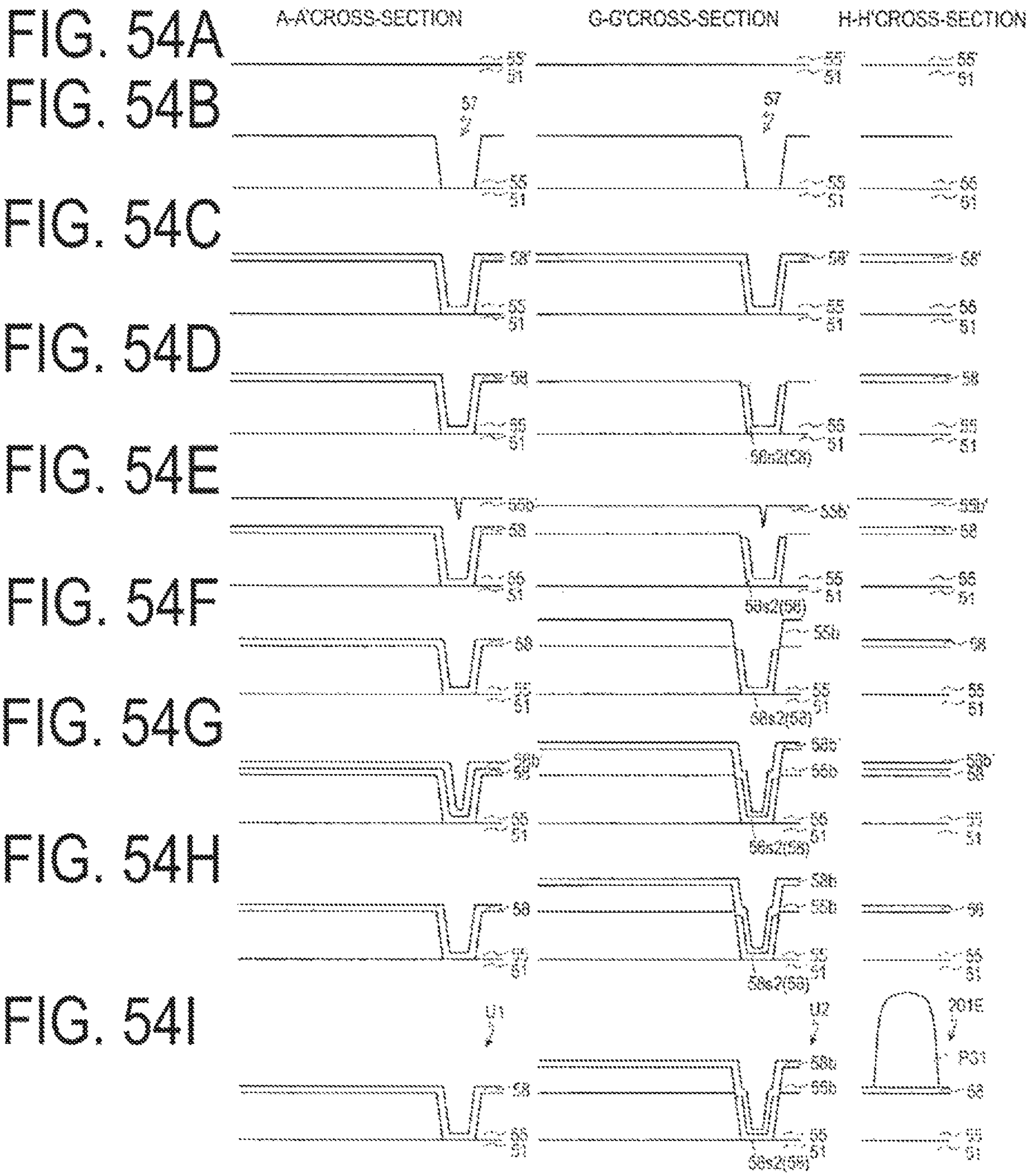
FIGS. 54A to 54I are schematic cross-sectional views for illustrating a manufacturing method of a slot substrate 201E included in the scanning antenna 1000E.

First, a first metal film 55' is formed on the dielectric substrate 51 as illustrated in FIG. 54A. Here, as the metal film 55', a layered film is used by layering Ti (having a thickness of 20 nm, for example) and Cu (having a thickness of 3000 nm, for example) in this order.

Thereafter, the first slot electrode 55 including the plurality of slots 57 is formed in the first antenna unit formation region and the second antenna unit formation region by patterning the first metal film 55', as illustrated in FIG. 54B.

Thereafter, as illustrated in FIG. 54C, the fourth insulating film 58' is formed on the first slot electrode 55 and within the slot 57. For the fourth insulating film 58', for example, a silicon oxide ($SiO_x$) film, a silicon nitride ($SiN_x$) film, a silicon oxynitride ($SiO_xN_y$; x>y) film, a silicon nitride oxide ($SiN_xO_y$; x>y) film, or the like can be used as appropriate. Here, as the fourth insulating film 58', a silicon nitride ($Si_xN_y$) film having a thickness of 100 nm, for example, is formed.

Next, as illustrated in FIG. 54D, the fourth insulating film 58' is etched by a known photolithography process to form the fourth insulating layer 58. The fourth insulating layer 58 is formed over the first antenna unit formation region so as to cover the first slot electrode 55 and the slot 57 in the first antenna unit formation region, and is formed only in the slot 57 in the second antenna unit formation region.

Next, as illustrated in FIG. 54E, a second metal film 55*b*' is formed on the first slot electrode 55 and on the fourth insulating layer 58. The second metal film 55*b*' includes, for example, a Cu film or an Al film. Here, as the second metal film 55*b*', a layered film is used by layering Ti (having a thickness of 20 nm, for example) and Cu (having a thickness of 180 nm, for example) in this order.

Thereafter, the second metal film 55*b*' is patterned to form the second slot electrode 55*b* on the first slot electrode 55 in the second antenna unit formation region, as illustrated in FIG. 54F. The second slot electrode 55*b* is not formed in the slot 57 and is formed in contact with the first slot electrode 55.

By forming the fourth insulating layer 58, etching of the first slot electrode 55 is suppressed in the process of forming the second metal film 55*b*'.

Next, as illustrated in FIG. 54G, the fifth insulating film 58*b*' is formed on the fourth insulating layer 58 and the second slot electrode 55*b*. For the fifth insulating film 58*b*', for example, a silicon oxide ($SiO_x$) film, a silicon nitride ($SiN_x$) film, a silicon oxynitride ($SiO_xN_y$; x>y) film, a silicon nitride oxide ($SiN_xO_y$; x>y) film, or the like can be used as appropriate. Here, as the fifth insulating film 58*b*', a silicon nitride ($Si_xN_y$) film having a thickness of 100 nm, for example, is formed.

Next, as illustrated in FIG. 54H, the fifth insulating film 58*b*' is etched by a known photolithography process to form the fifth insulating layer 58*b*. The fifth insulating layer 58*b* is formed to cover the second slot electrode 55*b* and the slot 57 in the second antenna unit formation region. Here, the fifth insulating layer 58*b* is not formed in the first antenna unit formation region. Here, the fifth insulating layer 58*b* is formed not to overlap with the columnar spacers PS1 and PS2.

Next, as illustrated in FIG. 54I, the columnar spacers PS1 and PS2 are formed on the fourth insulating layer 58. Here, the columnar spacers PS1 and PS2 are formed by using an acrylic resin film (having a thickness of 2.4 μm, for example).

In this way, the slot substrate 201E is manufactured.

Here, for example, the distance C1 in the normal direction of the dielectric substrate 1 between the patch electrode 15 and the slot electrode 55 of the plurality of first antenna units U1 is 2.8 μm (design value), and the distance C2 in the normal direction of the dielectric substrate 1 between the patch electrode 15 and the slot electrode 55 of the plurality of second antenna units U2 is 2.6 μm (design value). The difference between the distance C1 and the distance C2 (C1−C2) is 0.2 μm (design value). Here, the difference between distance C1 and distance C2 (C1−C2) corresponds to the thickness of the second slot electrode 55*b*, for example. For example, depending on the environment temperature at which the scanning antenna is installed, the distance C1 may vary approximately from 2.7 μm to 3.2 μm, and the distance C2 may vary approximately from 2.2 μm to 2.7 μm, for example. The difference between the distance C1 and the distance C2 (C1−C2) may vary approximately from 0.05 μm to 1.0 μm.

Modified Example

A scanning antenna 1000Ea according to Modified Example of the present embodiment will be described with reference to FIGS. 55A and 55B and FIGS. 56A to 56D. Common reference numerals may be assigned to the configuration common to the scanning antenna 1000E, and descriptions thereof may be omitted.

Figure 55A:
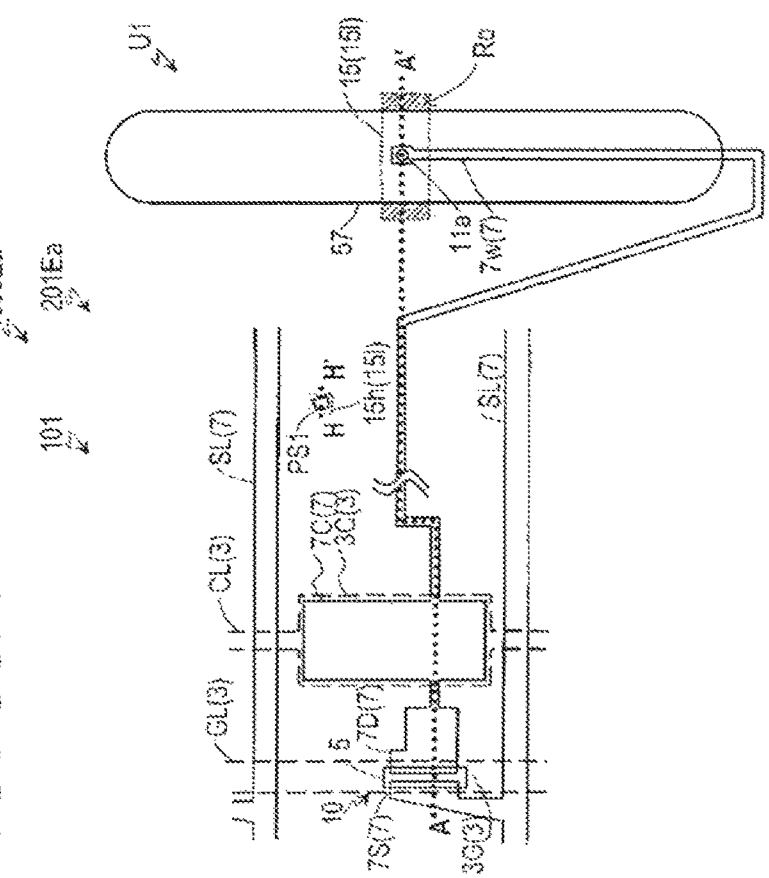
FIGS. 55A and 55B are schematic plan views illustrating a transmission and/or reception region R1 of a scanning antenna 1000Ea according to Modified Example of the fifth embodiment of the present disclosure.
Figure 55B:
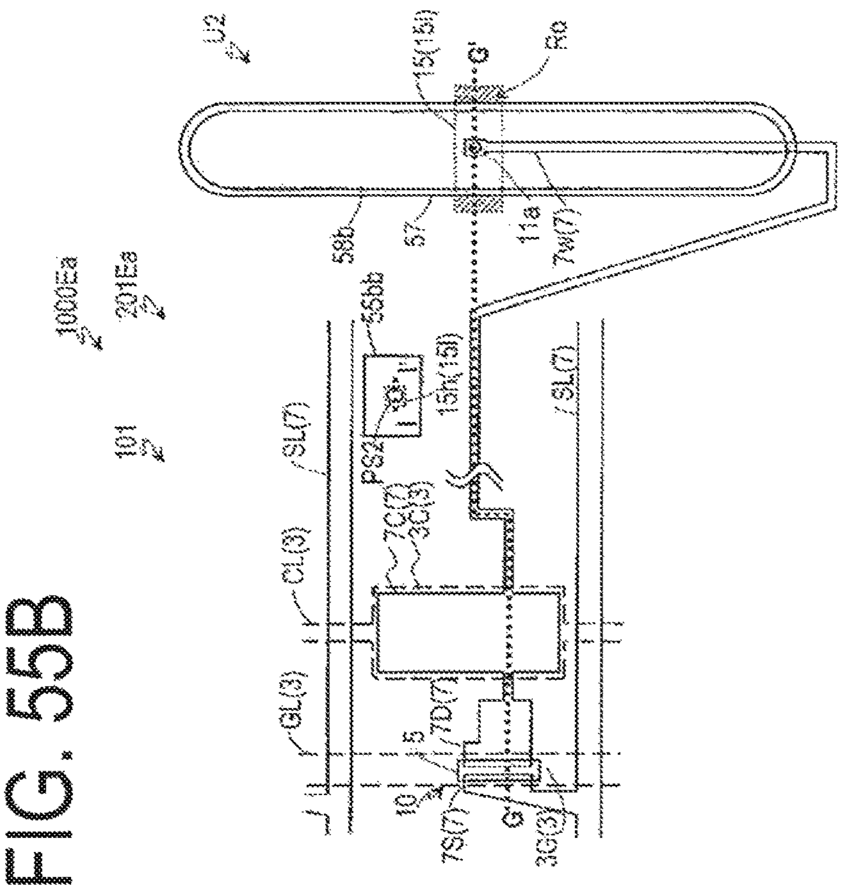
Figures 56A, 56B, 56C, 56D:
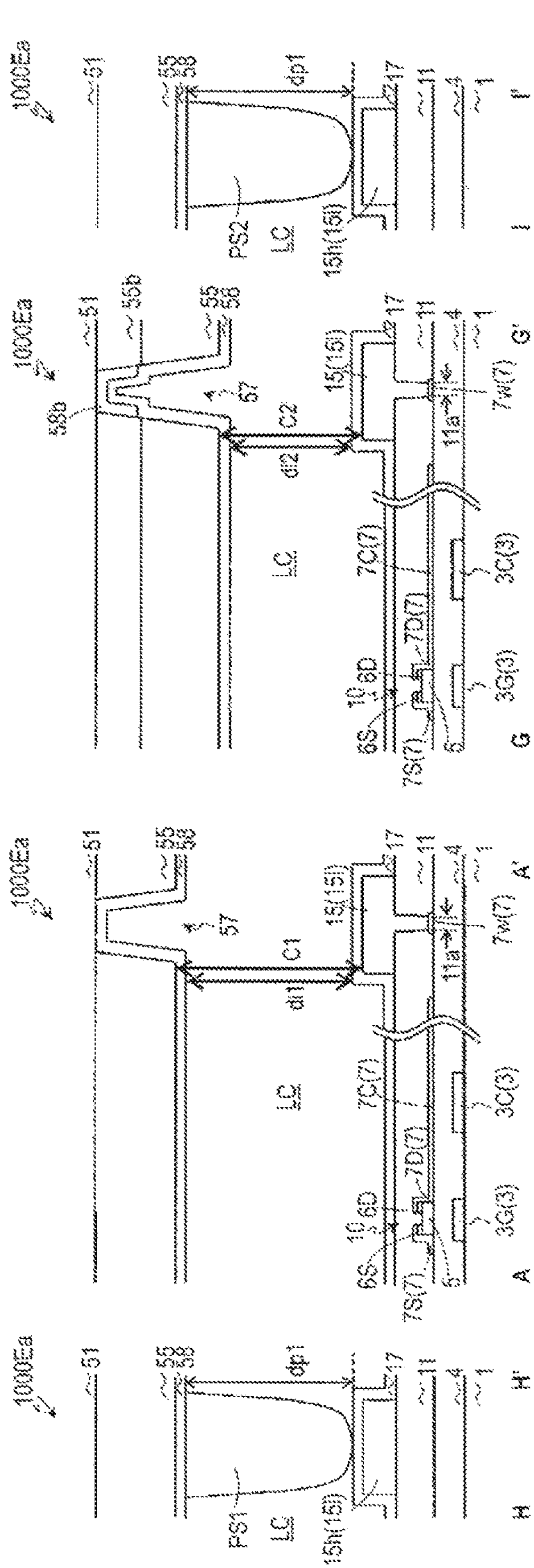
FIGS. 56A to 56D are schematic cross-sectional views illustrating the transmission and/or reception region R1 of the scanning antenna 1000Ea.

FIGS. 55A and 55B are schematic plan views of a transmission and/or reception region R1 of the scanning antenna 1000Ea, and FIGS. 56A to 56D are schematic cross-sectional views of the transmission and/or reception region R1 of the scanning antenna 1000Ea. FIG. 55A is a schematic plan view of first antenna units U1 of the transmission and/or reception region R1 of the scanning antenna 1000Ea, and FIG. 55B is a schematic plan view of second antenna units U2 of the transmission and/or reception region R1 of the scanning antenna 1000Ea. FIGS. 56A to 56D illustrate cross-sections along the line H-H' and the line A-A' in FIG. 55A and the cross-sections along line G-G' and line I-I' in FIG. 55B, respectively.

In a slot substrate 201Ea included in the scanning antenna 1000Ea, the second slot electrode 55*b* differs from the slot substrate 201E in that the second slot electrode 55*b* is formed between the dielectric substrate 51 and the first slot electrode 55. The slot substrate 201Ea further includes a fifth insulating layer 58*b* between the second slot electrode 55*b* and the first slot electrode 55 in the second antenna units U2. The fifth insulating layer 58*b* is formed only within the slot 57. Note that the fifth insulating layer 58*b* may be omitted.

Manufacturing Method of Slot Substrate 201Ea

A manufacturing method of the slot substrate 201Ea will be described with reference to FIGS. 57A to 57H. FIGS. 57A to 57H are schematic cross-sectional views for illustrating a manufacturing method of the slot substrate 201Ea. FIGS. 57A to 57H illustrate cross-sections (cross-section A-A', cross-section G-G', and cross-section H-H' of the slot substrate 201Ea) corresponding to FIG. 56B, FIG. 56C, and FIG. 56A. Note that illustration of the non-transmission and/or reception region R2 is omitted. The following description mainly describes differences from the manufacturing method of the slot substrate 201E described with reference to FIGS. 54A to 54I.

Figures 57A, 57B, 57C, 57D, 57E, 57F, 57G, 57H:
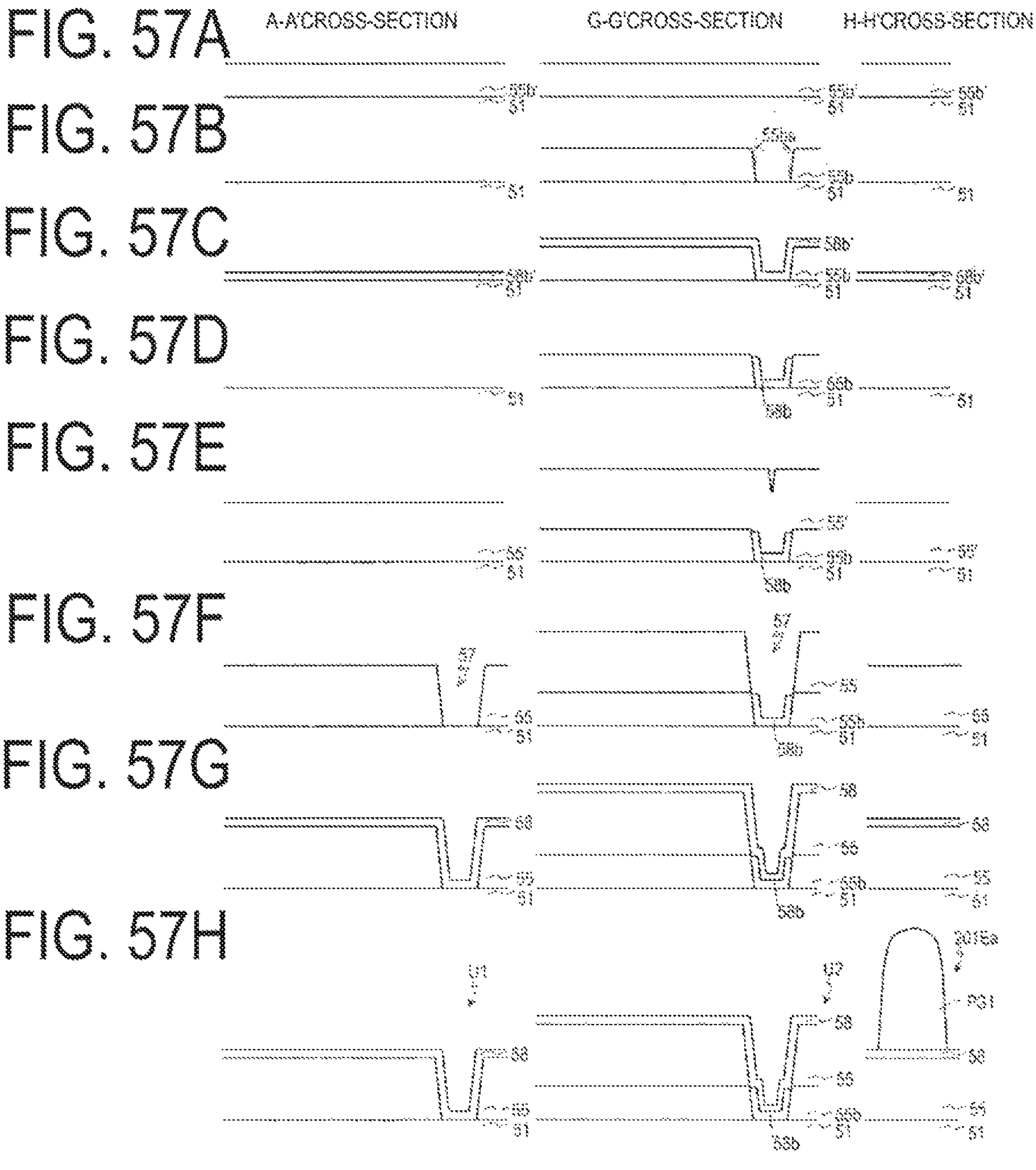
FIGS. 57A to 57H are schematic cross-sectional views for illustrating a manufacturing method of a slot substrate 201Ea included in the scanning antenna 1000Ea.

First, a second metal film 55*b*' is formed on the dielectric substrate 51 as illustrated in FIG. 57A.

Next, the second metal film 55*b*' is patterned to obtain a second slot electrode 55*b* including a plurality of openings 55*bs*, as illustrated in FIG. 57B. The second slot electrode 55*b* is not formed in the first antenna unit formation region.

Thereafter, as illustrated in FIG. 57C, a fifth insulating film 58*b*' is formed on the dielectric substrate 51, on the second slot electrode 55*b*, and within the opening 55*bs*. Here, as the fifth insulating film 58*b*', a silicon nitride ($Si_xN_y$) film having a thickness of 100 nm, for example, is formed.

Next, as illustrated in FIG. 57D, the fifth insulating film 58*b*' is etched by a known photolithography process to form the fifth insulating layer 58*b*. The fifth insulating layer 58*b* is formed only within the opening 55*bs*.

Next, as illustrated in FIG. 57E, a first metal film 55' is formed on the dielectric substrate 51, on the second slot electrode 55*b*, and on the fifth insulating layer 58*b*.

Next, the first metal film 55' is patterned to form the first slot electrode 55 including the plurality of slots 57, as illustrated in FIG. 57F. The slot 57 is formed to overlap the opening 55*bs* of the second slot electrode 55*b*. In the second antenna unit formation region, the first slot electrode 55 is formed so as to be in contact with the second slot electrode 55*b*.

Next, as illustrated in FIG. 57G, the fourth insulating layer 58 is formed to cover the first slot electrode 55 and within the slot 57.

Next, as illustrated in FIG. 57H, the columnar spacers PS1 and PS2 are formed on the fourth insulating layer 58.

In this way, the slot substrate 201Ea is manufactured.

The TFT substrate 101 is manufactured by the method described above. Here, as the patch conductive film 151', a layered film (Cu/Ti) may be formed including a Ti film (having a thickness of 20 nm, for example) and a Cu film (having a thickness of 200 nm, for example) in this order.

Sixth Embodiment

In the present embodiment, by forming an additional insulating layer in the second antenna unit region U2 of the slot substrate, a sum of the thicknesses of the first region Ro of the antenna unit and the insulating layer between the dielectric substrate 51 and the slot electrode 55 is varied between the first antenna units U1 and the second antenna units U2.

The structure of a transmission and/or reception region R1 of a scanning antenna 1000F according to the present embodiment will be described with reference to FIGS. 58A and 58B and FIGS. 59A to 59D. Common reference numerals may be assigned to the configuration common to the scanning antenna 1000E, and descriptions thereof may be omitted. The following mainly describes the points different from the previous embodiments.

Figure 58B:
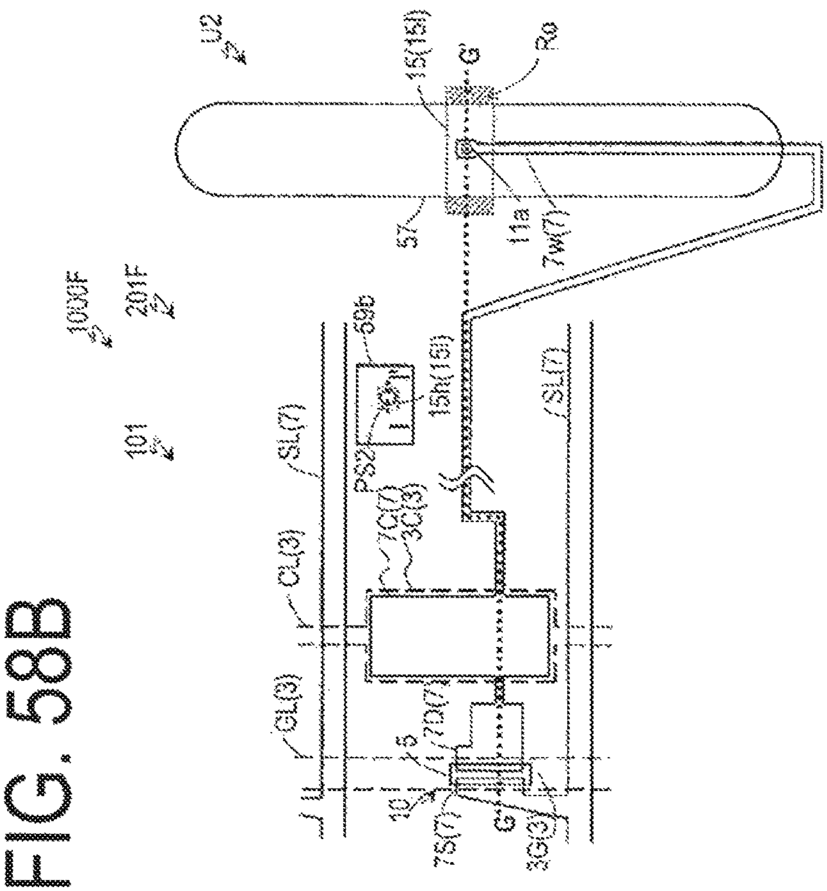
FIGS. 58A and 58B are schematic plan views illustrating a transmission and/or reception region R1 of a scanning antenna 1000F according to a sixth embodiment of the present disclosure.
Figure 58A:
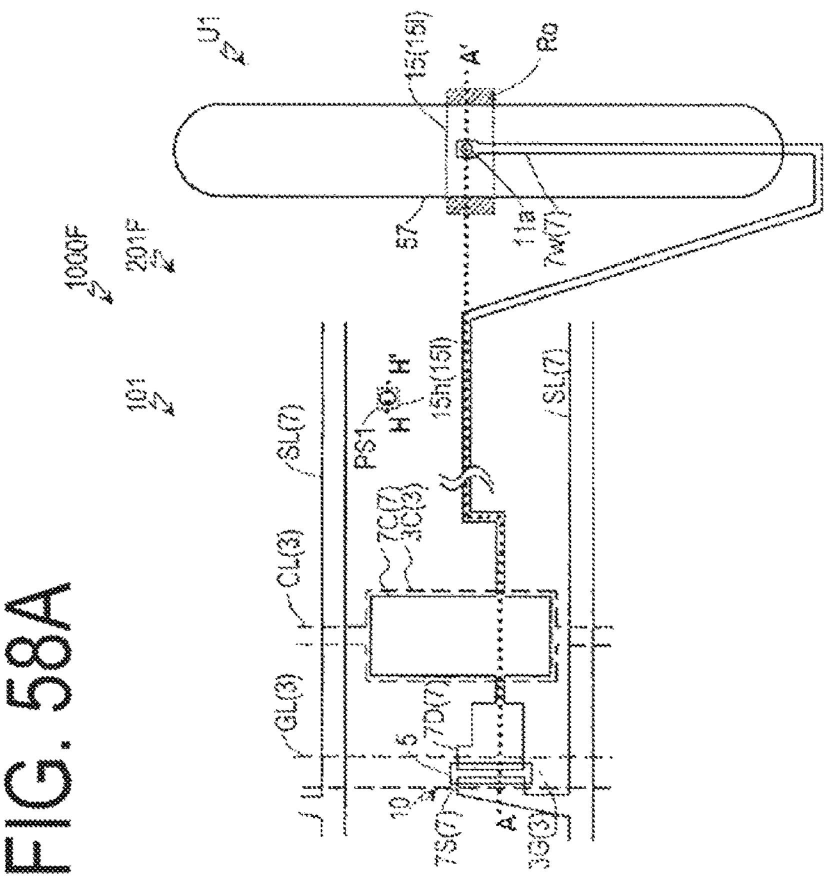
Figure 59A:
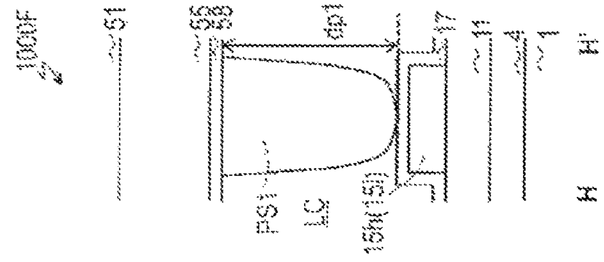
FIGS. 59A to 59D are schematic cross-sectional views illustrating the transmission and/or reception region R1 of the scanning antenna 1000F.
Figure 59B:
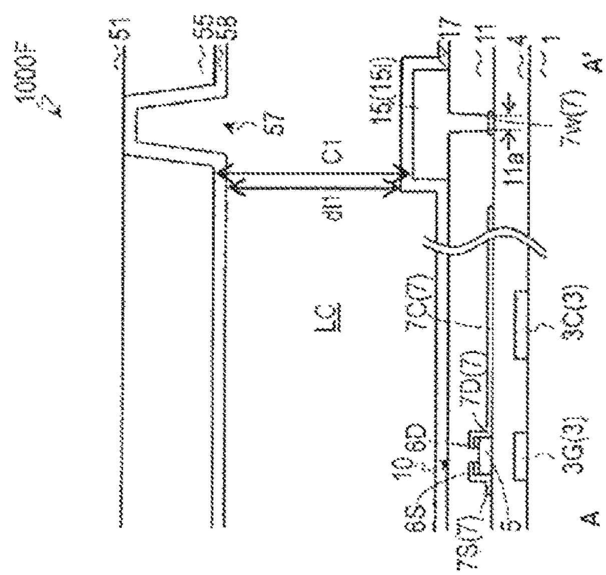
Figure 59C:
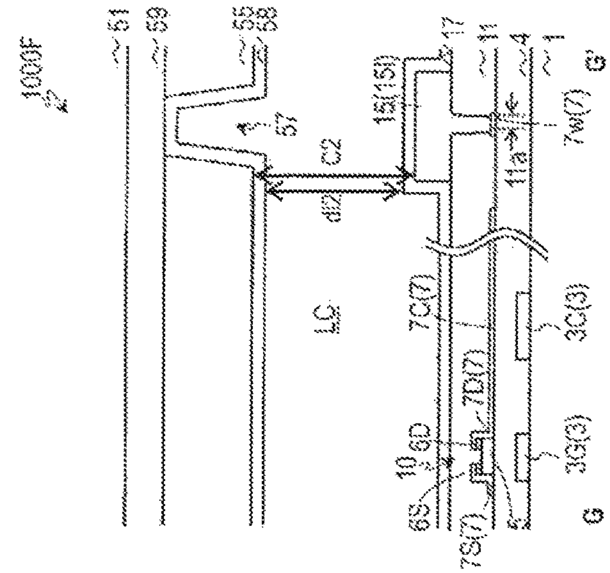
Figure 59D:
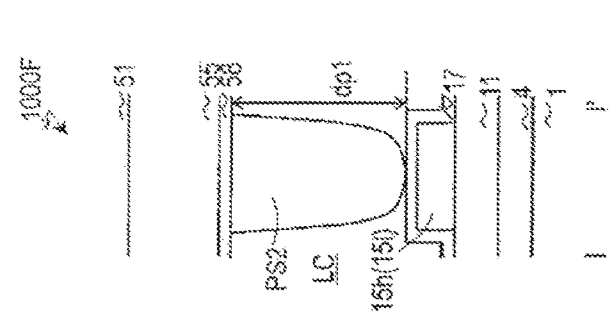

FIGS. 58A and 58B are schematic plan views of the transmission and/or reception region R1 of the scanning antenna 1000F, and FIGS. 59A to 59D are schematic cross-sectional views of the transmission and/or reception region R1 of the scanning antenna 1000F. FIG. 58A is a schematic plan view of first antenna units U1 of the transmission and/or reception region R1 of the scanning antenna 1000F, and FIG. 58B is a schematic plan view of second antenna units U2 of the transmission and/or reception region R1 of the scanning antenna 1000F. FIGS. 59A and 59B are schematic cross-sectional views of the first antenna units U1 of the transmission and/or reception region R1 of the scanning antenna 1000F, and FIGS. 59C and 59D are schematic plan views of the second antenna units U2 of the transmission and/or reception region R1 of the scanning antenna 1000F. FIGS. 59A to 59D illustrate cross-sections along the line H-H' and the line A-A' in FIG. 58A and the cross-sections along line G-G' and line I-I' in FIG. 58B, respectively.

The structure of the first antenna units U1 of the scanning antenna 1000F has the same structure as the first antenna units U1 of the scanning antenna 1000E. The second antenna units U2 of the scanning antenna 1000F differs from the first antenna units U1 in that the additional insulating layer 59 is included in at least the first region Ro. The additional insulating layer 59 is not formed in first antenna units U1. Thus, the distance C2 in the normal direction of the dielectric substrate 1 between the patch electrode 15 and the slot electrode 55 of the plurality of second antenna units U2 is smaller than the distance C1 in the normal direction of the dielectric substrate 1 between the patch electrode 15 and the slot electrode 55 of the plurality of first antenna units U1. The thickness dl2 of the liquid crystal layer LC in the first region Ro of the plurality of second antenna units U2 is smaller than the thickness dl1 of the liquid crystal layer LC of the first region Ro of the plurality of first antenna units U1. Here, an insulating layer is not formed in the first region Ro of the plurality of second antenna units U2 and between the dielectric substrate 51 and the slot electrode 55, while an additional insulating layer 59 is formed in the first region Ro of the plurality of first antenna units U1 and between the dielectric substrate 51 and the slot electrode 55. The additional insulating layer 59 may be formed from an inorganic material or may be formed from an organic material.

Here, the additional insulating layer 59 is formed not to overlap with the columnar spacer PS2 of the second antenna units U2. For example, the additional insulating layer 59 includes an opening 59*b* that overlaps with the columnar spacer PS2 of the second antenna units U2 when viewed from the normal direction of the dielectric substrate 51. Therefore, the columnar spacer PS1 of the first antenna units U1 and the columnar spacer PS2 of the second antenna units U2 have the same height dp1. This has the advantage of being easy to form the columnar spacer PS. However, the heights of the columnar spacer PS1 of the first antenna units U1 and the columnar spacer PS2 of the second antenna units U2 may be different from each other.

Note that, by forming an insulating layer between the dielectric substrate 51 and the slot electrode 55, and forming an opening or a recessed portion overlapping at least the first region Ro in the insulating layer, the sum of the thicknesses of the first region Ro of the antenna unit and the insulating layer between the dielectric substrate 51 and the slot electrode 55 may be varied between the first antenna units U1 and the second antenna units U2. As a result, the distance in the normal direction of the dielectric substrate 1 between the patch electrode 15 and the slot electrode 55 can be varied between the first antenna units U1 and the second antenna units U2.

Manufacturing Method of Slot Substrate 201F

A manufacturing method of a slot substrate 201F included in the scanning antenna 1000F will be described with reference to FIGS. 60A to 60F. FIGS. 60A to 60F are schematic cross-sectional views for illustrating a manufacturing method of the slot substrate 201F. FIGS. 60A to 60F illustrate cross-sections (cross-section A-A', cross-section G-G', and cross-section H-H' of the slot substrate 201F) corresponding to FIG. 59B, FIG. 59C, and FIG. 59A. The following description mainly describes differences from the manufacturing method of the slot substrate 201E described with reference to FIGS. 54A to 54I.

Figures 60A, 60B, 60C, 60D, 60E, 60F:
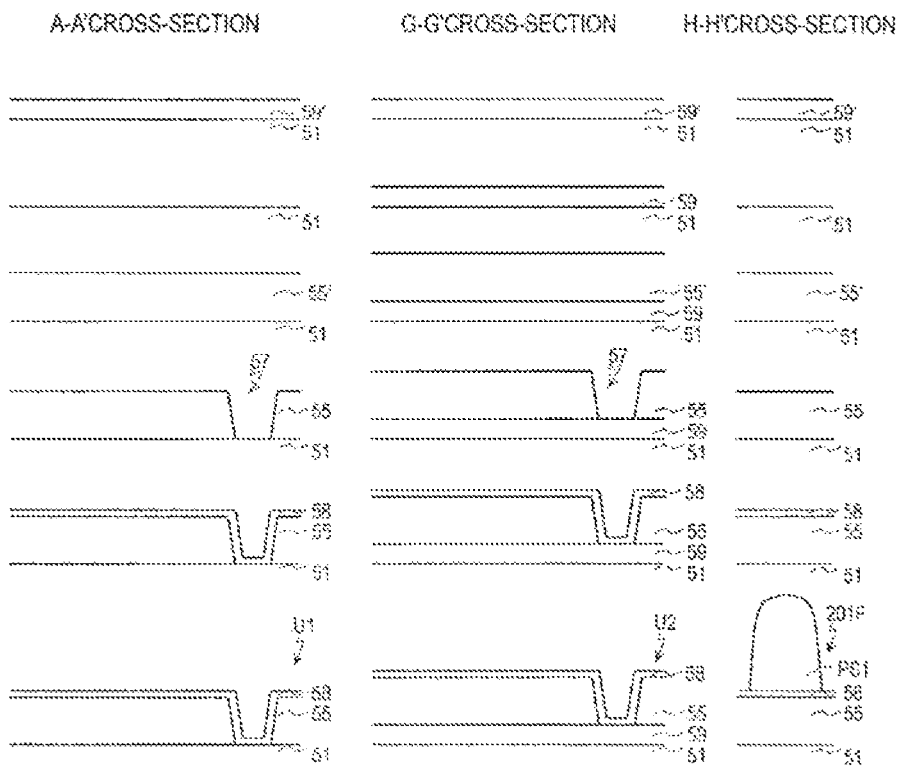
FIGS. 60A to 60F are schematic cross-sectional views for illustrating a manufacturing method of a slot substrate 201F included in the scanning antenna 1000F.

First, an insulating film 59' is formed on the dielectric substrate 51 as illustrated in FIG. 60A. The insulating film 59' is formed by the CVD method, for example. For the insulating film 59', a silicon oxide ($SiO_x$) film, a silicon nitride ($Si_xN_y$) film, a silicon oxynitride ($SiO_xN_y$; x>y) film, a silicon nitride oxide ($SiN_xO_y$; x>y) film, or the like can be used as appropriate. Alternatively, the insulating film 59' may be formed from an acrylic resin, a polyimide resin, or a silicone resin. The insulating film 20' may be a photosensitive resin. Here, as the insulating film 59', a silicon nitride ($Si_xN_y$) film having a thickness of 200 nm, for example, is formed.

Next, as illustrated in FIG. 60B, the insulating film 59' is etched by a known photolithography process to form an additional insulating layer 59. The additional insulating layer 59 is formed only in the second antenna unit formation region.

Next, as illustrated in FIG. 60C, the first metal film 55' is formed on the dielectric substrate 51 and on the additional insulating layer 59.

Thereafter, as illustrated in FIG. 60D, by patterning the first metal film 55', the slot electrode 55 including the plurality of slots 57 is formed in the first antenna unit formation region and the second antenna unit formation region.

Thereafter, as illustrated in FIG. 60E, the fourth insulating layer 58 is formed on the slot electrode 55 and within the slot 57.

Next, as illustrated in FIG. 60F, the columnar spacers PS1 and PS2 are formed on the fourth insulating layer 58.

In this way, the slot substrate 201F is manufactured.

Here, for example, the distance C1 in the normal direction of the dielectric substrate 1 between the patch electrode 15 and the slot electrode 55 of the plurality of first antenna units U1 is 2.8 μm (design value), and the distance C2 in the normal direction of the dielectric substrate 1 between the patch electrode 15 and the slot electrode 55 of the plurality of second antenna units U2 is 2.6 μm (design value). The difference between the distance C1 and the distance C2 (C1−C2) is 0.2 μm (design value). Here, the difference between the distance C1 and the distance C2 (C1−C2) corresponds to the thickness of the additional insulating layer 59, for example. For example, depending on the environment temperature at which the scanning antenna is installed, for example, the distance C1 may vary approximately from 2.7 μm to 3.2 μm, and the distance C2 may vary approximately from 2.2 μm to 2.7 μm. The difference between the distance C1 and the distance C2 (C1−C2) may vary approximately from 0.05 μm to 1.0 μm.

Seventh Embodiment

In the present embodiment, the distance between the patch electrode 15 and the slot electrode 55 is varied between the first antenna units U1 and the second antenna units U2 by forming a recessed portion in the surface of the dielectric substrate 51 (the surface closer to the liquid crystal layer LC).

The structure of a transmission and/or reception region R1 of a scanning antenna 1000G according to the present embodiment will be described with reference to FIGS. 61A and 61B and FIGS. 62A to 62D. Common reference numerals may be assigned to the configuration common to the scanning antenna 1000E, and descriptions thereof may be omitted. The following mainly describes the points different from the previous embodiments.

Figure 61B:
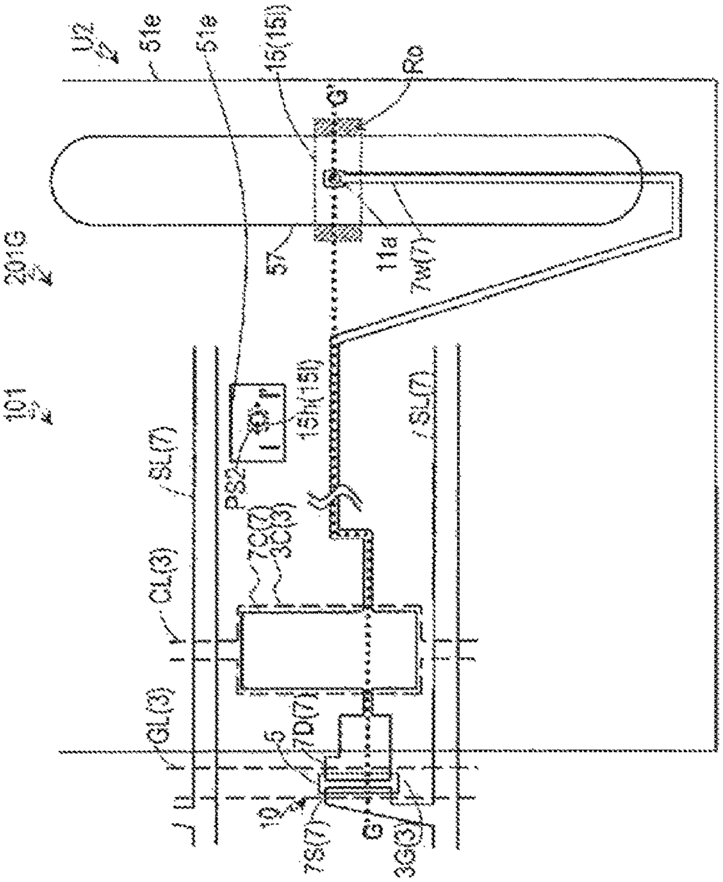
FIGS. 61A and 61B are schematic plan views illustrating a transmission and/or reception region R1 of a scanning antenna 1000G according to a seventh embodiment of the present disclosure.
Figure 61A:
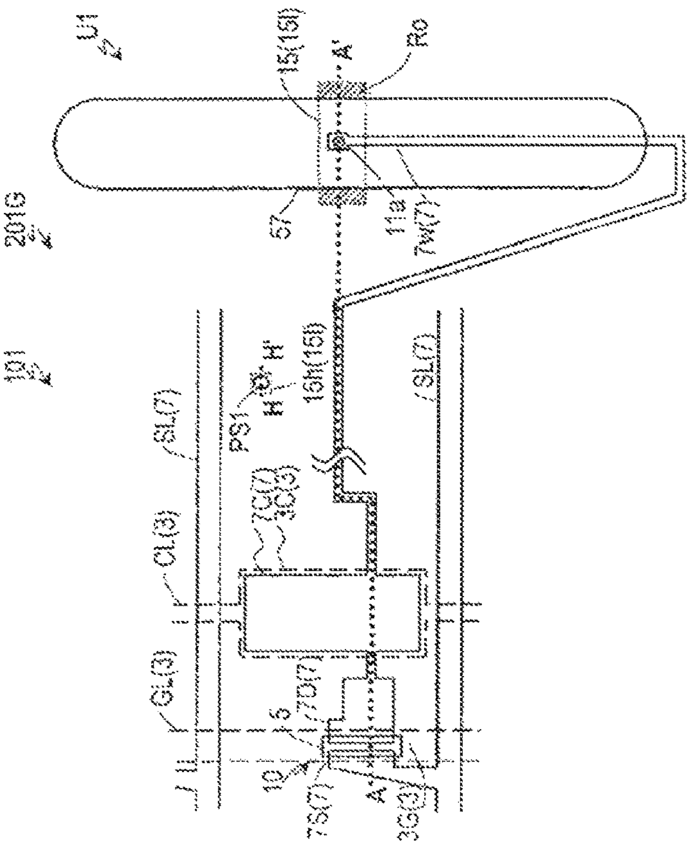
Figures 62A, 62B, 62C, 62D:
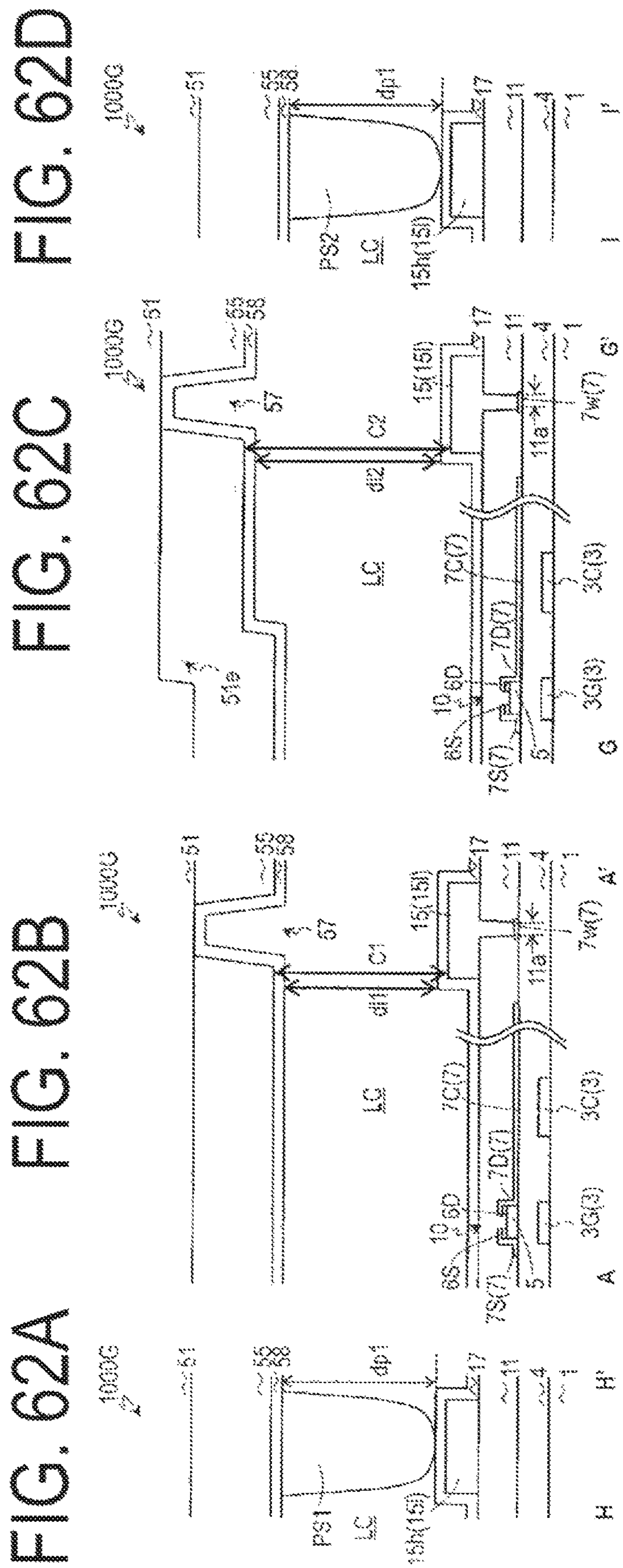
FIGS. 62A to 62D are schematic cross-sectional views illustrating the transmission and/or reception region R1 of the scanning antenna 1000G.

FIGS. 61A and 61B are schematic plan views of the transmission and/or reception region R1 of the scanning antenna 1000G, and FIGS. 62A to 62D are schematic cross-sectional views of the transmission and/or reception region R1 of the scanning antenna 1000G. FIG. 61A is a schematic plan view of first antenna units U1 of the transmission and/or reception region R1 of the scanning antenna 1000G, and FIG. 61B is a schematic plan view of second antenna units U2 of the transmission and/or reception region R1 of the scanning antenna 1000G. FIGS. 62A and 62B are schematic cross-sectional views of the first antenna units U1 of the transmission and/or reception region R1 of the scanning antenna 1000G, and FIGS. 62C and 62D are schematic cross-sectional views of the second antenna units U2 of the transmission and/or reception region R1 of the scanning antenna 1000G. FIGS. 62A to 62D illustrate cross-sections along the line H-H' and the line A-A' in FIG. 61A and the cross-sections along line G-G' and line I-I' in FIG. 61B, respectively.

The structure of the first antenna units U1 of the scanning antenna 1000G has the same structure as the first antenna units U1 of the scanning antenna 1000E. The second antenna units U2 of the scanning antenna 1000G differs from the first antenna units U1 in that a recessed portion 51*e* is formed on the surface of the dielectric substrate 51 (the surface closer to the liquid crystal layer LC). That is, when viewed from the normal direction of the first dielectric substrate 1 formed on the first main surface of the second dielectric substrate 51, the second dielectric substrate 51 includes a plurality of recessed portions 51*e* overlapping the first regions Ro of the plurality of second antenna units. Thus, the distance C2 in the normal direction of the dielectric substrate 1 between the patch electrode 15 and the slot electrode 55 of the plurality of second antenna units U2 is greater than the distance C1 in the normal direction of the dielectric substrate 1 between the patch electrode 15 and the slot electrode 55 of the plurality of first antenna units U1. The thickness dl2 of the liquid crystal layer LC in the first region Ro of the plurality of second antenna units U2 is greater than the thickness dl1 of the liquid crystal layer LC of the first region Ro of the plurality of first antenna units U1.

Here, the recessed portion 51*e* is formed not to overlap with the columnar spacer PS2 of the second antenna units U2. Therefore, the columnar spacer PS1 of the first antenna units U1 and the columnar spacer PS2 of the second antenna units U2 have the same height dp1. This has the advantage of being easy to form the columnar spacer PS. However, the heights of the columnar spacer PS1 of the first antenna units U1 and the columnar spacer PS2 of the second antenna units U2 may be different from each other.

Manufacturing Method of Slot Substrate 201G

A manufacturing method of a slot substrate 201G included in the scanning antenna 1000G will be described with reference to FIGS. 63A to 63E. FIGS. 63A to 63E are schematic cross-sectional views for illustrating a manufacturing method of the slot substrate 201G. FIGS. 63A to 63E illustrate cross-sections (cross-section A-A', cross-section G-G', and cross-section H-H' of the slot substrate 201G) corresponding to FIG. 61B, FIG. 61C, and FIG. 61A. The following description mainly describes differences from the manufacturing method of the slot substrate 201E described with reference to FIGS. 54A to 54I.

Figures 63A, 63B, 63C, 63D, 63E:
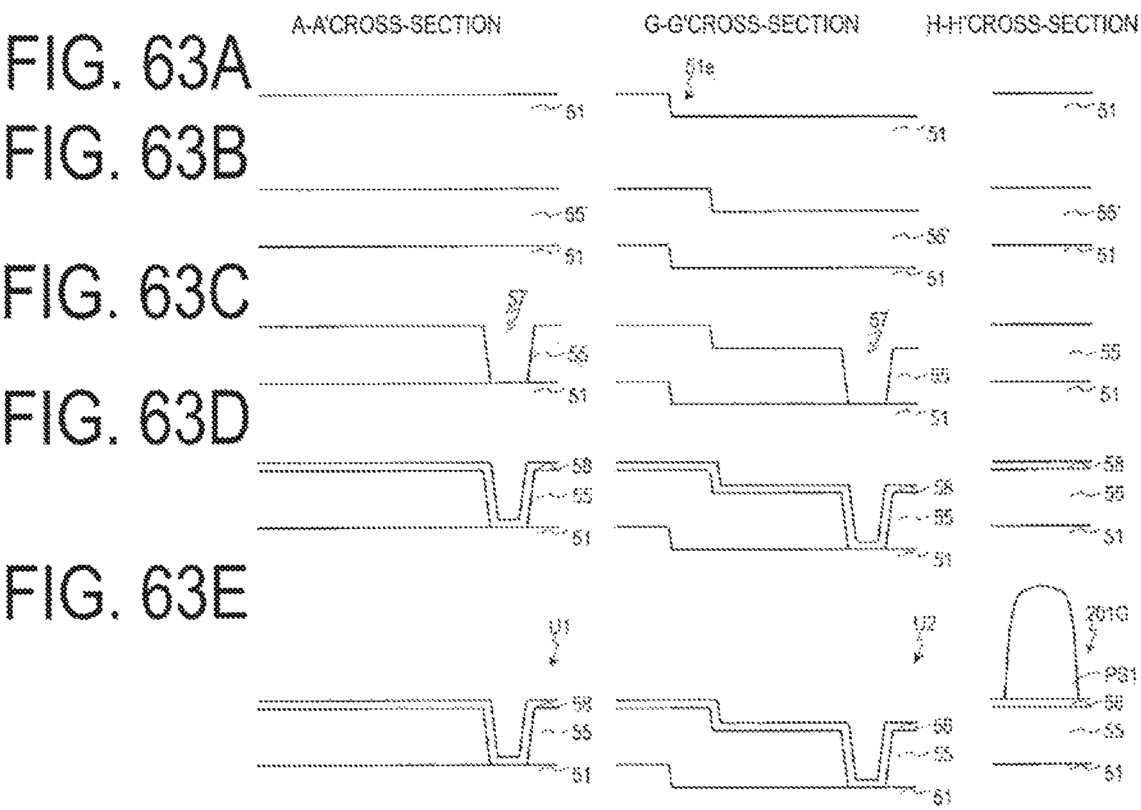
FIGS. 63A to 63E are schematic cross-sectional views for illustrating a manufacturing method of a slot substrate 201G included in the scanning antenna 1000G.

First, as illustrated in FIG. 63A, a recessed portion 51*e* is formed in a portion of the surface of the dielectric substrate 51. The recessed portion 51*e* is formed in at least a region that is the first region of the second antenna unit formation region and is not formed in the first antenna unit formation region. Here, the recessed portion 51*e* is formed not to overlap with the region forming the columnar spacers PS1 and PS2. The recessed portion 51*e* can be formed, for example, by etching the surface of the dielectric substrate 51. For example, a portion of the front surface and the back surface of the dielectric substrate 51 other than the region that forms the recessed portion 51*e* may be covered with a protective member and contacted with the etching solution. Here, the difference between the thickness of the dielectric substrate 51 within the recessed portion 51*e* and the thickness of the dielectric substrate 51 outside the recessed portion 51*e* is, for example, 200 nm.

Next, as illustrated in FIG. 63B, the first metal film 55' is formed on the surface of the dielectric substrate 51.

Thereafter, as illustrated in FIG. 63C, by patterning the first metal film 55', the slot electrode 55 including the plurality of slots 57 is formed in the first antenna unit formation region and the second antenna unit formation region.

Thereafter, as illustrated in FIG. 63D, the fourth insulating layer 58 is formed on the slot electrode 55 and within the slot 57.

Next, as illustrated in FIG. 63E, the columnar spacers PS1 and PS2 are formed on the fourth insulating layer 58.

In this way, the slot substrate 201G is manufactured.

Here, for example, the distance C1 in the normal direction of the dielectric substrate 1 between the patch electrode 15 and the slot electrode 55 of the plurality of first antenna units U1 is 2.6 μm (design value), and the distance C2 in the normal direction of the dielectric substrate 1 between the patch electrode 15 and the slot electrode 55 of the plurality of second antenna units U2 is 2.8 μm (design value). The difference between the distance C2 and the distance C1 (C2−C1) is 0.2 μm (design value). Here, the difference between distance C2 and distance C1 (C2−C1) corresponds to, for example, the difference between the thickness of the dielectric substrate 51 in the recessed portion 51*e* and the thickness of the dielectric substrate 51 outside the recessed portion 51*e*. For example, depending on the environment temperature at which the scanning antenna is installed, for example, the distance C1 may vary approximately from 2.2 μm to 2.7 μm, and the distance C2 may vary approximately from 2.7 μm to 3.2 μm. The difference between the distance C1 and the distance C2 (C2−C1) may vary approximately from 0.05 μm to 1.0 μm.

Example of Antenna Unit Array and Connection of Gate Bus Line and Source Bus Line In the scanning antenna according to the embodiments of the present disclosure, the antenna units are arranged concentrically, for example.

For example, in a case where the antenna units are arranged in m concentric circles, one gate bus line is provided for each circle, for example, such that a total of m gate bus lines is provided. For example, assuming that the outer diameter of the transmission and/or reception region R1 is 800 mm, m is 200, for example. Assuming that the innermost gate bus line is the first one, n (30, for example) antenna units are connected to the first gate bus line and nx (620, for example) antenna units are connected to the m-th gate bus line.

In such an arrangement, the number of antenna units connected to each gate bus line is different. Although m antenna units are connected to n source bus lines that are also connected to the antenna units constituting the innermost circle, among nx source bus lines connected to nx antenna units that constitute the outermost circle, the number of antenna units connected to other source bus lines is less than m.

In this way, the arrangement of antenna units in the scanning antenna is different from the arrangement of pixels (dots) in the LCD panel, and the number of connected antenna units differs depending on the gate bus line and/or source bus line. Accordingly, in a case where the capacitances (liquid crystal capacitances+auxiliary capacitances) of all the antenna units are configured to be the same, depending on the gate bus line and/or the source bus line, the electrical loads of the antenna units connected thereto differ. In such a case, there is a problem where variations occur in the writing of the voltage to the antenna unit.

Accordingly, to prevent this, the capacitance value of the auxiliary capacitance is preferably adjusted, or the number of antenna units connected to the gate bus line and/or the source bus line is preferably adjusted, for example, to make the electrical loads of the antenna units connected to the gate bus lines and the source bus lines substantially the same.

The scanning antenna according to the embodiments of the present disclosure is housed in a plastic housing as necessary, for example. It is preferable to use a material having a small dielectric constant $\varepsilon_m$ that does not affect microwave transmission and/or reception in the housing. The housing may include a through-hole provided in a portion thereof corresponding to the transmission and/or reception region R1. Furthermore, the housing may include a light blocking structure such that the liquid crystal material is not exposed to light. The light blocking structure is, for example, provided so as to block light that propagates through the dielectric substrate 1 and/or 51 from the side surface of the dielectric substrate 1 of the TFT substrate 101A and/or the side surface of the dielectric substrate 51 of the slot substrate 201 and is incident upon the liquid crystal layer. A liquid crystal material having a large dielectric anisotropy $\Delta\varepsilon_m$ may be prone to photodegradation, and as such it is preferable to shield not only ultraviolet rays but also short-wavelength blue light from among visible light. By using a light-blocking tape such as a black adhesive tape, for example, the light blocking structure can be easily formed in necessary locations.

INDUSTRIAL APPLICABILITY

Embodiments according to the present disclosure are used in scanning antennas for satellite communication or satellite broadcasting that are mounted on mobile bodies (ships, aircraft, and automobiles, for example) or the manufacture thereof.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A scanning antenna comprising:

a plurality of antenna units arranged in the scanning antenna;

a TFT substrate including a first dielectric substrate;

a slot substrate including a second dielectric substrate, and a slot electrode supported by a first main surface of the second dielectric substrate;

a liquid crystal layer provided between the TFT substrate and the slot substrate; and a reflective conductive plate disposed opposing a second main surface of the second dielectric substrate opposite to the first main surface with a dielectric layer interposed between the reflective conductive plate and the second dielectric substrate, wherein each of the plurality of antenna units includes a TFT supported by the first dielectric substrate, a patch electrode electrically connected to a drain of the TFT, a slot formed in the slot electrode corresponding to the patch electrode; and a first region in which the patch electrode and the slot electrode overlap each other when viewed from a normal direction of the first dielectric substrate, the patch electrodes of the plurality of antenna units are electrically independent, the plurality of antenna units includes a plurality of first antenna units and a plurality of second antenna units, a distance between the patch electrode and the slot electrode in the first region of the plurality of second antenna units is smaller than a distance between the patch electrode and the slot electrode in the first region of the plurality of first antenna units, the patch electrode of the plurality of first antenna units includes a first portion and the patch electrode of the plurality of second antenna units includes a second portion, the first portion and the second portion being included in the same conductive layer, and a thickness of the liquid crystal layer in the first region of the plurality of second antenna units is smaller than a thickness of the liquid crystal layer in the first region of the plurality of first antenna units.

2. The scanning antenna according to claim 1, wherein a thickness of the patch electrode in the plurality of second antenna units is greater than a thickness of the patch electrode of the plurality of first antenna units.

3. The scanning antenna according to claim 1, wherein a thickness of the slot electrode in the first region of the plurality of second antenna units is greater than a thickness of the slot electrode in the first region of the plurality of first antenna units.

4. The scanning antenna according to claim 1, wherein each of the plurality of first antenna units includes at least one first insulating layer formed in the first region between the first dielectric substrate and the patch electrode, each of the plurality of second antenna units includes at least one second insulating layer formed in the first region between the first dielectric substrate and the patch electrode, and a sum of thicknesses of the at least one second insulating layer is greater than a sum of thicknesses of the at least one first insulating layer.

5. The scanning antenna according to claim 1, wherein each of the plurality of second antenna units includes at least one insulating layer formed in the first region between the first dielectric substrate and the patch electrode, and each of the plurality of first antenna units does not include an insulating layer in the first region and between the first dielectric substrate and the patch electrode.

6. The scanning antenna according to claim 1, wherein each of the plurality of first antenna units includes at least one third insulating layer formed in the first region between the second dielectric substrate and the slot electrode, each of the plurality of second antenna units includes at least one fourth insulating layer formed in the first region between the second dielectric substrate and the slot electrode, and a sum of thicknesses of the at least one fourth insulating layer is greater than a sum of thicknesses of the at least one third insulating layer.

7. The scanning antenna according to claim 1, wherein each of the plurality of second antenna units includes at least one insulating layer formed in the first region between the second dielectric substrate and the slot electrode, and each of the plurality of first antenna units does not include an insulating layer in the first region and between the second dielectric substrate and the slot electrode.

8. The scanning antenna according to claim 1, wherein each of the plurality of first antenna units includes at least one first conductive layer formed in the first region between the first dielectric substrate and the patch electrode, each of the plurality of second antenna units includes at least one second conductive layer formed in the first region between the first dielectric substrate and the patch electrode, and a sum of thicknesses of the at least one second conductive layer is greater than a sum of thicknesses of the at least one first conductive layer.

9. The scanning antenna according to claim 1, wherein each of the plurality of second antenna units includes at least one conductive layer formed in the first region between the first dielectric substrate and the patch electrode, and each of the plurality of first antenna units does not include a conductive layer in the first region and between the first dielectric substrate and the patch electrode.

10. The scanning antenna according to claim 1, wherein a thickness of the second dielectric substrate in the first region of the plurality of second antenna units is greater than a thickness of the second dielectric substrate in the first region of the plurality of first antenna units.

11. The scanning antenna according to claim 10, wherein the second dielectric substrate includes a plurality of recessed portions overlapping the first region of the plurality of second antenna units when viewed from a normal direction of the first dielectric substrate, formed on the first main surface of the second dielectric substrate.

12. The scanning antenna according to claim 1, wherein each of the plurality of antenna units includes a columnar spacer, and a height of the columnar spacer of the plurality of first antenna units is approximately equal to a height of the columnar spacer of the plurality of second antenna units.

13. The scanning antenna according to claim 1, wherein the TFT substrate includes a gate metal layer supported by the first dielectric substrate and including a gate electrode of the TFT, a source metal layer supported by the first dielectric substrate and including a source electrode of the TFT, a semiconductor layer of the TFT, supported by the first dielectric substrate, a gate insulating layer formed between the gate metal layer and the semiconductor layer, an interlayer insulating layer formed on the TFT, and an additional insulating layer formed between the first dielectric substrate and the patch electrode, each of the plurality of second antenna units includes the additional insulating layer in at least the first region, and each of the plurality of first antenna units does not include the additional insulating layer.

14. The scanning antenna according to claim 1, wherein the TFT substrate includes a gate metal layer supported by the first dielectric substrate and including a gate electrode of the TFT, a source metal layer supported by the first dielectric substrate and including a source electrode of the TFT, a semiconductor layer of the TFT, supported by the first dielectric substrate, a gate insulating layer formed between the gate metal layer and the semiconductor layer, and an interlayer insulating layer formed on the TFT, and each of the gate insulating layer and/or the interlayer insulating layer includes a plurality of openings or a plurality of recessed portions overlapping with the patch electrode of each of the plurality of first antenna units when viewed from the normal direction of the first dielectric substrate.

15. A TFT substrate comprising:

a dielectric substrate; and a plurality of antenna unit regions arranged on the dielectric substrate, wherein each of the plurality of antenna unit regions includes a TFT supported by the dielectric substrate, and a patch electrode electrically connected to a drain of the TFT, the patch electrodes of the plurality of antenna unit regions are electrically independent, the plurality of antenna unit regions include a plurality of first antenna unit regions and a plurality of second antenna unit regions, a height of the patch electrode of the plurality of second antenna unit regions is greater than a height of the patch electrode of the plurality of first antenna unit regions, and the patch electrode of the plurality of first antenna unit regions includes a first portion and the patch electrode of the plurality of second antenna unit regions includes a second portion, the first portion and the second portion being included in the same conductive layer.

16. The TFT substrate according to claim 15, wherein a thickness of the patch electrode of the plurality of second antenna unit regions is greater than a thickness of the patch electrode of the plurality of first antenna unit regions.

17. The TFT substrate according to claim 15, wherein each of the plurality of antenna unit regions includes a second region including two mutually opposing sides of the patch electrode when viewed from a normal direction of the dielectric substrate, each of the plurality of first antenna unit regions includes at least one first insulating layer formed in the second region between the dielectric substrate and the patch electrode, each of the plurality of second antenna unit regions includes at least one second insulating layer formed in the second region between the dielectric substrate and the patch electrode, and a sum of thicknesses of the at least one second insulating layer is greater than a sum of thicknesses of the at least one first insulating layer.

18. The TFT substrate according to claim 15, wherein each of the plurality of antenna unit regions includes a second region including two mutually opposing sides of the patch electrode when viewed from a normal direction of the dielectric substrate, each of the plurality of second antenna unit regions includes at least one insulating layer formed in the second region between the dielectric substrate and the patch electrode, and each of the plurality of first antenna unit regions does not include an insulating layer in the second region and between the dielectric substrate and the patch electrode.

19. The TFT substrate according to claim 15, wherein each of the plurality of antenna unit regions includes a second region including two mutually opposing sides of the patch electrode when viewed from a normal direction of the dielectric substrate, each of the plurality of first antenna unit regions includes at least one first conductive layer formed in the second region between the dielectric substrate and the patch electrode, each of the plurality of second antenna unit regions includes at least one second conductive layer formed in the second region between the dielectric substrate and the patch electrode, and a sum of thicknesses of the at least one second conductive layer is greater than a sum of thicknesses of the at least one first conductive layer.

* * * * *